(12) United States Patent
Furukawa et al.

(10) Patent No.: US 6,262,513 B1
(45) Date of Patent: *Jul. 17, 2001

(54) ELECTRONIC COMPONENT AND METHOD OF PRODUCTION THEREOF

(75) Inventors: Osamu Furukawa, Sagamihara; Hitoshi Chiyoma, Asahikawa; Kazuhisa Yabukawa, Himeji; Kenichi Donuma, Koshigaya, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/973,858
(22) PCT Filed: May 31, 1996
(86) PCT No.: PCT/JP96/01492
 § 371 Date: Dec. 30, 1997
 § 102(e) Date: Dec. 30, 1997
(87) PCT Pub. No.: WO97/02596
 PCT Pub. Date: Jan. 23, 1997

(30) Foreign Application Priority Data

Jun. 30, 1995 (JP) ................................. P7-164379

(51) Int. Cl.$^7$ ..................................... H01L 41/08
(52) U.S. Cl. ................. 310/313 R; 310/340; 310/344
(58) Field of Search ................. 310/313 R, 340, 310/344, 348

(56) References Cited

U.S. PATENT DOCUMENTS

| 4,364,017 | * | 12/1982 | Tokunaga et al. | 310/313 R X |
| 4,734,608 | * | 3/1988 | Takoshima | 310/313 R |
| 5,010,270 | * | 4/1991 | Greer | 310/313 R |
| 5,243,250 | * | 9/1993 | Mitsutsuka | 310/313 R |

FOREIGN PATENT DOCUMENTS

| 52-16147 | 2/1977 | (JP) . |
| 53-129299 | 11/1978 | (JP) . |
| 55-61125 | 5/1980 | (JP) . |
| 56-92011 | 7/1981 | (JP) . |
| 57-173345 | 11/1982 | (JP) . |
| 59-63736 | 4/1984 | (JP) . |
| 62-98340 | * 6/1987 | (JP) ................... 310/313 R |

(List continued on next page.)

OTHER PUBLICATIONS

Kagaku Daijiten (Chemical Dictionary), Maruzen K.K., p. 1189, Mar. 5, 1985.

*Primary Examiner*—Mark O. Budd
(74) *Attorney, Agent, or Firm*—Oblon, Spivak, McClelland, Maier & Neustadt, P.C.

(57) ABSTRACT

An electronic device and a fabricating method for fabricating the electronic device, the electronic device comprising; a surface acoustic wave device 3 having a main surface thereon having a transducer portion 4 and wiring patterns 5 connected electrically to the transducer portion; a printed circuit board 1 having wiring patterns 2 formed at least on one main surface thereof; a plurality of conductive bumps 6 which connect electrically both of the mutually opposed wiring patterns and form a space portion 10 between the surface acoustic wave device 3 and a printed circuit board 1; and resin portion 11 which, by heating/melting and hardening, makes an intimate contact with other main surface of the device and coats the device 3 and seals the device 3 together with the printed circuit board 1, wherein, by employing a highly thixotropic and viscous thermo-setting resin compared with a conventional one, an electronic device having a simple structure can be provided and fabricating process for fabricating the electronic device can be simplified.

9 Claims, 35 Drawing Sheets

FOREIGN PATENT DOCUMENTS

| | | |
|---|---|---|
| 62-205635 | 9/1987 | (JP) . |
| 1-25428 | 1/1989 | (JP) . |
| 1-84752 | 3/1989 | (JP) . |
| 01128438 * | 5/1989 | (JP) ................................. 310/340 |
| 401133328 * | 5/1989 | (JP) ................................. 310/340 |
| 0179018 * | 7/1990 | (JP) ................................. 310/313 R |
| 3-289208 | 12/1991 | (JP) . |
| 4-56510 | 2/1992 | (JP) . |
| 404170811 * | 6/1992 | (JP) ................................. 310/313 R |
| 4-217335 | 8/1992 | (JP) . |
| 5-7121 | 1/1993 | (JP) . |
| 5-55303 | 3/1993 | (JP) . |
| 5-206523 | 8/1993 | (JP) . |
| 5-218230 | 8/1993 | (JP) . |
| 5-235203 | 9/1993 | (JP) . |
| 5-235688 | 9/1993 | (JP) . |
| 5-315397 | 11/1993 | (JP) . |
| 6-151626 | 5/1994 | (JP) . |
| 6-204293 | 7/1994 | (JP) . |
| 6-295937 | 10/1994 | (JP) . |
| 7-58149 | 3/1995 | (JP) . |

* cited by examiner (a)

(b)

(a)

(b)

(c)

(a)

(b)

(c)

(a)

(b)

(c)

(a)

(b)

(a)

(b)

(a)

(b)

(a)

(b)

(a)

(b)

(c)

(d)

(a)

(b)

(a)

(b)

(a)

(b)

(c)

(a)

(b)

(a)

(b)

(c)

(a)

(b)

(a)

(b)

ULTRA-VIOLET LIGHT (a)

(b)

(a)

(b)

(a)

(b)

(a)

(b)

ELECTRONIC COMPONENT AND METHOD OF PRODUCTION THEREOF

TECHNICAL FIELD

The present invention relates to an electronic device such as an acoustic surface wave apparatus, an EPROM (Erasable Programmable Read-Only Memory), a CCD (Charge Coupled Device), a semiconductor laser, a light-emitting diode and the like and the fabricating method thereof, in particular, an electronic device which has the device mounted on a substrate based on a face-down bonding method and the fabricating method thereof.

BACKGROUND ART

A surface acoustic wave device functionally requires a space portion on the surface of a transducer portion that propagates a surface wave. When a layer of foreign matter is formed on the surface of the transducer portion, it adversely affects the propagation of the surface wave and deteriorates the characteristics of the device. To solve this problem, a means for packaging the surface acoustic wave device is used. However, a resin sealing means for use with for example an IC device cannot be used because the resin thereof coats a transducer portion that excites and propagates a surface wave. Thus, conventionally, a sealing means that is so-called an airtightly sealing structure with a metal package or a ceramic package is used.

However, the productivity of the airtightly sealing structure with such a metal package or a ceramic package is low and the surface-mounting density is low.

Prior art references of surface acoustic wave apparatuses that solve such a problem based on a face-down bonding method are known as Japanese Patent Laid-Open Applications No. HEI 4-56510 and No. HEI 5-55303. In these surface acoustic wave apparatuses, a transducer portion and a bonding pad portion are formed on a surface acoustic wave device. A wiring pattern corresponding to the bonding pad portion of the device is formed on the front surface of a board. The bonding pad portion of the device and the wiring pattern of the board are aligned and connected with conductive member such as bump in such a manner that a space portion is formed between the transducer portion and the board. The device is coated and secured by the resin.

As an example of the sealing resin used for fabricating such a surface acoustic wave apparatus, a liquid thermosetting potting type epoxy resin or the like is used. However, since the viscosity of the resin is low, before the resin is hardened, the front surface of the transducer portion is coated with the liquid resin. To prevent this problem, before the device and the board are sealed, a frame-shaped insulation member or dam should be formed on the transducer portion in such a manner that the frame-shaped member or dam surrounds the propagation path of the surface acoustic wave generated by the transducer portion of the device.

Next, with reference to FIG. 46, a conventional surface acoustic wave apparatus will be described. FIG. 46(a) is a sectional view showing the conventional surface acoustic wave apparatus. FIG. 46(b) is a plan view taken along line A–A' of FIG. 46(a). FIG. 46(b) shows a printed circuit board on which a frame-shaped insulation portion is formed. In FIG. 46(b), dashed lines 201 and 202 are imaginary lines denoting a surface acoustic wave device 203 and conductive bumps 204, respectively. In FIG. 46(a), a printed circuit board 205 is composed of an insulation board. Conductive wiring patterns 206 are formed on both surfaces of the insulation board and on edge parts continuing them. A transducer portion 207 that is composed of a comb-shaped electrode pattern and a wiring pattern 208 that is electrically connected to the comb-shaped electrode pattern and supplies a signal are formed on a main surface of the surface acoustic wave device 203. The transducer portion 207 of the surface acoustic wave device 203 and the printed circuit board 205 are disposed in an opposite relation with a space portion 209. The wiring pattern 208 is electrically connected to the wiring patterns 206 on the printed circuit board 205 with conductive bumps 204 composed of Au, Ag, or the like. In addition to the surface acoustic wave device 203, the connected portions of the surface acoustic wave device 203 and the printed circuit board 205 with the conductive bumps 204 are coated with a resin member 210 such as epoxy resin. In this case, as an example of the material of the sealing resin, a liquid thermosetting type epoxy resin is used. In addition, a frame-shaped insulation member or dam 211 is formed on the surface acoustic wave device 203 in such a manner that the frame-shaped insulation member or dam 211 surrounds the surface acoustic wave device 203 so as to prevent the resin 210 from spreading over the space portion 209 before the resin 211 hardens. The frame-shaped insulation member or dam 211 is composed of polyimide resin or the like. In addition, a frame-shaped insulation member or dam 212 is formed on the printed circuit board 205 so as to prevent the resin 210, which coats all or part of the transducer portion 207 of the surface acoustic wave device 203, from spreading from the periphery of the printed circuit board 205. As with the frame-shaped insulation member or dam 211, the frame-shaped insulation member or dam 212 is composed of polyimide resin or the like. FIG. 46(b) is a plan view showing the printed circuit board 205 on which the frame-shaped insulation members or dams 211 and 212 are formed before the surface acoustic wave device 203 is mounted on the printed circuit board.

Thus, the resin 210, which seals the surface acoustic wave device, is blocked by the frame-shaped insulation members or dams 211. Thus, before the resin 210 spreads over the space portion 209, the resin 210 hardens. In other words, the resin 210 does not enter the surface acoustic wave propagation path of the surface acoustic wave device. Thus, since no foreign matter is formed on the front surface of the surface acoustic wave device, the characteristics of the surface acoustic wave device are not deteriorated. In addition, the dam 212 formed at the peripheral portion of the printed circuit board prevents the resin 210 from flowing outside the printed circuit board 205.

However, such frame-shaped insulation members or dams should be formed by a photolithography process using such as photo-sensitive polyimide resin. However, as the number of fabrication steps increases, the fabrication cost rises. Thus, the productivity of the surface acoustic wave apparatus decreases.

In addition, since the frame-shaped insulation members or dams are formed, the effective area of the transducer portion, which is a functional surface of the surface acoustic wave device, should be inevitably reduced. Thus, while there is a growing demand of miniaturization of, for example, an acoustic surface wave apparatus for mobile communication, the characteristics and functions of the surface acoustic wave apparatus cannot be satisfactorily obtained. Moreover, a study conducted by the inventors of the present invention reveals that even if such frame-shaped insulation members or dams are formed with the conventional liquid sealing resin, the resin slightly leaks out from a gap of the frame-shaped insulation members or dams due to the capillarity effect and thereby the resin reaches the transducer portion, which is the surface acoustic wave propagation path. Thus, the yield of the fabrication decreases.

Disclosure of Invention

The present invention has been done to overcome the above-described problems.

An object of the present invention is to provide an electronic device which can be easily sealed with a resin type sealing member without adversely affecting the characteristics of the device to be mounted on the electronic device, and fabricating method for fabricating thereof.

An object of the present invention is to provide an electronic device suitable for miniaturization and high density mounting of the devices, and fabricating method for fabricating thereof.

An object of the present invention is to provide an electronic device which can be easily sealed with a resin type sealing member without adversely affecting the characteristics of the device to be mounted on the electronic device, and a fabricating method for fabricating thereof, wherein the electronic device is, further, electrical noise resistant and easy in marking, and can improve the productivity and reliability accordingly.

An object of the present invention is to provide an electronic device which can be easily sealed with a resin type sealing member without adversely affecting the characteristics of the devices to be mounted on the electronic device and fabricating method for fabricating thereof, wherein the electronic device, further, can alleviate the degree of strain induced by the stress due to resin hardening or the difference of thermal expansions, and the adverse effects on the characteristics due to sealing, and still further can improve the productivity and reliability of the electronic device.

An object of the present invention is to provide an electronic device which can be easily sealed with resin type sealing member without adversely affecting the characteristics of the devices to be mounted on the electronic device and fabricating method for fabricating thereof, wherein the electronic device further enables to eliminate inconvenience due to the thickness of the bonding member and improve the productivity and reliability of the electronic device.

An object of the present invention is to provide an electronic device which can be easily sealed with resin type sealing member without adversely affecting the characteristics of the devices to be mounted on the electronic device and fabricating method for fabricating thereof, wherein the electronic device can further improve a surface wave absorbance (acoustic absorption effect) because such as the sealing member works as a surface acoustic wave absorber, and improve the productivity and reliability of the electronic device.

An object of the present invention is to provide an electronic device which can work stably without inducing the ambient noise and can secure the electromagnetic shielding effect (shield effect), and fabricating method for fabricating thereof.

An object of the present invention is to provide an electronic device which can work stably without inducing the adverse effect of the ambient noise even in a high frequency region and can secure the electromagnetic wave shielding effect (shield effect), and fabricating method for fabricating thereof.

An object of the present invention is to provide an electronic device which can work stably without inducing the adverse effect of the ambient noise even in the high frequency region of 1 GHZ and more and can secure the electromagnetic wave shielding effect (shield effect), and fabricating method for fabricating thereof.

An object of the present invention is to provide an electronic device which can work stably due to absorption of the energy of the ambient noise and can secure the electromagnetic wave shielding effect (shield effect), and fabricating method for fabricating thereof.

An object of the present invention is to provide an electronic device which can prevent the reliability from deteriorating due to the difference of the thermal expansions and the like, and further can prevent the resin for sealing from undesirable spreading, and the fabrication method for fabricating thereof.

An object of the present invention is to provide an electronic device which can absorb the difference between the thermal expansions of the constituents and alleviate the strain induced by the stress, and has a high reliability against thermal shock and the like, and the fabricating method for fabricating thereof.

Further, an object of the present invention is to provide an electronic device having a high reliability in mechanical strength, and the fabricating method thereof.

Further, an object of the present invention is to provide an acoustic surface wave apparatus capable of preventing the sealing member from spreading into the transducer part of the acoustic surface wave device, and the fabricating method for fabricating thereof.

Still further, an object of the present invention is to provide an acoustic surface wave apparatus which can prevent the sealing member from spreading into, in particular, the long and narrow transducer part of the acoustic surface wave device and has an enough high strength, and the fabricating method for fabricating thereof.

An object of the present invention is to provide an electronic device capable of securing a space portion effectively between a printed circuit board and a functional device to be mounted, and the fabricating method for fabricating thereof.

Further, an object of the present invention is to provide an electronic device capable of securing a space portion effectively between a printed circuit board and a functional device to be mounted and capable of bonding a functional device and the printed circuit board with enough strength, namely with high reliability in bonding, and the fabricating method for fabricating thereof.

An object of the present invention is to provide an electronic device having a high degree of freedom in designing without necessitating the frame member to be used for preventing the sealing member from spreading, and the fabricating method for fabricating thereof.

An object of the present invention is to provide an electronic device capable of fully exhibiting the function of the device without necessitating the frame member to be used for preventing the sealing member from spreading, and the fabricating method for fabricating thereof.

An object of the present invention is to provide an electronic device which has a large bonding strength between a printed circuit board and a device to be mounted, and a high reliability in bonding, and the fabricating method for fabricating thereof.

A fabricating method for fabricating an electronic device of the present invention comprises the steps of:

(a) disposing a first surface of a functional device in an opposite relation with a first surface of a printed circuit board, (b) disposing a hot-melt type member above the first surface of the printed circuit board and/or a second surface of the functional device, and (c) melting the hot-melt type member by heating and sealing the space portion formed between the functional device and the printed circuit board while leaving at least the space portion vacant.

In the fabricating method of an electronic device of the present invention, prior to (a) step described above, a frame-shaped member can be further disposed on the first surface of the printed circuit board so as to surround the space portion.

In the fabricating method of an electronic device of the present invention, in the (c) step described above, the hot-melt type member can be heated and melted so as to completely cover a second surface of the functional device.

In the fabricating method of an electronic device of the present invention, in the (c) step described above, the hot-melt type member can be heated and melted while exposing all the second surface of the functional device.

In the fabricating method of an electronic device of the present invention, in the (c) step described above, the hot-melt type member can be heated and melted while exposing a part of the second surface of the functional device.

In the fabricating method of an electronic device of the present invention, in the (a) step described above, the first surface of the functional device can be disposed in an opposite relation with the first surface of the printed circuit board with a conductive bonding member.

Further, in a fabricating method of an electronic device of the present invention, the functional device is a surface acoustic wave device, and, in the (a) step described above, a connecting pattern on the first surface of the printed circuit board and a connecting pattern on the first surface of the acoustic surface wave device can be disposed in an opposite relation through the conductive bonding member based on a face-down bonding method.

Further, in a fabricating method of an electronic device of the present invention, the functional device is a quartz oscillator or resonator. In the (a) step described above, a connecting pattern on the first surface of the printed circuit board and electrodes on a first surface of the quartz oscillator or resonator are disposed in an opposite relation through the conductive bonding member based on a face-down bonding method, and the connecting pattern on the first surface of the printed circuit board and the electrodes on a second surface of the quartz oscillator or resonator are connected electrically through an electrical connecting means. Further, between the (a) step and (b) step, a surrounding member can be disposed on the printed circuit board so as to surround the quartz oscillator or resonator, and, in the (b) step, the hot-melt type member can be disposed at least on the surrounding member.

Further, in a fabricating method of an electronic device of the present invention, the functional device is a piezoelectric oscillator or resonator, and in the (a) step described above, a connecting pattern on the first surface of the printed circuit board and electrodes on the first surface of the piezoelectric oscillator or resonator are disposed in an opposite relation through a conductive bonding member based on a face-down bonding method, and the connecting pattern on the first surface of the printed circuit board and the electrodes on the second surface of the piezoelectric oscillator or resonator are connected electrically with electrical connecting means.

Further, in a fabricating method of an electronic device of the present invention, the functional device is a photocoupler having a pair of light transmitting part and light receiving part, and in the (a) step described above, a connecting pattern on the first surface of the printed circuit board and a wiring pattern on the first surface of the photocoupler are disposed in an opposite relation through the conductive bonding member based on a face-down bonding method, and, between (a) step and (b) step, the surrounding member is disposed on the printed circuit board so as to surround the photocoupler, and, in (b) step, the hot-melt type member can be disposed on at least the surrounding member.

In a fabricating method of an electronic device of the present invention, the printed circuit board is a light-transmitting substrate, the functional device is an EPROM, and, in the (a) step, the first surface of the printed circuit board can be disposed in an opposite relation with the light receiving surface of the EPROM.

In a fabricating method of an electronic device of the present invention, the printed circuit board can be a light-transmitting substrate, the functional device can be a CCD, and, in the (a) step, the first surface of the printed circuit board can be disposed in an opposite relation with the light receiving surface of the CCD.

In a fabricating method of an electronic device of the present invention, the printed circuit board is a light-transmitting substrate, the functional device is a semiconductor laser, and, in the (a) step, the first surface of the printed circuit board can be disposed in an opposite relation with a light emitting surface of the semiconductor laser.

In a fabricating method of an electronic device of the present invention, the printed circuit board is a light-transmitting substrate, the functional device is a light-emitting diode, and, in the (a) step, the first surface of the printed circuit board can be disposed in an opposite relation with a light emitting surface of the light-emitting diode.

Further, in a fabricating method of an electronic device of the present invention, the functional device has some bumps, and, in the (a) step described above, the bumps on the functional device are disposed in an opposite relation with the printed circuit board, and, between the (a) step and (b) step, the functional device can be bonded to the printed circuit board while irradiating infrared light on the printed circuit board and/or the bumps.

Further, in a fabricating method of an electronic device of the present invention, the hot-melt type member can be a resin.

Further, in a fabricating method of an electronic device of the present invention, the hot-melt type member can be a thermosetting resin.

Further, in a fabricating method of an electronic device of the present invention, the hot-melt type member can be an epoxy resin.

Further, in a fabricating method of an electronic device of the present invention, the hot-melt type member can be a phenol-based epoxy resin.

Further, in a fabricating method of an electronic device of the present invention, the hot-melt type member can be a silicone resin.

Further, in a fabricating method of an electronic device of the present invention, the hot-melt type member can be a low melting glass.

Further, in a fabricating method of an electronic device of the present invention, the hot-melt type member can be a low melting glass having melting temperature in the range of 250° C. and 400° C.

Further, in a fabricating method of an electronic device of the present invention, the hot-melt type member can be a low melting glass having melting temperature in the range of 320° C. and 350° C.

Further, in a fabricating method of an electronic device of the present invention, the hot-melt type member can be a borosilicate lead glass.

Further, in a fabricating method of an electronic device of the present invention, the hot-melt type member can be at least one member selected from the members of a borosilicate lead glass and a borosilicate bismuth glass.

Further, in a fabricating method of an electronic device of the present invention, prior to (a) step described above, a connecting process can be furnished so as to bond temporarily between the printed circuit board and the functional device.

Further, in a fabricating method of an electronic device of the present invention, the size of the hot-melt type member can be bigger than that of the functional device and nearly identical with that of the printed circuit board.

Further, in a fabricating method of an electronic device of the present invention, the hot-melt type member can be a cold-pressed member of powder form raw material.

Further, in a fabricating method of an electronic device of the present invention, the shape of the hot-melt type member prior to hot-melting can have a shape hanging down it's peripheral part.

Further, in a fabricating method of an electronic device of the present invention, in the (c) step, a plurality of heating steps can be included.

Further, in a fabricating method of an electronic device of the present invention, the step for hot-melting the hot-melt type member can be executed under the conditions of a hardening temperature ranging from 100 to 200° C. and a hardening time ranging from 20 to 2 hours.

An electronic device of the present invention comprises; a printed circuit board having a first surface and a second surface; a functional device having a first surface and a second surface, the first surface thereof being disposed in an opposite relation with the first surface of the printed circuit board; and a hot-melt type member used for sealing a space portion between the first surface of the printed circuit board and the first surface of the functional device preventing the sealing member from intruding the space portion.

In an electronic device of the present invention, a frame-shaped member can be disposed on the first surface of the printed circuit board so as to surround the space portion.

Further, in an electronic device of the present invention, the hot-melt member is disposed so as to cover all the surface of the second surface of the functional device.

Further, in an electronic device of the present invention, the hot-melt member is disposed so as to cover a part of the surface of the second surface of the functional device.

Further, in an electronic device of the present invention, the hot-melt member is disposed so as to expose all the surface of the second surface of the functional device.

Further, in an electronic device of the present invention, a conductive bonding member can be disposed between a first surface of the printed circuit board and a first surface of the functional device.

Further, in an electronic device of the present invention, the functional device is an acoustic surface wave device, and a conductive bonding member can be disposed between a connecting pattern on the first surface of the printed circuit board and a connecting pattern on the first surface of the acoustic surface wave device so as to connect them based on the face-down bonding method.

Further, in an electronic device of the present invention, the functional device can be a quartz oscillator or resonator, a conductive bonding member can be disposed between a connecting pattern on the first surface of the printed circuit board and an electrode on the first surface of the quartz oscillator or resonator so as to connect them based on the face-down bonding method, and the wiring pattern on the first surface of the printed circuit board and the electrode on the second surface of the quartz oscillator or resonator can be electrically connected with an electrical connecting means.

Further, in an electronic device of the present invention, the functional device can be a piezoelectric oscillator or resonator, a conductive bonding member can be disposed between a connecting pattern on the first surface of the printed circuit board and an electrode on the first surface of the piezoelectric oscillator or resonator so as to connect them based on the face-down bonding method, and the wiring pattern on the first surface of the printed circuit board and the electrode on the second surface of the piezoelectric oscillator or resonator can be electrically connected with an electrical connecting means.

Further, in an electronic device of the present invention, the functional device can be a photocoupler having a pair of light-sending part and light-receiving part, a conductive bonding member can be disposed between a connecting pattern on the first surface of the printed circuit board and wiring pattern on the respective first surface of the photocoupler so as to connect between them based on the face-down bonding method, the surrounding member can be disposed on the first surface of the printed circuit board so as to surround the photocoupler, and the hot-melt member can be disposed at least on the surrounding member.

Further, in an electronic device of the present invention, the printed circuit board can be a light transmitting substrate and the functional device can be an EPROM in which the first surface serves as the light-receiving surface.

Further, in an electronic device of the present invention, the printed circuit board can be a light transmitting substrate and the first surface of the functional device can be a CCD.

Further, in an electronic device of the present invention, the printed circuit board can be a light transmitting substrate and the first surface of the functional device can be a light emitting surface of a semiconductor laser.

Further, in an electronic device of the present invention, the printed circuit board can be a light transmitting substrate and the first surface of the functional device can be a light emitting surface of a light-emitting diode.

Further, in an electronic device of the present invention, the hot-melt type member can be a resin.

Further, in an electronic device of the present invention, the hot-melt type member can be a thermo-setting resin.

Further, in an electronic device of the present invention, the hot-melt type member can be an epoxy resin.

Further, in an electronic device of the present invention, the hot-melt type member can be a phenol-based epoxy resin.

Further, in an electronic device of the present invention, the hot-melt type member can be a silicone resin.

Further, in an electronic device of the present invention, the hot-melt type member can be a low melting glass.

Further, in an electronic device of the present invention, the hot-melt type member can be a low melting glass having a melting temperature in the range from 250° C. to 400° C.

Further, in an electronic device of the present invention, the hot-melt type member can be a low melting glass having a melting temperature in the range from 320° C. to 350° C.

Further, in an electronic device of the present invention, the hot-melt type member can be a borosilicate lead glass.

Further, in an electronic device of the present invention, the hot-melt type member can be at least one member selected from the members of a borosilicate lead glass and a borosilicate bismuth glass.

Further, in an electronic device of the present invention, the printed circuit board can comprise a first wiring pattern formed on a first surface, a second wiring pattern formed on a second surface, a third wiring pattern formed on the peripheral surface of the printed circuit board connecting the first wiring pattern and the second wiring pattern.

An electronic device of the present invention comprises: a printed circuit board having a first surface and a second surface, and a wiring pattern formed at least on the first surface of the printed circuit board; a functional device having a first surface and a second surface, the first surface thereof being disposed in an opposite relation with the first surface of the printed circuit board; a conductive film formed on the second surface of the functional device; a conductive material electrically connecting between the conductive film and the pattern formed on the printed circuit board; and a sealing member used for sealing a space portion formed between the first surface of the printed circuit board and the first surface of the functional device while preventing the sealing member from intruding the space portion.

Further, an electronic device of the present invention comprises: a printed circuit board which has a first surface and a second surface, and a wiring pattern being formed at least on the first surface thereof; a functional device which has a first surface and a second surface, the first surface thereof being disposed in an opposite relation with the first surface of the printed circuit board; a metallic foil formed on the second surface of the functional device; a means for electrically connecting between the metallic foil and the wiring pattern formed on the printed circuit board; and a sealing member used for sealing a space portion formed between the first surface of the printed circuit board and the first surface of the functional device while preventing the sealing member from intruding the space portion.

Further, an electronic device of the present invention comprises: a printed circuit board which has a first surface and a second surface, and a wiring pattern being formed at least on the first surface thereof; a functional device which has a first surface and a second surface, and the first surface being disposed in an opposite relation with the first surface of the printed circuit board; a conductive film formed on the second surface of the functional device; a magnetic material dispersed resin electrically connecting between the conductive film and the pattern formed on the printed circuit board; and a sealing member used for sealing a space portion formed between the first surface of the printed circuit board and the first surface of the functional device while preventing the sealing member from intruding the space portion.

Further, an electronic device of the present invention comprises: a printed circuit board which has a first surface and a second surface; a functional device which has a first surface and a second surface, and the first surface being disposed in an opposite relation with the first surface of the printed circuit board; and a sealing member consisting of a metallic powder dispersed resin used for sealing a space portion formed between the first surface of the printed circuit board and the first surface of the functional device while preventing the sealing member from intruding the space portion.

Further, an electronic device of the present invention comprises: a printed circuit board which has a first surface and a second surface; a functional device which has a first surface and a second surface, and the first surface thereof being disposed in an opposite relation with the first surface of the printed circuit board; and a sealing member used for sealing a space portion formed between the first surface of the printed circuit board and the first surface of the functional device while preventing the sealing member from intruding the space portion, wherein the sealing member is a magnetic powder dispersed resin.

Further, an electronic device of the present invention comprises: a printed circuit board which has a first surface and a second surface; a functional device which has a first surface and a second surface, and the first surface thereof being disposed in an opposite relation with the first surface of the printed circuit board; and a sealing member used for sealing a space portion formed between the first surface of the printed circuit board and the first surface of the functional device while preventing the sealing member from intruding the space portion, wherein the sealing member is consisted of a radio wave absorbing material dispersed resin.

Further, an electronic device of the present invention comprises: a printed circuit board which has a first surface and a second surface; a functional device which has a first surface and a second surface, and the first surface being disposed in an opposite relation with the first surface of the printed circuit board; and a sealing member used for sealing a space portion formed between the first surface of the printed circuit board and the first surface of the functional device while preventing the sealing member from intruding the space portion, wherein the sealing member is consisted of a conductive filler containing resin.

Further, an electronic device of the present invention comprises: a printed circuit board having a first surface, a second surface, and concave parts being formed on two peripheral surfaces thereof respectively; a functional device having a first surface and a second surface, and the first surface being disposed in an opposite relation with the first surface of the printed circuit board; a sealing member for sealing the space portion formed between the first surface of the printed circuit board and the first surface of the functional device preventing the sealing member from intruding the space portion; and a metallic plate having a pair of convex part on two leg portions disposed mutually oppositely is disposed so as to engage with the each concave parts formed on the printed circuit board, and covering the first surface of the printed circuit board and the functional device.

Further, an electronic device of the present invention comprises: a printed circuit board having a first surface and a second surface, and concave parts being formed on two peripheral surfaces of the printed circuit board wherein inside the concave parts wiring patterns are formed; a functional device having a first surface and a second surface, and the first surface being disposed in an opposite relation with the first surface of the printed circuit board; a sealing member for sealing the space portion formed between the first surface of the printed circuit board and the first surface of the functional device preventing the sealing member from intruding the space portion; and a metallic plate having a pair of convex portion on two leg portions thereof disposed mutually oppositely and being disposed so as to engage with the each concave part formed on the printed circuit board and at the same time to electrically connect with each wiring pattern inside the concaves, and covering the first surface of the printed circuit board and the functional device.

Further, an electronic device of the present invention comprises: a printed circuit board having a first surface and a second surface, and a stepped part being formed on two peripheral surface with respective first surface side thereof as an upper step; a functional device having a first surface and a second surface, and the first surface being disposed in an opposite relation with the first surface of the printed circuit board; a sealing member for sealing the space portion formed between the first surface of the printed circuit board and the first surface of the functional device preventing the sealing member from intruding the space portion; and a metallic plate having a pair of protruded part disposed so as to oppose each other on two leg portions thereof and being disposed to engage with the each stepped part formed on the printed circuit board, and covering the first surface of the printed circuit board and the functional device.

Further, an electronic device of the present invention comprises: a printed circuit board having a first surface and a second surface, and stepped parts being formed on two peripheral surfaces with respective first surface side as an upper step and with the wiring pattern on the lower step of the printed circuit board; a functional device having a first surface and a second surface, and the first surface being disposed in an opposite relation with the first surface of the printed circuit board; a sealing member for sealing the space portion formed between the first surface of the printed circuit board and the first surface of the functional device while preventing the sealing member from intruding the space portion; and a metallic plate having a pair of protruded part disposed so as to oppose each other on two leg portions thereof and being disposed so as to engage with the respective stepped parts formed on the printed circuit board while electrically connecting with the wiring pattern of the lower step, and covering the first surface of the printed circuit board and the functional device.

Further, an electronic device of the present invention comprises: a printed circuit board which has a first surface and a second surface; a functional device which has a first surface and a second surface, and the first surface being disposed in an opposite relation with the first surface of the printed circuit board; a buffering member formed on the second surface of the functional device; and a sealing member used for sealing a space portion formed between the first surface of the printed circuit board and the first surface of the functional device while preventing the sealing member from intruding the space portion.

Further, an electronic device of the present invention comprises: a printed circuit board which has a first surface and a second surface; a functional device which has a first surface and a second surface, and the first surface being disposed in an opposite relation with the first surface of the printed circuit board; and a sealing member used for sealing a space portion formed between the first surface of the printed circuit board and the first surface of the functional device while preventing the sealing member from intruding the space portion, wherein the sealing member is a resin containing glass filler.

Further, an electronic device of the present invention comprises: a printed circuit board which has a first surface and a second surface, and a wiring pattern being formed on the first surface of the printed circuit board; a functional device which has a first surface and a second surface, a wiring pattern being formed on the first surface, and the first surface being disposed in an opposite relation with the first surface of the printed circuit board; a bonding member electrically connecting the wiring pattern on the printed circuit board and the wiring pattern on the functional device, and being disposed intensively on the central part of the functional device; and a sealing member used for sealing a space portion formed between the first surface of the printed circuit board and the first surface of the functional device while preventing the sealing member from intruding the space portion.

Further, an electronic device of the present invention comprises: a printed circuit board which has a first surface and a second surface, and a wiring pattern being formed on the first surface of the printed circuit board; a functional device which has a first surface and a second surface, a wiring pattern being formed on the first surface thereof, and the first surface being disposed in an opposite relation with the first surface of the printed circuit board; a first bonding member electrically connecting the wiring pattern on the printed circuit board and the wiring pattern on the functional device and being intensively disposed on the central part of the functional device; a second bonding member disposed around the peripheral portion of the functional device and not participating in the electrical connection between the wiring pattern of the printed circuit board and the wiring pattern of the functional device; and a sealing member used for sealing a space portion formed between the first surface of the printed circuit board and the first surface of the functional device while preventing the sealing member from intruding the space portion.

Further, an electronic device of the present invention comprises: a printed circuit board having a first and a second surface, a first wiring pattern being formed of a conductive material on the first surface with a first thickness, and a second wiring pattern being formed of a conductive material with a second thickness larger than that of the first wiring pattern; a functional device having a first and a second surface, a wiring pattern being formed on the first surface, and the first surface being disposed in an opposite relation with the first surface of the printed circuit board; a conductive bonding member disposed between the second wiring pattern of the printed circuit board and the wiring pattern of the functional device; and a sealing member for sealing the space portion formed between the first surface of the printed circuit board and the first surface of the functional device preventing the sealing member from intruding the space portion.

Further, an electronic device of the present invention comprises: a printed circuit board having a first surface and a second surface, a first board material region with a first thickness and a second board material region with a second thickness which is larger than the first thickness, and wiring patterns formed on the first region and the second region of the first surface; a functional device having a first and a second surface, a wiring pattern being formed on the first surface, and the first surface being disposed in an opposite relation with the first surface of the printed circuit board; a conductive bonding member disposed between the second wiring pattern of the printed circuit board and the wiring pattern of the functional device; and a sealing member for sealing the space portion formed between the first surface of the printed circuit board and the first surface of the functional device preventing the sealing member from intruding the space portion.

Further, an electronic device of the present invention comprises: a printed circuit board having a first and a second surface, and a wiring pattern being formed on the first surface; a functional device having a first and a second surface, a wiring pattern being formed on the first surface, and the first surface being disposed in an opposite relation with the first surface of the printed circuit board; a conductive bonding member being disposed between the wiring pattern of the first surface of the printed circuit board and a wiring pattern of the first surface of the functional device, and having the bumps piled up according to the spacing between the wiring patterns; and a sealing member for sealing the space portion formed between the first surface of the printed circuit board and the first surface of the functional device preventing the sealing member from intruding the space portion.

Further, an electronic device of the present invention comprises: a printed circuit board having a first and a second surface, and a wiring pattern being formed on the first surface; a functional device having a first and a second surface, a wiring pattern and a sound absorption material being formed on the first surface, and the first surface being disposed in an opposite relation with the first surface of the printed circuit board, wherein the functional device is a surface acoustic wave device; a conductive bonding member disposed between the wiring pattern of the first surface of the printed circuit board and a wiring pattern of the first surface of the functional device, wherein a height of the conductive connecting member is thicker than a thickness of the sound absorption material; and a sealing member for sealing the space portion formed between the first surface of the printed circuit board and the first surface of the functional device preventing the sealing member from intruding the space portion.

Further, an electronic device of the present invention comprises: a printed circuit board having a first and a second surface, and a wiring pattern being formed on the first surface; a functional device having a first and a second surface, a wiring pattern being formed on the first surface, a sound absorption material being formed on the second surface, and the first surface being disposed in an opposite relation with the first surface of the printed circuit board, wherein the functional device is a surface acoustic wave device; a conductive bonding member disposed between the wiring pattern of the printed circuit board and a wiring pattern of the functional device; and a sealing member for sealing the space portion formed between the first surface of the printed circuit board and the first surface of the functional device preventing the sealing member from intruding the space portion.

Further, an electronic device of the present invention comprises: a printed circuit board having a first and a second surface, and a wiring pattern being formed on the first surface; a functional device consisting having a first surface and a second surface, a wiring pattern being formed on the first surface, a sound absorption material being formed on the second surface, and the first surface being disposed in an opposite relation with the first surface of the printed circuit board, wherein the functional device is a surface acoustic wave device; a conductive bonding member disposed between the wiring pattern of the printed circuit board and a wiring pattern of the functional device; a metallic foil disposed on the second surface of the functional device; and a sealing member for sealing the space portion formed between the first surface of the printed circuit board and the first surface of the functional device preventing the sealing member from intruding the space portion.

Further, in an electronic device of the present invention, the sealing member can be a hot-melt type member.

Further, in an electronic device of the present invention, the sealing member can be a thermo-setting member.

Further, in an electronic device of the present invention, a frame-shaped member can be disposed on the first surface of the printed circuit board so as to surround the space portion.

Further, in an electronic device of the present invention, the sealing member can be disposed such that the second surface of the functional device can be covered wholly.

Further, in an electronic device of the present invention, the sealing member can be disposed so as to partially cover the second surface of the functional device.

Further, in an electronic device of the present invention, the sealing member can be disposed so as to expose all the second surface of the functional device.

Further, in an electronic device of the present invention, a conductive bonding member can be disposed between the first surface of the printed circuit board and the first surface of the functional device.

Further, an electronic device of the present invention comprises: a functional device being an acoustic surface wave device; and a conductive bonding member being disposed between the connecting pattern on the first surface of the printed circuit board and the connecting pattern on the first surface of the acoustic surface wave device so as to connect between them based on the face-down bonding method.

Further, an electronic device of the present invention comprises: a functional device being a quartz oscillator or resonator; a conductive bonding member bonding between the connecting pattern on the first surface of the printed circuit board and the electrode on the first surface of the quartz oscillator or resonator being disposed so as to connect them based on the face-down bonding method; and an electrically connecting means for connecting the wiring pattern on the first surface of the printed circuit board and the electrode on the second surface of the quartz oscillator or resonator.

Further, an electronic device of the present invention comprises: a functional device being a piezoelectric oscillator or resonator; a conductive bonding member bonding between the connecting pattern on the first surface of the printed circuit board and the electrode on the first surface of the piezoelectric oscillator or resonator being disposed so as to connect them based on the face-down bonding method; and an electrically connecting means for connecting the wiring pattern on the first surface of the printed circuit board and the electrode on the second surface of the piezoelectric oscillator or resonator.

Further, an electronic device of the present invention comprises: a functional device being a photocoupler having a pair of a light sending part and a light receiving part; a conductive bonding member bonding between a connecting pattern on the first surface of the printed circuit board and the wiring pattern on the respective first surfaces of the photocoupler being disposed so as to connect them based on the face-down bonding method; a surrounding member disposed on the first surface of the printed circuit board so as to surround the photocoupler; and a sealing member disposed at least on the surrounding member.

Further, in an electronic device of the present invention, the printed circuit board can be a light transmitting substrate and the functional device can be an EPROM of which first surface is a light-receiving surface.

Further, in an electronic device of the present invention, the printed circuit board can be a light transmitting substrate and the functional device can be a CCD of which first surface is a light receiving surface.

Further, in an electronic device of the present invention, the printed circuit board can be a light transmitting substrate and the functional device can be a semiconductor laser of which first surface is a light emitting surface.

Further, in an electronic device of the present invention, the printed circuit board can be a light transmitting substrate and the functional device can be a light-emitting diode of which first surface is a light-emitting surface.

A fabricating method for fabricating an electronic device of the present invention comprises the steps of: a step for disposing a first surface of a printed circuit board in an opposite relation with a first surface of a functional device; a step for forming a conductive film on a second surface of the functional device; a step for electrically connecting the conductive film and a wiring pattern on the first surface of the printed circuit board with a conductive material; and a step for sealing at least a space portion between the printed circuit board and the functional device with a sealing member preventing the space portion from the intrusion of the sealing member.

Further, a fabricating method for fabricating an electronic device of the present invention comprises the steps of: a step for disposing a first surface of a printed circuit board in an opposite relation with a first surface of a functional device; a step for disposing a metallic foil on a second surface of the functional device; a step for connecting the metallic foil and a wiring pattern on the first surface of the printed circuit board with an electrically connecting means; and a step for sealing at least a space portion between the printed circuit board and the functional device with a sealing member preventing the sealing member from intruding the space portion.

Further, a fabricating method for fabricating an electronic device of the present invention comprises the steps of: a step for disposing a first surface of a printed circuit board in an opposite relation with a first surface of a functional device; a step for forming a conductive film on a second surface of the functional device; a step for electrically connecting the conductive film and a wiring pattern on the first surface of the printed circuit board with a magnetic powder dispersed resin; and a step for sealing at least a space portion between the printed circuit board and the functional device with a sealing member preventing the sealing member from intruding the space portion.

Further, a fabricating method for fabricating an electronic device of the present invention comprises the steps of: a step for disposing a first surface of a printed circuit board in an opposite relation with a first surface of a functional device; and a step for sealing at least a space portion between the printed circuit board and the functional device with a sealing member consisting of a metal powder dispersed resin preventing the sealing member from intruding the space portion.

Further, a fabricating method for fabricating an electronic device of the present invention comprises the steps of: a step for disposing a first surface of a printed circuit board in an opposite relation with a first surface of a functional device; and a step for sealing at least a space portion between the printed circuit board and the functional device with a sealing member consisting of a magnetic powder dispersed resin preventing the sealing member from intruding the space portion.

Further, a fabricating method for fabricating an electronic device of the present invention comprises the steps of: a step for disposing a first surface of a printed circuit board in an opposite relation with a first surface of a functional device; and a step for sealing at least a space portion between the printed circuit board and the functional device with a sealing member consisting of an electromagnetic wave absorbing member dispersed resin preventing the sealing member from intruding the space portion.

Further, a fabricating method for fabricating an electronic device of the present invention comprises the steps of: a step for disposing a first surface of a printed circuit board in an opposite relation with a first surface of a functional device; and a step for sealing at least a space portion between the printed circuit board and the functional device with a sealing member consisting of a resin containing a conductive filler preventing the sealing member from intruding the space portion.

Further, a fabricating method for fabricating an electronic device of the present invention comprises the steps of: a step for disposing a first surface of a printed circuit board in an opposite relation with a first surface of a functional device; a step for sealing at least a space portion between the printed circuit board and the functional device with a sealing member preventing the sealing member from intruding the space portion; and a step for covering the first surface of the printed circuit board and the functional device with a metal plate by engaging a pair of convex parts disposed in an opposite relation each other on the leg portion of the metal plate and two concave parts disposed on the two peripheral surface of the printed circuit board.

Further, a fabricating method for fabricating an electronic device of the present invention comprises the steps of: a step for disposing a first surface of a printed circuit board in an opposite relation with a first surface of a functional device; a step for sealing at least a space portion between the printed circuit board and the functional device with a sealing member preventing the sealing member from intruding the space portion; and a step for covering the first surface of the printed circuit board and the functional device with a metal plate by engaging a pair of convex parts disposed in an opposite relation each other on the leg portion of the metal plate and two concave parts disposed on the two peripheral surfaces of the printed circuit board and by electrically connecting the wiring pattern disposed inside the concave and the wiring pattern at the tip end of the convex part.

Further, a fabricating method for fabricating an electronic device of the present invention comprises the steps of: a step for disposing a first surface of a printed circuit board in an opposite relation with a first surface of a functional device; a step for sealing at least a space portion between the printed circuit board and the functional device with a sealing member preventing the sealing member from intruding the space portion; and a step for covering the first surface of the printed circuit board and the functional device with a metal plate by engaging each stepped parts disposed on two edge surfaces of the printed circuit board in a manner that the first surface side is an upper step and a pair of protruded parts disposed in an opposite relation each other on the leg part of the metal plate.

Further, a fabricating method for fabricating an electronic device of the present invention comprises the steps of: a step for disposing a first surface of a printed circuit board in an opposite relation with a first surface of a functional device; a step for sealing at least a space portion between the printed circuit board and the functional device with a sealing member preventing the sealing member from intruding the space portion; and a step for covering the first surface of the printed circuit board and the functional device with a metal plate by engaging respective stepped parts, which are disposed on the edge surfaces of the printed circuit board in such a manner that the first surface is an upper side, and a pair of protruded parts disposed in an opposite relation each other on the leg portions of the metal plate as well as by electrically connecting the wiring pattern disposed on the lower surface of the edge surface and the wiring pattern disposed at the tip part of the protruded part.

Further, a fabricating method for fabricating an electronic device of the present invention comprises the steps of: a step for disposing a first surface of a printed circuit board in an opposite relation with a first surface of a functional device; a step for disposing a buffering member on the second surface of the functional device; and a step for sealing at least a space portion between the printed circuit board and the functional device with a sealing member preventing the sealing member from intruding the space portion.

Further, a fabricating method for fabricating an electronic device of the present invention comprises the steps of: a step for disposing a first surface of a printed circuit board in an opposite relation with a first surface of a functional device; and a step for sealing at least a space portion between the printed circuit board and the functional device with a sealing member consisting of a resin containing glass filler preventing the sealing member from intruding the space portion.

Further, a fabricating method for fabricating an electronic device of the present invention comprises the steps of: a step for disposing a first surface of a printed circuit board in an opposite relation with a first surface of a functional device while disposing a bonding member electrically connecting the wiring pattern of the printed circuit board and the wiring pattern of the functional device around the central part of the functional device; and a step for sealing at least a space portion between the printed circuit board and the functional device with a sealing member preventing the sealing member from intruding the space portion.

Further, a fabricating method for fabricating an electronic device of the present invention comprises the steps of: a step for disposing a first surface of a printed circuit board in an opposite relation with a first surface of a functional device while disposing intensively around the central part of the functional device a first bonding member for electrically connecting the wiring pattern of the printed circuit board and the wiring pattern of the functional device and disposing a second bonding member not participating in the electrical connection between the wiring pattern of the printed circuit board and the wiring pattern of the functional device around peripheral region of the functional device; and a step for sealing at least a space portion between the printed circuit board and the functional device member preventing the sealing member from intruding the space portion.

Further, a fabricating method for fabricating an electronic device of the present invention comprises the steps of: a step for disposing a first surface of a printed circuit board in an opposite relation with a first surface of a functional device while laying a conductive connecting member between the second wiring pattern of the printed circuit board and the wiring pattern of the functional device, wherein a first pattern and a second pattern of conductive material have respectively a first thickness and a second thickness which is thicker than that of the first one; and a step for sealing at least a space portion between the printed circuit board and the functional device preventing the sealing member from intruding the space portion.

Further, a fabricating method for fabricating an electronic device of the present invention comprises the steps of: a step for disposing a first surface of a printed circuit board in an opposite relation with a first surface of a functional device while laying a conductive connecting member between a wiring pattern on a second region of the printed circuit board and a wiring pattern of the functional device, wherein the printed circuit board has a first substrate region of a first thickness and a second substrate region of a second thickness which is thicker than the first thickness, and a wiring pattern is formed between the first and second region on the first surface; and a step for sealing at least a space portion between the printed circuit board and the functional device with a sealing member preventing the sealing member from intruding the space portion.

Further, a fabricating method for fabricating an electronic device of the present invention comprises the steps of: a step for disposing a first surface of a printed circuit board in an opposite relation with a first surface of a functional device while laying a conductive connecting member which is consisted of bumps piled up according to the space between a wiring pattern on the first surface of the printed circuit board and a wiring pattern on the first surface of the functional device; and a step for sealing at least a space portion between the printed circuit board and the functional device with a sealing member preventing the sealing member from intruding the space portion.

Further, a fabricating method for fabricating an electronic device of the present invention comprises the steps of: a step for disposing a first surface of a printed circuit board in an opposite relation with a first surface of a functional device while laying between them a conductive connecting member thicker than a sound absorption material, wherein the functional device is a surface acoustic wave device having a sound absorption material on the first surface thereof; and a step for sealing at least a space portion between the printed circuit board and the functional device member preventing the sealing member from intruding the space portion.

Further, a fabricating method for fabricating an electronic device of the present invention comprises the steps of: a step for disposing a first surface of a printed circuit board in an opposite relation with a first surface of a functional device, being an acoustic surface wave device, while laying between them a conductive connecting member; a step for forming a sound absorption material on a second surface of the functional device; and a step for sealing at least a space portion between the printed circuit board and the functional device with a sealing member preventing the sealing member from intruding the space portion.

Further, a fabricating method for fabricating an electronic device of the present invention comprises the steps of: a step for disposing a first surface of a printed circuit board in an opposite relation with a first surface of a functional device, being an acoustic surface wave device, while laying between them a conductive connecting member; a step for forming a sound absorption material on a second surface of the functional device; a step for disposing a metallic foil on the Cf2 second surface of the functional device; and a step for sealing at least a space portion between the printed circuit board and the functional device preventing the sealing member from intruding the space portion.

Further, in a fabricating method for fabricating an electronic device of the present invention, the sealing member is composed of a hot-melt type member, and a step for sealing comprises the steps of; a step for disposing a hot-melt type member above the first surface of the printed circuit board and/or the second surface of the functional device; and a step for sealing a space portion formed between the printed circuit board and the functional device by heating/melting the hot-melt type member preventing the sealing member from intruding the space portion.

Further, in a fabricating method for fabricating an electronic device of the present invention, the sealing member is a thermo-setting member, and a step for sealing comprises the step of: a step for pouring a liquid of the thermo-setting member from above the first surface of the printed circuit board and/or the second surface of the functional device on a predetermined position thereof; and a step for sealing a space portion between the printed circuit board and the functional device preventing the sealing member from intruding the space portion by heating/hardening the poured thermo-setting member.

Further, in a fabricating method for fabricating an electronic device of the present invention, the sealing member is a thermo-setting member, and a step for sealing comprises a step for sealing the space portion between the printed circuit board and the functional device preventing the sealing member from intruding at least the space portion by heating/hardening the liquid thermo-setting member while pouring the same from above the first surface of the printed circuit board and/or the second surface of the functional device on a predetermined position.

A fabricating method for fabricating the electronic device of the present invention can further comprise, prior to a step for disposing in an opposite relation, a step for disposing a frame-shaped member so as to surround the space portion on a first surface of the printed circuit board.

A fabricating method for fabricating the electronic device of the present invention comprises, during a sealing step, a step for forming the sealing member so as to cover all the second surface of the functional device.

A fabricating method for fabricating the electronic device of the present invention comprises, during a sealing step, a step for forming the sealing member while exposing all the second surface of the functional device.

A fabricating method for fabricating the electronic device of the present invention comprises, during a sealing step, a step for forming the sealing member while partially exposing the second surface of the functional device.

Further, a fabricating method for fabricating the electronic device of the present invention comprises, during a sealing step, a step for disposing a first surface of the printed circuit board in an opposite relation with a first surface of the functional device with a conductive connecting member.

Further, in a fabricating method for fabricating the electronic device of the present invention, the functional device is a surface acoustic wave device, and, during the oppositely disposing step, the connecting pattern of the first surface of the printed circuit board can be disposed in an opposite relation with the connecting pattern of the first surface of the surface acoustic wave device based on a face-down bonding method through a conductive connecting member.

Further, in a fabricating method for fabricating the electronic device of the present invention, the functional device is a quartz oscillator or resonator, and, during oppositely disposing step, a connecting pattern of the first surface of the printed circuit board is disposed in an opposite relation with electrode of the first surface of the quartz oscillator or resonator based on the face-down bonding method through a conductive connecting member, the wiring pattern on the first surface of the printed circuit board can be disposed in an opposite relation with the electrode on the first surface of the quartz oscillator or resonator with a conductive connecting member based on the face-down bonding method during the oppositely disposing step, the wiring pattern of the first surface of the printed circuit board and the electrode of the second surface of the quartz oscillator or resonator is electrically connected through an electrically connecting means, then, a surrounding member is disposed on the printed circuit board such that the surrounding member surrounds the quartz oscillator or resonator.

Further, in a fabricating method for fabricating the electronic device of the present invention, the functional device is a piezoelectric oscillator or resonator, and during the oppositely disposing step, the connecting pattern of the first surface of the printed circuit board is disposed in an opposite relation with the electrode of the first surface of the quartz oscillator or resonator with a conductive connecting member based on the face-down bonding method and the connecting pattern on the first surface of the printed circuit board and the electrode on the second surface of the quartz oscillator or resonator is electrically connected with an electrically connecting means.

Further, in a fabricating method for fabricating the electronic device of the present invention, the functional device is a photocoupler having a pair of light-sending part and a light-receiving part, and, during an oppositely disposing step, the connecting pattern of the first surface of the printed circuit board is disposed in an opposite relation with the connecting patterns on the respective first surfaces of the photocoupler based on the face-down bonding method through the conductive connecting member, then a surrounding member is disposed on the printed circuit board so as to surround the photocoupler.

In a fabricating method for fabricating the electronic device of the present invention, the printed circuit board is a light-transmitting substrate, the functional device is an EPROM, and, in an oppositely disposing step, the first surface of the printed circuit board is disposed in an opposite relation with respect to the light-receiving surface of the EPROM.

In a fabricating method for fabricating the electronic device of the present invention, the printed circuit board is a light-transmitting substrate, the functional device is a CCD, and the first surface of the printed circuit board can be disposed in an opposite relation with respect to the light-receiving surface of the CCD in an oppositely disposing step.

In a fabricating method for fabricating the electronic device of the present invention, the printed circuit board is a light-transmitting substrate, the functional device is a semiconductor laser, and the first surface of the printed circuit board is disposed in an opposite relation with the light-emitting surface of the semiconductor laser in an oppositely disposing step.

In a fabricating method for fabricating the electronic device of the present invention, the printed circuit board is a light-transmitting substrate, the functional device is a light-emitting diode, and a first surface of the printed circuit board is disposed in an opposite relation with a light-emitting surface of the light-emitting diode in the oppositely disposing step.

In a fabricating method for fabricating the electronic device of the present invention, the functional device has bump, the bump of the functional device is disposed in an opposite relation with the printed circuit board during an oppositely disposing step, thereafter the printed circuit board is bonded with the functional device under irradiation of an infra-red light on the printed circuit board and/or the bump.

A fabricating method for fabricating the electronic device of the present invention comprises the steps of: a step for aligning a plurality of the functional device to an aggregate of a plurality of printed circuit board at a predetermined position; a step for assembling the functional device and the aggregate of the printed circuit board with a conductive bonding member with a predetermined space; a step for disposing a hot-melt type member on the aggregate of the printed circuit board and the functional device; a step for heating and melting the hot-melt type member preventing the hot-melt type member from intruding the space portion between the printed circuit board and the functional device; and a step for dividing the aggregate of a plurality of the printed circuit board together with the hot-melt type member into a separate electronic devices.

A fabricating method for fabricating the electronic device of the present invention comprises the steps of:
  a step for aligning the functional device to the printed circuit board at a predetermined position; a step for assembling the functional device and the printed circuit board with a conductive connecting member with a predetermined space; a step for disposing a hot-melt type member on the printed circuit board; and a step for heating and melting the hot-melt type member preventing the hot-melt type member from intruding the space portion between the printed circuit board and the functional device, wherein the hot-melt type member is a thin sheet of the hot-melt type resin, and a step for heating and melting includes at least the following stages, (1) a stage for determining the shape of the resin by heating and melting the thin sheet of the resin, (2) a stage for transferring to the gel state maintaining the resin shape, (3) a stage for hardening the resin, and a temperature for the (2) stage is lower than that for (1) and A fabricating method for fabricating the electronic device of the present invention comprises the steps of:

a step for aligning a surface acoustic wave device to the printed circuit board at a predetermined position; a step for assembling the surface acoustic wave device and the printed circuit board through a conductive bonding member with a predetermined space;

a step for disposing a hot-melt type member on the printed circuit board; and a step for heating and melting the hot-melt type member preventing the hot-melt type member from intruding the space portion between the printed circuit board and the acoustic surface wave device, wherein a transducer portion and a plurality of the wiring pattern electrically connected to the transducer portion are formed on a main surface of the wafer composed of a piezoelectric material which serves as the surface acoustic wave device, a multiple connecting member are formed on some part of the wiring pattern, thereafter, when obtaining separate surface acoustic wave devices by cutting, a blade speed of from not less than 10 mm/sec to not more than 50 mm/sec is employed for cutting.

A fabricating method for fabricating the electronic device of the present invention comprises the steps of: a step for aligning a surface acoustic wave device to a printed circuit board at a predetermined position; a step for assembling the surface acoustic wave device and the printed circuit board through a conductive bonding member with a predetermined space; a step for disposing a hot-melt type member on the printed circuit board; and a step for heating and melting the hot-melt type member preventing the hot-melt type member from intruding the space portion between the printed circuit board and the acoustic surface wave device, wherein a transducer portion and a plurality of the wiring pattern electrically connected to the transducer portion are formed on a main surface of a wafer comprised of a piezoelectric material which constitutes the surface acoustic wave device, a plurality of connecting members are formed on some part of the wiring pattern, thereafter, when obtaining each surface acoustic wave device by cutting, a cutting operation is executed with water having an electrical resistivity of from not less than 0.01 M$\Omega$cm to not more than 100 M$\Omega$cm.

A fabricating method for fabricating the electronic device of the present invention comprises the steps of: a step for aligning a functional device to a printed circuit board at a predetermined position; a step for assembling the functional device and the printed circuit board through a conductive bonding member with a predetermined space; a step for disposing a hot-melt type member on the printed circuit board; and a step for heating and melting the hot-melt type member preventing the hot-melt type member from intruding the space portion between the printed circuit board and the functional device, wherein, after the conductive connecting member is formed on the wiring pattern of at least one main surface of the printed circuit board, the functional device and the printed circuit board are assembled through the conductive bonding member with a predetermined space.

According to a functional device of the present invention, in the functional device mounted on the printed circuit board based on the face-down bonding method, a plurality of connecting terminals electrically connected to the printed circuit board are intensively disposed around the central part of one main surface of the functional device.

Further, in a functional device of the present invention, the functional device can be a functional device having a relatively long and narrow shape.

Further, in a functional device of the present invention, the functional device can be an acoustic surface wave device.

A surface acoustic wave device of the present invention is provided with a piezoelectric substrate, a plurality of pairs of comb-shaped electrodes formed on the piezoelectric substrate, and a group of external connecting terminals disposed intensively around the central part of the piezoelectric substrate.

A surface acoustic wave device of the present invention can be provided with a sound absorbing material formed on the piezoelectric substrate in such a manner that the sound absorbing material sandwiches the comb-shaped electrode.

A surface acoustic wave device of the present invention can be provided with an electrode pad not participating in the connection with the outside.

In a surface acoustic wave device of the present invention, the group of the external connecting terminals can be extended to the comb-shaped electrode to form an electrical connection.

An imaging apparatus according to the present invention is provided with an optical system receiving a light image, a printed circuit board having a first surface and a second surface, a CCD device which has a first and a second surface, the first surface thereof being disposed in an opposite relation with the first surface of the printed circuit board, and a hot-melt type member for sealing the space portion between the first surface of the printed circuit board and the first surface of the CCD while preventing the hot-melt type sealing member from intruding the space portion, further provided with the CCD which executes photo-electric conversion of the light image entered into the CCD from the optical system.

In a mobile communication apparatus according to the present invention, as a band-pass filter in a radio-frequency region, a surface acoustic wave device can be used, wherein the surface acoustic wave device is provided with a printed circuit board having a first surface and a second surface, a surface acoustic wave device having a first and second surface, the first surface thereof being disposed in an opposite relation with the first surface of the printed circuit board, and the hot-melt type member for sealing the space portion between a first surface of the printed circuit board and a first surface of the surface acoustic wave device preventing the sealing member from intruding the space portion.

In a mobile communication apparatus according to the present invention, as a band-pass filter in the intermediate-frequency region, a surface acoustic wave device can be used, wherein the surface acoustic wave device is provided with a printed circuit board having a first surface and a second surface, a surface acoustic wave device having a first and second surface, the first surface thereof being disposed in an opposite relation with the first surface of the printed circuit board, and the hot-melt type member for sealing the space portion between the first surface of the printed circuit board and the first surface of the acoustic surface wave device preventing the sealing member from intruding the space portion.

In a mobile communication apparatus according to the present invention, as an oscillator of a frequency modulator, a surface acoustic wave resonator can be used, wherein the acoustic surface wave resonator is provided with a printed circuit board having a first surface and a second surface, an acoustic surface wave device having a first and second surface, the first surface thereof being disposed in an opposite relation with the first surface of the printed circuit board, and the hot-melt type member for sealing a space portion between a first surface of the printed circuit board and a first surface of the acoustic surface wave device preventing the sealing member from intruding the space portion.

In an oscillator circuit according to the present invention, a surface acoustic wave resonator can be used for an oscillator circuit of a radio-frequency modulator, wherein the acoustic surface wave resonator is provided with a printed circuit board having a first surface and a second surface, a surface acoustic wave device having a first and second surface, the first surface thereof being disposed in an opposite relation with the first surface of the printed circuit board, and a hot-melt type member for sealing the space portion between a first surface of the printed circuit board and a first surface of the acoustic surface wave device preventing the sealing member from intruding the space portion.

In an oscillator circuit according to the present invention, a quartz oscillator or resonator device is used in an oscillator circuit of a radio-frequency modulator, wherein the quartz oscillator or resonator device is provided with a printed circuit board having a first surface and a second surface, the quartz oscillator or resonator having a first and second surface, the first surface thereof being disposed in an opposite relation with the first surface of the printed circuit board, a conductive connecting member connecting the connecting pattern on the first surface of the printed circuit board and the electrode on the first surface of the quartz oscillator or resonator based on a face-down bonding method, an electrically connecting means for electrically connecting the wiring pattern of a first surface of the printed circuit board and an electrode on the second surface of the quartz oscillator or resonator, and the hot-melt type member for sealing the space portion between the first surface of the printed circuit board and the first surface of the quartz oscillator or resonator preventing the sealing member from intruding the space portion.

A fabricating method for fabricating the electronic device of the present invention comprises the steps of (a) a step for disposing a first surface of a printed circuit board in an opposite relation with a first surface of a functional device, (b) a step for pouring a liquid thermo-setting member at a predetermined position from a place above the first surface of the printed circuit board and/or the second surface of the functional device, (c) a step for heating/hardening the poured thermo-setting member and sealing the space portion between the printed circuit board and the functional device preventing the sealing member from intruding at least the space portion.

A fabricating method for fabricating the electronic device of the present invention comprises the steps of:
 a step for aligning a functional device to a printed circuit board at a predetermined position; a step for assembling the functional device and the printed circuit board with a conductive connecting member with a specified space; a step for disposing a hot-melt type member on the printed circuit board;
 a step for heating and melting the hot-melt type member preventing the hot-melt type member from intruding a space portion between the printed circuit board and the functional device; and a step for hardening the hot-melt type member following the heating and melting operation, wherein, after the conductive bonding member is formed on a wiring pattern of at least one main surface of the printed circuit board, the functional device and the printed circuit board are assembled with the conductive connecting member with a predetermined space.

Further, a fabricating method for fabricating the electronic device of the present invention comprises the steps of (a) a step for disposing a first surface of a printed circuit board in an opposite relation with a first surface of a functional device, (b) a step for heating/hardening a liquid thermo-setting member while dripping the liquid thermo-setting member to a predetermined position from a place above the first surface of the printed circuit board and/or the second surface of the functional device, and sealing a space portion between the printed circuit board and the functional device preventing at least the sealing member from intruding the space portion.

A fabricating method for fabricating the electronic device of the present invention comprises the steps of (a) a step for disposing a first surface of a printed circuit board in an opposite relation with a first surface of a functional device, (b) a step for disposing a hot-melt type member above a first surface of the printed circuit board and/or a second surface of the functional device, (c) a step for heating/melting the hot-melt type member and sealing the space portion between the printed circuit board and the functional device preventing the sealing member from intruding at least the space portion.

An electronic device of the present invention comprises: a printed circuit board having a first surface and a second surface; a functional device having a first surface and a second surface, the first surface thereof being disposed in an opposite relation with the second surface of the printed circuit board; and a hot-melt type member for sealing a first space portion between the first surface of the printed circuit board and the first surface of the functional device preventing the hot-melt type member from intruding the first space portion and a second space portion between the second surface of the functional device and the hot-melt type member.

A fabricating method for fabricating an electronic device of the present invention comprises steps of (a) a step for disposing a first surface of a printed circuit board in an opposite relation with a first surface of a functional device, (b) a step for coating a thermo-setting type buffering member on a bottom surface of a concave-shaped hot-melt type member, (c) a step for disposing the hot-melt type member above the first surface of the printed circuit board and/or the second surface of the functional device while laying out the thermo-setting type buffering member between them, (d) a step for heating/melting the hot-melt type member and sealing the space portion between the printed circuit board and the functional device preventing the sealing member from intruding the space portion.

In the fabricating method described above, liquid silicone is preferable as the thermo-setting type buffering member.

An electronic device of the present invention comprises:
 a printed circuit board having a first surface and a second surface; a functional device having a first surface and a second surface, the first surface thereof being disposed in an opposite relation with the second surface of the printed circuit board;
 a hot-melt type member for sealing a first space portion between the first surface of the printed circuit board and the first surface of the functional device preventing the hot-melt type member from intruding the first space portion and a second space portion between the second surface of the functional device and the hot-melt type member; and the thermo-setting type buffering member laid out between the second surface of the functional device and the hot-melt type member.

Liquid silicone is preferable as the thermo-setting type buffering member mentioned above.

The hot-melt type member can be provided with an aligning means to the functional device.

For a shape of the hot-melt type member, a shape hanging down along the circumference relative to the functional device can be adopted.

In a fabricating method for fabricating an electronic device of the present invention, the fabricating method comprises the steps of; (a) a step for disposing a first surface of a printed circuit board in an opposite relation with a first surface of a functional device, (b) a step for disposing a buffering member having a first packing density on a second surface of the functional device, (c) a step for disposing a sealing member having a second packing density larger than the first packing density above the first surface of the printed circuit board and/or the second surface of the functional device, (d) a step for sealing with the sealing member a space portion between the printed circuit board and the functional device preventing the sealing member from intruding the space portion.

In a fabricating method for fabricating an electronic device of the present invention, the fabricating method comprises the steps of; (a) a step for disposing a first surface of a printed circuit board in an opposite relation with a first surface of a functional device, (b) a step for stacking buffering members having a first packing density and a second packing density on a second surface of the functional device, (c) a step for disposing a sealing member having a third packing density which is larger than the first and second ones above the first surface of the printed circuit board and/or the second surface of the functional device, (d) and a step for sealing the space portion between the printed circuit board and the functional device with the sealing member preventing the sealing member from intruding the space portion.

An electronic device of the present invention comprises: a printed circuit board having a first surface and a second surface; a functional device having a first surface and a second surface, the first surface thereof being disposed in an opposite relation with the first surface of the printed circuit board; a hot-melt type member for sealing a space portion between the first surface of the printed circuit board and the first surface of the functional device preventing the hot-melt type member from intruding the space portion; and a means for preventing deformation of the functional device relative to the functional device and the hot-melt type member.

For a means for preventing the deformation, a buffering member disposed between the functional device and the hot-melt type member is preferable.

For a means for preventing the deformation, a space portion disposed between the functional device and the hot-melt type member is preferable.

For a means for preventing the deformation, numerous bubbles included in the hot-melt type member is preferable.

According to a fabricating method for fabricating an electronic device of the present invention: a first surface of a printed circuit board is disposed in an opposite relation with respect to a first surface of a functional device with a predetermined space; a hot-melt type member is heated/melted after that member is disposed on the first surface of the printed circuit board and/or the second surface of the functional device; and the hot-melt type member seals a space portion between the printed circuit board and the functional device preventing the sealing member from intruding at least the space portion.

In this case, any melt type member which can be heated/melted with any kind of indirect heating means such as an irradiation of high-frequency wave, electromagnetic wave, ultrasonic wave, light or the like can be used. Here, the heating can be any kind of heating including the indirect heating method such as the high-frequency, the electromagnetic wave, the ultrasonic wave, the light and the like.

According to a fabricating method for fabricating an electronic device of the present invention, since a frame-shaped member used for preventing a resin from intruding the space portion is not necessitated, a conventional step for forming the frame-shaped member can be eliminated, wherein the resin has a definite viscosity and is used for sealing a space portion formed between a functional device and a printed circuit board. Consequently, there is a merit that the electronic device having a simple construction can be easily obtained. Further, by connecting a sheet type resin prepared for a sealing resin through heating/melting and hardening, the resin member can be easily prevented from spreading in, in particular, a surface of the functional device opposing to a space portion. Therefore, without adversely affecting on the functional device, an electronic device, in which a space portion is formed between the functional device and the printed circuit board and is sealed with the sealing resin, can be easily fabricated.

Here, the heating method can be any kind of heating including the indirect heating method such as the high-frequency, the electromagnetic wave, the ultrasonic wave, the light and the like.

For material used for a printed circuit board, ceramic such as alumina, magnesia, silicon carbide and the like, glass coated ceramic, multilayered ceramic substrate such as alumina and the like having built-in conductor or functional device inside, and resin board such as glass epoxy including FR-4 can be cited.

As examples of the functional device, a surface acoustic wave device, a quartz oscillator or resonator, a piezoelectric oscillator or resonator, a photocoupler having at least a pair of light sending part and light receiving part, an EPROM, a CCD, a semiconductor laser or a light-emitting diode can be cited.

According to a fabricating method for fabricating an electronic device of the present invention, a functional device such as a surface acoustic wave device or a semiconductor device can be mounted by a face-down bonding method (a bonding method for directly sticking a chip with an upside-down relation to a package without employing the steps for die-bonding and wire-bonding) (for details of the face-down bonding method, see "Kagaku Daijiten (Chemical Dictionary)", Maruzen K. K., page 1189, Mar. 5, 1985). The face-down bonding method includes, in concrete, flip chip method, beam lead method, TAB method, pedestal method and the like. In the present invention, a hot-melt type member such as a sheet of thermo-setting resin is applied as a sealing member during the sealing step, a surface or the whole of the resin is melted and hardened by heating, thereby a functional device and a printed circuit board are sealed preventing a sealing member from intruding a space portion between a main surface of the functional device opposite to the printed circuit board and the printed circuit board.

A printed circuit board constituting a part of an electronic device of the present invention can be provided with a wiring pattern, depending on the mounting method, on one main surface only or both of one main surface and the other main surface. Further, for example, in the case of a surface acoustic wave device, in order to secure a space portion, a transducer part consisting of a comb-shaped electrode and a wiring pattern electrically connected to the transducer part is required to be formed on one surface.

A functional device and a printed circuit board can be bonded with a conductive bonding member laid down between them, wherein a space of a space portion formed according to the present invention is, though depending on a shape of the bonding member, 10–200 μm, and preferable to be 20–80 μm.

In the present invention, a conductive connecting member is defined as a means for electrically connecting between a semiconductor laser and a printed circuit board and fixing them. Such as a bump or a conductive resin can be used. For the bump, a ball-bump, a plated bump and the like are cited, and for the conductive resin, a conductive paste, an anisotropic conductive resin and the like are included.

In the present invention, the above-described members can be applied singly or in parallel, further can be combined compositely. These are all included in the present invention. That is, as a conductive connecting member of the present invention, such as a bump and a conductive resin can be applied in combination and a ball bump and an anisotropic conductive resin can be applied in combination.

For an electrically connecting member connecting between a wiring pattern on a printed circuit board and a wiring pattern on a functional device, such as a conductive bump, a metal plated conductive resin ball and a metal bump composed of Au, Ag, solder (Sn-based, Pb-based, In-based and the like) and the like can be cited.

These conductive bumps, by connecting a printed circuit board and a functional device under a condition of a definite temperature and pressure, connect electrically a wiring pattern on the printed circuit board and a wiring pattern on the functional device, and form and secure a space portion between the printed circuit board and the functional device. In order to secure a predetermined space portion, a bump made of such as Au, Ag, solder or the like are preferable as a conductive bump.

In a fabricating method for fabricating an electronic device of the present invention, by covering/hardening a composite, which is obtained by connecting a functional device and a printed circuit board, with a thermo-setting resin, the electronic device mounted on the printed circuit board is fabricated. In this case, when a preformed sheet of an epoxy type resin is used as the thermo-setting resin and is heated, a part of a surface or the whole of the resin can be melted and hardened to connect a functional device and a printed circuit board. Since the viscosity of the resin can be kept high during hardening, the resin can be prevented from spreading into a space portion formed on a surface of the functional device opposite to the printed circuit board. Further, because the resin is not a liquid type, an insulating frame-shaped wall or dam is not necessarily needed. However, because the sealing effect can be improved further by applying a frame-shaped insulating wall, the frame-shaped insulation wall or dam is included in the present invention.

A liquid type thermo-setting resin used for a conventional sealing resin member, such as an epoxy-based resin for potting use, has such a low viscosity as 15 Pa·s, the viscosity does not rise high and remains low even after raising the temperature to 100–200° C., therefore a sealing member can not be prevented from spreading in a space portion between a printed circuit board and a functional device without a frame-shaped insulating member.

Nevertheless, according to a fabricating method for fabricating an electronic device of the present invention, until the melting of such as a preformed sheet of an epoxy based resin begins by heating, a higher viscosity state can be kept and a hardening step can be controlled even after the melting, and the viscosity of at least not less than 50 Pa·s is attained. Therefore, an enveloping operation for enveloping a functional device is easily done.

A sheet of a resin can be easily obtained by cold pressing powder of raw material such as an epoxy resin into a required shape and a weight. A hot-melt type member such as a sheet of a resin and the like is disposed on the other main surface than a main surface on which a space portion of a functional device is formed, for example, in the case of a functional device being a surface acoustic wave device, not on a main surface on which a wiring pattern of a surface acoustic wave device is formed but on the other surface.

A shape of a sheet of a resin in this case is preferred to be larger than that of a functional device and nearly equal or a little bit smaller than that of a printed circuit board. The more preferable shape of the sheet shaped resin is larger than that of the functional device and nearly equal to that of the printed circuit board.

By implementing like this, alignment of a sheet of a resin to a functional device and a printed circuit board can be executed firmly.

Further, when a shape of a functional device is 2 mm×2 mm in dimension, if a dimension of a printed circuit board is 4 mm×4 mm, a dimension of 4 mm×4 mm dimension is applied for a sheet of a resin.

The choice of a dimension of a functional device can be suitably done depending on a volume of the functional device and a thickness of a sheet of a resin.

By heating/melting and hardening a hot-melt type member of a sheet of a resin or the like which is disposed on a reverse side of a surface of a functional device facing a space portion, the hot-melt type member is intimately contacted and integrated with at least another main surface of the functional device to envelop the device, thereby seals a surface acoustic wave device with a printed circuit board.

Though a condition for heating/melting and hardening are required to be suitably controlled, in the present invention, the temperature for heating/melting a hot-melt type member of a sheet of a resin is 100–200° C., and the hardening time is 20–2 hrs. More preferably, after the heating/melting step is executed in the temperature range of 110–170° C., the hardening step is done in the temperature range of 100–160° C. and in the holding time range of 3–20 hrs.

For fabricating an electronic device of the present invention, a sheet of a buffering member having a smaller size than that of a hot-melt type member is adhered on one main surface of the hot-melt type member. A buffering sheet side of the hot-melt type member is disposed in an opposite relation with another main surface of the functional device having one main surface on which a wiring pattern is formed. At least the other main surface of the functional device and the buffering sheet are intimately contacted to envelop the device as well as to seal the device with the printed circuit board. For the sheet of the buffering member, for example, such material as an elastic rubber sheet rich in elasticity can be cited. Instead, a sheet of metal foil or a two sheet of waxed paper can be laminated to be disposed. Here, a shape of each sheet can be smaller than that of a sheet of a resin member and not necessarily required to be equal in shape with that of the resin member, and the shape also can be arbitrary. With these structures, a strain caused by a contraction or a difference of the thermal expansions during hardening of the resin member can be alleviated. Further, because alignment of a buffering sheet between the resin member used for sealing and a surface acoustic wave device can be easily executed, an improvement of the productivity and reliability can be attained.

When an electronic device is fabricated according to the present invention, between a hem part along a circumference of a resin portion and that along a circumference of a printed circuit board, a wiring pattern from one main surface of a printed circuit board is partly exposed in such a manner that the resin portion does not wholly cover the wiring pattern, and the wiring pattern can be connected with a concave formed wiring pattern along a side surface of the printed circuit board.

Therefore, when an electronic device is mounted by surface-mounting method on a surface of a circuit board together with other passive devices, the connecting operation between connecting parts on the circuit board and a concave shaped wiring pattern on a side surface of a printed circuit board can be easily executed with a solder and the like.

According to a fabricating method of the present invention, a height of a wiring pattern connected to a conductive connecting member for connecting between a printed circuit board and a functional device can be controlled by partly adjusting a thickness of a printed circuit board material or a thickness of a conductor material of a wiring pattern, or by adjusting a height itself of an electrically connecting member. Thus, since a proper space portion can be secured between a printed circuit board and a functional device, even a functional device is such as a surface acoustic wave device disposed with a surface acoustic wave absorption member, a bonding strength between a surface acoustic wave device and a printed circuit board can be kept enough high, so the reliability of the bonding can be improved.

In a fabricating method of an electronic device such as a surface acoustic wave device of the present invention, when a wiring pattern of a printed circuit board is formed, a repeated coating of a conductive paste by screen printing method is executed at least on a part of a wiring pattern, thereafter burning or cofiring is followed.

Here, a thickness of a repeatedly coated and fired part is preferable to be thicker by in the range of 5–100 $\mu$m than that of the other part.

Further, in a fabricating method of an electronic device of the present invention, when a wiring pattern of a printed circuit board is formed, at least a part of the wiring pattern can be made thicker than that of the other part of the wiring pattern using a film forming method such as a vapor depositing method or a sputtering method.

A difference between the above-described thicknesses is preferable to be not less than 0.5 $\mu$m.

Further, in a fabricating method of an electronic device of the present invention, when a printed circuit board is formed, a green sheet corresponding to a portion opposite to a connecting member, which serves as an electrical connecting member, and a neighboring area can be added and can be followed by firing. Thereby the wiring pattern is formed on the printed circuit board.

A difference of the thicknesses between that of a fired part with an added green sheet and that of the other part is preferable to be essentially in the range of 5–500 $\mu$m.

By adopting a fabricating method for fabricating a printed circuit board described above, even if a thickness of a connecting member is small, since a thickness of the printed circuit board material belonging to a wiring pattern portion or a thickness of a conductive material can be added to that of the connecting member, an appropriate volume of a space portion can be effectively secured between a functional device and a printed circuit board. In particular, even in the case of a surface acoustic wave device having a surface acoustic wave absorption member disposed on it, a sufficient bonding strength can be kept between a surface acoustic wave device and a printed circuit board. Thus, the bonding strength can be improved and consequently the reliability too.

Further, in an electronic device of the present invention, in order to secure an appropriate volume of a space portion, a plurality of the conductive bump can be piled up on nearly same place as a conductive connecting member for electrically connecting use. Here, an added thickness of a plurality of the conductive bumps is preferable to be in the range of 30–150 $\mu$m. Instead, when the conductive ball bumps are applied as the conductive connecting member for electrically connecting, a thickness of the conductive ball bump is adjusted by varying a width of a conductive thin wire. Here, a ball bump essentially consisting of Au, a ball bump essentially consisting of Sn, a ball bump essentially consisting of Pb or the like is preferable as a conductive bump. Or, further, when a functional material is coated at least on one main surface or on a part of the other main surface of a functional device, in concrete, when a surface acoustic wave absorption member is coated at least on one main surface or on a part of the other main surface of the surface acoustic wave device, a functional material, that is, a surface acoustic wave absorption material can be coated thinner than a thickness of a conductive connecting member.

Thus, by controlling a thickness of a conductive connecting member which serves as an electrically connecting part, an appropriate volume of a space portion can be effectively secured between a functional device and a printed circuit board. Here, since there is no need to partly change a thickness of a board material of a printed circuit board or a thickness of a conductive material, a fabrication of an electronic device is executed more easily.

In a fabricating method of an electronic device of the present invention, prior to (a) step, a step is provided so as to bond temporarily between a printed circuit board and a functional device.

By temporarily bonding, alignment between a printed circuit board and a functional device can be finely regulated, therefore, a printed circuit board and a functional device is precisely disposed in an opposite relation.

In a fabricating method for fabricating an electronic device of the present invention, preceding (a) step, a step for disposing a frame-shaped member on a first surface of a printed circuit board can be added so as to surround a space portion.

In a fabricating method for fabricating an electronic device of the present invention, a step for disposing a frame shaped member for preventing a sealing resin from intruding a space portion between a functional device and a printed circuit board is not necessarily needed for sealing a space portion between the printed circuit board and the functional device preventing the sealing member from intruding the space portion. However, by disposing a frame-shaped member so as to surround a space portion, the execution for preventing a sealing resin which has a definite viscosity from spreading into the space portion between the functional device and the printed circuit board is made sure. The frame-shaped member in the present invention can be any one of conventional frame-shaped member.

Further, in a fabricating method for fabricating an electronic device of the present invention, the step (c) can be executed so as to wholly envelop the second surface of a functional device by heating/melting a hot-melt type member. Still further, the step (c) can be executed so as to wholly expose the second surface of the functional device by heating/melting the hot-melt type member. Further, the step (c) can be executed so as to partly expose the second surface of the functional device by heating/melting the hot-melt type member.

When a second surface of the functional device is wholly enveloped by heating/melting the hot-melt type member in the step (c), the second surface of the functional device can be completely protected. Further, when the second surface of the functional device is either wholly or partly exposed by heating/melting the hot-melt type member in the step (c), since the second surface of the functional device is exposed, by implementing a further wiring pattern, the electronic devices themselves can be stacked or an electronic device and other one can be connected through this wiring pattern.

Further, in a fabricating method for fabricating an electronic device of the present invention, in step (a), the first surface of the printed circuit board and the first surface of the functional device can be disposed in an opposite relation with a conductive connecting member. By disposing the first surface of the printed circuit board in an opposite relation with the first surface of the functional device, the first surface of the printed circuit board and the first surface of the functional device can be disposed speedily and firmly.

Here, a connecting member is defined as a means for electrically connecting between a device (functional device) and a printed circuit board and further fixing them. For example, a so-called bump, or a conductive resin can be used. For examples of the bump, there are a ball bump and a plated bump. For examples of the conductive resin, there are a conductive paste and an anisotropic conductive resin.

In the present invention, the above-described member can be applied singly or in parallel. These are all included in the present invention. That is, for a conductive connecting member electrically connecting a wiring pattern on a printed circuit board and a wiring pattern on a surface acoustic wave device such as a conductive bump, there are a conductive metal plated resin ball or metal bumps composed of Au, Ag, solder (Sn-based, Pb-based, In-based and the like) and the like.

These conductive bumps, by connecting a printed circuit board and a surface acoustic wave device under a predetermined temperature and pressure, connect electrically a wiring pattern on a printed circuit board and a wiring pattern on a surface acoustic wave device, and further form and secure a space portion between a printed circuit board and a surface acoustic wave device. In order to secure a definite space portion, a metal bump made of such as Au, Ag, solder or the like is particularly preferable as a conductive bump.

Further, in order to secure an appropriate volume of a space portion, a plurality of a conductive bump piled up on nearly same place can be used in place of the conductive bonding member for electrically connecting use. Here, an added thickness of the plurality of the conductive bump is preferable to be in the range of 30–150 $\mu$m. Instead, when a conductive ball bump is applied as a conductive bonding member for electrically connecting use, a thickness of the conductive ball bump is controlled by varying a width of a conductive thin wire. Here, a ball bump essentially consisting of Au, a ball bump essentially consisting of Sn, a ball bump essentially consisting of Pb or the like is preferable as a conductive bump.

Further, in a fabricating method for fabricating an electronic device of the present invention, a surface acoustic wave device is used as a functional device. In this case, in step (a), a connecting pattern of a first surface of a printed circuit board and a connecting pattern of a first surface of a functional device can be disposed in an opposite relation through a conductive connecting member based on the face-down bonding method.

When a surface acoustic wave device is mounted based on the face-down method in the present invention, if such as a sheet of a resin is used as a hot-melt type member for sealing use, a surface acoustic wave device and a printed circuit board can be sealed while preventing a sealing member from intruding a space portion formed between a transducer formed on a surface acoustic wave device and a printed circuit board by melting and hardening a surface or whole of the resin.

According to the present invention, since a frame-shaped member, which is used for preventing a resin for sealing a space portion formed between a functional device and a printed circuit board from intruding the space portion, is not necessarily required, a structure of a surface acoustic wave device can be made simple. Further, when a connection is obtained by heating/melting and hardening a hot-melt type member for sealing use such as a sheet of a resin, the resin can be easily prevented from spreading into, in particular, a surface portion of a transducer of a surface acoustic wave device. Thus, a surface acoustic wave device, which has a space portion between a surface acoustic wave device and a printed circuit board and is sealed with a sealing resin, can be easily fabricated without adversely affecting on a surface wave propagating path of the surface acoustic wave device.

According to the present invention, a sealing resin having a definite viscosity can prevent a sealing member from intruding a space portion between, for example, a main surface of a transducer side of a surface acoustic wave device and a printed circuit board without implementing a frame-shaped member. Thus, a surface acoustic wave device having a simple structure is easily obtained. Since an electronic device of the present invention does not require to use a frame-shaped member or a surrounding member, a miniaturization of an electronic device can be attained. Consequently, an electronic device suitable for a high density mounting can be provided. Further, according to a fabricating method for fabricating an electronic device of the present invention, a functional device can be mounted on a printed circuit board without implementing a frame-shaped member or a surrounding member, and a miniaturized electronic device than a conventional one can be fabricated. Further, an electronic device suitable for a high density mounting can be fabricated.

In the present invention, a sheet of a thermo-setting member, for example, can be used for sealing purpose. By heating it, the surface or the whole part of the resin is melted and hardened, thereby a surface acoustic wave device and a printed circuit board can be sealed preventing the sealing member from intruding a space portion between a transducer portion formed on a surface acoustic wave device and the printed circuit board.

By disposing a first surface of a printed circuit board in an opposite relation with a main surface of a transducer side of a surface acoustic wave device, the first surface of the printed circuit board and the main surface on the transducer side of the surface acoustic wave device can be speedily and firmly disposed.

A space of a space portion formed according to the present invention is, though depending on a shape of a conductive connecting member, 10–200 µm, and preferable to secure 20–80 µm.

Further, when a bump is constituted by partly raising a thickness of a wiring pattern on a printed circuit board or a wiring pattern on a surface acoustic wave device, a direct bonding between a wiring pattern on a printed circuit board and a wiring pattern on a surface acoustic wave device can be obtained.

Still further, in the present invention, a ring-shaped insulating wall can be disposed inside and/or outside a connecting member along a locus formed of a plurality of the connecting member.

These ring-shaped insulating walls can play a roll for firmly securing a space portion between a surface acoustic wave device and a printed circuit board.

Further, in the present invention, by forming precedently a connecting member used for electrically connecting purpose on a wiring pattern of a printed circuit board, a bonding strength can be improved, consequently the reliability of the bonding is also improved.

Further, in a fabricating method for fabricating an electronic device of the present invention, a quartz oscillator or resonator can be used as the functional device. Then, in the step (a), the wiring pattern on the first surface of the printed circuit board is disposed in an opposite relation with the electrode on the first surface of the quartz oscillator or resonator with a conductive connecting member based on the face-down bonding method and the wiring pattern on the first surface of the printed circuit board is electrically connected to the electrode on the second surface of the quartz oscillator or resonator with a bonding wire. Between the step (a) and (b), a surrounding member is disposed on the printed circuit board so as to surround the quartz oscillator or resonator, and in step (b), a hot-melt type member is disposed at least on the surrounding member.

In the present invention, when a quartz oscillator or resonator is mounted based on the face-down bonding method, a surrounding member is disposed along a circumference of the quartz oscillator or resonator in order to secure oscillation of the quartz oscillator or resonator, wherein a sheet of a resin member, for example, can be used as a hot-melt type sealing member to be disposed on the surrounding member, and, through melting a surface or the whole of the resin by heating and hardening, the sealing operation is executed to secure the oscillation of the quartz oscillator or resonator while preventing the sealing member from intruding a space portion between a quartz oscillator or resonator and a printed circuit board.

Further, since a surrounding member is disposed along a circumference of a quartz oscillator or resonator, without enclosing a bonding wire in a hot-melt type member, a wiring pattern on a first surface of a printed circuit board and an electrode formed on a surface other than a surface opposite to a space portion of the quartz oscillator or resonator are electrically connected with an electrically connecting means such as a bonding wire.

According to the present invention, since a frame-shaped member is not necessarily required for preventing a hot-melt type member from intruding a space portion between a quartz oscillator or resonator and a printed circuit board, a structure can be made simple. Further, by using a preformed sheet of a resin, for example, as the hot-melt type member and bonding by heating/melting/hardening, a resin sealing free from an adverse effect on oscillation of the quartz oscillator or resonator is obtained preventing the hot-melt type member from intruding a space portion between the quartz oscillator or resonator and the printed circuit board.

In the present invention, such as a sheet of a thermosetting resin member can be used as a sealing member during a sealing step, and, through melting of a surface or the whole of the resin and hardening by heating, a quartz oscillator or resonator and a printed circuit board can be sealed preventing the sealing member from intruding a space portion between the quartz oscillator or resonator and the printed circuit board.

By disposing a first surface of a printed circuit board in an opposite relation with a first surface of a quartz oscillator or resonator, the first surface of the printed circuit board and the first surface of the quartz oscillator or resonator can be speedily and firmly disposed.

A space of the space portion formed according to the present invention is, depending on a shape of a conductive bonding member, 10–200 µm, and preferable to be 20–80 µm.

Further, when a conductive connecting member is constituted as a bump by partly raising a thickness of a wiring pattern on a printed circuit board or that of an electrode on a first surface of a quartz oscillator or resonator, a direct connection between the wiring pattern on the printed circuit board and the electrode on the first surface of the quartz oscillator or resonator can be obtained.

Still further, in the present invention, a ring-shaped insulating wall can be disposed inside and/or outside the connecting members along a locus formed of a plurality of a connecting member.

These ring-shaped insulating walls can play a roll for firmly securing a space portion between a quartz oscillator or resonator and a printed circuit board.

Further, in the present invention, by forming precedently a connecting member used for electrically connecting purpose on a wiring pattern of a printed circuit board, bonding strength can be improved, consequently the reliability of connection is also improved.

Further, in a fabricating method for fabricating an electronic device of the present invention, a piezoelectric oscillator or resonator can be used as the functional device. Then, in the step (a), the wiring pattern on the first surface of the printed circuit board is electrically connected to the electrode on the second surface of the piezoelectric oscillator or resonator with a bonding wire and the wiring pattern on the first surface of the printed circuit board is disposed in an opposite relation with the electrode on the first surface of the piezoelectric oscillator or resonator through a conductive connecting member based on the face-down bonding method.

In the present invention, when a piezoelectric oscillator or resonator is mounted based on the face-down method, a sheet of a resin member, for example, can be used as a hot-melt type sealing member to be disposed on the piezoelectric oscillator or resonator, and, through melting and hardening the surface or the whole of the resin by heating, the sealing operation is executed preventing the sealing member from intruding a space portion between the piezoelectric oscillator or resonator and the printed circuit board. Further, when disposing a hot-melt type member to be used for sealing on the piezoelectric oscillator or resonator, a buffering member can be disposed between the piezoelectric oscillator or resonator and the hot-melt type member. Since thereby the direct contact between the piezoelectric oscillator or resonator and the hot-melt type member can be avoided, the piezoelectric oscillator or resonator exhibits its function. It is preferable the buffering member has a larger surface area than that of the second surface of the piezoelectric oscillator or resonator.

Further, a wiring pattern on a first surface of a printed circuit board and an electrode formed on a surface other than that opposite to a space portion of the piezoelectric oscillator or resonator can be electrically connected with a bonding wire while enclosing the bonding wire in a hot-melt type member.

According to the present invention, since a frame-shaped member is not necessarily required for preventing a hot-melt type member for sealing purpose from intruding a space portion between a piezoelectric oscillator or resonator and a printed circuit board, a structure can be made simple. Further, when such as a preformed sheet of a resin is used as a hot-melt type member, connection can be attained through heating/melting/hardening the hot-melt type member. Thus, the hot-melt type member can be easily prevented from intruding a space portion between the piezoelectric oscillator or resonator and the printed circuit board, and the sealing operation can be implemented without affecting adversely on an oscillation of the piezoelectric oscillator or resonator.

In the present invention, a sheet of a resin member, for example, can be used as a hot-melt type sealing member during sealing step, and, through melting and hardening of a surface or the whole of the resin by heating, the sealing member can be prevented from intruding a space portion between the piezoelectric oscillator or resonator and the printed circuit board.

By disposing a first surface of a printed circuit board in an opposite relation with a first surface of a piezoelectric oscillator or resonator, the first surface of the printed circuit board and the first surface of the piezoelectric oscillator or resonator can be speedily and firmly disposed.

A space of a space portion formed according to the present invention is, depending on a shape of a conductive connecting member, 10–200 $\mu$m, and preferable to be 20–80 $\mu$m.

Further, when a conductive connecting member is constituted as a bump by partly raising a thickness of a wiring pattern on a printed circuit board or an electrode on a first surface of a piezoelectric oscillator or resonator, direct bonding between the wiring pattern on the printed circuit board and the electrode on the first surface of the piezoelectric oscillator or resonator can be obtained.

Still further, in the present invention, a ring-shaped insulating wall can be disposed inside and/or outside the connecting members along a locus formed of a plurality of the connecting member.

These ring-shaped insulating walls can play a roll for firmly securing a space portion between a piezoelectric oscillator or resonator and a printed circuit board.

Further, in the present invention, by forming precedently a connecting member used for electrically connecting purpose on a wiring pattern of a printed circuit board, the bonding strength can be improved, consequently the reliability of the bonding is also improved.

Further, in a fabricating method for fabricating an electronic device of the present invention, a photocoupler having a pair of light sending part and light receiving part can be used as the functional device. Then, in the step (a), the wiring pattern on the first surface of the printed circuit board is disposed in an opposite relation with the wiring pattern on the respective first surfaces of the photocoupler with a conductive connecting member based on the face-down bonding method. Between the step (a) and (b), a surrounding member is disposed on the printed circuit board so as to surround the photocoupler, and in step (b), the hot-melt type member is disposed at least on the surrounding member.

In the present invention, when a photocoupler is mounted based on the face-down bonding method, a surrounding member is disposed along a circumference of the photocoupler in order to secure a light path for the photocoupler and a sheet of a resin member, for example, can be used as a hot-melt type sealing member to be disposed on the surrounding member. Through melting and hardening of a surface or the whole of the resin by heating, the photocoupler and the printed circuit board can be sealed while securing the light path for the photocoupler as well as maintaining a space portion between the photocoupler and the printed circuit board.

According to the present invention, since a frame-shaped member is not necessarily required for preventing a hot-melt type member from intruding a space portion between a photocoupler and a printed circuit board, a structure can be made simple. Further, by using a preformed sheet of a resin, for example, as the hot-melt type member and by connecting through heating/melting/hardening, the photocoupler and the printed circuit board can be sealed easily preventing from intruding into the space portion between the photocoupler and the printed circuit board. Thus, without affecting adversely on the light path of the photocoupler, sealing with the resin can be executed.

According to the present invention, since a frame-shaped member is not necessarily required for preventing a hot-melt type member from intruding a space portion between a photocoupler and a printed circuit board, there is a merit that an electronic device having a simple structure can be obtained.

In the present invention, such as a sheet of a thermosetting resin member can be used as a sealing member during the sealing step, and, through melting and hardening of a surface or the whole of the resin by heating, a photocoupler and a printed circuit board can be sealed securing a space portion between the photocoupler and the printed circuit board.

By disposing a first surface of a printed circuit board in an opposite relation with the respective first surfaces of a photocoupler, the first surface of the printed circuit board and the first surface of the photocoupler can be speedily and firmly disposed.

A spacing of a space portion formed according to the present invention is, depending on a shape of a conductive connecting member, 10–200 $\mu$m, and preferable to be 20–80 $\mu$m.

Further, when a conductive connecting member is constituted as a bump by partly raising a thickness of a wiring pattern on a printed circuit board or an electrode on the respective first surfaces of a photocoupler, a direct connection between the wiring pattern on the printed circuit board and the electrodes on the respective first surfaces of the photocoupler can be attained.

Still further, in the present invention, a ring-shaped insulating wall can be disposed inside and/or outside the connecting members along a locus formed of a plurality of the connecting member.

These ring-shaped insulating walls can play a roll for firmly securing a space portion between a photocoupler and a printed circuit board.

Further, in the present invention, by forming precedently a connecting member used for electrically connecting purpose on a wiring pattern of a printed circuit board, the bonding strength can be improved, consequently the reliability of the bonding is also improved.

Further, in a fabricating method for fabricating an electronic device of the present invention, the printed circuit board can be a light transmitting substrate, and the functional device can be an EPROM, and, in step (a), the first surface of the printed circuit board and the light receiving surface of the EPROM can be disposed in an opposite position.

For a printed circuit board, in order to enable to irradiate at least the EPROM by an ultra-violet light, a substrate which transmits an ultra-violet light can be used. For example, glass substrate can be cited.

In the present invention, when an EPROM is mounted based on the face-down bonding method, such as a sheet of a resin member can be used as a hot-melt type sealing member, and, through melting and hardening of a surface or the whole of the resin by heating, the EPROM and the printed circuit board can be sealed maintaining a space portion between the EPROM and the printed circuit board.

According to the present invention, since a frame-shaped member is not necessarily required for preventing a hot-melt type member from intruding a space portion between an EPROM and a printed circuit board, the EPROM can be mounted with a simple structure. Further, by using a preformed sheet of a resin, for example, as a hot-melt type member and by connecting through heating/melting/hardening, the resin can be easily prevented from spreading into, particularly, a light receiving portion of the EPROM. Thus, without adversely affecting on regulation of the light of an EPROM, an EPROM which has a space portion between the EPROM and the printed circuit board and is sealed with a resin can be easily manufactured.

In the present invention, such as a sheet of a thermo-setting resin can be used as a sealing member during the sealing step, and, through melting and hardening a surface or the whole of the resin by heating, an EPROM and a printed circuit board can be sealed securing a space portion between a light receiving portion formed on the EPROM and the printed circuit board.

By disposing a first surface of a printed circuit board in an opposite relation with a main surface of a light receiving side of an EPROM, the first surface of the printed circuit board and the main surface of the light receiving side of the EPROM can be speedily and securely disposed.

A spacing of a space portion formed according to the present invention is, depending on a shape of a conductive connecting member, 10–200 $\mu$m, and preferable to be 20–80 $\mu$m.

Further, when a conductive connecting member is constituted as a bump by partly raising a thickness of a wiring pattern on a printed circuit board or a wiring pattern on an EPROM, a direct connection between the wiring pattern on the printed circuit board and the wiring pattern on the EPROM can be attained.

Still further, in the present invention, a ring-shaped insulating wall can be disposed inside and/or outside the connecting members along a locus formed of a plurality of the connecting member.

These ring-shaped insulating walls can play a roll for firmly securing a space portion between an EPROM and a printed circuit board.

Further, in the present invention, by forming precedently a connecting member used for electrically connecting purpose on a wiring pattern of a printed circuit board, the bonding strength can be improved, consequently the reliability of the bonding is also improved.

Further, in a fabricating method for fabricating an electronic device of the present invention, the printed circuit board can be a light transmitting substrate, the functional device can be a CCD, and, in step (a), the first surface of the printed circuit board and the light receiving surface of the CCD can be disposed in an opposite relation.

For a printed circuit board, a substrate having an optically flat surface can be used, that is, in order to enable to irradiate at least a light receiving surface of a CCD with an ultra-violet light, a substrate capable of transmitting an ultra-violet light can be used. Such as a glass substrate can be cited.

In the present invention, when a CCD is mounted based on the face-down bonding method, a sheet of a resin, for example, can be used as a hot-melt type member, and, through melting and hardening of a surface or the whole of the resin by heating, the CCD and the printed circuit board can be sealed maintaining a space portion between a light receiving portion of the CCD and the printed circuit board.

According to the present invention, since a frame-shaped member is not necessarily required for preventing a hot-melt type member from intruding a space portion between a CCD and a printed circuit board, the CCD can be assembled with a simple structure. Further, by using a preformed sheet of a resin, for example, as a hot-melt type member and, by connecting through heating/melting and hardening, the resin can be easily prevented from spreading into, in particular, a light receiving portion of the CCD. Thus, without adversely affecting on regulation of the CCD, a CCD which has a space portion between the CCD and the printed circuit board and is sealed with the resin can be easily manufactured.

In the present invention, a sheet of a thermo-setting resin, for example, can be used as a sealing member during the sealing step, and, through melting and hardening a surface or the whole of the resin by heating, a CCD and a printed circuit board can be sealed maintaining a space portion between a light receiving portion formed on the CCD and the printed circuit board.

By disposing a first surface of a printed circuit board in an opposite relation with a main surface of a light receiving side of a CCD, the first surface of the printed circuit board and the main surface of the light receiving side of the CCD can be speedily and securely disposed.

A spacing of a space portion formed according to the present invention is, depending on a shape of a conductive connecting member, 10–200 $\mu$m, and preferable to be 20–80 $\mu$m.

Further, when a conductive connecting member is constituted as a bump by partly raising a thickness of a wiring pattern on a printed circuit board or a wiring pattern on a CCD, a direct connection between the wiring pattern on the printed circuit board and the wiring pattern on the CCD can be attained.

Still further, in the present invention, a ring-shaped insulating wall can be disposed inside and/or outside the connecting members along a locus formed of a plurality of the connecting member.

These ring-shaped insulating walls can play a roll for firmly securing a space portion between a CCD and a printed circuit board.

Further, in the present invention, by forming precedently a connecting member used for electrically connecting purpose on a wiring pattern of a printed circuit board, the bonding strength can be improved, consequently the reliability of the bonding is also improved.

Further, in a fabricating method for fabricating an electronic device of the present invention, the printed circuit board can be a light transmitting substrate, the functional device can be a semiconductor laser, and, in step (a), the first surface of the printed circuit board can be disposed in an opposite relation with a light emitting surface of the semiconductor laser.

For a printed circuit board, in order to enable for a laser beam emitted from an emitting surface of a semiconductor laser to transmit at least a substrate and to output from the other side, a light transmitting substrate can be used. For example, a glass substrate can be cited.

In the present invention, when a semiconductor laser is mounted based on the face-down bonding method, a sheet of a resin, for example, can be used as a hot-melt type sealing member, and, by melting and hardening a surface or the whole of the resin by heating, the semiconductor laser and a printed circuit board can be sealed securing a space portion between an light-emitting surface of the semiconductor laser and the printed circuit board.

According to the present invention, since a frame-shaped member is not necessarily required for preventing a hot-melt type member from intruding a space portion between a semiconductor laser and a printed circuit board, an semiconductor laser can be assembled with a simple structure. Further, by using a preformed sheet of a resin, for example, as the hot-melt type member for sealing use and, by connecting through heating/melting and hardening, the resin can be easily prevented from spreading into a light-emitting surface of the semiconductor laser. Thus, without adversely affecting on an output of the semiconductor laser, a semiconductor laser can be assembled with resin sealing while securing a space portion between the semiconductor laser and the printed circuit board.

In the present invention, such as a sheet of a thermo-setting resin can be used as a sealing member during the sealing step, and, through melting and hardening a surface or the whole of the resin by heating, a semiconductor laser and a printed circuit board can be sealed securing a space portion between a light emitting portion of the semiconductor laser and the printed circuit board.

By disposing a first surface of a printed circuit board in an opposite relation with a main surface of a light emitting side of a semiconductor laser, the first surface of the printed circuit board and the main surface of the light emitting side of the semiconductor laser can be speedily and firmly disposed.

A spacing of a space portion formed according to the present invention is, depending on a shape of a conductive connecting member, 10–200 μm and preferable to be 20–80 μm.

Further, when a conductive connecting member is constituted as a bump by partly raising a thickness of a wiring pattern on a printed circuit board or a wiring pattern on a semiconductor laser, a direct connection between the wiring pattern on the printed circuit board and the wiring pattern on the semiconductor laser can be attained.

Still further, in the present invention, a ring-shaped insulating wall can be disposed inside and/or outside the connecting member along the locus formed of a plurality of the connecting member.

These ring-shaped insulating walls can play a roll for firmly securing a space portion between a semiconductor laser and a printed circuit board.

Further, in the present invention, by forming precedently a connecting member used for electrically connecting purpose on a wiring pattern of a printed circuit board, the bonding strength can be improved, consequently the reliability of the bonding is also improved.

Further, in a fabricating method for fabricating an electronic device of the present invention, the printed circuit board can be a light transmitting substrate, the functional device can be a light-emitting diode, and, in step (a), the first surface of the printed circuit board can be disposed in an opposite relation with the light emitting surface of the light-emitting diode.

For a printed circuit board, in order to enable for a light beam from a light-emitting surface of a light-emitting diode to transmit at least a substrate and to output from the other side, a light transmitting substrate can be used. For example, a glass substrate can be cited.

In the present invention, when a light-emitting diode is mounted based on the face-down bonding method, a sheet of a resin, for example, can be used as a hot-melt type member, and, through melting and hardening of a surface or the whole of the resin by heating, the light-emitting diode and the printed circuit board can be sealed securing a space portion between the light-emitting surface of the light-emitting diode and the printed circuit board.

According to the present invention, since a frame-shaped member is not necessarily required for preventing a hot-melt type member from intruding a space portion between a light-emitting diode and a printed circuit board, a light-emitting diode can be assembled with a simple structure. Further, by using a preformed sheet of a resin, for example, as the hot-melt type member and, by connecting through heating/melting and hardening, the resin is easily prevented from intruding a light emitting surface of the light-emitting diode. Thus, without adversely affecting on outputting of an emitted light from the light-emitting diode, a light-emitting diode can be sealed with the resin while securing a space portion between the light-emitting diode and the printed circuit board.

In the present invention, a sheet of a thermo-setting resin, for example, can be used as a sealing member, and, through melting and hardening of a surface or the whole of the resin by heating, a light-emitting portion of a light-emitting diode and a printed circuit board can be sealed securing a space portion between the light-emitting portion of the light-emitting diode and the printed circuit board.

By disposing a first surface of a printed circuit board in an opposite relation with a main surface of a light emitting side of a light-emitting diode, the first surface of the printed circuit board and the main surface of the light emitting side of the light-emitting diode can be speedily and securely disposed.

A spacing of a space portion formed according to the present invention is, depending on a shape of a conductive connecting member, 10–200 μm, and preferable to be 20–80 μm.

Further, when a bump to be used for a conductive connecting member is constituted by partly raising a thickness of a wiring pattern on a printed circuit board or a wiring pattern on a light-emitting diode, a direct connection between the wiring pattern on the printed circuit board and the wiring pattern on the light-emitting diode can be obtained.

Still further, in the present invention, a ring-shaped insulating wall can be disposed along a locus formed of a plurality of the connecting member inside and/or outside the respective connecting members.

These ring-shaped insulating walls can play a roll for firmly securing a space portion between a light-emitting diode and a printed circuit board.

Further, in the present invention, by forming precedently a connecting member to be used for electrically connecting purpose on a wiring pattern of a printed circuit board, the bonding strength can be improved, consequently the reliability of the bonding is also improved.

Further, in a fabricating method for fabricating an electronic device of the present invention, a bump can be formed on the functional device, wherein, in step (a), a bump on the functional device can be disposed in an opposite relation with a printed circuit board and, between step (a) and (b), the printed circuit board and the functional device can be connected under irradiation of an infra-red light on the printed circuit board and/or the bump.

By disposing a first surface of a printed circuit board in an opposite relation with a first surface of a functional device with a bump on the functional device, the first surface of the printed circuit board and the first surface of the functional device can be speedily and firmly disposed.

Further, by constituting a bump by partially raising a thickness of a wiring pattern on a functional device, a wiring pattern on a printed circuit board and the wiring pattern on the functional device can be directly connected.

For disposing a bump on a functional device in an opposite relation with a printed circuit board, a disposing operation can be executed by handling the printed circuit board as a saucer and by clasping a functional device with a vacuum chucking tool so as to dispose the bump opposite to the printed circuit board. When connecting, by moving the functional device toward the printed circuit board, the functional device is bonded to the printed circuit board with the bump.

In the present invention, a bump is defined as a means for electrically connecting between a functional device and a printed circuit board and further fixing them. For a bump, there are a ball bump and a plated bump, and bump which uses a conductive paste and an anisotropic conductive resin as a conductive resin.

In the present invention, the above-described member can be applied singly or in parallel. These are all included in the present invention.

For a conductive bump electrically connecting a wiring pattern on a printed circuit board and a wiring pattern on a functional device, there are a metal bump and the like including a conductive metal plated resin ball and a metal bump composed of Au, Ag, the solders (Sn-based, Pb-based, In-based and the like) and the like.

These bumps, with connecting a printed circuit board and a functional device under a definite temperature and pressure, fix the printed circuit board and the functional device, and further electrically connect a wiring pattern on the printed circuit board and a wiring pattern on a light-emitting diode. And thereby forms and secures a space portion between the printed circuit board and the functional device. In order to secure a definite space portion, a metal bump composed of such as Au, Ag, solder and the like are preferable as a conductive bump.

In order to connect a functional device and a printed circuit board with a bump formed on the functional device, the bump is required to be heated up to a temperature enough high for connection. With an irradiation of an infra-red light to heat the bump, a mechanical vibration found in such as an ultra-sonic vibrating method can be made unnecessary.

When heating through irradiation of an infra-red light, by irradiating the infra-red light on a functional device from a surface which does not have bump and transferring a thus given heat to a bump, the bump can be indirectly heated. However, a particular attention must be paid to a heating temperature and a heating time period to avoid an adverse effect arising from heating the whole functional device. It is preferable to heat directly a surface of the functional device having a bump and a surface of the printed circuit board opposite to the surface of the functional device having the bump.

The bump can be heated up to sufficiently high temperature, normally up to several hundreds degrees centigrade depending on the types of the bump, to connect the functional device and the printed circuit board. Because speedy heating of the bump is preferable, a tungsten halogen lamp, for example, can be adopted as an infra-red light source.

No sooner than the temperature of the bump reaches enough high temperature to connect the functional device and the printed circuit board, the functional device and the printed circuit board are connected through the bump by applying a required pressure on the functional device and the printed circuit board.

A space of the space portion formed according to the present invention is, depending on the shapes of the bumps, 10–200 $\mu$m, and preferable to be 20–80 $\mu$m.

Thus, the functional device and the printed circuit board can be connected through the bump and can be sealed with the resin.

Further, in the fabricating method for fabricating the electronic device of the present invention, the resin such as the thermo-setting resin can be used as the hot-melt type member.

In the present invention, an electronic device is fabricated by mounting a functional device on a printed circuit board, covering them with a hot-melt type member such as a thermo-setting resin and hardening it, wherein, when the printed circuit board and the functional device are connected through melting and hardening of a part of the surface or the whole of a sheet of a resin by heating the resin, a viscosity of the resin can be kept enough high and thereby securely prevent the resin from flowing into a space portion formed on a surface of the functional device during hardening. The sheet of a resin of the hot-melt type member can be obtained by cold pressing method. When, in this case, a shape of the sheet of a resin is formed to be larger than that of the functional device and nearly equal that of the printed circuit board, an alignment operation of the hot-melt type member against the functional device and the printed circuit board can be securely implemented, and the functional device and the printed circuit board can be firmly sealed. Further, by processing the hot-melt type member so as to have a hanging down shape along its periphery prior to the heating/melting step, the sealing between the functional device and the printed circuit board can be further secured.

Further, for an aligning means for aligning a sheet of a resin to a functional device, a concave part can be formed partially on a surface of the functional device side of the sheet of the resin. The shape of this concave part is a little bit larger than that of the outside form of the functional device, thereby disposing operation for disposing manually or automatically the sheet of the resin on the functional device is implemented conveniently. In particular, when the sheet of the resin is disposed on the functional device using vacuum chucking tool on an automounter (automatically transferring apparatus), a precise alignment can be secured and productivity also can be improved. In a bottom portion of the concave part, between the functional device and the resin, a space, that is, an air portion can be introduced a little, thereby impairment of the characteristics due to warp (deformation) of the functional device can be avoided. Further, the shape of the concave part formed on the resin can be that having two steps, wherein, when a space portion is produced on the narrower concave part, by heating/melting the resin, the space portion can be easily introduced with the functional device, and a buffering effect (by the air part) is obtained.

For the resin having the hanging down periphery portion too, the similar effect due to the alignment and buffering member(by air) can be obtained.

A liquid type thermo-setting resin used for a conventional sealing resin member, for example, an epoxy-based resin for potting use, has such a low viscosity as 15 Pa·s, the viscosity does not rise high and remains low even after the temperature is raised to 100–200° C., therefore, without a frame-shaped insulating member, the sealing member can not be prevented from flowing into a space portion between a printed circuit board and a functional device and from impairing a function of the functional device.

Nevertheless, until a resin such as a sheet of a thermo-setting resin, which has a required shape and weight obtained by cold pressing a powder raw material, begins melting by heating, a higher viscosity state can be kept and a hardening step can be controlled even after melting, thereby the viscosity of at least not less than 50 Pa·s is attained. Therefore, an enveloping operation for enveloping the functional device is easily executed.

For a resin, a thermo-setting resin is preferable, such as an epoxy-resin, a silicone-resin, an urethane-resin, and the like can be cited. The epoxy-resin, further, phenol-based epoxy-resin is preferable. In particular, a bisphenol A-based epoxy-resin or a phenolic novolac-based epoxy resin is preferable for a fabricating method for fabricating an electronic device of the present invention.

A sheet of a resin mounted on a surface of a functional device other than that opposite to a space portion adheres to the other surface than that opposite to the space portion of the functional device and envelops the functional device, and seals the functional device with a printed circuit board.

Though a condition for heating/melting and hardening is required to be suitably controlled in this case, in the present invention, a temperature for heating/melting a hot-melt type member of a sheet of a resin is 100–200° C., and a holding time for hardening is 1–2 hrs. More preferably, after the heating/melting step is executed in the temperature range of 110–170° C., the hardening step is done in the temperature range of 100–160° C. and with the holding time of, for example, 1 hr. By this, the processing time period can be shortened.

The heating step does not require to be always executed under a definite condition of the temperature and the holding time, and modification of the condition can be applied according to the necessity. For example, after heating is executed under a temperature of around 160° C. and holding time of 3 hrs, an additional treatment under a temperature of around 120° C. and holding time of 1 hrs can be followed. By processing like this, a hot-melt type member such as a sheet of a resin can be wholly melted maintaining an appropriate viscosity, and hardens while maintaining a configuration for firm sealing.

Further, instead of the resin, a low melting glass can be applied with the same object. In this case, powder (frit) of the low melt glass can be cold pressed to form a sheet shape. If necessary for pressing, a little quantity of wax or polyvinyl alcohol and the like can be used as a binder. A melting temperature range of the low melt glass is in the temperature range of 250–400° C., preferably in the range of 300–350° C., and borosilicate glass having the melting temperature in the above-described range is adequate. A borosilicate glass having not less than 50% by weight of PbO as a component is most adequate. A little quantity of ZnO, Al2O3, TiO2, Bi2O3, PbF2, CuO can be included. For example, borosilicate bismuth glass can be used. Further, these glasses can be used in a combined manner.

Though an appropriate control of conditions for heating/melting/and hardening is required, in the present invention, a hot-melt type member, for example, a low melt glass is treated in the temperature range of 250–400° C. and with a hardening time period of 1–2 hrs, more preferably, after heating/melting in the temperature range of 300–350° C., a hardening step is executed in the temperature range of 100–160° C. and a holding time period of 1–20 hrs.

The heating step does not require to be always executed under a definite condition of the temperature and the holding time period, and modification on the conditions can be applied according to the necessity. For example, after heating is executed under a temperature of around 300° C. and a holding time period of 3 hrs, an additional treatment under a temperature of around 120° C. and a holding time period of 3 hrs can be provided. By processing like this, a hot-melt type member, for example, a low melt glass can be wholly melted maintaining an appropriate viscosity, and hardens while securing a configuration for sealing.

An electronic device of the present invention comprises a printed circuit board having a first surface and a second surface, a functional device having a first surface and a second surface wherein the first surface is disposed opposite to the first surface of the printed circuit board, and a hot-melt type member for sealing a space portion between the first surface of the printed circuit board and the first surface of the functional device while preventing the hot-melt type member intruding the space portion.

According to an electronic device of the present invention, a first surface of a printed circuit board is disposed in an opposite relation with a first surface of a functional device with a predetermined position and spacing; a hot-melt type member is disposed above the first surface of the printed circuit board and/or a second surface of the functional device; and the hot-melt type member seals a space portion between the printed circuit board and the functional device while preventing the sealing member from intruding at least the space portion.

According to an electronic device of the present invention, since a frame-shaped member used for preventing a resin, which seals a space portion formed between a functional device and a printed circuit board, from intruding the space portion is not necessitated, a conventional step for forming the frame-shaped member can be eliminated, thereby, there is a merit that the electronic device having a simple construction can be easily obtained.

For material for a printed circuit board, ceramic such as alumina, magnesia, silicon carbide and the like, glass-ceramic, multilayered ceramic substrate which is composed of such as alumina and the like and has built-in conductors or functional devices inside, and a resin substrate such as glass-epoxy substrate including a FR-4 can be cited.

For a functional device, for example, a surface acoustic wave device, a quartz oscillator or resonator, a piezoelectric oscillator or resonator, a photocoupler having at least a pair of light sending part and light receiving part, an EPROM, a CCD, a semiconductor laser or a light-emitting diode can be cited.

According to an electronic device of the present invention, a functional device, for example, a surface acoustic wave device or a semiconductor device can be mounted by a face-down bonding method (a technology for directly bonding a chip in an upside-down relation to a package without the steps for die-bonding and wire-bonding) (for details of the face-down bonding method, see "Kagaku Daijiten (Chemical Dictionary)", Maruzen K. K., page 1189, Mar. 5, 1985). The face-down bonding method includes, in concrete, flip chip method, beam lead method, TAB method, pedestal method and the like. In the present invention, a hot-melt type member obtained by cold pressing powdered raw material, for example, a sheet of a thermo-setting resin is applied as a sealing member during the sealing step; a surface or the whole of the resin is melted and hardened by heating; thereby a functional device and a printed circuit board are sealed while preventing the sealing member from intruding a space portion between a main surface of the functional device disposed oppositely to the printed circuit board and the printed circuit board.

A printed circuit board constituting a part of an electronic device of the present invention can be provided with a wiring pattern, depending on the mounting method, on one main surface only or on both of the one main surface and another main surface, further, on all of one main surface, another main surface and side surfaces. When the wiring patterns are formed on one main surface, another main surface and side surfaces, the wiring pattern on one main surface and the wiring pattern on another main surface can be connected through the wiring pattern on the side surfaces. Further, for example, in the case of the surface acoustic wave device, in order to secure a space portion, a transducer part consisting of a comb-shaped electrode and a wiring pattern electrically connected to the transducer part are required to be formed on one surface.

A functional device and a printed circuit board can be connected through a conductive connecting member which is laid down between them, wherein a space of the space portion formed according to the present invention is, depending on the shape of the connecting member, 10–200 $\mu$m, and preferable to be 20–80 $\mu$m.

In the present invention, a conductive connecting member is defined as a means for electrically connecting between a functional device and a printed circuit board and fixing them. So-called a bump or a conductive resin can be used, for example. For the bump, a ball-bump, a plated bump and the like are cited, and for the conductive resin, a conductive paste, an anisotropic conductive resin and the like are included.

In the present invention, the above-described member can be applied singly or in parallel. These are all included in the present invention.

In an electronic device of the present invention, a frame-shaped insulating wall or a dam is not necessarily required. However, by including these in the present invention, an effectiveness for sealing can be further improved.

A liquid type thermo-setting resin used for a conventional sealing resin member, for example, an epoxy-based resin for potting use, has such a low viscosity as 15 Pa·s, the viscosity does not rise high and remains low even after the temperature is raised to 100–200° C., therefore, without a frame-shaped insulating member, the sealing member can not be prevented from flowing into a space portion between a printed circuit board and a functional device and from impairing a function of the functional device.

Nevertheless, until a resin such as a sheet of a thermo-setting resin, which has a required shape and weight obtained by cold pressing a powder raw material, begins melting by heating, a higher viscosity state can be kept and a hardening step can be controlled even after melting, thereby the viscosity of at least not less than 50 Pa·s is attained. Therefore, an enveloping operation for enveloping the functional device is easily executed.

The sheet of the resin described above can be easily obtained by cold pressing, for example, powdered raw material of epoxy resin into a film shape having a required shape and weight.

A sheet of a resin disposed on a surface of a functional device which surface is a reversed one to a surface opposite to a space portion, by heating/melting and ensuing hardening, adheres at least to the other main surface of the functional device and envelops the device. Thus the sheet of the resin seals the surface acoustic wave device together with the printed circuit board.

In an electronic device of the present invention, a sheet of a buffering member having a smaller shape than that of a hot-melt type member is adhered to one main surface of the hot-melt type member; the sheet of the buffering member adhered to the hot-melt type member is disposed in an opposite relation on the other main surface of a surface acoustic wave device having one main surface on which a wiring pattern is formed; at least the other main surface of the device and the buffering sheet are intimately contacted by heating/melting/hardening in such a manner that the buffering sheet envelops the device and seals the device together with the printed circuit board. For the sheet of the buffering member, for example, such material as elastic rubber sheet rich in elasticity can be cited. Instead, a metal foil or two layer of waxed paper can be disposed. Here, film size of respective layers can be smaller than the shape of the sheet of the resin member and not necessarily required to be equal, and the shape also can be arbitrary. With these structures, strain due to contraction or difference of the thermal expansions during hardening of the resin member can be alleviated. Further, because alignment of the buffering sheet between the resin member for sealing and the functional device can be easily executed, an improvement of productivity and reliability can be attained.

Further, instead of the sheet of the buffering member, the sheet resin member having silicone coated on the surface facing to the functional device can be disposed on the functional device so as to envelop the functional device; and by heating/melting it, the functional device can be sealed, wherein the liquid silicone become gummy and can work as a buffering member.

Further, a space portion (air) can be introduced between the resin member and the functional device as a buffering member.

That is, as to a material for a resin portion, by reducing a packing density of an epoxy resin, air bubbles can be made remain within the resin. Thus, the air bubbles, even after heating and melting, can remain as the space portion. Further, two layers of resin material having fillers of different densities, namely, having different bubble densities, can be used. That is, by applying the epoxy resin having low packing density (high fluidity material) for the layer facing the functional device and high packing density one (high fluidity material) for the other layer, the two layers of resin material having different densities are realized. In this case, the fluidity of the material can be controlled by varying a quantity of a hardener or the filler in the resin.

Further, in an electronic device of the present invention, a wiring pattern on one main surface of a printed circuit board is exposed between an edge portion along a periphery of a resin portion and that along a periphery of the printed circuit board in such a manner that the resin portion does not envelop wholly the wiring pattern. In this case, the wiring pattern can be connected with a concave formed wiring pattern along a side surface of the printed circuit board.

Therefore, when an electronic device is mounted by a surface-mounting method on a surface of a circuit board together with other passive devices, a connecting part on the circuit board and a concave shaped wiring pattern on a side surface of the printed circuit board can be easily connected with a solder and the like.

According to an electronic device of the present invention, a height of a wiring pattern which connects to a conductive connecting member for connecting a printed circuit board and a functional device can be controlled by adjusting partly a thickness of a printed circuit board material or a thickness of a conductive material of the wiring pattern. Or, by adjusting a height itself of the electrically connecting member, a proper space portion can be secured between the printed circuit board and the functional device. Therefore, even when the functional device is a surface acoustic wave device disposed with a surface acoustic wave absorption member, a bonding strength between the acoustic surface wave device and the printed circuit board can be kept enough high, so the reliability of the bonding can be improved.

In an electronic device of the present invention, when a wiring pattern of a printed circuit board is formed, at least a part of a wiring pattern can be obtained by a repeated coating of a conductive paste using a screen printing method, thereafter burning or cofiring can be followed. In this case, the thickness of the repeatedly coated portion after firing is preferable to be thicker by in the range of 5–100 $\mu$m than that of the other part.

Further, in an electronic device of the present invention, when a wiring pattern of a printed circuit board is formed, at least a part of the wiring pattern can be made thicker than that of the other part of the wiring pattern using a film forming method such as a vapor depositing method or a sputtering method.

The difference between the above-described thicknesses is preferable to be not less than 0.5 $\mu$m.

Further, in an electronic device of the present invention, a printed circuit board can be added with a green sheet corresponding to a portion opposite to a connecting member, which serves as an electrical connecting portion, and a neighboring area, thereafter a wiring pattern can be formed on the printed circuit board.

The difference between thickness of the portion fired with an added green sheet and that of the other part is preferable essentially in the range of 5–500 $\mu$m.

By adopting a printed circuit board described above, even if a thickness of a connecting member is small, since a thickness of a printed circuit board material or that of a conductive material of a wiring pattern portion can be added to that of a connecting member, an appropriate volume of a space portion can be effectively secured between a functional device and a printed circuit board. In particular, even if a surface acoustic wave device is disposed with a surface acoustic wave absorption member, a sufficient bonding strength can be kept between the acoustic surface wave device and the printed circuit board. Thus, the bonding strength and the reliability can be improved.

Further, in an electronic device of the present invention, in order to secure an appropriate volume for a space portion, a plurality of a conductive bump can be piled up on nearly same position to form a conductive connecting member used as an electrically connecting portion. In this case, an added thickness of the plurality of the conductive bump is preferable to be in the range of 30–150 $\mu$m. Instead, when a conductive ball bump are applied as the conductive bonding member for connecting electrically, a thickness of the conductive ball bump is regulated by varying a width of a conductive thin wire. Here, ball bump essentially consisting of Au, ball bump essentially consisting of Sn, ball bump essentially consisting of Pb and the like are preferable as the conductive bump. Or, further, when a functional material is coated on one main surface or at least a part of the other main surface of a functional device, in concrete, when a surface acoustic wave absorption member is coated at least on one main surface or on a part of the other main surface of the surface acoustic wave device, the functional material, that is, the surface acoustic wave absorption material can be coated thinner than a thickness of a conductive connecting member.

Thus, by regulating a thickness of a conductive connecting member forming an electrically connecting portion, an appropriate volume for a space portion can be effectively secured between a functional device and a printed circuit board.

Here, there is no need to change partly a thickness of a board material of the printed circuit board or a thickness of the conductive material.

In an electronic device of the present invention, a frame-shaped member is disposed on a first surface of the printed circuit board so as to surround the space portion.

In an electronic device of the present invention, a frame shaped member, which prevents a hot-melt type member for sealing purpose from intruding a space portion between a functional device and a printed circuit board, is not necessarily required to be disposed for sealing the space portion while leaving a space portion between a functional device and a printed circuit board. However, by disposing the frame-shaped member so as to surround the space portion, the hot-melt type member is more firmly prevented from flowing into the space portion between the functional device and the printed circuit board. For the frame-shaped member, a conventional frame-shaped member can be used as it is.

Further, in an electronic device of the present invention, a hot-melt type member can be disposed so as to envelop all of a second surface of a functional device. Further, the hot-melt type member can be disposed so as to wholly expose the second surface of the functional device.

Further, the second surface of the functional device can be partially exposed.

When the second surface of the functional device is disposed so as to wholly envelop the second surface of the functional device, the second surface of the functional device can be completely protected. Further, when the whole or a part of the second surface of the functional device is exposed, since the second surface of the functional device is exposed, a wiring pattern can be further implemented thereon, and thereby the wiring pattern can connect each electronic devices by stacking them and to the other electronic device.

Further, in an electronic device of the present invention, the first surface of the printed circuit board and the first surface of the functional device can be disposed in an opposite relation through a conductive connecting member.

In the present invention, a conductive connecting member is defined as a means for electrically connecting between a functional device and a printed circuit board and further fixing them. For example, so-called bump, conductive resin can be used. For the bump, there are a ball bump and plated bump. For the conductive resin, there are a conductive paste and an anisotropic conductive resin.

In the present invention, the above-described member can be applied singly or in parallel. These are all included in the present invention.

For a conductive bump which electrically connects a wiring pattern on a printed circuit board and an electrode on a first surface of a surface acoustic wave device, there are a conductive metal plated resin ball and a metal bump composed of Au, Ag, a solder (Sn-based, Pb-based, In-based and the like) and the like.

These conductive bumps, by connecting a printed circuit board and a functional device under a definite temperature and a pressure, connect electrically a wiring pattern on the printed circuit board and an electrode on a first surface of the functional device, and form and secure a space portion between the functional device and the printed circuit board. In order to secure a definite space portion, the metal bump composed of such as Au, Ag, solder and the like is particularly preferable as a conductive bump. Further, in order to secure an appropriate volume for the space portion, a plurality of a conductive bump piled up at nearly same place can be used as a conductive connecting member for electrically connecting purpose. Here, an added thickness of the plurality of the conductive bumps is preferable to be in the range of 30–150 $\mu$m. Instead, when the conductive ball bumps are applied as the conductive connecting member for connecting electrically, the thickness of the conductive ball bumps can be controlled by varying the width of the conductive thin wire. Here, the ball bump essentially consisting of Au, Sn, Pb or the like is preferable as the conductive bump.

Further, in an electronic device of the present invention, when a surface acoustic wave device is used as the functional device, the connecting pattern of the first surface of the printed circuit board and the connecting pattern of the first surface of the acoustic surface wave device can be disposed in an opposite relation with a conductive connecting member based on the face-down bonding method.

In the present invention, when a surface acoustic wave device is mounted based on the face-down method, if a sheet of a resin, for example, is used as a hot-melting type member during sealing step, a functional device and a printed circuit board can be sealed maintaining a space portion between the functional device and the printed circuit board.

According to the present invention, since a frame-shaped member, which prevents a resin for sealing a space portion between the functional device and the printed circuit board from intruding the space portion, is not necessitated, a surface acoustic wave device having a simple structure can be attained.

In the present invention, a sheet of a thermo-setting member, for example, can be employed as a sealing member for sealing purpose, and a functional device and a printed circuit board can be sealed maintaining a space portion between a transducer portion formed on a surface acoustic wave device and the printed circuit board.

A spacing of a space portion formed according to the present invention is, though depending on a shape of a conductive connecting member, 10–200 $\mu$m, and preferable to be in the range of 20–80 $\mu$m.

Further, when a conductive connecting member is constituted by partly raising a thickness of a wiring pattern on a printed circuit board or a wiring pattern on a surface acoustic wave device, direct connection between the wiring pattern on the printed circuit board and the wiring pattern on the acoustic surface wave device can be obtained.

Still further, in the present invention, a ring-shaped insulating wall can be disposed inside and/or outside the respective connecting members along the locus formed of a plurality of the connecting member.

These ring-shaped insulating walls can play a roll for firmly securing a space portion between a functional device and a printed circuit board.

Further, an electronic device of the present invention comprises; a quartz oscillator or resonator as the functional device; a conductive connecting member for disposing the wiring pattern on the first surface of the printed circuit board in an opposite relation with the electrode on the first surface of the quartz oscillator or resonator based on the face-down bonding method; and a bonding wire, for example, for electrically connecting the wiring pattern on the first surface of the printed circuit board and the electrode on the second surface of the quartz oscillator or resonator.

According to the present invention, since a frame-shaped Am member is not necessarily required for preventing a hot-melt type member from intruding a space portion between a quartz oscillator or resonator and a printed circuit board, a structure can be made simple. Further, by using a preformed sheet of a resin, for example, as a hot-melt type member for sealing use and by connecting through heating/melting/hardening, a space portion between a quartz oscillator or resonator and a printed circuit board can be sealed with the resin without affecting adversely on a oscillation of the quartz oscillator or resonator while preventing the resin spreading into the space portion.

In the present invention, a sealing resin having a certain definite viscosity can be prevented from intruding a space portion formed between a quartz oscillator or resonator and a printed circuit board without employing a frame-shaped insulating member, consequently an electronic device having a simple structure can be obtained.

In the present invention, a sheet of a thermo-setting resin member, for example, can be used as a sealing member for sealing use, and, through melting a surface or the whole of the resin and hardening by heating, a quartz oscillator or resonator and a printed circuit board are sealed maintaining a space portion between them.

A spacing of a space portion formed according to the present invention is, depending on a shape of a conductive connecting member, 10–200 $\mu$m, and preferable to be 20–80 $\mu$m.

Further, when a conductive connecting member is constituted as a bump by partly raising a thickness of a wiring pattern on a printed circuit board or an electrode on a first surface of a quartz oscillator or resonator, a direct connection between the wiring pattern on the printed circuit board and the electrode on the first surface of the quartz oscillator or resonator can be obtained.

Still further, in the present invention, a ring-shaped insulating wall can be disposed inside and/or outside the respective connecting members along a locus formed of a plurality of the connecting members.

These ring-shaped insulating walls can play a roll for firmly securing a space portion between a quartz oscillator or resonator and a printed circuit board.

Further, in the present invention, by forming precedently a connecting member used for electrically connecting purpose on a wiring pattern of a printed circuit board, the bonding strength can be improved, consequently the reliability of the bonding is also improved.

Further, a surrounding member can be disposed on the printed circuit board so as to surround a quartz oscillator or resonator, and a hot-melt type member can be disposed at least on the surrounding member.

Thereby, an oscillation of a quartz oscillator or resonator can be completely secured.

Further, in an electronic device of the present invention; the functional device can be a piezoelectric oscillator or resonator; the connecting pattern on the first surface of the printed circuit board is disposed in an opposite relation with the electrode on the first surface of the piezoelectric oscillator or resonator based on the face-down bonding method; and a bonding wire can electrically connect between the wiring pattern on the first surface of the printed circuit board and the electrode on the second surface of the piezoelectric oscillator or resonator.

In the present invention, when a piezoelectric oscillator or resonator is mounted based on the face-down bonding method, a hot-melt type member to be disposed on the piezoelectric oscillator or resonator can be, for example, a sheet of a resin and can seal a space portion maintaining a space portion between a piezoelectric oscillator or resonator and a printed circuit board. Further, when disposing the hot-melt type member for sealing purpose on the piezoelectric oscillator or resonator, a buffering member can be introduced between the piezoelectric oscillator or resonator and the resin for sealing, thereby preventing the hot-melt type member from contacting directly with the piezoelectric oscillator or resonator and enabling the piezoelectric oscillator or resonator to exhibit it function. The shape of the buffering member is preferable to be larger than that of the second surface of the piezoelectric oscillator or resonator.

Further, a wiring pattern on a first surface of a printed circuit board and an electrode on a surface of a piezoelectric oscillator or resonator other than that opposite to a space portion of the piezoelectric oscillator or resonator can be electrically connected through a bonding wire embedded in a hot-melt type member.

According to the present invention, since a frame-shaped member is not necessarily required for preventing a hot-melt type member from intruding a space portion between a piezoelectric oscillator or resonator and a printed circuit board, an electronic device having a simple structure can be obtained. Further, by using such as a preformed sheet of a resin as the hot-melt type member for sealing purpose and by connecting through heating/melting/hardening, the resin can be easily prevented from intruding the space portion between the piezoelectric oscillator or resonator and the printed circuit board. Thus, without adversely affecting on a oscillation of the piezoelectric oscillator or resonator, the resin sealing can be executed.

According to the present invention, since a hot-melt type member can be prevented from intruding a space portion between a piezoelectric oscillator or resonator and a printed circuit board without necessitating a frame-shaped insulating member, an electronic device having a simple structure can be attained.

In the present invention, as a sealing member, such as a sheet of a thermo-setting resin can be used, and, by melting a surface or the whole of the resin by heating, and by hardening, a piezoelectric oscillator or resonator and a printed circuit board can be sealed maintaining a space portion between them.

A spacing of a space portion formed according to the present invention is, depending on a shape of a conductive bonding member, 10–200 $\mu$m, and preferable to be 20–80 $\mu$m.

Further, when a conductive connecting member is constituted as a bump by partly raising a thickness of a wiring pattern on a printed circuit board or an electrode on a first surface of a piezoelectric oscillator or resonator, a direct connection between the wiring pattern on the printed circuit board and the electrode on the first surface of the piezoelectric oscillator or resonator can be obtained.

Still further, in the present invention, a ring-shaped insulating wall can be disposed inside and/or outside the respective connecting members along a locus formed of a plurality of the connecting members.

These ring-shaped insulating walls can play a roll for firmly securing a space portion between a piezoelectric oscillator or resonator and a printed circuit board.

Further, a fabricating method for fabricating an electronic device of the present invention comprises; a photocoupler having a pair of light sending part and light receiving part as the functional device; a conductive connecting member for disposing a wiring pattern on a first surface of a printed circuit board in an opposite relation with a wiring pattern on a respective first surface of the photocoupler based on the face-down bonding method; a surrounding member disposed on the printed circuit board so as to surround the photocoupler; and a hot-melt type member disposed at least on the surrounding member.

When a photocoupler is mounted based on the face-down bonding method in the present invention, a surrounding member can be disposed along a circumference of a photocoupler to secure a light path of the photocoupler, and, as a hot-melt type member for sealing, such as a sheet of a resin can be employed. Thereby, the photocoupler and the printed circuit board can be sealed while securing the light path for the photocoupler and maintaining a space portion between the photocoupler and the printed circuit board.

According to the present invention, since a frame-shaped member is not necessarily required for preventing a hot-melt type member from intruding a space portion between a photocoupler and a printed circuit board, a structure can be made simple. Further, by using such as a preformed sheet of a resin as the hot-melt type member and by connecting through heating/melting/hardening, the photocoupler can be sealed with the resin without adversely affecting on a light path of the photocoupler.

According to the present invention, since a hot-melt type member can be prevented from intruding a space portion between a photocoupler and a printed circuit board without applying a frame-shaped insulating member, there is a merit that an electronic device having a simple structure can be attained.

In the present invention, such as a sheet of a thermo-setting resin can be used as a sealing member, and, by melting a surface or the whole of the resin by heating and hardening, a photocoupler and a printed circuit board can be sealed maintaining a space portion between them.

A spacing of a space portion formed according to the present invention is, depending on a shape of a conductive bonding member, 10–200 $\mu$m, and preferable to be 20–80 $\mu$m.

Further, when a conductive connecting member is constituted as a bump by partly raising a thickness of a wiring pattern on a printed circuit board or an electrode on a first surface of a photocoupler, direct bonding between the wiring pattern on the printed circuit board and the electrode on the first surface of the photocoupler can be obtained.

Still further, in the present invention, a ring-shaped insulating wall can be disposed inside and/or outside the respective connecting members along a locus formed of a plurality of the connecting members.

These ring-shaped insulating walls can play a roll for firmly securing a space portion between a photocoupler and a printed circuit board.

Further, in an electronic device of the present invention, the printed circuit board can be a light transmitting substrate and the functional device can be an EPROM.

For a printed circuit board, in order for an ultra-violet light to be irradiated at least on an EPROM, a substrate capable of transmitting ultra-violet light can be used. For example, a glass substrate can be cited.

In the present invention, when an EPROM is mounted based on the face-down bonding method, such as a sheet of a resin is used as a hot-melt type member for sealing use and, the EPROM and the printed circuit board is sealed maintaining a space portion between a light receiving portion of the photocoupler and the printed circuit board maintaining.

According to the present invention, since a frame-shaped insulating member is not necessarily required for preventing a hot-melt type member from intruding a space portion between an EPROM and a printed circuit board, an assemblage of the EPROM having a simple structure can be obtained.

In the present invention, such as a sheet of a thermo-setting resin can be used as a sealing member, and, an EPROM and a printed circuit board can be sealed maintaining a space portion between a light receiving portion on the EPROM and the printed circuit board.

Further, a spacing of a space portion formed according to the present invention is, depending on a shape of a conductive connecting member, 10–200 μm, and preferable to be 20–80 μm.

Further, when a conductive connecting member is constituted as a bump by partly raising a thickness of a wiring pattern on a printed circuit board or a wiring pattern on an EPROM, direct bonding between the wiring pattern on the printed circuit board and the wiring pattern on the EPROM can be obtained.

Still further, in the present invention, a ring-shaped insulating wall can be disposed inside and/or outside the respective connecting members along a locus formed of a plurality of the connecting members.

These ring-shaped insulating walls can play a roll for firmly securing a space portion between an EPROM and a printed circuit board.

Further, in an electronic device of the present invention, the printed circuit board can be a light transmitting substrate and the functional device can be a CCD, and the first surface of the printed circuit board can be disposed in an opposite relation with the light receiving surface of the CCD.

For a printed circuit board, in order for an ultra-violet light to be able to irradiate a surface of a light receiving surface of a CCD, a substrate being optically flat and capable of transmitting the ultra-violet light can be used. For example, a glass substrate can be cited.

In the present invention, when a CCD is mounted based on the face-down bonding method, such as a sheet of a resin can be used as a hot-melt type member for sealing use, and the CCD and a printed circuit board can be sealed maintaining a space portion between the CCD and the printed circuit board.

According to the present invention, since a frame-shaped member is not necessarily required for preventing a hot-melt type member from intruding a space portion between a CCD and a printed circuit board, a CCD having a simple structure can be obtained.

In the present invention, a sheet of a thermo-setting resin, for example, can be used as a sealing member, and a CCD and a printed circuit board can be sealed maintaining a space portion formed between a light receiving portion of the CCD and a printed circuit board.

Further, a spacing of a space portion formed according to the present invention is, depending on a shape of a conductive connecting member, 10–200 μm, and preferable to be 20–80 μm.

Further, when a conductive connecting member is constituted as a bump by partly raising a thickness of a wiring pattern on a printed circuit board or a wiring pattern on a CCD, a direct bonding between the wiring pattern on the printed circuit board and the wiring pattern on the CCD can be obtained.

Still further, in the present invention, a ring-shaped insulating wall can be disposed inside and/or outside respective connecting members along a locus formed of a plurality of the connecting members.

These ring-shaped insulating walls can play a roll for firmly securing a space portion between a CCD and a printed circuit board.

Further, in an electronic device of the present invention, the printed circuit board can be a light transmitting substrate and the functional device can be a semiconductor laser, and a first surface of the printed circuit board can be disposed in an opposite relation with a light emitting surface of the semiconductor laser.

For a printed circuit board, in order for a laser light from an emitting surface of a semiconductor laser to transmit a printed circuit board to output from an opposite surface of the printed circuit board, a substrate capable of transmitting a light can be used. For example, glass substrate can be cited.

In the present invention, when a semiconductor laser is mounted based on the face-down bonding method, such as a sheet of a resin can be used as a hot-melt type member for sealing use, and a space portion between the semiconductor laser and a printed circuit board can be sealed with the resin maintaining a space portion between an emitting surface of the semiconductor laser and the printed circuit board.

According to the present invention, since a frame-shaped member is not necessarily required for preventing a hot-melt type member from intruding a space portion between a semiconductor laser and a printed circuit board, a semiconductor laser having a simple structure can be assembled.

Further, by using a preformed sheet of a resin as a hot-melt type member and by connecting through heating/melting/hardening of the resin, without adversely affecting on an external output of a laser light from the semiconductor laser, a space portion can be formed between the semiconductor laser and the printed circuit board and a semiconductor laser sealed with the resin can be obtained.

In the present invention, a sheet of a thermo-setting resin, for example, can be a sealing member, and, through melting and hardening a surface or the whole of the resin by heating the resin, a semiconductor laser and a printed circuit board can be sealed maintaining a space portion between a light-emitting portion formed on the semiconductor laser and the printed circuit board.

Further, a spacing of a space portion formed according to the present invention is, depending on a shape of a conductive connecting member, 10–200 μm, and preferable to be 20–80 μm.

Further, when a conductive connecting member is constituted as a bump by partly raising a thickness of a wiring pattern on a printed circuit board or a wiring pattern on a semiconductor laser, direct bonding between the wiring pattern on the printed circuit board and the wiring pattern on the semiconductor laser can be obtained.

Still further, in the present invention, a ring-shaped insulating wall can be disposed inside and/or outside the respective connecting members along a locus formed of a plurality of the connecting members.

These ring-shaped insulating walls can play a roll for firmly securing a space portion between a semiconductor laser and a printed circuit board.

Further, in an electronic device of the present invention, the printed circuit board can be a light transmitting substrate and the functional device can be a light-emitting diode, and a first surface of the printed circuit board can be disposed in an opposite relation with a light emitting surface of the light-emitting diode.

For a printed circuit board, at least so as a light from a light-emitting surface of a light-emitting diode to transmit the printed circuit board to output from an opposite surface, a substrate capable of transmitting the light can be used. For example, glass substrate can be cited.

In the present invention, when a light-emitting diode is mounted based on the face-down bonding method, a sheet of a resin, for example, can be used as a hot-melt type member, and the light-emitting diode and the printed circuit board can be sealed maintaining a space portion between a light emitting surface of the light-emitting diode and the printed circuit board.

According to the present invention, since a frame-shaped member is not necessarily required for preventing a hot-melt type member from intruding a space portion between a light-emitting diode and a printed circuit board, a light-emitting diode having a simple structure can be obtained. Further, by using a preformed sheet of a resin, for example, as a hot-melt type member and by bonding through heating/melting/hardening, the resin is prevented from spreading into in particular a light-emitting surface of the light-emitting diode and, without adversely affecting on a light output from the light-emitting diode, a light-emitting diode which has a space portion between the light-emitting diode and the printed circuit board and is sealed with the resin can be obtained.

In the present invention, a sheet of a thermo-setting resin, for example, can be used as a sealing member, and, through melting and hardening of a surface or the whole of the resin by heating, a light-emitting diode and a printed circuit board can be sealed maintaining a space portion between a light-emitting surface of the light-emitting diode and the printed circuit board.

Further, a spacing of a space portion formed according to the present invention is, depending on a shape of a conductive connecting member, 10–200 $\mu$m, and preferable to be 20–80 $\mu$m.

Further, when a conductive connecting member is constituted as a bump by partly raising a thickness of a wiring pattern on a printed circuit board or a wiring pattern on a light-emitting diode, direct bonding between the wiring pattern on the printed circuit board and the wiring pattern on the light-emitting diode can be obtained.

Still further, in the present invention, a ring-shaped insulating wall can be disposed inside and/or outside the respective connecting members along a locus formed of a plurality of the connecting members.

These ring-shaped insulating walls can play-a roll for firmly securing a space portion between a light-emitting diode and a printed circuit board.

In an electronic device of the present invention, for a hot-melt type member, a resin such as a thermo-plastic resin or a thermo-setting resin can be used.

In the present invention, by hardening a sheet of a hot-melt type member such as a thermo-setting resin which covers a bonded body of a functional device and a printed circuit board, an electronic device can be assembled on a printed circuit board. Here, when a surface or the whole of a preformed sheet of the resin is heated and melted, since the viscosity of the resin can be kept enough high for bonding the functional device and the printed circuit board. Thus, the resin is firmly prevented from spreading into a space portion formed on a first surface of the functional device during hardening.

A liquid type thermo-setting resin used as a conventional sealing resin member such as an epoxy-based resin for potting use has such a low viscosity as 15 Pa·s, the viscosity does not rise high and remains low even after a temperature is raised to 100–200° C. Therefore, without a frame-shaped insulating member, the sealing member can not be prevented from spreading into a space portion between the printed circuit board and the functional device and from impairing a function of the functional device.

Nevertheless, by using a resin such as a thermo-setting resin which is a sheet obtained by cold pressing a powder raw material into a required shape and weight, a high viscosity state is kept until melting start by heating and by controlling a hardening state even after melting, a viscosity of at least not less than 50 Pa·s can be obtained. Thus, a functional device is firmly covered.

For a resin, a thermo-setting resin such as an epoxy-resin, a silicone-resin, an urethane-resin, and the like can be cited. The epoxy-resin is preferable one, further, a phenol-based epoxy-resin is more preferable. In particular, a bisphenol A-based epoxy-resin and a phenolic novolac-based epoxy resin are suitable for an electronic device of the present invention.

A sheet of a resin disposed on a surface of a functional device other than that opposite to a space portion of the functional device adheres to the other surface than that opposite to the space portion of the functional device and envelops the functional device, and seals the functional device with the printed circuit board.

In the present invention, a hot-melt type member such as a sheet of a resin can be heated in the range of temperature of 100–200° C., more preferably being heated in the range of 110–170° C.

Further, instead of a resin, a low melting glass can be applied with same object. In this case, a powder of the low melt glass (frit) can be cold pressed to form a sheet. If necessary for molding, a little quantity of wax or polyvinyl alcohol can be added as a binder. The preferable melting temperature range of the low melt glass is in the range of temperature of 250–400° C., more preferably in the range of 300–350° C., and borosilicate glass having the melting temperature in the above-described range is adequate. The borosilicate glass having not less than 50% by weight of PbO as a component is most preferable. A little quantity of ZnO, Al2O3, TiO2, Bi2O3, PbF2, CuO can be included. These glass member can be used plurally.

A fabricating method for fabricating an electronic device of the present invention comprises the steps of: aligning a plurality of a functional device to an aggregate of a plurality of a printed circuit board at a predetermined position; assembling the functional device and the aggregate of the printed circuit board through a conductive connecting member with a predetermined spacing; disposing a hot-melt type member on the aggregate of the printed circuit board and the functional device; heating and melting the hot-melt type member while leaving a space portion between the printed circuit board and the functional device; and dividing the aggregate of the plurality of the printed circuit boards together with the hot-melt type member into an individual electronic device.

In the present invention, a plurality of a functional devices is aligned to an aggregate of a printed circuit board at a predetermined position and the functional device and the aggregate of the printed circuit board are assembled through a conductive connecting member with a predetermined spacing. Then, a hot-melt type member is disposed on the aggregate of the printed circuit board and the functional device, and the hot-melt type member is heated and melted leaving a space portion between the printed circuit board and the functional device. Finally, the aggregate of a plurality of the printed circuit boards is cut together with the hot-melt type member and divided simultaneously into a plurality of an individual electronic devices.

In the present invention, a conductive connecting member and a surface acoustic wave device used as a functional device are collectively assembled on an aggregate of the printed circuit boards, then a hot-melt type member such as a sheet of a resin is disposed to seal them. That is, a plurality of electronic devices can be obtained simultaneously, thereby the productivity can be improved.

According to a fabricating method for fabricating an electronic device of the present invention, since a frame-shaped member is not necessarily required for preventing a hot-melt type member from intruding a space portion between a functional device and a printed circuit board, a step for forming a frame-shaped insulating member can be made unnecessary contrary to a conventional method and a plurality of electronic devices having a simple structure can be simultaneously obtained. Further, by using a preformed sheet of a resin, for example, such as a hot-melt type member and by bonding through heating/melting/hardening of the resin, the resin can be prevented from spreading into a surface opposite to a space portion of the respective functional devices, and, without adversely affecting on the respective functional devices, the electronic devices which formed a space portion between the respective functional devices and the printed circuit board and is sealed with the resin are obtained easily.

For a material used for a printed circuit board, ceramic such as alumina, magnesia, silicon carbide and the like, glass-ceramic, multilayered ceramic substrate such as alumina and the like having built-in conductors or functional devices inside, and resin substrate such as glass-epoxy substrate including FR-4 can be cited. Further, on the printed circuit board, marker showing a dividing area can be provided.

For a functional device, for example, a surface acoustic wave device, a quartz oscillator or resonator, a piezoelectric oscillator or resonator, a photocoupler having a pair of light sending part and light receiving part, an EPROM, a CCD, a semiconductor laser or a light-emitting diode can be cited.

According to a fabricating method for fabricating an electronic device of the present invention, a plurality of functional devices such as surface acoustic wave devices or semiconductor devices can be mounted by a face-down bonding method (a technology for directly bonding a chip in an upside-down relation to a package without a step for die-bonding and wire-bonding) (for details of the face-down bonding method, see "Kagaku Daijiten (Chemical Dictionary)", Maruzen K. K., page 1189, Mar. 5, 1985). The face-down bonding method includes, in concrete, a flip chip method, a beam lead method, a TAB method, a pedestal method and the like. In the present invention, a sheet of a thermo-setting resin, for example, is applied as a sealing member during sealing step; through melting and hardening of a surface or the whole of the resin by heating, the respective functional devices and the printed circuit board are sealed while maintaining a space portion between main surfaces of the respective functional devices opposite to the printed circuit board and the printed circuit board.

The respective printed circuit board constituting a part of the electronic device of the present invention can be provided with a wiring pattern, depending on a mounting method, on one main surface only or on both of one main surface and other main surface. Further, for example, in the case of a surface acoustic wave device, in order to secure a space portion, a transducer portion composed of a comb-shaped electrode and a wiring pattern electrically connected to the transducer portion are necessitated to be formed on one surface.

Respective functional device and a printed circuit board can be connected through a connecting member, wherein a spacing of a space portion formed according to the present invention is, depending on a shape of the connecting member, desirable to be 10–200 $\mu$m, and preferable to be 20–80 $\mu$m.

In the present invention, a connecting member is defined as a means for electrically connecting between a device (functional device) and a printed circuit board and fixing both of them. So-called bump or conductive resin can be used, for example. For the bump, a ball-bump, a plated bump and the like are cited, and for the conductive resin, a conductive paste, an anisotropic conductive resin and the like are included.

In the present invention, the above-described members can be applied singly or in parallel. These are all included in the present invention.

For a connecting member for electrically connecting between a wiring pattern on a printed circuit board and a wiring pattern on a device (functional device) such as a conductive bump, there are a conductive metal plated resin ball and a metal bump composed of Au, Ag, solders (Sn-based, Pb-based, In-based and the like) and the like.

These conductive bumps, through bonding a printed circuit board and a device (functional device) under a definite temperature and pressure, connect electrically a wiring pattern on the printed circuit board and a wiring pattern on the device(functional device) and form and secure a space portion between the functional device and the printed circuit board. In order to secure a definite space portion, a metal bump composed of such as Au, Ag, solders and the like are preferable as a conductive bump.

In a fabricating method for fabricating an electronic device of the present invention, by covering and hardening a bonded body of a printed circuit board and respective functional devices with a thermo-setting resin, the printed circuit board and the functional devices are assembled on the printed circuit board and by dividing it, the electronic devices are constituted. Here, when a preformed sheet of an epoxy based resin is used as a thermo-setting resin, a surface or the whole of the resin can be melted by heating, and, when the respective functional device and the printed circuit board are connected by hardening, a viscosity of the resin can be kept high. Thus, the resin can be prevented from spreading into a space portion formed on surface of the respective functional device opposing to the printed circuit board. Since the resin is not a liquid type, a frame-shaped insulating wall or a dam is not necessarily required. However, the frame-shaped insulating member can raise the sealing effectiveness and is included in the present invention.

A liquid thermo-setting resin used as a conventional sealing resin member such as an epoxy-based resin for potting use, has such a low viscosity as 15 Pa·s, the viscosity does not rise high and remains low even after the temperature is raised to 100–200° C. Therefore, without a frame-shaped insulating member, a space portion can not be maintained since a sealing member spreads into a space portion between a printed circuit board and a functional device, and a function of the functional device can be impaired.

Nevertheless, according to a fabricating method of an electronic device of the present invention, until a resin such as a sheet of a thermo-setting resin begins melting by heating, a high viscosity state can be kept, and a viscosity of at least not less than 50 Pa·s is attained by controlling a hardening state even after the melting. Therefore, the respective functional devices are easily enveloped.

The sheet of the resin can be easily obtained by cold pressing powder of a raw material, for example, an epoxy resin into a required shape and a weight. The sheet of the resin is disposed on the other main surface other than a main surface on which a space portion of a functional device is formed, for example, in the case of the functional device being a surface acoustic wave device, is disposed not on the main surface on which the wiring pattern of the surface acoustic wave device is formed but on the other main surface.

The shape of the sheet of the resin in this case is preferred to be a little bit smaller than that of a printed circuit board after division or nearly equal to that. The more preferable shape of the sheet of the resin is nearly equal to that of the printed circuit board preceding the division.

Implementing like this, alignment of a sheet of a resin to the respective functional devices and the printed circuit board preceding to the division can be secured.

The selection of a dimension can be suitably done depending on a total volume of the respective functional devices and a thickness of the sheet of the resin.

A sheet of a resin for a hot-melt type member is disposed on the reversed sides of the surfaces of the respective functional devices which faces a space portion, and is made to have an intimate contact with at least the other main surface of the functional device and envelops the device, thus seals the functional device with a printed circuit board.

Though a condition for heating/melting and hardening are required to be suitably controlled in this case, in the present invention, the temperature for heating/melting a sheet of a hot-melt type resin is 100–200° C., and a hardening time is 20–2 hrs. More preferably, after the heating/melting step is executed in the temperature range of 110–170° C., the hardening step is done in the temperature range of 100–160° C. and in the holding time range of 3–20 hrs.

For fabricating an electronic device of the present invention such as a surface acoustic wave apparatus, a sheet of a buffering member having a smaller size than that of a hot-melt type member is adhered on one main surface of the hot-melt type member. A buffering sheet side of the hot-melt type member is disposed in an opposite relation with other main surfaces of the respective surface acoustic wave devices having one main surface on which a wiring pattern is formed. At least the other main surface of the functional device and the buffering sheet are intimately contacted to envelop the device as well as to seal the device with the printed circuit board. For the sheet of the buffering member, for example, such material as an elastic rubber sheet rich in elasticity can be cited. Instead, a sheet of metal foil or a two sheet of waxed paper can be laminated to be disposed. Here, a shape of each sheet can be smaller than that of a sheet of a resin member and not necessarily required to be equal in shape with that of the resin member, and the shape also can be arbitrary. With these structure, a strain caused by a contraction or a difference of the thermal expansions during hardening of the resin member can be alleviated. Further, because alignment of a buffering sheet between the resin member used for sealing and the respective surface acoustic wave devices can be easily executed, an improvement of the productivity and reliability can be attained.

According to a fabricating method of the present invention, a height of a wiring pattern connecting to a conductive connecting member for connecting between a printed circuit board and the respective functional devices can be controlled by adjusting partly the thickness of the printed circuit board member or the thickness of the conductive member of the wiring pattern, or, by adjusting the height of the electrically connecting members themselves, proper space portions can be secured between the printed circuit board and the respective functional devices. Thus, even when the acoustic surface wave devices having the surface acoustic wave absorption member thereon are used as the functional devices, the bonding strength between the respective acoustic surface wave devices and the printed circuit board can be kept enough high, hence the reliability of the bonding can be improved.

In a fabricating method of an electronic device such as a surface acoustic wave device of the present invention, when a wiring pattern of a printed circuit board is formed, a repeated coating of a conductive paste by screen printing method is executed at least on a part of the wiring pattern, thereafter burning or cofiring is followed.

Here, a thickness of a repeatedly coated and fired part is preferable to be thicker by in the range of 5–100 $\mu$m than that of the other part.

Further, in a fabricating method of an electronic device of the present invention, when a wiring pattern of a printed circuit board is formed, at least a part of the wiring pattern can be made thicker than that of the other part of the wiring pattern using a film forming method such as the vapor depositing method or the sputtering method.

The difference between the above-described thicknesses is preferable to at least be not less than 0.5 $\mu$m.

Further, in a fabricating method of an electronic device of the present invention, when a printed circuit board is formed, a green sheet can be added to an area opposing to a connecting member used for electrical connecting and a neighboring area, thereafter being fired, and a wiring pattern is formed on the printed circuit board.

The difference of the thicknesses between that of a part fired with added green sheet and that of the other part is preferable essentially in the range of 5–500 $\mu$m.

By adopting a fabricating method for fabricating a printed circuit board described above, even if a thickness of a connecting member is small, since a thickness of a printed circuit board material of a wiring pattern part or a thickness of a conductive material can be added to that of the connecting member, appropriate volumes of a space portion can be effectively secured between the respective functional devices and a printed circuit board. In particular, even in the case of a surface acoustic wave device having a surface acoustic wave absorption member disposed on it, an enough high bonding strength can be kept between the surface acoustic wave device and the printed circuit board. Thus, the bonding strength can be improved and consequently the reliability is too.

Further, in an electronic device of the present invention, in order to secure an appropriate volume for a space portion, a plurality of the conductive bumps piled up on nearly same place can be used in place of a conductive connecting member for electrically connecting purpose. Here, a total thickness of the plurality of the conductive bumps is preferable to be in the range of 30–150 $\mu$m. Instead, when the conductive ball bumps are applied as the conductive connecting member for electrically connecting purpose, the thickness of the conductive ball bumps can be controlled by varying a width of a conductive thin wire. Here, a ball bump essentially consisting of Au, a ball bump essentially consisting of Sn, a ball bump essentially consisting of Pb and the like are preferable as the conductive bump. Or, further, when a functional material is coated at least on one main surface or on a part of the other main surface of the functional device, in concrete, when a surface acoustic wave absorption member is coated at least on one main surface or on a part of the other main surface of the acoustic surface wave device, the functional material, that is, the surface acoustic wave absorption material can be coated thinner than the thickness of the conductive connecting member.

Thus, by controlling a thickness of a conductive connecting member which forms an electrically connecting part, an appropriate volume of a space portion can be effectively secured between the respective functional devices and a printed circuit board. Here, since there is no need to change partly a thickness of a board material of the printed circuit board or a thickness of a conductive material, a fabrication of a plurality of the electronic devices is executed more easily.

A fabricating method for fabricating an electronic device of the present invention comprises the steps of: aligning a functional device against a printed circuit board at a predetermined position; assembling the functional device and the printed circuit board through a conductive connecting member with a predetermined spacing; disposing a hot-melt type member on the printed circuit board; and heating and melting the hot-melt type member while maintaining a space portion between the printed circuit board and the functional device, wherein the hot-melt type member is a sheet of a hot-melt type resin, and the step for heating/melting/hardening includes at least the following stages of, (1) determining a shape of the resin by heating and melting the sheet of the resin, (2) transferring to a gel state maintaining a resin shape, (3) hardening the resin, and the temperature for the (2) stage is lower than that for (1) and (3).

In the present invention, a functional device is disposed to a printed circuit board at a predetermined position; a functional device and the printed circuit board are connected through a conductive connecting member with a predetermined spacing and a sheet of a hot-melt type resin is disposed on the printed circuit board; and the sheet of the hot-melt type member is heated/melted leaving a space portion between the printed circuit board and the functional device. Here, the stage for heating/melting and hardening is exposed to a plurality of temperature conditions, that is, (1) stage for determining a shape of the resin by heating and melting the sheet of the resin, (2) stage for transferring to the gel state maintaining the resin shape, (3) stage for hardening the resin, and the temperature for the (2) stage is controlled to be the lowest one.

Thus, by introducing multiply stepped temperature conditions in the heating/melting and hardening step, a functional device and a printed circuit board can be sealed firmly while preventing a resin from intruding a space portion formed between the functional device and the printed circuit board.

According to the present invention, since a frame-shaped member is not necessarily required for preventing a resin, which seals and has a definite viscosity, from intruding a space portion between a functional device and a printed circuit board, a step for forming a conventionally needed frame-shaped insulating member can be made unnecessary, and, consequently, an electronic device having a simple structure can be obtained. Further, by using such as a preformed sheet of the resin as a resin for sealing use and by connecting through heating/melting/hardening of the sheet, the resin can be easily prevented from intruding a surface opposing to a space portion of a functional device. Thus, without adversely affecting on the functional device, an electronic device sealed with the resin can be easily fabricated while forming a space portion between the printed circuit board and the functional device.

For a material for a printed circuit board, ceramic such as alumina, magnesia, silicon carbide and the like, glass-ceramic, a multilayered ceramic substrate such as alumina and the like having built-in conductors or functional devices inside, and a resin substrate such as a glass-epoxy substrate including FR-4 can be cited.

For a functional device, for example, a surface acoustic wave device, a quartz oscillator or resonator, a piezoelectric oscillator or resonator, a photocoupler having a pair of light-sending part and light- receiving part, an EPROM, a CCD, a semiconductor laser or a light-emitting diode can be cited.

According to a fabricating method for fabricating an electronic device of the present invention, a functional device, for example, a surface acoustic wave device or a semiconductor device can be mounted by a face-down bonding method (a technology for directly bonding a chip in an upside-down relation to a package without the steps for die-bonding and wire-bonding) (for details of the face-down bonding method, see "Kagaku Daijiten (Chemical Dictionary)", Maruzen K. K., page 1189, Mar. 5, 1985). The face-down bonding method includes, in concrete, flip chip method, beam lead method, TAB method, pedestal method and the like. In the present invention, a hot-melt type member obtained by cold-pressing a powder form of a raw material, for example, a sheet of a thermo-setting resin is applied as a sealing member during the sealing step; through melting and hardening of a surface or the whole of the resin by heating, a functional device and a printed circuit board are sealed while maintaining a space portion between one main surface of the functional device which opposes to the printed circuit board and the printed circuit board.

A printed circuit board constituting a part of an electronic device of the present invention can be provided with a wiring pattern, depending on a mounting method, on one main surface only or both of the one main surface and another main surface. Further, for example, in the case of a surface acoustic wave device, in order to secure a space portion, a transducer part composed of a comb-shaped electrode and a wiring pattern which electrically connects to the transducer part are required to be formed on one surface.

A functional device and a printed circuit board can be connected through a connecting member laid down between them, wherein a spacing of a space portion formed according to the present invention is, depending on a shape of the connecting member, 10–200 μm, and preferable to be 20–80 μm.

In the present invention, a connecting member is defined as a means for electrically connecting between a device (functional device) and a printed circuit board and fixing them. So-called bump or conductive resin can be used, for example. For a bump, a ball-bump, a plated bump and the like are cited, and for a conductive resin, a conductive paste, an anisotropic conductive resin and the like are included.

In the present invention, the above-described member can be applied singly or in parallel. These are all included in the present invention.

For a conductive bump electrically connecting a wiring pattern on a printed circuit board and a wiring pattern on a device (functional device), there are a conductive metal plated resin ball and a metal bump composed of Au, Ag, the solders (Sn-based, Pb-based, In-based and the like) and the like.

These conductive bumps, through bonding a printed circuit board and a device (functional device) under a definite temperature and pressure, connect electrically a wiring pattern on the printed circuit board and a wiring pattern on the device (functional device), and form and secure a space portion between a functional device and a printed circuit board. In order to secure a definite space portion, a metal bump made of such as Au, Ag, the solders and the like are preferable as a conductive bump.

In a fabricating method for fabricating an electronic device of the present invention, a printed circuit board having a functional device bonded on it is enveloped with a sheet of a thermo-setting resin and the resin is hardened, thereby an electronic device can be constructed on a printed circuit board. Here, when a preformed sheet of an epoxy type resin is used as a thermo-setting resin, a surface or the whole of the resin is melted by heating the resin, and a functional device and a printed circuit board are connected by hardening, then, the viscosity of the resin can be kept high, the resin can be prevented from intruding a space portion formed on the side of functional device opposite to the printed circuit board during hardening. Further, since the resin is not a liquid type, a frame-shaped insulating wall or a dam is not necessarily required. However, the frame-shaped insulating member can improve a sealing effectiveness and is included in the present invention.

The liquid type thermo-setting resin for a conventional sealing resin member such as an epoxy-based resin for potting use has such a low viscosity as 15 Pa·s, and it viscosity does not rise high and remains low even after the temperature is raised to 100–200° C. Therefore, without a frame-shaped insulating member, the resin spreads into a space portion between a functional device and a printed circuit board, can not maintain the space portion and impairs the function of the functional device.

Nevertheless, according to a fabricating method of an electronic device of the present invention, by employing such as a preformed sheet of an epoxy type resin, a high viscosity state can be kept until the melting starts by heating. And, the hardening state can be controlled even after the melting and the viscosity of at least not less than 50 Pa·s is attained. Therefore, the functional device can be easily covered.

The sheet of the resin can be easily obtained by cold pressing powder of a raw material, for example, an epoxy resin into a required shape and a weight. The sheet of the resin is disposed on the other main surface other than a main surface on which a space portion of a functional device is formed, for example, in the case of the functional device being a surface acoustic wave device, is disposed not on the main surface on which the wiring pattern of the surface acoustic wave device is formed but on the other main surface.

A sheet shape of a resin in this case is preferred to be a little bit larger than that of a functional device and nearly equal to or a little bit smaller than that of a printed circuit board. The more preferable shape of the sheet of the resin is larger than that of the functional device and nearly equal to that of the printed circuit board. Implementing like this, an alignment of the sheet of the resin to the functional device and the printed circuit board can be secured. Further, by providing the sheet of the resin a shape of hanging down along a circumference, a functional device and a printed circuit board are firmly sealed.

Further, if a shape of a functional device is a size of 2 mm×2 mm and a shape of a printed circuit board is a size of 4 mm×4 mm, a shape of a sheet of a resin is a size of 4 mm×4 mm.

The selection of the size can be appropriately done depending on a volume of a functional device and a thickness of a sheet of a resin.

A sheet of a resin disposed on a surface of a functional device other than that facing to a space portion is, by heating/melting and hardening of it, made to form an intimate contact with at least the other main surface of the functional device and envelops the device, thus seals the functional device with a printed circuit board.

For a resin, a thermo-setting resin is preferable and, for example, an epoxy-resin, a silicone-resin, an urethane-resin, and the like can be cited. The epoxy-resin is preferable one among them and, further, a phenol-based epoxy-resin is more preferable one. In particular, a bisphenol A-based epoxy-resin and a phenolic novolac-based epoxy resin are adequate for a fabricating method for fabricating an electronic device of the present invention.

A sheet of a resin disposed on a surface of a functional device other than that facing to a space portion makes an intimate contact with the other surface than that facing to the space portion of the functional device and envelops the functional device, and seals the functional device with the printed circuit board. Though, in the present invention, a condition for heating/melting and hardening is required to be properly controlled, after a temperature for heating/melting is raised to the range of 110–170° C., the gelation step is done in the temperature range of 90–150° C. for, for example, 0.5 hr, and hardening step is done in the temperature range of 100–160° C. for 3–20 hrs.

In a fabrication of an electronic device such as a surface acoustic wave device of the present invention; a sheet of a buffering member having a smaller size than that of a hot-melt type member is adhered on one main surface of the hot-melt type member; a surface of the hot-melt type member having a sheet of the buffering member on it is disposed in an opposite relation with the other main surface of a surface acoustic wave device having one main surface on which the wiring pattern is formed; at least the other main surface of the device and the sheet of the buffering member are intimately contacted to envelop the device as well as to seal the device with the printed circuit board. For a sheet of the buffering member, for example, such material as an elastic rubber sheet rich in elasticity can be cited. Instead, a metal foil or two sheet of a waxed paper can be laminated and can be disposed. Here, a size of a sheet of each layer can be smaller than that of the sheet of the resin and not necessarily required to be equal with, and an arbitrary shape can be also allowed. With these structures, a strain induced by a contraction or the difference of thermal expansions during hardening of the resin member can be alleviated. Further, since the buffering sheet can be easily aligned between the sealing resin portion and the surface acoustic wave device, an improvement in the productivity and reliability can be realized.

In a fabrication of an electronic device such as a surface acoustic wave apparatus of the present invention, a wiring pattern from one main surface of a printed circuit board is exposed between a peripheral edge of a resin portion and a peripheral edge of a printed circuit board not so as for the resin portion to envelop a wiring pattern, and, in this case, the wiring pattern can be connected with a concave formed wiring pattern along a side surface of the printed circuit board.

Therefore, when a surface acoustic wave device is mounted on a surface of a circuit board together with other passive devices based on a surface-mounting method, a connecting portion on a circuit board and a concave wiring pattern formed on a side surface of the printed circuit board can be easily connected with solder and the like.

According to a fabricating method for fabricating an electronic device of the present invention, a height of a wiring pattern connecting to a conductive connecting member, which electrically connects a printed circuit board and a functional device, can be controlled by adjusting a thickness of a printed circuit board material or a thickness of a conductive material in a wiring pattern, or by adjusting a height of a conductive connecting member itself for electrical connecting purpose. Thus, since a proper space portion can be secured between the printed circuit board and the functional device, even when a surface acoustic wave device disposed thereon with a surface acoustic wave absorption member is used as the functional device, the bonding strength between the surface acoustic wave device and the printed circuit board can be kept enough high, hence the reliability of the bonding can be improved.

In a fabricating method for fabricating an electronic device of the present invention, for example, a surface acoustic wave device, when a wiring pattern of a printed circuit board is formed, at least a part of a wiring pattern can be obtained by repeatedly coating a conductive paste with a screen printing method, thereafter followed by burning or cofiring.

Here, a thickness of the repeatedly coated and fired part is preferable to be thicker by in the range of 5–100 µm than that of the other part.

Further, in a fabricating method for fabricating an electronic device of the present invention, when a wiring pattern of a printed circuit board is formed, at least a part of the wiring pattern can be made thicker than that of the other part of the wiring pattern by using a film forming method such as a vapor depositing method or a sputtering method.

The difference between the above-described thicknesses is preferable to be not less than 0.5 µm.

Further, in a fabricating method for fabricating an electronic device of the present invention, when a printed circuit board is formed, a green sheet can be added to an area facing to a connecting member, which works as an electrical connecting portion, and a neighboring area and can be fired together, thereafter the wiring pattern is formed on the printed circuit board.

The difference between the thickness of the portion fired with added green sheet and that of the other part is preferable to be essentially in the range of 5–500 µm.

By employing a fabricating method for fabricating a printed circuit board described above, even if a thickness of a connecting member is small, since a thickness of a printed circuit board material of a wiring pattern portion or that of a conductive material can be added to that of the connecting member, an appropriate volume of a space portion can be effectively secured between a functional device and the printed circuit board. In particular, even if a surface acoustic wave device, which has a surface acoustic wave absorption member disposed on it, is used, a sufficient bonding strength can be kept between the acoustic surface wave device and the printed circuit board. Thus, the bonding strength can be improved and consequently the reliability too.

Further, in an electronic device of the present invention, in order to secure an appropriate volume of a space portion, a plurality of the conductive bumps piled up on nearly same place can be used in place of a conductive connecting member for electrically connecting purpose. Here, a total thickness of the plurality of the conductive bumps is preferable to be in the range of 30–150 µm. Instead, when the conductive ball bumps are employed as the conductive connecting member for bonding electrically, the thickness of the conductive ball bumps is controlled by varying a width of a conductive thin wire. Here, a ball bump essentially consisting of Au, Sn, Pb or the like is preferable as a conductive bump. Or, further, when a functional material is coated at least on one main surface or on a part of the other main surface of the functional device, in concrete, when a surface acoustic wave absorption member is coated at least on one main surface or on a part of the other main surface of the surface acoustic wave device, a functional material, that is, the surface acoustic wave absorption material can be coated thinner than the thickness of the conductive connecting member.

Thus, by controlling a thickness of a conductive connecting member for forming an electrically connecting portion, an appropriate volume of a space portion can be effectively secured between a functional device and a printed circuit board. Here, since there is no need to change partly a thickness of a board material of the printed circuit board or that of a conductive material, a fabrication of an electronic device is made simpler.

A fabricating method for fabricating an electronic device according to the present invention comprises the steps of: aligning a surface acoustic wave device to a printed circuit board at a predetermined position; assembling the surface acoustic wave device and the printed circuit board through a conductive bonding member with a predetermined spacing; disposing a hot-melt type member to the printed circuit board; and heating/melting the hot-melt type member while leaving a space portion between the printed circuit board and the surface acoustic wave device, wherein a transducer part and a plurality of wiring patterns electrically connecting to the transducer part are formed on one main surface of a wafer of a piezoelectric material which works as the surface acoustic wave device, and, after providing a plurality of the connecting member on a part of the wiring pattern, a blade speed of from not less than 10 mm/sec to not more than 50 mm/sec is employed in cutting and thus obtains the individual surface acoustic wave device.

In the present invention, a surface acoustic wave device is disposed on a printed circuit board at a predetermined position. In this case, a transducer portion and a plurality of wiring patterns which are electrically connected to the transducer portion are formed on one main surface of a wafer composed of a piezoelectric material serving as a surface acoustic wave device, and a plurality of connecting members are formed on a part of a wiring pattern. Then, the surface acoustic wave device and the printed circuit board are assembled through a conductive connecting member with a predetermined spacing. Then, a hot-melt type member is disposed to the printed circuit board and the hot-melt type member is heated and while leaving a space portion between the printed circuit board and the acoustic surface wave device. Finally, a blade speed is adjusted to cut at from not less than 10 mm/sec to not more than 50 mm/sec according to the plurally constructed wiring pattern, thus can obtain an individual surface acoustic wave device.

For the blade described above, a cutting tool such as a diamond-cutter is adopted appropriately.

By optimizing a cutting condition for cutting a wafer of a piezoelectric material during fabrication of the surface acoustic wave device as described above, an impairment caused by an electrostatic charge entailing the cutting operation can be avoided. More concretely, a transducer portion or an electrode pattern of the surface acoustic wave device can be avoided from degrading.

In the present invention, after a plurality of transducer portions and a wiring pattern connected electrically to the transducer portions are formed on a piezoelectric material, the conductive connecting members and the surface acoustic wave devices are collectively assembled, then after sealed by disposing such as a sheet of a resin, and a plurality of surface acoustic wave apparatuses are obtained by cutting. Thus, the productivity can be improved.

According to a fabricating method for fabricating an electronic device of the present invention, since a frame-shaped member is not necessarily required for preventing a hot-melt type member from intruding a space portion between a surface acoustic wave device and a printed circuit board, a step for forming a conventionally needed frame-shaped insulating member can be made unnecessary, and, consequently, a plurality of electronic devices having a simple structure can be simultaneously obtained. Further, by using a preformed sheet of a resin as a hot-melt type member and by connecting through heating/melting and hardening of it, the hot-melt type member can be easily prevented from intruding a surface of the surface acoustic wave device facing to a space portion, and, without affecting adversely on the surface acoustic wave device, the surface acoustic wave apparatus sealed with the resin can be easily manufactured forming a space portion between the surface acoustic wave device and the printed circuit board.

As a material for a printed circuit board, ceramic such as alumina, magnesia, silicon carbide and the like, glass-ceramic, multilayered ceramic substrate such as alumina and the like having built-in conductors or functional devices inside, and a resin substrate such as a glass-epoxy substrate including FR-4 can be cited. Further, on the printed circuit board, a marker for showing the diving area can be implemented.

According to a fabricating method for fabricating an electronic device of the present invention, a surface acoustic wave device can be mounted based on a face-down bonding method (a technology for directly bonding a chip in an upside-down relation to a package without the steps for die-bonding and wire-bonding) (for details of the face-down bonding method, see "Kagaku Daijiten (Chemical Dictionary)", Maruzen K. K., page 1189, Mar. 5, 1985). The face-down bonding method includes, in concrete, flip chip method, beam lead method, TAB method, pedestal method and the like. In the present invention, such as a sheet of a thermo-setting resin is employed as a sealing member during the sealing step, and, through hardening of a surface or the whole of the resin by heating, the surface acoustic wave device and the printed circuit board are sealed maintaining a space portion between the main surface of the surface acoustic wave device which is opposed to the printed circuit board and the printed circuit board.

The respective printed circuit boards constituting a part of an electronic device of the present invention can be provided with wiring patterns, depending on the mounting method, on one main surface only or on both of the one main surface and another main surface. Further, in the case of a surface acoustic wave device, in order to secure a space portion, a transducer portion composed of an electrode having a comb-shaped pattern and a wiring pattern electrically connected to the transducer portion are required to be formed on one surface.

A surface acoustic wave device and a printed circuit board can be connected through a conductive connecting member laid down between them, wherein a spacing of a space portion formed according to the present invention is, depending on a shape of the conductive connecting member, 10–200 μm, and preferable to be 20–80 μm.

In the present invention, a conductive connecting member is defined as a means for electrically connecting a surface acoustic wave device and a printed circuit board and fixing them. So-called bump or a conductive resin can be used, for example. For a bump, a ball-bump, a plated bump and the like are cited, and for a conductive resin, a conductive paste, an anisotropic conductive resin and the like are included.

In the present invention, the above-described member can be applied singly or in parallel. These are all included in the present invention.

For a conductive connecting member for electrically connecting a wiring pattern on a printed circuit board and a wiring pattern on a surface acoustic wave device such as a conductive bump, there are a conductive metal plated resin ball and such metal bumps as formed of Au, Ag, the solders (Sn-based, Pb-based, In-based and the like) and the like.

These conductive bumps, by bonding a printed circuit board and a surface acoustic wave device under a definite temperature and pressure, connect electrically a wiring pattern on a printed circuit board and a wiring pattern on a surface acoustic wave device and form and secure a space portion between the surface acoustic wave device and the printed circuit board. In order to secure a definite space portion, a metal bump composed of such as Au, Ag, the solders and the like are preferable as a conductive bump.

In a fabricating method for fabricating an electronic device of the present invention, by covering and hardening a printed circuit board having a surface acoustic wave device thereon with a hot-melt type member, the electronic device is assembled on the printed circuit board and is divided to constitute surface acoustic wave apparatuses. Here, when a preformed sheet of an epoxy type resin, for example, is used as the hot-melt type member and a surface or the whole of the resin is melted and hardened by heating, the surface acoustic wave device and the printed circuit board can be connected. Here, since a viscosity of the resin can be kept high, the resin can be prevented from spreading into a space portion formed on a side of the surface acoustic wave device facing to the printed circuit board during hardening. Further, since the resin is not a liquid type, a frame-shaped insulating wall or a dam is not necessarily required. However, the frame-shaped insulating member can improve a sealing effectiveness and is included in the present invention.

The liquid type thermo-setting resin used as a conventional sealing resin member, for example, such as an epoxy-based resin for potting use, has such a low viscosity as 15 Pa·s, and the viscosity does not rise high and remains low even after a temperature is raised up to 100–200° C. Therefore, without a frame-shaped insulating member, a sealing member can not be prevented from flowing into a space portion between a printed circuit board and a functional device and the function of the functional device is liable to be impaired.

Nevertheless, according to a fabricating method for fabricating an electronic device of the present invention, by using a preformed sheet of an epoxy type resin, until the resin starts melting by heating, a viscosity can be kept high. Even after the resin finishes melting, by controlling a hardening state, a viscosity of not less than at least 50 Pa·s can be obtained. Thus, a surface acoustic wave device can be easily covered.

A sheet of a resin can be easily obtained by cold pressing powder of raw material, for example, such as an epoxy resin into a required shape and weight. The sheet of the resin is disposed on other main surface of a surface acoustic wave device than that on which a space portion is formed, that is, not on a main surface on which a wiring pattern of the surface acoustic wave device is formed but on the other surface side.

The shape of the sheet of the resin in this case is preferred to be equal with a shape of the printed circuit board or a little bit smaller than that after division. The more preferred shape of the sheet of the resin is nearly equal to that of the printed circuit board before to cutting.

Implementing like this, alignment of a sheet of a resin to a surface acoustic wave device and a printed circuit board prior to the division can be secured.

The selection of a size can be appropriately done depending on a total volume of a surface acoustic wave device and a thickness of a sheet of a resin.

A sheet of a resin disposed on a surface of a surface acoustic wave device other than that facing a space portion, is made to build an intimate contact with at least the other main surface of the device and envelops the device through heating/melting and hardening of the resin, thus seals the surface acoustic wave device with a printed circuit board.

Though a condition of heating/melting and hardening is required to be adequately controlled in this case, in the present invention, the temperature of heating/melting a hot-melt type member of a sheet of a resin is 100–200° C., and the hardening time is 20–2 hrs. More preferably, after the heating/melting step is executed in the temperature range of 110–170° C., the hardening step is done in the temperature range of 100–160° C. for 3–20 hrs.

In a fabrication of an electronic device, namely, a surface acoustic wave apparatus of the present invention; a sheet of a buffering member having a smaller shape than that of a hot-melt type member is adhered on one main surface of the hot-melt type member; a surface of the hot-melt type member, on which the sheet of the buffering member is disposed, is disposed in an opposite relation with other main surface of a surface acoustic wave device which has one main surface on which the wiring pattern is formed; at least the other main surface of the respective devices and the buffering sheet are, by heating/melting/hardening, made to contact intimately and to envelop the surface acoustic wave device as well as to seal the surface acoustic wave device with a printed circuit board. For the sheet of the buffering member, for example, such material as an elastic rubber sheet rich in elasticity can be cited. Instead, a metal foil or two-layered waxed paper can be laminated to be disposed. Here, the shape of the sheet of each layer can be smaller than that of the sheet of the resin and not necessarily required to be equal with that, and also can be arbitrary. With these structures, a strain caused by a contraction or the difference of the thermal expansions during hardening of the resin member can be alleviated. Further, because alignment of the buffering sheet between the resin member for sealing and the surface acoustic wave device can be easily executed, the improvement of the productivity and reliability can be attained.

According to a fabricating method for fabricating an electronic device of the present invention, the height of a wiring pattern connected to a conductive connecting member, which constitutes an electrical connecting part between a printed circuit board and a surface acoustic wave device, can be controlled by varying partly the thickness of the printed circuit board material or that of the conductive material in the wiring pattern, or, by controlling the height of the conductive connecting member itself which constitutes the electrical connecting part, thereby a proper space portion can be secured between the printed circuit board and the surface acoustic wave device. Thus, even when the surface acoustic wave device having the surface acoustic wave absorption member thereon are used as a functional device, the bonding strength between the surface acoustic wave device and the printed circuit board can be kept enough high, hence the reliability of the bonding can be improved.

In a fabricating method of an electronic device of the present invention, namely, a surface acoustic wave apparatus, when a wiring pattern of a printed circuit board is formed, a repeated coating of a conductive paste by screen printing method is executed at least on a part of the wiring pattern, thereafter burning or cofiring step is followed.

Here, the thickness of the repeatedly coated and fired part is preferable to be thicker by in the range of 5–100 $\mu$m than that of the other part.

Further, in a fabricating method of an electronic device of the present invention, when a wiring pattern of a printed circuit board is formed, at least a part of the wiring pattern can be made thicker than that of the other part of the wiring pattern by using a film forming method such as a vapor depositing method or a sputtering method.

The difference between the above-described thicknesses is preferable to be not less than 0.5 $\mu$m.

Further, in a fabricating method of an electronic device of the present invention, when a printed circuit board is formed, a green sheet can be added to an area facing to a connecting member used for electrical connecting and it's neighboring area, and, thereafter, the wiring pattern is formed on the printed circuit board.

The difference between the thickness of a part fired with added green sheet and that of the other part is preferable to be essentially in the range of 5–500 $\mu$m.

By adopting the fabricating method for fabricating the printed circuit board described above, even if the thickness of a connecting member is small, since the thickness of the part of a printed circuit board material pertaining to a wiring pattern or that of a conductive material can be added to that of the connecting member, an adequate volume of a space portion can be effectively secured between a surface acoustic wave device and a printed circuit board. In particular, even in the case of the surface acoustic wave device having the surface acoustic wave absorption member disposed on it, a sufficient bonding strength can be kept between the surface acoustic wave device and the printed circuit board. Thus, the bonding strength can be improved and consequently the reliability too.

Further, in an electronic device of the present invention, in order to secure an adequate volume of a space portion, a plurality of conductive bumps piled up on nearly same place can be used as a conductive connecting member constituting electrical connecting portion. Here, a total thickness of a plurality of conductive bumps is preferable to be in the range of 30–150 $\mu$m. Instead, when a conductive ball bump is applied as a conductive connecting member for connecting electrically, the thickness of the conductive ball bumps is controlled by varying the width of a conductive thin wire. Here, the ball bump essentially consisting of Au, Sn, Pb and the like are preferable as the conductive bump. Or, when a surface acoustic wave absorption material is coated at least on one main surface or on a part of the other main surface of the surface acoustic wave device, a functional material, that is, the surface acoustic wave absorption material can be coated thinner than the thickness of the conductive connecting member.

Thus, by controlling the thickness of a conductive connecting member which forms an electrically connecting part, a proper volume of a space portion can be effectively secured between a surface acoustic wave device and a printed circuit board. Here, since there is no need to change partly the thickness of the board material of the printed circuit board or that of a conductive material, a plurality of electronic devices is more easily manufactured.

A fabricating method for fabricating an electronic device of the present invention comprises the steps of: aligning a surface acoustic wave device to a printed circuit board at a predetermined position; assembling the surface acoustic wave device and the printed circuit board through a conductive connecting member with a predetermined spacing; disposing a hot-melt type member on the printed circuit board; and heating and melting the hot-melt type member while leaving a space portion between the printed circuit board and the surface acoustic wave device, wherein a plurality of transducer part and the wiring pattern electrically connected to the transducer part are formed on a main surface of a wafer consisting of a piezoelectric material which constitutes the surface acoustic wave device, and, after providing a plurality of the connecting member on a part of the wiring pattern, a cutting operation is executed with water having an electrical resistivity of from not less than 0.01 MΩcm to not more than 100 MΩcm to obtain the individual acoustic surface wave device.

In the present invention, a surface acoustic wave device is aligned to a printed circuit board at a predetermined position, wherein a plurality of transducer parts and wiring patterns, which are electrically connected to the transducer part, are formed on a main surface of a wafer consisting of a piezoelectric material which constitutes the surface acoustic wave device, and a plurality of connecting members are formed on a part of the wiring pattern. Next, the surface acoustic wave device and the printed circuit board are connected through a conductive connecting member with a predetermined spacing. Then, a hot-melt type member is disposed on the printed circuit board and is heated/melted while leaving a space portion between the printed circuit board and the surface acoustic wave device. Finally, a cutting operation is executed with water having an electrical resistivity adjusted to from not less than 0.01 MΩcm to not more than 100 MΩcm corresponding to a plurality of wiring patterns to obtain the individual surface acoustic wave device.

By controlling the conditions of cutting the wafer of a piezoelectric material during fabricating a surface acoustic wave device described above, impairment caused by an electrostatic charge entailing the cutting operation can be avoided. More concretely, a transducer part or the wiring pattern of an electrode of a surface acoustic wave device can be avoided from deterioration.

In the present invention, after a plurality of transducer portions and the wiring patterns which are electrically connected to the transducer portions are formed on a piezoelectric material, conductive connecting members and surface acoustic wave devices are collectively assembled and sealed, for example, by disposing a sheet of a resin, then, by cutting it, a plurality of surface acoustic wave apparatus can be obtained. Thus, the productivity can be improved.

According to a fabricating method of an electronic device of the present invention, since a frame-shaped insulating member is not necessarily required for preventing a hot-melt type member from intruding the respective space portions formed between the surface acoustic wave devices and the printed circuit boards, a step for forming a conventionally needed frame-shaped insulating member can be made unnecessary and, further, a plurality of electronic devices having a simple structure can be obtained simultaneously. Further, by using such as a preformed sheet of a resin as a hot-melt type member and by connecting through heating/melting and hardening of the resin, the hot-melt type member can be easily prevented from intruding into a surface facing to a space portion of the surface acoustic wave device, and, without adversely affecting on the surface acoustic wave device, the surface acoustic wave apparatus sealed with the resin is easily fabricated leaving the space portion between the surface acoustic wave device and the printed circuit board.

For material used for the printed circuit board, ceramic such as alumina, magnesia, silicon carbide and the like, glass-ceramic, a multilayered ceramic substrate such as alumina and the like having built-in conductors or functional devices inside, and a resin substrate such as a glass-epoxy substrate including FR-4 can be cited. Further, on the printed circuit board, markers for showing dividing areas can be provided.

According to a fabricating method for fabricating an electronic device of the present invention, a surface acoustic wave device can be mounted based on a face-down bonding method (a technology for directly bonding a chip in an upside-down relation to a package without the steps for die-bonding and wire-bonding) (for details of the face-down bonding method, see "Kagaku Daijiten (Chemical Dictionary)", Maruzen K. K., page 1189, Mar. 5, 1985). The face-down bonding method includes, in concrete, flip chip method, beam lead method, TAB method, pedestal method and the like. In the present invention, a sheet of a thermosetting resin, for example, is applied as a sealing member during the sealing step; the surface or the whole of the resin is melted and hardened by heating; thereby the surface acoustic wave device and the printed circuit board are sealed leaving a space portion between the main surface of the surface acoustic wave device facing to the printed circuit board and the printed circuit board.

The respective printed circuit boards constituting a part of an electronic device of the present invention can be provided with a wiring pattern, depending on a mounting method, on one main surface only or on both of the one main surface and another main surface. Further, in the case of a surface acoustic wave device, in order to secure a space portion, a transducer portion composed of an electrode having a comb-shaped pattern and the wiring pattern electrically connected to the transducer part are necessitated to be formed on one surface.

A surface acoustic wave device and a printed circuit board can be connected through a conductive connecting member laid down between them, wherein a spacing of a space portion formed according to the present invention is, depending on a shape of the conductive connecting member, 10–200 μm, and preferable to be 20–80 μm.

In the present invention, a conductive connecting member is defined as a means for electrically connecting a surface acoustic wave device and a printed circuit board and fixing them. So-called bump or conductive resin can be used, for example. For a bump, a ball-bump, a plated bump and the like are cited, and for a conductive resin, a conductive paste, an anisotropic conductive resin and the like are included.

In the present invention, the above-described member can be applied singly or in parallel. These are all included in the present invention.

For a member for electrically connecting a wiring pattern on a printed circuit board and a wiring pattern on a surface acoustic wave device such as a conductive bump, there are a conductive metal plated resin ball and a metal bump formed of Au, Ag, the solders (Sn-based, Pb-based, In-based and the like) and the like.

These conductive bumps, through connecting a printed circuit board and a surface acoustic wave device under a definite temperature and pressure, connect electrically a wiring pattern on the printed circuit board and a wiring pattern on the surface acoustic wave device and thereby form and secure a space portion between the surface acoustic wave device and the printed circuit board. In order to secure a definite space portion, a metal bump made of such as Au, Ag, the solders and the like is preferable as a conductive bump.

In a fabricating method for fabricating an electronic device of the present invention, a hot-melt type member envelops a printed circuit board having a surface acoustic wave device bonded thereon and hardens, thereby the device is assembled on the printed circuit board and the assembled body is divided to constitute surface acoustic wave apparatuses. Here, when the surface acoustic wave device and the printed circuit board are connected through melting and hardening of the surface or the whole of the preformed sheet of an epoxy-based resin, which works as a thermo-setting resin, by heating, since the viscosity of the resin can be kept high, the surface acoustic wave device and the printed circuit board can be connected preventing the resin from intruding the space portion formed on the side of the acoustic surface wave device facing to the printed circuit board during hardening. Further, since the resin is not a liquid type, a frame-shaped insulating wall or a dam is not necessarily required. However, the frame-shaped insulating member can improve the effect of the sealing and is included in the present invention.

The liquid type thermo-setting resin used as a conventional sealing resin member, for example, an epoxy-based resin for potting use, has such a low viscosity as 15 Pa·s, the viscosity does not rise high and remains low even after the temperature is raised up to 100–200° C., therefore, without the frame-shaped insulating member, the sealing member spreads into a space portion between the printed circuit board and the functional device and can not maintain the space portion. Thus, the function of the functional device is impaired.

Nevertheless, according to a fabricating method for fabricating an electronic device of the present invention, when a sheet of an epoxy based resin is employed, until the resin begins melting by heating, a high viscosity state can be kept and a hardening state can be controlled even after melting, and the viscosity of at least not less than 50 Pa·s is attained. Thus, the surface acoustic wave device is easily covered.

The sheet of a resin can be easily obtained by cold pressing powder of raw material, for example, an epoxy resin into a required shape and weight. The film is disposed on the other main surface of the acoustic surface wave device than one main surface on which a space portion is formed, that is, not on the main surface on which the wiring pattern of the surface acoustic wave device is formed but on the other surface.

The shape of a sheet of a resin in this case is preferred to be a little bit smaller than that of a printed circuit board or nearly equal to that after division. The more preferable shape of the sheet is nearly equal to that of the printed circuit board prior to division.

By implementing like this, alignment of the sheet of the resin to the surface acoustic wave device and the printed circuit board prior to the division can be secured.

The selection of a dimension can be appropriately done depending on the total volume of a surface acoustic wave device and the thickness of the sheet of the resin.

The sheet of a resin disposed on the surface of the surface acoustic wave device other than that facing a space portion, is made to build an intimate contact with at least the other main surface of the device and envelops the device by heating/melting and hardening it, thus seals the surface acoustic wave device with the printed circuit board.

Though the conditions of heating/melting and hardening are required to be adequately controlled in this case, in the present invention, the temperature of heating/melting the hot-melt type member composed of the sheet of the resin is 100–200° C., and the hardening time is 20–2 hrs. More preferably, after heated and melted in the temperature range of 110–170° C., the resin is hardened for 3–20 hrs in the range of temperature of 100–160° C.

In a fabrication of an electronic device, namely, a surface acoustic wave apparatus of the present invention; a sheet of a buffering member having a smaller shape than that of a hot-melt type member is adhered on one main surface of the hot-melt type member; the buffering sheet side of the hot-melt type member is disposed in an opposite relation with the other main surface of the acoustic surface wave device having one main surface on which the wiring pattern is formed; at least the other main surfaces of the respective devices and the buffering sheet are, by heating/melting/hardening, made to contact intimately to envelop the surface acoustic wave device as well as to seal the surface acoustic wave device with the printed circuit board. For the sheet of the buffering member, for example, such material as an elastic rubber sheet rich in elasticity can be cited. Instead, a metal foil or a two-layered waxed paper can be laminated to be disposed. Here, the size of the sheet of each layer can be smaller than that of the sheet of the resin and not necessarily required to be equal with that, and any shape can be acceptable. With these structures, a strain caused by a contraction or the difference of the thermal expansions during hardening of the resin member can be alleviated. Further, because alignment of the buffering sheet between the resin member for sealing and the surface acoustic wave device can be easily executed, the productivity and reliability can be improved.

According to a fabricating method for fabricating an electronic device of the present invention, the height of the wiring pattern connected to the conductive connecting member which constitutes an electrical connecting part between a printed circuit board and a surface acoustic wave device can be controlled by varying partly the thickness of a printed circuit board material or that of a conductive material in the wiring pattern, or, by controlling the height of a conductive connecting member itself constituting the electrical connecting part, thereby proper space portions can be secured between the printed circuit boards and the surface acoustic wave devices. Thus, even in the case of the surface acoustic wave device having a surface acoustic wave absorption member thereon, the bonding strength between the surface acoustic wave device and the printed circuit board can be kept enough high, hence the reliability of the bonding can be improved.

In a fabricating method of the electronic device, namely, a surface acoustic wave apparatus of the present invention, when a wiring pattern of a printed circuit board is formed, a repeated coating of a conductive paste by screen printing method can be executed at least on a part of the wiring pattern, thereafter burning or cofiring step is followed.

Here, the thickness of the repeatedly coated and fired part after firing is preferable to be thicker by in the range of 5–100 μm than that of the other part.

Further, in a fabricating method of the electronic device of the present invention, when a wiring pattern of a printed circuit board is formed, at least a part of the wiring pattern can be made thicker than that of the other part of the wiring pattern by using a sheet forming method such as the vapor depositing method or the sputtering method.

The difference between the above-described thicknesses is preferable to be not less than 0.5 μm.

Further, in a fabricating method of the electronic device of the present invention, when a printed circuit board is formed, a green sheet can be added to an area opposing to a connecting member used for electrical connecting use and it's neighboring area and fired, thereby a wiring pattern is formed on the printed circuit board.

The difference between the thickness of the portion fired with added green sheet and that of the other portion is preferable to be essentially in the range of 5–500 μm.

By adopting a fabricating method for fabricating a printed circuit board described above, even if a thickness of a connecting member is small, since a thickness of the portion of a printed circuit board material of a wiring pattern or that of a conductive material can be added to that of the connecting member, an adequate volume of a space portion can be effectively secured between a surface acoustic wave device and a printed circuit board. In particular, even in the case of the surface acoustic wave device having the surface acoustic wave absorption member disposed on it, a bonding strength can be kept high between the surface acoustic wave device and the printed circuit board. Thus, the bonding strength and the reliability can be improved.

Further, in the electronic device of the present invention, in order to secure an adequate volume of a space portion, a plurality of conductive bumps piled up on nearly same place can be used as a conductive connecting member constituting an electrical connecting portion. Here, a total thickness of a plurality of conductive bumps is preferable to be in the range of 30–150 $\mu$m. Instead, the total thickness can be controlled by employing conductive ball bumps as the conductive connecting member for connecting electrically, and further by varying the width of a conductive thin wire. Here, ball bumps essentially consisting of Au, Sn, Pb and the like are preferable as the conductive bump. Or, when a surface acoustic wave absorption material is coated at least on one main surface or on a part of the other main surface of the surface acoustic wave device, the functional material, that is, the surface acoustic wave absorption material can be coated thinner than the thickness of the conductive connecting member.

Thus, by controlling the thickness of a conductive connecting member which forms an electrically connecting portion, a proper volume of a space portion can be effectively secured between a surface acoustic wave device and a printed circuit board. Here, since there is no need to change partly the thickness of the board material of the printed circuit board or that of the conductive material, a plurality of electronic devices is manufactured more easily.

A fabricating method for fabricating the electronic device of the present invention comprises the steps of: aligning a surface acoustic wave device to a printed circuit board at a predetermined position; assembling the surface acoustic wave device and the printed circuit board through a conductive connecting member with a predetermined spacing; disposing a hot-melt type member on the printed circuit board; and heating and melting the hot-melt type member while leaving a space portion between the printed circuit board and the surface acoustic wave device, wherein, after providing the conductive connecting member on the wiring pattern formed at least on one main surface of the printed circuit board, the printed circuit board and the functional device are connected with the conductive connecting member with a predetermined spacing.

In the present invention, a functional device is aligned to a printed circuit board at a predetermined position, wherein a conductive connecting member is formed on a wiring pattern formed at least on one main surface of a printed circuit board. Next, the functional device and the printed circuit board are connected with the connecting member with a predetermined spacing. Then, a hot-melt type member is disposed on the printed circuit board, thereafter the hot-melt type member is heated/melted while leaving a space portion between the printed circuit board and the functional device.

By implementing like this, since the thermal history inflicted on a boundary region connecting a functional device and a conductive connecting member can be alleviated, the bonding strength can be improved and, further, the reliability also can be improved.

According to a fabricating method for fabricating the electronic device of the present invention, since a frame-shaped member is not necessarily required for preventing a hot-melt type member from intruding respective space portions formed between a functional device and a printed circuit board, the step for mounting a conventionally needed frame-shaped insulating member is made unnecessary and the electronic device having a simple structure can be obtained. Further, by using a preformed sheet of a resin as a hot-melt type member and by bonding through heating/melting and hardening of the resin, the hot-melt type member can be easily prevented from intruding the surface facing to a space portion of the functional device. Thus, without adversely affecting on the functional device, the electronic device sealed with the resin can be easily fabricated leaving the space portion between the functional device and the printed circuit board.

For material used for a printed circuit board, ceramic such as alumina, magnesia, silicon carbide and the like, glass-ceramic, a multilayered ceramic substrate such as alumina and the like having built-in conductors or functional devices inside, and a resin substrate such as a glass-epoxy substrate including FR-4 can be cited. Further, on the printed circuit board, marker for showing an area to be divided can be provided.

For a functional device, for example, a surface acoustic wave device, a quartz oscillator or resonator, a piezoelectric oscillator or resonator, a photocoupler having a pair of light sending part and light receiving part, an EPROM, a CCD, a semiconductor laser, or a light-emitting diode are cited.

According to a fabricating method for fabricating an electronic device of the present invention, a functional device can be mounted based on a face-down bonding method (a technology for directly bonding a chip in an upside-down relation to a package without the steps for die-bonding and wire-bonding) (for details of the face-down bonding method, see "Kagaku Daijiten (Chemical Dictionary)", Maruzen K. K., page 1189, Mar. 5, 1985). The face-down bonding method includes, in concrete, flip chip method, beam lead method, TAB method, pedestal method and the like. In the present invention, a sheet of a thermosetting resin, for example, is applied as a sealing member during the sealing step; the surface or the whole of the resin is melted and hardened by heating; thereby a surface acoustic wave device and a printed circuit board are sealed leaving a space portion between the main surface of the surface acoustic wave device which faces to the printed circuit board and the printed circuit board.

The respective printed circuit board constituting a part of an electronic device of the present invention can be provided with a wiring pattern, depending on the mounting method, on one main surface only or on both of the one main surface and another main surface.

A functional device and a printed circuit board can be connected with a conductive connecting member laid down between them, wherein a spacing of a space portion formed according to the present invention is, depending on a shape of the conductive connecting member, 10–200 $\mu$m, and preferable to be 20–80 $\mu$m.

In the present invention, a conductive connecting member is defined as a means for electrically connecting a device (functional device) and a printed circuit board and fixing them. So-called bump or a conductive resin can be used, for example. For the bump, a ball-bump, a plated bump and the like are cited, and for the conductive resin, a conductive paste, an anisotropic conductive resin and the like are included.

In the present invention, the above-described member can be applied singly or in parallel. These are all included in the present invention.

For the member for electrically connecting a wiring pattern on a printed circuit board and a wiring pattern on a device (functional device) such as a conductive bump, there are a conductive metal plated resin ball and metal bumps composed of such as Au, Ag, the solders (Sn-based, Pb-based, In-based and the like) and the like.

These conductive bumps, through connecting a printed circuit board and a device (functional device) under a definite temperature and pressure, connect electrically a wiring pattern on the printed circuit board and a wiring pattern on the device(functional device) and thereby form and secure a space portion between the device (functional device) and the printed circuit board. In order to secure a definite space portion, the metal bumps composed of such as Au, Ag, the solders and the like are preferable as a conductive bump.

In a fabricating method for fabricating the electronic device of the present invention, a hot-melt type member envelops a printed circuit board having a functional device bonded thereon and hardens, thereby the device is mounted on the printed circuit board, and, after that, the mounted device is divided to constitute the acoustic surface wave apparatus. Here, when such as a preformed sheet of an epoxy type resin is used as a thermo-setting resin and the functional device and the printed circuit board are connected through melting and hardening of the surface or the whole of the resin by heating, since the viscosity of the resin can be kept high, the functional device and the printed circuit board can be connected preventing the resin from intruding the space portion formed on the side of the functional device facing to the printed circuit board during hardening step. Further, since the resin is not a liquid type, a frame-shaped insulating wall or a dam is not necessarily required. However, the frame-shaped insulating member can improve the sealing effectiveness and is included in the present invention.

The liquid type thermo-setting resin such as an epoxy-based resin for potting use used as a conventional sealing resin member has such a low viscosity as 15 Pa·s, the viscosity does not rise high and remains low even after the temperature is raised up to 100–200° C. Therefore, the sealing member can not be prevented from flowing into a space portion between the printed circuit board and the functional device and the space portion can not be maintained without a frame-shaped insulating member. Thus, the function of the functional device is impaired.

Nevertheless, according to a fabricating method for fabricating the electronic device of the present invention, when a sheet of an epoxy based resin is applied, until the resin begins to melt by heating, a higher viscosity state can be kept and be controlled even after melting of the resin, and the viscosity of at least not less than 50 Pa·s is attained. Thus, a surface acoustic wave device can be easily covered.

The sheet of a resin such as an epoxy resin can be easily obtained by cold pressing powder of raw material into a required shape and weight. The sheet is disposed on one other main surface than a main surface on which a space portion of a functional device is formed.

The shape of a sheet of a resin in this case is preferred to be a little bit smaller than that of a printed circuit board or nearly equal to that after cutting. The more preferable shape of the sheet is nearly equal to that of the printed circuit board before division.

Implementing like this, alignment of a sheet of a resin to a functional device and a printed circuit board prior to the division can be secured.

The selection of a size can be properly done depending on the total volume of a functional device and the thickness of a sheet of a resin.

A hot-melt type member such as a sheet of a resin, which is disposed on the surface of a functional device other than that facing a space portion, is made to build an intimate contact with at least the other main surface of the device and envelops the device by heating/melting and hardening, and thus seals a surface acoustic wave device with a printed circuit board.

Though the conditions for heating/melting and hardening are required to be adequately controlled in this case, in the present invention, the temperature for heating/melting a sheet of a resin is 100–200° C., and the hardening time is 20–2 hrs. More preferably, after a heating/melting step is executed in the temperature range of 110–170° C., a hardening step is done in the temperature range of 100–160° C. for 3–20 hrs.

In a fabrication of an electronic device of the present invention; a sheet of a buffering member having a smaller shape than that of a hot-melt type member is adhered on one main surface of the hot-melt type member; the buffering sheet adhered side of the hot-melt type member is disposed in an opposite relation with the other main surface of a functional device other than one main surface on which the wiring pattern is formed; at least the other main surface of the respective device and the buffering sheet are, by heating/melting and by hardening, made to contact intimately to envelop the functional device as well as to seal the functional device with a printed circuit board. For the sheet of the buffering member, for example, such material as an elastic rubber sheet rich in elasticity can be cited. Instead, a metal foil or a two-layered waxed paper can be disposed. Here, the shape of the sheet of each layer can be smaller than that of the sheet of the resin and are not necessarily required to be equal with that, and any shape can be acceptable. With these structures, the strain caused by contraction or the difference of the thermal expansions during hardening of the resin member can be alleviated. Further, since the buffering sheet can be easily aligned between the resin member for sealing and the device, the productivity and reliability can be improved.

According to a fabricating method for fabricating an electronic device of the present invention, a height of a wiring pattern connected to a conductive connecting member, which constitutes an electrical connecting part between the printed circuit board and a functional device, can be controlled by varying partly the thickness of the printed circuit board material or that of the conductive material in the wiring pattern, or, by controlling the height of the conductive connecting member itself which constitutes the electrical connecting portion, thereby a proper space portion can be secured between the printed circuit board and the functional device. Thus, even in the case of a surface acoustic wave device having a surface acoustic wave absorption member thereon, the bonding strength between the surface acoustic wave device and the printed circuit board can be kept enough strong, hence the reliability of bonding can be improved.

In a fabricating method for fabricating an electronic device of the present invention, when a wiring pattern of a printed circuit board is formed, a conductive paste can be repeatedly coated at least on a part of the wiring pattern by screen printing method, thereafter burning or cofiring step can be followed.

Here, the thickness of the repeatedly coated and fired part is preferable to be thicker than that of the other part by in the range of 5–100 $\mu$m.

Further, in a fabricating method of an electronic device of the present invention, when a wiring pattern of a printed circuit board is formed, at least a part of the wiring pattern can be made thicker than the other part of the wiring pattern by using the film forming method such as a vapor depositing method or a sputtering method.

The difference between the above-described thicknesses is preferable to be not less than 0.5 $\mu$m.

Further, in a fabricating method of an electronic device of the present invention, when a printed circuit board is formed, a green sheet can be added to an area opposing to a connecting member used for electrical connecting use and it's neighboring area and the printed circuit board is fired, thereby a wiring pattern is formed on the printed circuit board.

The difference between the thickness of the part fired with added green sheet and that of the other part is preferable to be essentially in the range of 5–500 $\mu$m.

By adopting the fabricating method for fabricating a printed circuit board described above, even when a thickness of a connecting member is small, since the thickness of a printed circuit board material of the wiring pattern portion or that of a conductive material can be added to that of a connecting member, an adequate volume of a space portion can be effectively secured between a surface acoustic wave device and a printed circuit board. In particular, even in the case of a functional device having a functional material disposed on it, a bonding strength can be kept high between the functional device and the printed circuit board. Thus, the bonding strength can be improved and consequently the reliability too.

Further, in an electronic device of the present invention, a total thickness of conductive bumps is preferable to be in the range of 30–150 $\mu$m. Instead, when a conductive ball bump is employed as a conductive connecting member for connecting electrically, the thickness of the conductive ball bump is controlled by varying a width of a conductive thin wire. Here, ball bumps essentially consisting of Au, Sn, Pb and the like are preferable as the conductive bump. Or, when a functional material is coated at least on one main surface or on a part of the other main surface of the functional device, the functional material can be coated thinner than the thickness of the conductive connecting member.

Thus, by controlling the thickness of the conductive connecting member which forms an electrically connecting portion, a proper volume of a space portion can be effectively secured between a functional device and a printed circuit board. Here, since there is no need to change partly the thickness of the board material of the printed circuit board or that of a conductive material, a plurality of electronic devices can be fabricated more easily.

An electronic device of the present invention which will be explained below comprises; a printed circuit board having a first surface and a second surface; a functional device having a first surface and a second surface, the first surface being disposed in an opposite relation with the first surface of the printed circuit board; and a hot-melt type member for sealing a space portion between the first surface of the printed circuit board and the first surface of the functional device while leaving the space portion.

A fabricating method for fabricating an electronic device such as described above can, for example, comprises the steps of; disposing a first surface of a printed circuit board in an opposite relation with a first surface of a functional device; disposing a hot-melt type member above the first surface of the printed circuit board and/or a second surface of the functional device; and sealing a space portion between the printed circuit board and the functional device while leaving the space portion at least between the printed circuit board and the functional device by heating/melting the hot-melt type member.

A fabricating method for fabricating an electronic device can comprises the steps of; disposing a first surface of a printed circuit board in an opposite relation with a first surface of a functional device; pouring a liquid thermo-setting member from above the first surface of the printed circuit board and/or a second surface of the functional device at a predetermined position; and, while heating/melting the poured thermo-setting member, sealing a space portion between the printed circuit board and the functional device leaving the space portion at least between the printed circuit board and the functional device.

Further, a fabricating method for fabricating an electronic device, for example, comprises the steps of; disposing a first surface of a printed circuit board in an opposite relation with a first surface of a functional device; heating and hardening a liquid thermo-setting member while dripping the liquid member from above the first surface of the printed circuit board and/or a second surface of the functional device at a predetermined position; and sealing a space portion between the printed circuit board and the functional device while leaving the space portion at least between the printed circuit board and the functional device.

Here, any heating means for melting a hot-melt type member or means for hardening a thermo-setting member can be applied. For example, an indirect heating means such as irradiation of the high-frequency, the electromagnetic wave, the ultrasonic wave, the light and the like can be applied.

According to an electronic device of the present invention such as a surface acoustic wave apparatus, a frame-shaped insulating member is not necessarily required for preventing a hot-melt type member from intruding a space portion formed between a surface acoustic wave device and a printed circuit board. As a result, the electronic device having a simple structure can be obtained. Further, by using such as a preformed sheet of a resin as the hot-melt type member and by connecting through heating/melting and hardening of it, the resin can be easily prevented from intruding into, in particular, the surface of the transducer of a surface acoustic wave device. Thus, a surface acoustic wave apparatus sealed with the resin can be easily fabricated leaving a space portion between the surface acoustic wave device and a printed circuit board without adversely affecting on the surface wave propagating path of the surface acoustic wave device.

Further, by connecting through pouring/dripping and hardening a resin for sealing such as a liquid type resin, the resin for sealing can be, without a frame-shaped insulating member, prevented from spreading into a space portion formed between a surface acoustic wave device and a printed circuit board. Thus, the electronic device having a simple structure can be obtained. In addition, since the resin spread over the side surface of the surface acoustic wave device works as a surface acoustic wave absorption member (sound wave absorber) which absorbs an unnecessary surface acoustic wave, an unnecessary spurious radiation can be attenuated and thereby the characteristics of a surface acoustic wave apparatus is improved. Further, by hardening the liquid of the resin, the printed circuit board and the surface acoustic wave device can be sealed.

Still further, an electronic device of the present invention comprises; a printed circuit board having a first surface and a second surface, a wiring pattern being formed at least on the first surface of the printed circuit board; a functional device having a first surface and a second surface, the first surface being disposed in an opposite relation with the first surface of the printed circuit board; a conductive film formed on the second surface of the functional device; a conductive material electrically connecting between the conductive film and a wiring pattern on the printed circuit board; and a sealing member for sealing a space portion formed between the first surface of the printed circuit board and the first surface of the functional device while preventing the resin from spreading into the space portion.

That is, in one embodiment of an electronic device of the present invention such as a surface acoustic wave apparatus, a conductive film is formed on almost all of other main surface of a surface acoustic wave device which works as a functional device and has a wiring pattern on one main surface, and, the conductive film and at least a part of a wiring pattern of a printed circuit board are connected through a conductive material. Consequently, if a noise is induced from outside cause, the conductive film receives the induced noise, therefrom the noise can be earthed through the wiring pattern of the printed circuit board. There is a so-called electromagnetic wave shield effect (shield effect).

The conductive material can be a conductive resin including a conductor such as Ag. Further, it can be an anisotropic conductive resin having a conductor embedded therein. Or, a thin bonding wire such as of Al, Au, Cu, solders and the like can be used instead.

A fabricating method for fabricating such a structure as described above comprises the steps of; disposing a first surface of a printed circuit board in an opposite relation with a first surface of a functional device; forming a conductive film on a second surface of the functional device; connecting electrically a conductive film and a wiring pattern on the first surface of the printed circuit board through a conductive material; and sealing a space portion between the printed circuit board and the functional device with the sealing member preventing the sealing member from spreading into the space portion.

Further, an electronic device of the present invention comprises; a printed circuit board having a first surface and a second surface, a wiring pattern being formed at least on the first surface of the printed circuit board; a functional device having a first surface and a second surface, the first surface being disposed in an opposite relation with the first surface of the printed circuit board; a metal foil formed on the second surface of the functional device; a means for electrically connecting between the metal foil and the wiring pattern on the printed circuit board; and a sealing member for sealing a space portion formed between the first surface of the printed circuit board and the first surface of the functional device while preventing the sealing member from intruding the space portion.

In place of a conductive film and a conductive material, a metal foil can be applied. That is, in another aspect of an electronic device of the present invention such as a surface acoustic wave apparatus, the metal foil is disposed at least in a part of a space formed between the other main surface of the surface acoustic wave device, which has one main surface having a wiring pattern thereon, and the resin member, and a side portion of the metal foil is connected to at least a part of the wiring pattern of the printed circuit board. Consequently, if a noise is induced from outside cause, the metal foil receives the induced noise which can be earthed through the wiring pattern of the printed circuit board.

A fabricating method for fabricating an electronic device having such a structure as described above comprises, for example, the steps of; disposing a first surface of a printed circuit board in an opposite relation with a first surface of a functional device; disposing a metal foil on a second surface of a functional device; connecting electrically the metal foil and a wiring pattern on the first surface of the printed circuit board through a conductive means; and sealing a space portion between the printed circuit board and the functional device with a sealing member preventing the sealing member from intruding the space portion.

A fabricating method for fabricating an electronic device having such a structure as described comprises, for example, the steps of; adhering a metal foil having a smaller shape than that of a sheet of the resin, which serves as a hot-melt type member, to one main surface of the sheet of the resin; disposing the metal foil side of the resin in an opposite relation with the other main surface of a surface acoustic wave device having one main surface on which the wiring pattern is formed; and making an intimate contact with at least the other main surface of the device and the metal foil and enveloping the device as well, by letting the side portion of the metal foil contact/connect to at least a part of the wiring pattern of the printed circuit board, and to seal the device with the printed circuit board.

Further, for example, a fabricating method for fabricating an electronic device having a structure described above comprises the steps of; assembling a surface acoustic wave device and a printed circuit board through an electrically connecting member with a predetermined spacing; disposing a metal foil on the other main surface of the surface acoustic wave device; dripping a liquid member on the device while heating the printed circuit board and the surface acoustic wave device, adhering it to the side part of the device, and hardening it; enveloping the device by making an intimate contact between the other main surface of the device and the metal foil; contacting/connecting the side portion of the metal foil to at least a part of the wiring pattern of the printed circuit board; and sealing the device with the printed circuit board.

For the metal foil, such inexpensive foils as Al foil, Cu foil, Ni foil, Zn foil, and Sn foil can be applied. Here, an intimate contact between the metal foil and a device is required but rigid adhesion is not necessarily required between them. Rather, due to the existence of a minute spacing, a long term frequency variation of the device can be suppressed to a very low level.

Further, an electronic device of the present invention comprises; a printed circuit board having a first surface and a second surface, a wiring pattern being formed at least on a first surface of the printed circuit board; a functional device having a first surface and a second surface, the first surface being disposed in an opposite relation with the first surface of the printed circuit board; a conductive film formed on the second surface of the functional device; a magnetic material dispersed resin connecting electrically between the conductive film and the pattern on the printed circuit board; and a sealing member for sealing a space portion formed between the first surface of the printed circuit board and the first surface of the functional device while preventing the sealing member from intruding the space portion.

That is, in another aspect of an electronic device of the present invention such as a surface acoustic wave apparatus, a conductive film is disposed on almost all surface of the other main surface of a surface acoustic wave device which has one main surface having the wiring pattern thereon, and the conductive film and at least a part of the wiring pattern of the printed circuit board are connected with a magnetic material dispersed resin. For the magnetic material, ferrite is preferable. In this case, since the magnetic material can be electrically conductive mainly in a high-frequency region of not less than 1 GHz, even if a noise is induced from outside cause, the conductive film receives the induced noise and earths it through the magnetic material dispersed resin, and further through the wiring pattern of the printed circuit board.

A fabricating method for fabricating an electronic device having such a structure as described above comprises the steps of; disposing a first surface of a printed circuit board in an opposite relation with a first surface of a functional device; providing a conductive film on a second surface of a functional device; connecting electrically the conductive film and the wiring pattern on the first surface of the printed circuit board through a magnetic material dispersed resin; and sealing a space portion between the printed circuit board and the functional device with the sealing member preventing the sealing member from spreading into the space portion.

Further, an electronic device of the present invention comprises; a printed circuit board having a first surface and a second surface; a functional device having a first surface and a second surface, the first surface being disposed in an opposite relation with the first surface of the printed circuit board; and a sealing member, which is composed of a resin dispersed with magnetic powder, for sealing a space portion formed between the first surface of the printed circuit board and the first surface of the functional device while preventing the sealing member from intruding the space portion.

That is, in another aspect of an electronic device of the present invention such as a surface acoustic wave apparatus, a sealing member such as a hot-melt type member, a thermo-setting member and the like comprise of a metal powder dispersed resin. In this case, since the metal powder dispersed resin shows a low resistivity and become electrically conductive in a high-frequency region, even if a noise is induced from outside cause, it can flow from the resin through the wiring pattern on the printed circuit board to the earth.

Such structure as described above can be fabricated with, for example, the following steps of; disposing a first surface of a printed circuit board in an opposite relation with a first surface of a functional device; and sealing a space portion between the printed circuit board and the functional device with a sealing member having metal powder dispersed therein preventing the sealing member from intruding the space portion.

Further, an electronic device of the present invention comprises; a printed circuit board having a first surface and a second surface; a functional device having a first surface and a second surface, the first surface being disposed in an opposite relation with the first surface of the printed circuit board; a resin member having powder of magnetic material dispersed therein; and a sealing member used for sealing a space portion formed between the first surface of the printed circuit board and the first surface of the functional device while preventing the sealing member from intruding the space portion.

That is, in another aspect of an electronic device of the present invention such as a surface acoustic wave apparatus, a sealing member such as a hot-melt type member, a thermo-setting member and the like are composed of a magnetic powder dispersed resin. As an example of the magnetic material, ferrite is cited. In this case, since the magnetic material can be electrically conductive state mainly in the high-frequency region of not less than 1 GHz, if a noise is induced from outside cause, the induced noise can be earthed through the magnetic material dispersed resin and a wiring pattern of a printed circuit board.

Such a structure as described above can be fabricated with, for example, the following steps of; disposing a first surface of a printed circuit board in an opposite relation with a first surface of a functional device; and sealing a space portion between the printed circuit board and the functional device with a sealing member comprising of magnetic powder dispersed resin leaving the space portion at least between the functional device and the printed circuit board.

An electronic device of the present invention comprises; a printed circuit board having a first surface and a second surface; a functional device having a first surface and a second surface, the first surface being disposed in an opposite relation with the first surface of the printed circuit board; and a sealing member, which is a resin dispersed with an electromagnetic wave absorption material, for sealing a space portion formed between the first surface of the printed circuit board and the first surface of the functional device while preventing the sealing member from intruding the space portion.

That is, in another aspect of an electronic device of the present invention such as a surface acoustic wave apparatus, a sealing member such as a hot-melt type member, a thermo-setting member and the like is a resin dispersed with an electromagnetic wave absorption material therein. As an example of the electromagnetic wave absorption material, carbon, ferrite or a mixture of them, and the like are effective. In this case, since the energy of an extraneously induced electrical noise is absorbed by the electromagnetic wave absorber, the effect of the noise on the surface acoustic wave device which serves as a functional device is reduced.

An example of such a structure described above can be fabricated with the following steps of; disposing a first surface of a functional device in an opposite relation with a first surface of a printed circuit board; and sealing a space portion between the printed circuit board and the functional device with a sealing member which has an electromagnetic wave absorption material dispersed therein preventing a sealing member from spreading into at least the space portion.

An electronic device of the present invention comprises; a printed circuit board having a first surface and a second surface; a functional device having a first surface and a second surface, the first surface being disposed in an opposite relation with the first surface of the printed circuit board; and a sealing member for sealing a space portion formed between the first surface of the printed circuit board and the first surface of the functional device while preventing the sealing member from intruding the space portion, wherein the sealing member is a resin including a conductive filler.

That is, in another aspect of an electronic device of the present invention such as a surface acoustic wave apparatus, a sealing member such as a hot-melt type member, a thermo-setting member and the like are comprised of a conductive filler dispersed resin. As an example of the conductive filler, carbon can be cited. In this case, since, in the high-frequency region, the resistivity of the conductive filler dispersed resin become low and electrically conductive, even if an ambient noise entered, the noise flows from the resin to the wiring pattern to be earthed.

All of these examples have a so-called electromagnetic wave shielding effect (shield effect) against an extraneously induced electrical noise and the like.

An example of such a structure described above can be fabricated with the following steps of; disposing a first surface of a functional device in an opposite relation with a first surface of a printed circuit board; and sealing a space portion between the printed circuit board and the functional device with a sealing member preventing the sealing member from intruding at least the space portion, wherein the sealing member is a resin dispersed with a conductive filler therein.

Further, an electronic device of the present invention comprises: a printed circuit board having a first surface and a second surface, concave parts being formed on two side surfaces respectively; a functional device having a first surface and a second surface, the first surface being disposed in an opposite relation with the first surface of the printed circuit board; a sealing member for sealing a space portion formed between the first surface of the printed circuit board and the first surface of the functional device preventing the sealing member from intruding the space portion; and a metal plate having a pair of convex part disposed on the leg parts of the metal plate so as to oppose each other and engage with the respective corresponding concave part formed on the printed circuit board, the first surface of the printed circuit board and the functional device being covered with the metal.

Further, an electronic device of the present invention comprises: a printed circuit board having a first surface and a second surface, concave parts being formed on two side surfaces of a printed circuit board, wherein inside the concave parts a wiring pattern is formed; a functional device having a first surface and a second surface, the first surface being disposed in an opposite relation with the first surface of the printed circuit board; a sealing member for sealing a space portion formed between the first surface of the printed circuit board and the first surface of the functional device preventing the sealing member from intruding the space portion; and a metal plate having a pair of convex part disposed on the leg parts of the metal plate so as to oppose each other and engage with the respective corresponding concave parts formed on the printed circuit board, and, at the same time, electrically connecting with respective wiring patterns inside the concaves, the first surface of the printed circuit board and the functional device being covered with the metal.

That is, in an another aspect of an electronic device of the present invention such as a surface acoustic wave apparatus, a printed circuit board is provided with a concave part on a side surface at two places, and a metal plate having a convex part at an edge part at the two leg parts is disposed in such a manner that at least a part of the resin part is covered, wherein the printed circuit board and the metal plate are integrated by engaging respectively corresponding concave part on the side surface of the printed circuit board and the convex part formed at the edge part of the metal plate.

That is, a metal plate has such a structure as covers sealing members such as a hot-melt type member, a thermo-setting member and the like and the printed circuit board that a marking operation on the flat part of the metal plate with such means as a stamping and the like can be done easily.

Further, in an another aspect of an electronic device of the present invention such as a surface acoustic wave apparatus; a printed circuit board is provided with concave shaped wiring patterns on at least two places of the side surfaces, the respective concave shaped wiring patterns being electrically connected to at least a part of the wiring patterns formed on the one main surface; a metal plate having a convex part at the respective side part is disposed in such a manner that at least a part of a sealing member such as a hot-melt type member, a thermo-setting member and the like is covered; and the printed circuit board and the metal plate are integrated by engaging/contacting/connecting the respectively corresponding concave part on the side surface of the printed circuit board and the convex part formed at the side part of the metal plate.

Thus, by electrically earthing the metal plate itself, an electromagnetic wave shielding effect and an easy marking property are provided and the noise resistance is improved.

Such a structure as described above can be fabricated with, for example, the following steps of; disposing a first surface of a printed circuit board in an opposite relation with a first surface of a functional device; sealing a space portion between the printed circuit board and the functional device leaving the space portion at least between the functional device and the printed circuit board; engaging a pair of convex parts, which is disposed at two leg parts of the metal plate, and the respective concave parts, which is disposed at two places of the side surfaces of the printed circuit board, in such a manner as to oppose each other; and covering the first surface of the printed circuit board and the functional device with the metal plate.

A fabricating method for fabricating an electronic device of the present invention comprises, for example, the steps of; disposing a first surface of a printed circuit board in an opposite relation with a first surface of a functional device; sealing a space portion between the printed circuit board and the functional device leaving the space portion at least between the functional device and the printed circuit board; engaging a pair of convex parts disposed at the leg parts of the metal plate and the respective concave parts disposed at two places of the side surfaces of the printed circuit board in such a manner as to oppose each other; connecting electrically the wiring patterns disposed inside the concave parts and the wiring patterns disposed at the tip of the convex parts; and covering the first surface of the printed circuit board and the functional device with the metal plate.

An electronic device of the present invention comprises; a printed circuit board having a first surface and a second surface, step portions being formed at two places of the side surfaces wherein an upper step is formed on the side of the first main surface of the printed circuit board; a functional device having a first surface and a second surface, the first surface being disposed in an opposite relation with the first surface of the printed circuit board; a sealing member for sealing a space portion formed between the first surface of the printed circuit board and the first surface of the functional device while preventing the sealing member from intruding the space portion; and a metal plate having a pair of protruded portions at two places of the leg portions, the first surface of the printed circuit board and the functional device being covered with the metal plate, wherein the protruded portions of the metal part are engaged with the respective step portions of the printed circuit board.

An electronic device of the present invention comprises; a printed circuit board having a first surface and a second surface, step portions being formed on two side surfaces, wherein upper steps are formed on a first surface side and a wiring pattern is disposed on the lower step surfaces respectively; a functional device having a first surface and a second surface, the first surface being disposed in an opposite relation with the first surface of the printed circuit board; a sealing member for sealing a space portion formed between the first surface of the printed circuit board and the first surface of the functional device while preventing the sealing member from intruding the space portion; and a metal plate having a pair of protruded portions disposed at two leg portions in such a manner as to oppose each other, the first surface of the printed circuit board and the functional device being covered with the metal plate, wherein the metal plate is electrically connected to respective wiring patterns of the lower steps and is engaged with the respective stepped portions of the printed circuit board.

That is, in an another aspect of an electronic device of the present invention such as a surface acoustic wave apparatus, cut out portions are formed at least on two side surfaces of the printed circuit board, the metal plate having the protruded portions on the side portions is disposed in such a manner that the metal plate covers at least a part of a sealing member such as a hot-melt type member, a thermo-setting member and the like, and the cut out portions formed on the side surfaces of the printed circuit board and the protruded portions formed on the side portions of the metal plate are held each other to be integrated.

This kind of structure can be fabricated, for example, with following steps of; disposing a first surface of a functional device in an opposite relation with a first surface of a printed circuit board; sealing the printed circuit board and the functional device with the sealing member leaving a space portion at least between the printed circuit board and the functional device; engaging the respective step portions formed on the two side surfaces of the printed circuit board and a pair of the protruded portion disposed at two leg portions of the metal plate, wherein the respective step portions are formed on two side surfaces of the printed circuit board in such a manner that the first surface side is the upper step; and covering the first surface of the printed circuit board and the functional device with the metal plate.

Further, another example of this kind of structure can be fabricated with following steps of; disposing a first surface of a functional device in an opposite relation with a first surface of a printed circuit board; sealing the printed circuit board and the functional device with a sealing member leaving a space portion at least between the printed circuit board and the functional device; engaging the respective step portions, which are formed on the two side surfaces of the printed circuit board in such a manner as the first surface side is the upper step, and a pair of the protruded portion, which is disposed at two leg portions of the metal plate, as well as, connecting electrically the wiring pattern disposed on the lower step surfaces of the side surfaces and the wiring pattern disposed at the tip of the protruding portion; and covering the first surface of the printed circuit board and the functional device with the metal plate.

With such a structure, a metal plate can be set on the printed circuit board with a high precision. Thus, on a flat portion of the metal plate, the marking is easily done with such method as a stamping and the like.

Further, in an another aspect of an electronic device of the present invention such as a surface acoustic wave apparatus, cut out portions are formed on at least two side surfaces of the printed circuit board, at least a part of the wiring pattern formed on the one main surface and the wiring pattern formed on at least a part of the cut out portions are electrically connected, the metal plate having the protruded portions on the side portions is disposed in such a manner that the metal plate covers at least a part of the sealing member such as a hot-melt type member, a thermo-setting member and the like; and, by letting the cut out portions formed on the side surfaces of the printed circuit board and the protruded portions formed on the side portions of the metal plate hold together, a wiring pattern formed on the cut out portions and the protruded portion formed on the side portion of the metal plate are contacted/connected and integrated.

With such a structure, a metal plate can provide a flat portion on an outer surface of a surface acoustic wave apparatus. Thus, an electromagnetic shielding effect and easy printing of marks can be attained.

Such a structure as described above can be obtained with the following steps of; forming a concave portion or a cut out portion at least on two respective places of the side surfaces of the printed circuit board; forming a convex portion or a protruded portion on the respective side portions of the metal plate; disposing a metal plate in such a manner that the metal plate covers at least a part of a sealing member consisted of such as a hot-melt type member, a thermo-setting member and the like, wherein the functional device is covered with the sealing member; and integrating the concave portions or the cut out portions formed on the side surfaces of the printed circuit board and the convex portions or the protruded portions formed on the side portions of the metal plate so as to hold together them. In addition, by using the metal plate having a shape at least a part of which is flat and almost parallel with the printed circuit board, the fabrication process can be made easy.

In an electronic device of the present invention such as a surface acoustic wave apparatus, a buffering member can be disposed between a sealing member such as a hot-melt type member, a thermo-setting member and the like and the surface acoustic wave device which works as a functional device, or the glass filler can be included in the resin which works as the sealing member and consists of such as the hot-melt type member, the thermo-setting member and the like. A strain induced from the stress caused by the hardening and the thermal expansion of the resin which works as a sealing member can be alleviated and an adverse effect on the characteristics caused by the sealing operation can be also reduced, accordingly. As an example of the buffering member, an elastic body such as a rubber can be cited. Further, in place of the hot-melt type member, the thermo-setting member, and the like which work as the sealing member, a resin including glass filler can be cited. As an example of the glass filler, one member selected from the group of essentially consisting of amorphous silica, fractured crystalline silica or of fused silica can be used.

In addition, in an electronic device of the present invention such as a surface acoustic wave apparatus, by dint of the alignment of a conductive connecting member at a predetermined position, the difference between the thermal expansions can be absorbed. Thus, the reliability can be improved and a resin used for sealing can be prevented from intruding a space portion.

Further, according to a fabricating method for fabricating an electronic device of the present invention such as a surface acoustic wave apparatus, since a sheet of a buffering member is easily aligned between a sealing member such as a hot-melt typemember, a thermo-settingmember, and the like, and a surface acoustic wave device which serves as a functional device, the productivity and the reliability can be improved.

An electronic device of the present invention comprises a printed circuit board having a first surface and a second surface, a functional device having a first surface and a second surface, the first surface being disposed in an opposite relation with the first surface of the printed circuit board, a buffering member disposed on the second surface of the functional device, and a sealing member for sealing a space portion formed between the first surface of the printed circuit board and the first surface of the functional device while preventing the sealing member from intruding the space portion.

That is, in an aspect of an electronic device of the present invention such as a surface acoustic wave apparatus, a buffering member is disposed between the functional device such as the surface acoustic wave device and the sealing member such as a hardened hot-melt type member, a thermosetting liquid resin and the like. As an example of the buffering member, such material as an elastic rubber sheet rich in elasticity can be cited. Instead, a metal foil or a two layered waxed paper can be disposed. Further, the buffering member can be comprised of a conductive material. For example, carbon which works as the conductive filler can be employed together with the sealing member to give conductivity.

An important point, during the hardening of the resin, is to make an influence on the characteristics and functions of the acoustic surface wave device caused by the contraction as small as possible. With such a structure described above, the strain caused by the stress on the resin can be alleviated. Same effect can be attained with a low-melt glass.

Such a structure as this is fabricated according to the following steps of; disposing a first surface of a functional device in an opposite relation with a first surface of a printed circuit board; disposing a buffering member on the second surface of the functional device; and sealing a space portion formed between the printed circuit board and the functional device while preventing the sealing member from intruding the space portion.

For example, a sheet of the buffering member having a smaller shape than that of a hot-melt type member is adhered to one main surface of the hot-melt type member, the buffering sheet adhered to the hot-melt type member is disposed in an opposite relation with the other main surface of a surface acoustic wave device having one main surface on which the wiring pattern is formed, and at least one other main surface of the function and the buffering sheet are intimately contacted to cover the functional device by heating/melting/hardening as well as to seal the device together with the printed circuit board.

Further, for example, the following steps can be employed; a sheet of a buffering member is adhered to one main surface of a functional device and the adhered body is disposed in an opposite relation with the other main surface of a surface acoustic wave device which has a main surface having a wiring pattern formed thereon; the liquid resin which is a thermo-setting member is dripped or flowed from above that body; and, by heating/melting them, the sheet of the buffering member is intimately contacted with at least other main surface of the functional device to cover the functional device as well as to seal the functional device with the printed circuit board.

As an example of a sheet of the buffering member, such a material as an elastic rubber sheet rich in elasticity can be cited. Instead, a sheet of metal foil or a laminate of two sheet of waxed paper can be disposed. Here, the size of the respective sheets can be smaller than that of the sheet of the resin and not necessarily required to be equal with that, and the shape also can be arbitrary. With these structures, the strain caused by the contraction or the difference of the thermal expansions during hardening of the resin member can be alleviated. Further, since the buffering sheet can be easily aligned between the resin member for sealing and the functional device, the productivity and reliability can be improved.

An electronic device of the present invention comprises; a printed circuit board having a first surface and a second surface; a functional device which has a first surface and a second surface disposed in an opposite relation with the first surface of the printed circuit board; and a sealing member which is a resin including glass filler and seals a space portion formed between the printed circuit board and the functional device while preventing the sealing member from intruding the space portion.

Further, in an aspect of an electronic device of the present invention such as a surface acoustic wave device, a resin, which is a sealing member and is comprised of a hot-melt type member or a thermo-setting member and the like, is a resin incorporating glass filler. As an example of the glass filler, the fractured member of fused silica, amorphous silica, and crystalline silica, or low melt glass including such as $PbO-B_2O_3$ system or $SiO_2$, $Al_2O_3$, $PbF_2$, and the like can be cited. The shape of the glass filler is preferred normally to be in the range of average particle size of from 0.1 $\mu$m to 50 $\mu$m. In addition, the shape can be narrow and long. Further, a mixture of a glass filler having an average particle size in the range of 0.1–1 $\mu$m and a glass filler having an average particle size of 5–50 $\mu$m can be employed. With such a structure, a thermal expansion coefficient of the sealing member resin can be made small enough to be close to the thermal expansion coefficient of the surface acoustic wave device or the printed circuit board, wherein the sealing member resin is composed of the resin which is a hot-melt type member or a liquid resin which can be hardened. As a result, since the differences between the thermal expansions of the constituents can be absorbed, the strain induced by the stress can be alleviated and the reliability involving the thermal shock resistance can be improved. Further, by employing the resin including such as the glass filler, the mechanical strength is also improved.

Such a structure as described above, for example, can be fabricated according to the following steps of; disposing a first surface of a functional device in an opposite relation with a first surface of a printed circuit board; and sealing a space portion formed between the printed circuit board and the functional device with the sealing member which is a resin incorporating glass filler while preventing the sealing member from spreading the space portion.

Further, an electronic device of the present invention comprises; a printed circuit board having a first surface and a second surface, a wiring pattern being formed on the first surface; a functional device having a first surface and a second surface, a wiring pattern being formed on the first surface, the first surface being disposed in an opposite relation with the first surface of the printed circuit board; a connecting member which is intensively disposed around a central region of the functional device and is electrically connected to the wiring patterns of both of the printed circuit board and the functional device; and a sealing member for sealing a space portion between the first surface of the printed circuit board and the first surface of the functional device preventing the sealing member from intruding the space portion.

That is, in another aspect of an electronic device of the present invention such as a surface acoustic wave device, a plurality of conductive connecting members are intensively disposed in an opposite position around a central region of a surface acoustic wave device which is the functional device. In this case, the function of the connecting member is to connect electrically a wiring pattern of a surface acoustic wave device and a wiring pattern of a printed circuit board. Therefore, a defective connection must be avoided. An important cause for defective connection among others is the strain induced by the stress due to the differences between the thermal expansions of the respective constituents. However, by intensively disposing the connecting members around the central region of a surface acoustic wave device, a concentration of the strain induced by the stress can be alleviated. This is particularly effective when a surface acoustic wave device has a narrow and long shape.

Such a structure as this is fabricated according to, for example, the following steps of; disposing a first surface of a functional device in an opposite relation with a first surface of a printed circuit board while disposing a connecting member, which connects electrically a wiring pattern of the printed circuit board and a wiring pattern of a functional device, around a central region of the functional device; and sealing with a sealing member a space portion between the printed circuit board and the functional device preventing the sealing member from intruding the space portion.

An electronic device of the present invention comprises; a printed circuit board having a first surface and a second surface, a wiring pattern being formed on the first surface; a functional device having a first surface and a second surface, a wiring pattern being formed on the first surface, the first surface being disposed in an opposite relation with the first surface of the printed circuit board; a first connecting member, which is intensively disposed around a central region of the functional device, for connecting electrically the wiring pattern of the printed circuit board and the wiring pattern of the functional device; a second connecting member which is disposed around a peripheral region of the printed circuit board and is not involved in an electrical connection between the wiring pattern of the printed circuit board and the wiring pattern of the functional device; and a sealing member for sealing a space portion between the first surface of the printed circuit board and the first surface of the functional device preventing the sealing member from intruding the space portion.

That is, in an another aspect of an electronic device of the present invention such as a surface acoustic wave apparatus, a plurality of conductive connecting members are intensively disposed around a central region of a surface acoustic wave device which is a functional device in such a manner as to oppose each other, and other plurality of connecting members, which do not participate in an electrical connection, are disposed along a peripheral area of the device in such a manner as to oppose each other. With such a structure, the surface acoustic wave device and the printed circuit board can be connected more firmly and a sealing member, which is disposed in an opposite position along the peripheral area of the device, is prevented from intruding a transducer portion of the surface acoustic wave device, wherein the sealing member is a plurality of connecting members such as a sheet of the resin which is a hot-melt type member or a liquid resin which is a thermo-setting member. In particular, this effect is effective for the surface acoustic wave device having a narrow and long shape.

Such a structure as this is fabricated according to, for example, the following steps of; disposing a first connecting member intensively around a central area of a functional device, wherein the first connecting member connects electrically the wiring pattern of the printed circuit board and the wiring pattern of the functional device; disposing a first surface of a functional device in an opposite relation with a first surface of a printed circuit board while disposing a second connecting member along a peripheral area, wherein the second connecting member is not participated in electrical connecting between the wiring pattern of the printed circuit board and the wiring pattern of the functional device; and sealing, with the sealing member, a space portion between the printed circuit board and the functional device preventing the sealing member from intruding at least the space portion.

When considering a functional device such as a surface acoustic wave device, in the functional device which is mounted on a printed circuit board based on the face-down bonding method, a plurality of connecting terminals which is electrically connected with the printed circuit board can be disposed intensively around a center of one main surface of the functional device. Further, a shape of the functional device can be relatively narrow and long and that is effective in maintaining the strength of the electronic device.

When a functional device is, for example, a surface acoustic wave device, the surface acoustic wave device comprises; a piezoelectric substrate; a plurality of pairs of comb-shaped electrodes formed on the piezoelectric substrate; and a group of externally connecting terminals disposed intensively around a center of the piezoelectric substrate. The surface acoustic wave device can be further provided with a sound absorbing material formed on the piezoelectric substrate in such a manner that the sound absorbing material surrounds the comb-shaped electrode.

Further, on both surfaces of a surface acoustic wave device, the electrode pad not participating in the external connection can be disposed. Such an electrode pad that does not participate in the external connection prevents a sealing member from intrusion and maintains the strength when the functional device has a relatively narrow and long shape. In addition, the group of the external connecting terminals can include external connecting terminals which extend to the comb-shaped electrode to electrically connect.

According to a fabricating method for fabricating an electronic device of the present invention such as a surface acoustic wave apparatus, a height of a wiring pattern which is connected to a conductive connective member which is an electrical connecting member connecting a printed circuit board and the surface acoustic wave device can be controlled by adjusting a thickness of the printed circuit board material or that of the conductive material in the wiring pattern, or by adjusting the height of the conductive connecting member itself which works as an electrical connection. Thus, since a proper space portion can be secured between the printed circuit board and the functional device, even when the surface acoustic wave device is disposed with the surface acoustic wave absorption member, the bonding strength between the surface acoustic wave device and the printed circuit board can be kept enough high, hence the reliability of the bonding can be improved.

An electronic device of the present invention comprises; a printed circuit board having a first surface and a second surface, a first wiring pattern of a conductive material having a first thickness and a second wiring pattern of the conductive material having a second thickness thicker than that of the first thickness being disposed on the first surface; a functional device having a first surface and a second surface, a wiring pattern being formed on the first surface, the first surface being disposed in an opposite relation with the first surface of the printed circuit board; a conductive connecting member disposed between the second wiring pattern of the printed circuit board and the wiring pattern of the functional device; and a sealing member for sealing a space portion between the first surface of the printed circuit board and the first surface of the functional device preventing the sealing member from intruding the space portion.

That is, in an aspect of an electronic device of the present invention such as a surface acoustic wave apparatus, a thickness of at least a part of a conductive material in a wiring pattern formed on a main surface of a printed circuit board is thicker than that of the conductive material of the other part of the wiring pattern. The difference of the thicknesses is preferable to be in the range of from 5 μm to 100 μm. With such a structure, even when the thickness of a conductive connecting member is small, since the thickness of the conductive material can be included in the thickness, a space portion between a surface acoustic wave device, which works as a functional device, and a printed circuit board can be effectively secured. In particular, even when the surface acoustic wave device is disposed with the surface acoustic wave absorbent, the connecting strength can be maintained strong enough between the surface acoustic wave device and the printed circuit board.

Such a structure of an electronic device as described above, when a wiring pattern of a printed circuit board is formed, can be obtained by a repeated coating of a conductive paste on at least a part of the wiring pattern with a screen printing method, thereafter by firing or cofiring. In this case, the difference between the thickness of the repeatedly coated part and that of the other part is preferable to be in the range of from 5 μm to 100 μm.

In addition, for example, when a wiring pattern of a printed circuit board is formed, at least a thickness of a part of the wiring pattern can be made thicker than that of the other part of the wiring pattern using a film forming method such as a vapor depositing method or a sputtering method. In the electronic device of the present invention, the difference of the film thicknesses of the films is preferred to be in the range of not less than 5 μm.

An electronic device of the present invention comprises; a printed circuit board which has a first surface and a second surface, a first region having a substrate material of a first thickness and a second region having the substrate material of a second thickness thicker than the first thickness, and a wiring pattern being formed on the first region and the second region of the first surface; a functional device having a first surface and a second surface, a wiring pattern being formed on the first surface, and the first surface being disposed in an opposite relation with the first surface of the printed circuit board; a conductive connecting member disposed between the wiring pattern of the second region of the printed circuit board and the wiring pattern of the functional device; and a sealing member for sealing a space portion between the first surface of the printed circuit board and the first surface of the functional device preventing the sealing member from intruding the space portion.

That is, in an aspect of an electronic device of the present invention such as a surface acoustic wave apparatus, a thickness of at least a part of the region of printed circuit board material of a wiring pattern formed on a main surface of a printed circuit board is thicker than that of the printed circuit board material of the other region of the wiring pattern. The difference of the thicknesses is preferable to be in the range of from 5 μm to 100 μm. With such a structure, even if a thickness of a conductive connecting member is small, since the thickness of the printed circuit board material can be included in a total thickness and, thus, a space portion between a surface acoustic wave device which works as a functional device and the printed circuit board can be effectively secured, particularly, even when the surface acoustic wave device is provided with a surface acoustic wave absorbent, the connecting strength can be maintained strong enough between the surface acoustic wave device and the printed circuit board.

Such a structure as described above, when a printed circuit board is formed for example, can be obtained by adding a corresponding green sheet to a part opposed to a connecting member which works as an electrically connecting portion and to a neighboring region and by firing, thereafter the wiring pattern can be formed on the printed circuit board.

The difference between a thickness of a part fired with added green sheet and that of the other part is preferable to be essentially in the range of 5–500 μm.

By adopting a fabricating method for fabricating a printed circuit board described above, even when a thickness of a conductive connecting member is small, since a thickness of a printed circuit board material at the wiring pattern portion or that of a conductive material can be included in a total thickness and, thus, a space portion between a surface acoustic wave device, which works as a functional device, and the printed circuit board can be effectively secured, particularly, even when the surface acoustic wave device is provided with a surface acoustic wave absorbent, the connecting strength can be maintained strong enough between the surface acoustic wave device and the printed circuit board. Thus, the connecting strength and the reliability of the connection can be improved.

Further, an electronic device of the present invention comprises; a printed circuit board having a first surface and a second surface, a wiring pattern being formed on the first surface; a functional device having a first surface and a second surface, the wiring pattern being formed on the first surface, the first surface being disposed in an opposite relation with the first surface of the printed circuit board; a conductive connecting member which is disposed between the wiring pattern of the first surface of the printed circuit board and the wiring pattern of the first surface of the functional device, and is formed by piling-up bumps according to a spacing between these wiring patterns; and a sealing member for sealing a space portion between the first surface of the printed circuit board and the first surface of the functional device preventing the sealing member from intruding the space portion.

That is, in another aspect of an electronic device of the present invention such as a surface acoustic wave device, in order to secure an appropriate volume of a space portion, as a conductive connecting member which is an electrical connecting member, a plurality of conductive bumps can be piled-up on nearly same place. In this case, a total thickness of a plurality of conductive bumps is preferable to be in the range of from 30 μm to 150 μm. Instead, when the conductive ball bumps are employed as the conductive connecting member which works as an electrically connecting member, a width of the conductive ball bumps can be adjusted by varying a thickness of a conductive thin wire. Here, ball bumps essentially consisting of Au, Sn, Pb or the like are preferable as the conductive bump. Further, a surface acoustic wave device can be coated with a sound wave absorber which has a thickness less than that of the conductive connecting member at least on one main surface or on a part of the other main surface of the surface acoustic wave device.

Thus, by providing such a conductive connecting member which serves as a thickness-regulated electrical connecting portion, an appropriate volume of a space portion can be effectively secured between a surface acoustic wave device and the printed circuit board. Here, since there is no need to partly change a thickness of a board material of a printed circuit board or that of a conductive material, the electronic device can be fabricated more easily.

In such a structure as described above, in order to secure an appropriate volume of a space portion, a plurality of conductive bumps are piled-up on nearly same place and serve as a conductive connecting member which works as an electrical connecting portion. In this case, a sum of the thicknesses of a plurality of conductive bumps is preferable to be in the range of from 30 μm to 150 μm. Instead, when the conductive ball bumps are employed as a conductive connecting member which works as an electrically connecting member, a width of the conductive ball bump can be adjusted by varying the thickness of a conductive thin wire. Here, ball bumps essentially consisting of Au, Sn, Pb or the like are preferable as the conductive bump. Further, when a surface acoustic wave device can be coated with a sound wave absorber at least on one main surface or on a part of the other main surface, the surface acoustic wave absorbent can be coated thinner than a thickness of a conductive connecting member.

Thus, by controlling a thickness of conductive connecting member which serves as an electrical connecting portion, an appropriate volume of a space portion can be effectively secured between a surface acoustic wave device and a printed circuit board. In this case, since there is no need to change partly a thickness of a board material of the printed circuit board or that of the conductive material, the electronic device can be fabricated more easily.

Further, an electronic device of the present invention comprises; a printed circuit board having a first surface and a second surface, a wiring pattern being formed on the first surface; a surface acoustic wave device, which works as a functional device, having a first surface and a second surface, a wiring pattern and a sound absorbing member being formed on the first surface, the first surface being disposed in an opposite relation with the first surface of the printed circuit board; a conductive connecting member disposed between the wiring pattern of the printed circuit board and the wiring pattern of the functional device, the thickness of the member being more than that of the sound absorbing member; and a sealing member for sealing a space portion between the first surface of the printed circuit board and the first surface of the functional device preventing the sealing member from intruding the space portion.

Further, an electronic device of the present invention comprises; a printed circuit board having a first surface and a second surface, a wiring pattern being formed on the first surface; a surface acoustic wave device, which works as a functional device, having a first surface and a second surface, a wiring pattern being formed on the first surface, a sound absorbing material being formed on the second surface, the first surface being disposed in an opposite relation with the first surface of the printed circuit board; a conductive connecting member disposed between the wiring pattern of the printed circuit board and the wiring pattern of the functional device; and a sealing member for sealing a space portion between the first surface of the printed circuit board and the first surface of the functional device preventing the sealing member from intruding the space portion.

Further, an electronic device of the present invention comprises; a printed circuit board having a first surface and a second surface, a wiring pattern being formed on the first surface; a surface acoustic wave device, which works as the functional device, having a first surface and a second surface, a wiring pattern being formed on the first surface, a sound absorbing member being formed on the second surface, the first surface being disposed in an opposite relation with the first surface of the printed circuit board; a conductive connecting member disposed between the wiring pattern of the printed circuit board and the wiring pattern of the functional device; a metal foil disposed on the second surface of the functional device; and a sealing member for sealing the space portion between the first surface of the printed circuit board and the first surface of the functional device preventing the sealing member from intruding the space portion.

That is, in another aspect of a surface acoustic wave apparatus of the present invention, a sound wave absorber is disposed at least on one main surface or on a part of the other main surface of the surface acoustic wave device and a thickness of that member is less than that of the connecting member. The difference of the thicknesses is preferable to be in the range of from 5 $\mu$m to 50 $\mu$m. In the device having the sound wave absorber disposed thereon, the thickness of the absorbing member is required to be appropriate. With such a structure, even when a thickness of a connecting member is small, an appropriate space portion can be secured between the surface acoustic wave device and the printed circuit board.

As described above, an electronic device of the present invention comprises; a printed circuit board having a first surface and a second surface; a functional device having a first surface and a second surface, the first surface being disposed in an opposite relation with the first surface of the printed circuit board; and a sealing member for sealing a space portion between the first surface of the printed circuit board and the first surface of the functional device preventing the sealing member from intruding the space portion. For the sealing member, such as a hot-melt type member or a thermo-setting member can be employed.

Here, a hot-melt type member is defined as a member being solid state in initial stage such as a resin powder which has a pellet shape. Further, a thermo-setting member is defined as a member having such a fluidity that enables to drip or pour in the initial stage such as a liquid type thermo-setting resin member.

According to an electronic device of the present invention such as a surface acoustic wave device, a conductive film or a metal foil is formed between a sealing member composed of a hot-melt type member, a thermo-setting member or the like for sealing use and the surface acoustic wave device which serves as a functional device, being direct currently or high frequency currently connected to the wiring pattern on the printed circuit board. Instead, for a sealing member such as a hot-melt type member or a thermo-setting type liquid resin, a resin dispersed with magnetic material, metal powder, conductive filler or radio-wave absorber can be employed. Thus, since a noise-resistance can be improved, an electronic device highly resistant to an extraneous electrical noise, the surface acoustic wave device, can be provided. Further, when a printed circuit board is provided with a metal plate so that at least a part of the hot-melt type member is covered and the printed circuit board and the metal plate are engaged, since a surface of the metal plate can be made flat, the electronic device such as the surface acoustic wave device can be made resistant to the ambient noise as well as superior in marking characteristics.

Further, according to an electronic device of the present invention such as a surface acoustic wave device, since a frame-shaped member is not necessarily required for preventing a hot-melt type member from intruding a space portion between the surface acoustic wave device and a printed circuit board, an electronic device having a simple structure can be obtained. Still further, through hardening of a sealing member such as a sheet of a resin by heating and melting, or through connecting by hardening a resin which has a property to be hardened by heating, photo polymerization or the like while pouring or dripping, the resin can be prevented from intruding, in particular, into a surface of a transducer portion of the surface acoustic wave device. Hence, the surface acoustic wave apparatus sealed with the resin can be easily obtained while leaving a space portion between the surface acoustic wave device and a printed circuit board without affecting adversely on a surface acoustic wave propagating path of the surface acoustic wave apparatus.

According to the present invention, a resin for sealing use which has a definite viscosity can be prevented from intruding a space portion between, for example, a main surface of a transducer side of a surface acoustic wave device and a printed circuit board without a frame-shaped insulating member. Thus, a surface acoustic wave device having a simple construction is easily obtained. Since an electronic device of the present invention does not require to use the frame-shaped insulating member or a surrounding member, an electronic device can be miniaturized. Therefore, an electronic device suitable for a high density mounting can be provided. Further, according to a fabricating method for fabricating an electronic device of the present invention, a functional device can be mounted on a printed circuit board without the frame-shaped member or the surrounding member, and a miniaturized electronic device than the conventional one can be fabricated, accordingly. Further, an electronic device suitable for an intensive mounting can be fabricated.

Further, according to a fabricating method for fabricating an electronic device of the present invention such as a surface acoustic wave apparatus, since a resin having a definite viscosity is employed, a preparative process for preparing a frame-shaped insulating member which is conventionally needed is made unnecessary.

For a sealing member of an electronic device of the present invention as described above, for example, a hot-melt type member can be used. In addition, a thermo-setting member, for example, can be employed as a sealing member.

Further, a frame-shaped member which is disposed on a first surface of a printed circuit board and surrounds a space portion can be further provided. Although the frame-shaped member is not necessarily required, by further using the member, a space portion can be secured more surely between a printed circuit board and a functional device. Therefore, an impairment of the function of a functional device such as surface acoustic wave device, a light-receiving device, a light-emitting device and the like due to spreading of the sealing member into a space portion can be more firmly prevented.

Further, a sealing member can be disposed so as to wholly cover a second surface of a functional device. In addition, the sealing member can be disposed so as to partly cover a second surface of the functional device. Still further, the sealing member can be disposed in such a manner that the sealing member wholly covers the second surface of the functional device.

Further, a conductive connecting member can be disposed between a first surface of a printed circuit board and a first surface of a functional device. The spacing between the first surface of the printed circuit board and the first surface of the functional device can be controlled by, for example, the conductive connecting member.

Still further, a functional device can be a surface acoustic wave device, and a conductive connecting member can be provided in such a manner that the conductive member connects the connecting pattern of the first surface of the printed circuit board and the connecting pattern of the first surface of the surface acoustic wave device based on the face-down bonding method. By thus controlling a thickness of the conductive connecting member which works as an electrical connecting portion, an appropriate spacing between the surface acoustic wave device which works as the functional device and the printed circuit board can be effectively secured.

Though any kind of functional devices can be mounted, such as surface acoustic wave device, a quartz oscillator or resonator, a piezoelectric oscillator or resonator, a photo-coupler, an EPROM, a CCD, a semiconductor laser, a light-emitting diode and the like can be cited. When a functional device to be mounted is a light-receiving element, a light-emitting element, or a photo-electric conversion element such as an EPROM, a CCD, a semiconductor laser, and a light-emitting diode, the printed circuit board should be composed of a material which transmits light and is disposed at least on an area where the functional device is mounted.

When a functional device is a quartz oscillator or resonator, a conductive connecting member, which connects a connecting pattern of a first surface of a printed circuit board and electrodes of a first surface of the quartz oscillator or resonator based on the face-down bonding method, and a bonding wire which connects electrically the wiring pattern of the first surface of the printed circuit board and the electrodes on the second surface of the quartz oscillator or resonator can be provided.

Further, when a functional device is a piezoelectric oscillator or resonator, a conductive connecting member, which connects a connecting pattern of a first surface of a printed circuit board and the electrodes of a first surface of the piezoelectric oscillator or resonator based on the face-down bonding method, and a bonding wire which connects electrically the wiring pattern of the first surface of the printed circuit board and the electrodes on the second surface of the piezoelectric oscillator or resonator can be provided.

Further, when a functional device is a photocoupler having a pair of light-sending part and light receiving part, a conductive connecting member, which connects a connecting pattern on a first surface of a printed circuit board and a wiring pattern on the respective first surfaces of the photocoupler based on the face-down bonding method, and a surrounding member which is disposed on the first surface of the printed circuit board and surrounds the photo-coupler can be provided, wherein a sealing member can be disposed at least on the surrounding member.

Further, a substrate which transmits light can be employed in place of a printed circuit board and, in place of a functional device, an EPROM of which first surface is a light receiving surface can be employed.

Further, a substrate which transmits light can be employed in place of a printed circuit board and, in place of a functional device, a CCD that first surface is a light receiving surface can be employed.

Further, a substrate which transmits light can be employed in place of the printed circuit board and, in place of a functional device, a semiconductor laser of which first surface is a light emitting surface can be employed.

Further, a substrate which transmits light can be employed in place of a printed circuit board and, in place of a functional device, a light emitting diode and a CCD of which respective first surfaces are the light emitting surface and the light receiving surface can be employed.

As described above, an electronic device of the present invention comprises; a printed circuit board having a first surface and a second surface; a functional device having a first surface and a second surface, the first surface being disposed in an opposite relation with the first surface of the printed circuit board; and a sealing member for sealing a space portion between the first surface of the printed circuit board and the first surface of the functional device preventing the sealing member from intruding the space portion. For the sealing member, for example, such as a hot-melt type member or a thermo-setting member can be employed.

Here, a hot-melt type member is defined as a member being solid state in initial stage such as a resin powder which has a pellet shape. Further, a thermo-setting member is defined as a member having such a fluidity that enables to drip or pour in the initial stage such as a liquid type thermo-setting resin member.

When a hot-melt type member is employed as a sealing member, a fabricating method comprises the steps; disposing a first surface of a functional device in an opposite relation to a first surface of a printed circuit board; disposing a hot-melt type member above a first surface of the printed circuit board and/or a second surface of the functional device; heating/melting the hot-melt type member; and sealing a space portion between the printed circuit board and the functional device preventing the sealing member from spreading into the space portion.

Further, when a liquid thermo-setting member is employed, a fabricating method comprises the steps; disposing a first surface of a functional device in an opposite relation to a first surface of a printed circuit board; pouring a liquid thermo-setting member from above the first surface of the printed circuit board and/or a second surface of the functional device on a predetermined position thereof; heating/hardening the thermo-setting type member; and sealing a space portion between the printed circuit board and the functional device preventing the sealing member from intruding the space portion.

When a liquid thermo-setting member is employed, a fabricating method comprises the steps; disposing a first surface of a functional device in an opposite relation to a first surface of a printed circuit board; heating/hardening while dripping a liquid thermo-setting member from above the first surface of the printed circuit board and/or a second surface of the functional device on a predetermined position thereof; and sealing a space portion between the printed circuit board and the functional device while preventing the sealing member from intruding the space portion.

In addition, an electronic device of the present invention relates to a functional device such as a surface acoustic wave device or a semiconductor device which has a structure mounted based on the face-down bonding method (a technology for directly bonding a chip in an upside-down relation to a package without the steps for die-bonding and wire-bonding) (for details of the face-down bonding method, see "Kagaku Daijiten (Chemical Dictionary)", Maruzen K. K., page 1189, Mar. 5, 1985). The face-down bonding method includes, in concrete, flip chip method, beam lead method, TAB method, pedestal method and the like. As to an electronic device of the present invention, when a hot-melt type member obtained by cold pressing a powder type raw material, such as a sheet of a thermo-setting resin, is applied as a sealing member, through hardening of the surface or the whole of the resin by heating, thereby the surface acoustic wave device and the printed circuit board are sealed leaving a space portion between a transducer portion formed on the surface acoustic wave device and a printed circuit board. Further, when a resin having a property to harden through heating or photo-synthesis is used as a sealing member, by hardening while dripping or by hardening while pouring, the surface acoustic wave device and the printed circuit board can be sealed maintaining a space portion between a transducer portion disposed on the surface acoustic wave device and the printed circuit board.

A printed circuit board constituting a part of an electronic device of the present invention such as a surface acoustic wave device can be provided with a wiring pattern, depending on a mounting method, on one main surface only or on both of the one main surface and another main surface. Instead, a printed circuit board which has built-in resistors or capacitors or coils inside can be used, wherein a wiring pattern can be formed on one main surface or on both of the one main surface and other main surface and can be electrically connected to the built-in functional parts. For material used for the printed circuit board, ceramic such as alumina, magnesia, silicon carbide and the like, glass-ceramic, multilayered ceramic substrate such as alumina and the like having built-in conductor or functional device inside, and resin substrate such as glass-epoxy substrate including FR-4 can be cited. Further, the substrate such as the multi-layered substrate, the flexible substrate (includes the film-carrier) can be employed.

Further, in order to secure a space portion, in the case of a surface acoustic wave device, a transducer part composed of a comb-shaped electrode pattern and a wiring pattern electrically connected to the transducer part are required to be formed on one surface.

In the present invention, a connecting member is defined as a means for electrically connecting a device (functional device) and a printed circuit board and fixing them. So-called bump or conductive resin can be used, for example. For the bump, ball-bump, plated bump and the like are cited, and for the conductive resin, conductive paste, anisotropic conductive resin and the like are included.

In the present invention, these connecting member can be employed singly or plurally. All is included in the present invention.

In the present invention, "an intimate contact" is defined as a state wherein two different members are in contact with each other and can be separated from each other easily with an extraneous force. Fine space between them is allowed. On the contrary, "rigid adhesion" is defined as a state wherein two different members are in contact with each other and moreover are adhered each other so strong that they can not be separated easily with the extraneous force.

Further, the "heating" in the present invention can be any one of a direct heating or an indirect heating if it can provide enough quantity of heat to be able to melt or harden a sealing member. Such means for heating as high-frequency heating, heating by electromagnetic wave, heating by ultra-sound, heating by light and the like can be employed.

For a conductive connecting member for electrically connecting a wiring pattern on a printed circuit board and a wiring pattern on a functional device such as a surface acoustic wave device, for example a conductive bump, there are the conductive metal plated resin ball and such metal bumps as comprised of Au, Ag, the solders (Sn-based, Pb-based, In-based and the like) and the like.

These conductive bumps, by connecting a printed circuit board and a functional device under a predetermined temperature and pressure, connect electrically a wiring pattern on the printed circuit board and a wiring pattern on the functional device and form and secure a space portion between the functional device and the printed circuit board. In order to secure a definite space portion, the metal bumps comprised of such as Au, Ag, the solders and the like are preferable as a conductive bump.

A spacing of a space portion formed according to the present invention is preferable to be in the range of from 100 $\mu$m to 200 $\mu$m, depending on a shape of a conductive connecting member, and more preferable to secure a range of from 20 $\mu$m to 80 $\mu$m.

Further, when a conductive connecting member is constituted as the bumps having a partly raised thickness portion by raising a wiring pattern on a printed circuit board or by raising the thickness of a wiring pattern on a surface acoustic wave device, the wiring pattern on the printed circuit board can be directly connected to the wiring pattern on the surface acoustic wave device.

As an example of an electronic device of the present invention such as a surface acoustic wave apparatus, in a surface acoustic wave device mounted based on the face-down bonding method, when a sheet of a resin is used as a resin for sealing, through melting and hardening a surface or the whole of by heating, the surface acoustic wave device and the printed circuit board can be sealed leaving a space portion between a transducer portion formed on the surface acoustic wave device and the printed circuit board.

A printed circuit board constituting a part of an electronic device such as a surface acoustic wave device of the present invention can be provided with a wiring pattern, depending on the mounting method, on one main surface only or on both of the one main surface and another main surface. Further, in the surface acoustic wave device, in order to secure a space portion, a transducer part consisting of an electrode having a comb-shaped pattern and the wiring pattern electrically connected to the transducer part are required to be formed on one surface.

For the conductive connecting member for electrically connecting a wiring pattern on a printed circuit board and a wiring pattern on a functional device such as a surface acoustic wave device, for example, a conductive bump, there are a conductive metal plated resin ball and such metal bumps as formed of Au, Ag, the solders (Sn-based, Pb-based, In-based and the like) and the like.

For example, a conductive ball bump essentially consisting of Au can be employed. Further, a conductive ball bump essentially consisted of Sn can be used. Still further, a conductive ball bump essentially consisted of Pb can be employed. Further, conductive ball bumps essentially consisted of Sn and Pb can be employed and the conductive ball bumps essentially consisted of Sn and Ag can be used.

These conductive bumps, by bonding a printed circuit board and a functional device under a predetermined temperature and pressure, connect electrically a wiring pattern on the printed circuit board and a wiring pattern on a surface acoustic wave device and form and secure a space portion between the surface acoustic wave device and the printed circuit board. For a conductive connecting member, a conductive ball bump can be employed and a thickness of the conductive ball bump can be controlled by varying a width of a conductive thin wire. In order to secure a definite space portion, the metal bumps composed of such as Au, Ag, the solders and the like are preferable as a conductive bump.

A spacing of a space portion formed according to the present invention is preferable to be in the range of from 100 $\mu$m to 200 $\mu$m, depending on a shape of a bonding member, and more preferable to be in the range of from 20 $\mu$m to 80 $\mu$m.

Further, when a conductive connecting member is constituted as a bump having a partly thickness raised portion of a wiring pattern on a printed circuit board or that of a wiring pattern on a surface acoustic wave device, the wiring pattern on the printed circuit board can be directly connected to the wiring pattern on the surface acoustic wave device. Further, by forming precedently a connecting member used for electrically connecting purpose on the wiring pattern of the printed circuit board, the bonding strength can be improved, consequently the reliability of the bonding is also improved.

Such a structure as described above can be fabricated according to the steps of; disposing a functional device having the bumps in an opposite relation to a printed circuit board; connecting the printed circuit board and a functional device while irradiating an infra-red light to the printed circuit board and/or the bumps; and sealing the printed circuit board and the functional device leaving a space portion between them.

Further, an electronic device of the present invention can be fabricated according to the following steps of; disposing a functional device having the bumps to a predetermined position of a printed circuit board; connecting a printed circuit board and a functional device while irradiating an infra-red light from the rear side of the printed circuit board and/or the functional device; and sealing the printed circuit board and the functional device leaving a space portion between them.

The infra-red light can be irradiated with a tungsten halogen lamp.

Further, while leaving a space portion formed between a functional device and a printed circuit board, a periphery portion of a sealing member and that of the printed circuit board can be sealed with the sealing member used for covering the functional device. The sealing member can be any one of such as a hot-melt type member and a liquid thermo-setting member.

Further, as an aspect of an electronic device of the present invention such as a surface acoustic wave device, a wiring pattern of one main surface of a printed circuit board can be exposed between, for example, a peripheral edge portion of a resin part and that of the printed circuit board. Therefore, since a resin portion does not cover wholly the wiring pattern, an exposed wiring pattern can be connected to a concave-shaped wiring pattern formed on a side surface of the printed circuit board.

Accordingly, when a surface acoustic wave apparatus is mounted on a circuit board based on the surface mounting method together with other passive elements and the like, a connecting member on the circuit board and a concave-shaped wiring pattern formed on a side surface of the side portion of the printed circuit board are easily connected.

Further, in an electronic device of the present invention, a surface acoustic wave apparatus, an epoxy-resin can be employed as a resin member.

Further, in an electronic device of present invention, namely in a surface acoustic wave device, a ring-shaped insulating wall can be disposed inside and/or outside of the respective connecting members along a locus formed by a plurality of connecting members.

These ring-shaped insulating walls can play a roll for firmly securing a space portion between a surface acoustic wave device and a printed circuit board.

In an example of a fabricating method for fabricating an electronic device of the present invention such as a surface acoustic wave apparatus, the apparatus is fabricated by mounting a surface acoustic wave device on a printed circuit board by covering them with a sheet of a thermo-setting resin and by hardening the resin, wherein the printed circuit board and the surface acoustic wave device can be bonded due to melting and hardening of a part of a surface or the whole of the resin by heating a sheet of an epoxy resin. According to the present fabricating method, a viscosity of the resin can be kept high and thereby can prevent the resin from flowing into a space portion formed on a surface of a transducer portion of a surface acoustic wave device. Further, because the resin is not a liquid type, an frame-shaped insulating wall or dam is not necessarily required. According to the present invention, since a frame-shaped member for preventing the resin, which has a definite viscosity and seals a space portion formed between a main surface on a transducer side of a surface acoustic wave device and a printed circuit board, from intruding the space portion is not required, a structure of the surface acoustic wave apparatus can be made simple. In the electronic device of the present invention, since there is no need of a frame-shaped insulating wall or a surrounding member, the miniaturization of the electronic device can be obtained. Consequently, the electronic device suitable for an intensive mounting can be attained. Further, according to a fabricating method for fabricating an electronic device of the present invention, a functional device can be mounted on a printed circuit board without a frame-shaped member or a surrounding member, and a miniaturized electronic device than a conventional one can be fabricated. Further, an electronic device suitable for a high density mounting can be fabricated.

However, since a further improvement can be attained by employing a frame-shaped insulating wall, all is contained in this invention. Further, by forming a connecting member which serves as an electrical connecting part on a wiring pattern of a printed circuit board, the bonding strength and the reliability of the bonding can be improved.

A liquid type thermo-setting resin used for a conventional sealing resin member such as an epoxy-based resin for potting use, has such a low viscosity as 15 Pa·s, and the viscosity does not easily rise high and remains low even after the temperature is raised to 100–200° C. Therefore, a sealing member can not be prevented from flowing into a space portion between a printed circuit board and a surface acoustic wave device, thus impairs the propagation of a surface wave of the surface acoustic wave device.

Nevertheless, according to a surface acoustic wave apparatus of the present invention, when a sheet of a resin such as an epoxy based resin is applied, until the resin begins to melt by heating, a higher viscosity state can be kept. By controlling hardening even after melting, the viscosity of at least not less than 50 Pa·s is attained. Thus, a surface acoustic wave device can be easily covered.

For example, by employing a thermo-setting resin such as an epoxy-resin which is obtained by transforming into a sheet by cold-pressing a powder raw material, a highly viscous state can be maintained until beginning of melting by heating. Even after melting, by controlling hardening, at least not less than 50 Pa·s is obtained. Accordingly, a surface acoustic wave device can be easily enveloped.

The sheet of a resin like this, for example, can be easily obtained by cold-pressing a powdered epoxy resin into a required shape and weight. For the resin, a thermo-setting resin is preferable and, for example, an epoxy-resin, a silicone-resin, an urethane-resin, and the like can be cited. The epoxy-resin is preferable one among them and, further, a phenol-based epoxy-resin is more preferable. In particular, a bisphenol A based epoxy-resin and a phenolic novolac-based epoxy resin are adequate for an electronic device of the present invention. The sheet of the resin is disposed on the other main surface of a surface acoustic wave device other than a main surface on which a wiring pattern is formed.

Further, a sheet of a resin can be obtained, instead of obtaining by cold-pressing a raw material powder, by impregnating an unwoven fabric with a powder material, and by punching it to obtain a required shape of the resin. Further, a sheet of a resin having a required shape can be obtained by mixing the raw material powder with an organic binder (binder) such as PVB (poly-vinyl butyral) system or acryl system, dispersing, sheet-forming, and punching or cutting.

The sheet of a resin disposed on a surface of a surface acoustic wave device thereon a transducer portion and a wiring pattern, which is electrically connected to the transducer portion, are not formed is made to form an intimate contact with the other surface of the device, covers the device, and seals a surface acoustic wave device with the printed circuit board by heating/melting and by hardening.

Further, instead of a resin, a low melting glass can be applied with same object. In this case, powder of the low melt glass (frit) can be cold pressed to form a sheet. If necessary for shaping, a little quantity of wax or polyvinyl alcohol can be added as a binder. For the low melt glass, the melting temperature is in the range of 250–400° C., and the range of 300–350° C. is adequate for borosilicate lead glass. A little quantity of ZnO, Al2O3, TiO2, Bi2O3, PbF2, CuO can be included. The borosilicate lead glass having not less than 50% by weight of PbO as a component is most preferable.

The low melt glass such as borosilicate bismuth glass other than the borosilicate lead glass can be employed.

The sheet of a resin can be easily obtained by cold pressing powder of raw material such as an epoxy resin into a required shape and weight. The sheet of the resin is disposed on the other main surface than a main surface on which a wiring pattern of a surface acoustic wave device is formed.

The shape of a sheet of a resin in this case is preferred to be larger than that of a surface acoustic wave device and nearly equal or a little bit smaller than that of a printed circuit board. The more preferable shape of the sheet of the resin is larger than that of the surface acoustic wave device and nearly equal to that of the printed circuit board.

Implementing like this, a sheet of a resin can be firmly aligned to a surface acoustic wave device and a printed circuit board.

Further, when a shape of a surface acoustic wave device being 2 mm×2 mm dimension, if the dimension of a printed circuit board is 4 mm×4 mm, 4 mm×4 mm dimension is employed for a sheet of a resin.

The selection of a dimension can be appropriately done depending on a volume of a surface acoustic wave device and a thickness of a sheet of a resin.

The sheet of a resin can be disposed on a surface of a surface acoustic wave device on which surface a transducer portion and a wiring pattern connected electrically to the transducer portion are not formed. Through heating/melting and hardening of the sheet, the sheet of the resin makes an intimate contact with the other surface of the device, covers the device, and seals the surface acoustic wave device with a printed circuit board.

Though the conditions for heating/melting and hardening are required to be suitably controlled in this case, in the present invention, the temperature for heating/melting a hot-melt type member of a sheet of a resin is 100–200° C., and the holding time for hardening is 20–2 hrs. More preferably, after heating/melting step is executed in the temperature range of 110–170° C., the hardening step is done in the temperature range of 100–160° C. and in the holding time range of 3–20 hrs. The heating method in the present invention can be any one of a direct heating or an indirect heating method if it can provide enough quantity of heat in such a level that the sealing member can be melted and hardened. Such means for heating as high-frequency heating, heating by electromagnetic wave, heating by ultrasound, heating by irradiation of light and the like can be employed.

Though, in the above, an explanation is given on an example wherein a printed circuit board and a functional device are connected by heating/hardening a sealing member composed of a hot-melt type sheet resin after melting the sealing member, as described above, the printed circuit board and the functional device can be connected also by dripping or pouring a liquid type thermo-setting resin.

A fabricating method for fabricating an electronic device of the present invention using such a liquid thermo-setting member as a sealing member comprises the steps of; (a) disposing a first surface of a printed circuit board in an opposite relation with a first surface of a functional device, (b) pouring a liquid thermo-setting member from above the first surface of the printed circuit board and/or the second surface of the functional device on a predetermined position thereof, and (c) heating/hardening the poured thermo-setting member and sealing a space portion between the printed circuit board and the functional device preventing the sealing member from spreading into at least the space portion.

Further, a fabricating method for fabricating an electronic device of the present invention using such a liquid thermo-setting member as a sealing member comprises the steps of; (a) disposing a first surface of a printed circuit board in an opposite relation with a first surface of a functional device, (b) heating/hardening a poured thermo-setting member while dripping a liquid thermo-setting member from above the first surface of the printed circuit board and/or the second surface of the functional device on a predetermined position thereof, and sealing a space portion between the printed circuit board and the functional device preventing the sealing member from spreading into at least the space portion.

Further, a functional device is aligned to a printed circuit board at a predetermined position; the functional device and the printed circuit board are assembled through the conductive connecting member with a definite spacing; a liquid member is dripped to the functional device while heating the functional device and the printed circuit board and preventing the liquid member from intruding a space portion between them; and the liquid member is adhered to the side portion of the functional device, and, by hardening, covers the functional device and seals the space portion between the functional device and the printed circuit board.

Further, an electronic device of the present invention comprises, for example; a printed circuit board; a functional device electrically connected onto a printed circuit board through a conductive connecting member based on the face-down bonding method; a dripping member which is adhered to a side portion of the functional device and, by hardening, covers the functional device while preventing the liquid member from intruding a space portion between the functional device and the printed circuit board; and a sealing portion wherein a peripheral portion of the dripping member and that of the printed circuit board is made to form an contact.

In a fabricating method for fabricating an electronic device of the present invention such as a surface acoustic wave device wherein a liquid thermo-setting member is hardened by heating, the surface acoustic wave device which works as a functional device is mounted based on the face-down bonding method; further, a liquid member is dripped or poured on the surface acoustic wave device while heating a package and the surface acoustic wave device, thereby a viscosity of the liquid member is raised and the liquid member is spread over to a side surface of the acoustic surface wave device to serve as a sound wave absorber; and, further, by hardening after the liquid member reaches the printed circuit board, covers the electronic device such as the surface acoustic wave device and seals the surface acoustic wave device and the printed circuit board preventing the sealing member from intruding a space portion between the transducer portion disposed on the surface acoustic wave device and the printed circuit board.

In this case, a heating method in the present invention can be any one of a direct heating or an indirect heating method if it can provide enough quantity of heat in such a level that the sealing member can be melted and hardened. Such means for heating as high-frequency heating, heating by electromagnetic wave, heating by ultra-sound, heating by irradiation of light and the like can be employed.

Further, for example, a functional device is disposed to a printed circuit board at a predetermined position; the functional device and the printed circuit board are assembled through a conductive connecting member with a definite spacing; a liquid member is dripped to the functional device while heating the functional device and the printed circuit board and preventing the liquid member from intruding a space portion between them; and the liquid member is adhered to a side portion of the functional device, and, by hardening, covers the functional device and seals the space portion between the functional device and the printed circuit board.

A fabricating method for fabricating a structure described above comprises the following steps of; disposing a functional device having bumps in an opposite relation with a printed circuit board; connecting the printed circuit board and the functional device while irradiating an infra-red light to the printed circuit board and/or the bumps; and sealing the printed circuit board and the device preventing the sealing member from intruding a space portion.

Further, a fabricating method comprises the steps of; disposing a functional device having bumps to a printed circuit board at a predetermined position; connecting the printed circuit board and a functional device while irradiating an infra-red light from the reverse side of the printed circuit board and/or the functional device; and sealing the printed circuit board and the functional device preventing the sealing member from intruding a space portion.

The light emission from such as a tungsten halogen lamp can be employed as an infra-red light source.

Further, a peripheral portion of a sealing member and that of a printed circuit board can be sealed with a sealing member which covers a functional device leaving a space portion formed between the functional device and the printed circuit board. The sealing member such as a hot-melt type member or a liquid thermo-setting member can be employed.

In a fabricating method for fabricating an electronic device of the present invention, wherein a printed circuit board and a functional device are connected by dripping or pouring a liquid member, which hardens by heating, photo-polymerization and the like, as a sealing member, since a frame-shaped insulating member is not necessarily required for preventing a hot-melt type member from intruding a space portion between the functional device such as a surface acoustic wave device and the printed circuit board, an electronic device having a simple structure can be obtained. In addition, since the resin that spreads over the side surface portions of the surface acoustic wave device also functions as a sound wave absorber (sound absorbing material), unnecessary spurious radiations can be attenuated and thereby the performance of the surface acoustic wave apparatus can be improved. Moreover, the printed circuit board and the surface acoustic wave device can be sealed by hardening a liquid resin.

Further, if a conductive film or a metal foil is formed between a resin for sealing and a surface acoustic wave device, since these member can be connected to a part of a wiring pattern on a printed circuit board such as an earthing pattern, interference from an ambient noise and the like can be attenuated and thereby noise resistance can be improved.

In a fabricating method for fabricating an electronic device of the present invention such as a surface acoustic wave device, wherein a liquid thermo-setting member is heated and hardened, since a frame-shaped insulating member is not necessarily required for preventing a hot-melt type member from intruding a space portion between the surface acoustic wave device which serves as a functional device and a printed circuit board, an electronic device having a simple structure can be obtained. In addition, since a resin that spreads over side surface portions of the surface acoustic wave device also functions as a sound wave absorber (sound absorbing material), unnecessary spurious radiations can be attenuated and thereby the performance of the surface acoustic wave apparatus can be improved. Moreover, the printed circuit board and the surface acoustic wave device can be sealed by hardening a liquid resin.

Further, according to a fabricating method for fabricating an electronic device and a surface acoustic wave apparatus of the present invention, since a conductive film or a metal foil is formed between a resin for sealing and a surface acoustic wave device, and is connected with a part of a wiring pattern on a printed circuit board such as an earthing pattern, the interference from an ambient noise and the like can be attenuated and thereby a noise resistance can be improved.

Further, by disposing a metal plate on a printed circuit board in such a manner that covers at least a part of a resin and by engaging, since a front surface portion of a metal plate can be made flat, a surface acoustic wave apparatus strongly resistant to an ambient noise and superior in marking characteristics can be provided.

Further, according to a fabricating method for fabricating an electronic device and a surface acoustic wave apparatus of the present invention, by forming precedently a conductive connecting member for electrical connecting on a wiring pattern of a printed circuit board, the bonding strength and the reliability of the bonding can be improved.

For a liquid member used for sealing step, a sealing member of a liquid epoxy resin used generally in the sealing step of a semiconductor can be employed. In addition, a viscosity is preferable to be high and not less than 15 Pa·s is more preferable.

Further, instead of a resin, a liquid low melt glass can be employed. The preferable composition in this case is borosilicate lead glass, further, the borosilicate lead glass containing not less than 50% by weight of PbO is more preferable. In addition, a liquid resin can be combined with the liquid low melt glass.

An electronic device of the present invention relates to an electronic device such as a surface acoustic wave device or a semiconductor device which has an assembled structure mounted by a face-down bonding method (a technology for directly bonding a chip in an upside-down relation to a package without the steps for die-bonding and wire-bonding) (for details of the face-down bonding method, see "Kagaku Daijiten (Chemical Dictionary)", Maruzen K. K., page 1189, Mar. 5, 1985). The face-down bonding method includes, in concrete, flip chip method, beam lead method, TAB method, pedestal method and the like. For the electronic device of the present invention, a hot-melt type member obtained by cold pressing raw material powder such as a sheet of a thermo-setting resin is employed as a sealing member during sealing step; the surface or the whole of the resin is melted and hardened by heating, thereby the functional device and the printed circuit board are sealed preventing the sealing member from intruding the space portion between a transducer portion disposed on the surface acoustic wave device and the printed circuit board. Further, when a resin which has a property to harden due to heating or photo-polymerization is used as a sealing member, by hardening while dripping or by hardening while pouring, a surface acoustic wave device and a printed circuit board can be sealed while maintaining a space portion between a transducer portion disposed on the surface acoustic wave device and the printed circuit board.

A printed circuit board constituting a part of an electronic device such as a surface acoustic wave apparatus and the like can be provided with a wiring pattern, depending on the mounting method, on one main surface only or on both of the one main surface and another main surface. Instead, when a printed circuit board has built-in resistors or capacitors or coils inside, a wiring pattern can be formed on the one main surface or on both of one main surface and the other main surface and can be electrically connected to the built-in functional parts. For material used for the printed circuit board, ceramic such as alumina, magnesia, silicon carbide and the like, glass-ceramic, multilayered ceramic substrate such as alumina and the like having built-in conductors or functional devices inside, and resin substrate such as glass-epoxy substrate including FR-4 can be cited. Further, the substrate such as the multi-layered substrate, the flexible substrate (includes the film-carrier) can be employed.

Further, from a necessity to secure a space portion, a transducer portion composed of a comb-shaped electrode pattern and a wiring pattern electrically connected to the transducer portion are required to be formed on the one surface of the surface acoustic wave device.

In the present invention, a connecting member is defined as a means for electrically connecting between a device (functional device) and a printed circuit board and further fixing them. For example, so-called bumps, conductive resins can be used. For the bumps, there are the ball bumps and plated bumps. For the conductive resin, there are the conductive paste and the anisotropic conductive resin film (ACF).

In the present invention, these connecting member can be employed singly or in parallel. All is included in the present invention.

In the present invention, an "intimate contact" is defined as a state wherein two different members are in contact with each other and can be separated from each other easily with extraneous force. Minute space between them is allowed. On the contrary, "rigid adhesion" is defined as a state wherein two different members are in contact with each other and, moreover, are adhered each other so strong that they can not be separated easily with the extraneous force.

For a connecting member such as conductive bumps which connect electrically a wiring pattern on a printed circuit board and a wiring pattern on a functional device such as a surface acoustic wave device, there are the conductive metal plated resin ball and metal bumps composed of Au, Ag, the solders (Sn-based, Pb-based, In-based and the like) and the like.

These conductive bumps, by bonding a printed circuit board and a functional device at a predetermined temperature and pressure, connect electrically a wiring pattern on a printed circuit board and a wiring pattern on a functional device and form and secure a space portion between the functional device and the printed circuit board. In order to secure a definite space portion, the metal bumps made of such as Au, Ag, the solders and the like are preferable for the conductive bump.

A spacing of a space portion formed according to the present invention is preferable to be in the range of from 100 μm to 200 μm, depending on a shape of a bonding member, and more preferable to be in the range of from 20 μm to 80 μm.

Further, when a conductive connecting member is constituted as a bump having a partly thickness raised portion of the wiring pattern on a printed circuit board or that of a wiring pattern on a surface acoustic wave device, the wiring pattern on the printed circuit board can be directly connected to the wiring pattern on the surface acoustic wave device.

For a conductive connecting member for electrically connecting a wiring pattern on a printed circuit board and a wiring pattern on a functional device such as a surface acoustic wave device, for example, the conductive bumps, there are the conductive metal plated resin ball and the metal bumps composed of Au, Ag, the solders (Sn-based, Pb-based, In-based and the like) and the like.

For example, the conductive ball bumps essentially consisting of Au can be employed. Further, the conductive ball bumps essentially consisted of Sn can be used. Still further, the conductive ball bumps essentially consisted of Pb can be employed. Further, the conductive ball bumps essentially consisted of Sn and Pb can be employed and the conductive ball bumps essentially consisted of Sn and Ag can be used.

These conductive bumps, by bonding a printed circuit board and a functional device at a predetermined temperature and pressure, connect electrically a wiring pattern on a printed circuit board and a wiring pattern on a surface acoustic wave device and form and secure a space portion between the surface acoustic wave device and the printed circuit board. For a conductive connecting member, the conductive ball bumps can be employed and a thickness of the conductive ball bump can be controlled by varying a width of a conductive thin wire. In order to secure a definite space portion, the metal bumps made of such as Au, Ag, the solders and the like are preferable as a conductive bump.

A spacing of a space portion formed according to the present invention is preferable to be in the range of from 100 μm to 200 μm, depending on a shape of a bonding member, and more preferable to be in the range of from 20 μm to 80 μm.

Further, when a conductive connecting member is constituted as a bump having a partly thickness raised portion in a wiring pattern on a printed circuit board or that of a wiring pattern on a surface acoustic wave device, the wiring pattern on the printed circuit board can be directly connected to the wiring pattern on the surface acoustic wave device. Further, by forming precedently a bonding member for connecting electrically on the wiring pattern of the printed circuit board, the bonding strength can be improved, consequently the reliability of the bonding is also improved.

Such a structure as described above can be fabricated according to the steps of; disposing a functional device which has a bump in an opposite relation to a printed circuit board; connecting a printed circuit board and a functional device while irradiating an infra-red light to the printed circuit board and/or the bump; and sealing a space portion between the printed circuit board and the functional device leaving the space portion between them.

Further, an electronic device of the present invention can be fabricated according to the following steps of; disposing a functional device which has a bump to a predetermined position of a printed circuit board; connecting a printed circuit board and a functional device while irradiating an infra-red light from a rear side of the printed circuit board and/or the functional device; and sealing a space portion between the printed circuit board and the functional device leaving the space portion between them.

An infra-red light can be irradiated with a tungsten halogen lamp.

Further, while leaving a space portion formed between a functional device and a printed circuit board, a peripheral portion of a sealing member and that of a printed circuit board can be sealed with a sealing member for covering a functional device. The sealing member can be any of such as a hot-melt type member and a liquid thermo-setting member.

Further, as an aspect of an electronic device of the present invention such as a surface acoustic wave device, a wiring pattern of one main surface of a printed circuit board can be exposed between, for example, a peripheral portion of a resin portion and that of a printed circuit board. Therefore, since there is no chance that the resin portion covers the wiring pattern, the exposed wiring pattern can be connected to a concave-shaped wiring pattern formed on the side surface of the side portion of the printed circuit board.

Accordingly, when a surface acoustic wave apparatus is mounted on a circuit board together with other passive elements and the like based on the surface mounting method, a connecting member on the circuit board and a concave-shaped wiring pattern formed on the side surface of the side portion of the printed circuit board are easily connected.

Further, in an electronic device of the present invention, a surface acoustic wave apparatus, an epoxy-resin can be employed as a resin member.

Further, in an electronic device of present invention, namely in a surface acoustic wave device, a ring-shaped insulating wall can be disposed inside and/or outside the respective connecting members along a locus formed by a plurality of connecting members.

These ring-shaped insulating walls can play a roll for firmly securing a space portion between a surface acoustic wave device and a printed circuit board.

As an example of a fabricating method for an electronic device of the present invention such as a surface acoustic wave apparatus, the surface acoustic wave apparatus can be obtained as an assembled body together with a printed circuit board by covering a connected body of the surface acoustic wave device and printed circuit board with a sheet of a thermo-setting resin and hardening it, and, further, by heating a sheet of a epoxy based resin and by melting/hardening a surface and the whole of it, the surface acoustic wave device and the printed circuit board can be connected. When such a fabricating method is employed, since a high viscosity of the resin can be maintained during the hardening step, intrusion of the resin into a space portion formed on a surface of a transducer portion of the surface acoustic wave device can be prevented. Further, in this case, since the resin is not a liquid resin, a frame-shaped insulating wall or a dam is not necessarily required to dispose. However, employment of the frame-shaped insulating wall can enhance the sealing effect and is included in the present invention. In addition, by forming precedently a connecting member which serves as an electrical connecting portion on a wiring pattern of a printed circuit board, the connecting strength and the reliability of the connection can be improved.

In an aspect of a fabricating method for fabricating an electronic device and a surface acoustic wave apparatus which utilize a thermo-setting member as a sealing member, a conductive film is formed on almost all the other main surface of a surface acoustic wave device which serves as a functional device and has one main surface thereon the wiring pattern is formed, and a conductive film and at least a part of a wiring pattern of a printed circuit board are connected with a conductive material. Therefore, if a noise is induced from an extraneous cause, the conductive film receives and earth it through the wiring pattern of the printed circuit board. That is, it has an electromagnetic wave shield effect (shield effect).

A conductive material can be a coated and sintered body of a conductive resin paste including a conductor such as Ag or an anisotropic conductive resin paste being embedded in the conductor. Further, the thin wire of metals such as Al, Au, Cu formed by an well-known wire bonding method can be employed. These are electrically connected to a wiring pattern of a printed circuit board, in detail, to an earthing pattern and conduct electricity. In addition, a conductive film and at least a part of the wiring pattern of the printed circuit board can be connected by, for example, dripping/hardening a liquid resin dispersed with a magnetic material such as ferrite. In this case, the magnetic material dispersed resin connects the conductive film formed on the other main surface of the surface acoustic wave device and an earthing pattern formed on the printed circuit board in the frequency range of, for example, not less than 1 GHz.

In stead of a conductive film and a conductive material, a metal foil can be employed. In another aspect of a fabricating method for fabricating an electronic device and a surface acoustic wave device, a metal foil is disposed on the other main surface of the surface acoustic wave device which has one main surface having a wiring pattern thereon and a side portion of the metal foil is connected to at least a part of the wiring pattern of the printed circuit board.

Consequently, if a noise is induced by an extraneous cause, a metal foil receives it and earth it through a wiring pattern of a printed circuit board. For metallic materials for a metal foil, such materials as Al, Cu, Ni, Zn, Sn, and the like are preferable.

Such a structure can be fabricated with the following steps of; assembling a surface acoustic wave device and a printed circuit board with a predetermined spacing through an electrically connecting member; disposing a metal foil on the other main surface of the surface acoustic wave device; dripping a liquid member on the device, adhering to a side portion of the device and hardening while heating the printed circuit board and the surface acoustic wave device; thus, forming an intimate contact between at least the other main surface of the device and the metal foil and covering the device; and contact connecting a side portion of the metal foil to at least a part of the wiring pattern on the printed circuit board and sealing the functional device with the printed circuit board.

In another aspect of a fabricating method for fabricating an electronic device and a surface acoustic wave device of the present invention, a printed circuit board can have at least two places of concave portions or cut-out portions on the side surfaces, a metal plate can have the convex portions or the protruded portions on the side surfaces, the metal plate also can be disposed so that it covers at least a part of a liquid resin, which covers the surface acoustic wave device and is hardened, and the concave portions or the cut-out portions on the side surfaces of the printed circuit board and the convex portions or the protruded portions formed at the edge of the metal plate can be integrally engaged.

That is, in such a structure that a metal plate covers a resin portion or a glass portion and the printed circuit board, marking with such as a stamping method can be executed easily on a flat part of the metal plate.

By employing a metal plate having a shape of which at least a part is flat and is parallel with a printed circuit board, since a flat area can be secured enough for marking, it is more preferable.

Further, by electrically earthing a metal plate itself to a part of a printed circuit board, more preferably, to an earthing pattern, easy marking property and an electromagnetic shielding effect can be given, and a noise resistance against an ambient noise is improved.

Such a structure can be easily fabricated as shown below. The concave portions or the cut-out portions are formed on at least two places of the side surfaces of a printed circuit board, convex portions or protruded portions are formed at the edge of a metal plate, the metal plate is disposed so that it covers at least a part of the liquid resin which covers the surface acoustic wave device, and the concave portions or the cut-out portions formed on the side surfaces of the printed circuit board and the convex portions or the protruded portions formed at the edge of the metal plate can be engagingly integrated. In addition, the fabrication is made easy by employing a metal plate having a shape of which at least a part is flat and parallel to the printed circuit board.

Further, in another aspect of a fabricating method for fabricating an electronic device such as a surface acoustic wave device, after a conductive connecting member serving as an electrical connecting portion is formed on a wiring pattern formed at least on one main surface of a printed circuit board, the device and the printed circuit board are assembled with the electrical connecting portion with a definite spacing.

By assembling like this, a thermal history induced on a connecting interface between a surface acoustic wave device and a conductive connecting member which serves as an electrical connecting portion during processing can be alleviated. Thus, the connecting strength and the reliability can be improved.

Further, according to a fabricating method of an electronic device of the present invention such as a surface acoustic wave apparatus, by precedently forming a connecting member, which works as an electrical connecting portion, on a wiring pattern of a printed circuit board, the connecting strength and the reliability of the connection are improved.

Further, according to a fabricating method of an electronic device of the present invention such as a surface acoustic wave apparatus, by employing an aggregate of a printed circuit board and by simultaneously cutting after sealing with a resin which serves as a hot-melt type member, the fabricating process can be made simple and, accordingly, productivity can be improved. In addition, by controlling step by step the processing temperature of the processing steps relating to heating/melting/hardening, sealing ability and reliability can be improved.

Further, according to a fabricating method for a surface acoustic wave apparatus of the present invention, by optimizing the condition for cutting a wafer of piezoelectric material which constitutes a surface acoustic wave device, deterioration of a wiring pattern of the surface acoustic wave device is prevented and the connecting characteristics is improved.

According to a fabricating method of an electronic device of the present invention such as a surface acoustic wave apparatus, a height of a wiring pattern, which connects to a conductive connecting member for connecting a printed circuit board and a functional device, can be controlled by partly adjusting a thickness of a printed circuit board material or a thickness of a conductive material in the wiring pattern or by adjusting a height of an electrically connecting member itself. Thus, since a proper space portion can be secured between a printed circuit board and a functional device such as a surface acoustic wave device, even when a surface acoustic wave device disposed with the surface acoustic wave absorption member is used as a functional device, the bonding strength between the surface acoustic wave device and the printed circuit board can be kept enough high, hence the reliability of the bonding can be improved.

That is, a fabricating method of an electronic device of the present invention, wherein an opposing spacing at a space portion is controlled, comprises the steps of; disposing a first surface of a printed circuit board in an opposite relation with a first surface of a functional device while letting a conductive connecting member intervene between a second wiring pattern of a printed circuit board and a wiring pattern of a functional device, wherein the printed circuit board has a first wiring pattern of a conductive material having a first thickness and a second wiring pattern of the conductive material having a second thickness thicker than the first one on the first surface; and sealing at least a space portion between the printed circuit board and the functional device with a sealing member preventing the sealing member from intruding at least the space portion.

Further, in a fabricating method of an electronic device of the present invention wherein an opposing spacing at a space portion is controlled, a printed circuit board has a first region composed of a substrate material having a first thickness and a second region composed of the substrate material having a second thickness thicker than that of the first region, a wiring pattern is formed on the first region and the second region of the first surface of the printed circuit board, the first surface of the printed circuit board and the first surface of the functional device are disposed in an opposite relation while letting a conductive connecting member intervene between the wiring pattern of the second region of the printed circuit board and the wiring pattern of the functional device, and a space portion between the printed circuit board and the functional device is sealed with a sealing member preventing the sealing member from intruding at least the space portion.

Further, in a fabricating method of an electronic device of the present invention wherein an opposing spacing at a space portion is controlled, a first surface of a printed circuit board and a first surface of a functional device are disposed in an opposite relation while letting a conductive connecting member intervene between a wiring pattern of the first surface of the printed circuit board and a wiring pattern of the first surface of the functional device, wherein a conductive connective member is composed of bumps piled up depending on a spacing between the wiring pattern of the first surface of the printed circuit board and the wiring pattern of the first surface of the functional device, and a space portion between the printed circuit board and the functional device is sealed with a sealing member preventing the sealing member from intruding at least the space portion.

Further, in a fabricating method of an electronic device of the present invention wherein an opposing spacing at a space portion is controlled, a first surface of a printed circuit board and a first surface of a functional device, which is a surface acoustic wave device having a sound absorbing material on the first surface, are disposed in an opposite relation while letting a conductive connecting member having a thickness thicker than that of the sound absorbing material intervene, and a space portion between the printed circuit board and the functional device is sealed with the sealing member preventing the sealing member from intruding at least the space portion.

Further, in a fabricating method of an electronic device of the present invention wherein an opposing spacing at a space portion is controlled, a first surface of a printed circuit board and a first surface of a functional device, which is a surface acoustic wave device, are disposed in an opposite relation while letting a conductive connecting member intervene, a sound absorbing material is formed on a second surface of the functional device, and a space portion between the printed circuit board and the functional device is sealed with a sealing member preventing the sealing member from intruding at least the space portion.

Further, in a fabricating method of an electronic device of the present invention wherein an opposing spacing at a space portion is controlled, a first surface of a printed circuit board and a first surface of a functional device, which is a surface acoustic wave device, are disposed in an opposite relation while letting a conductive connecting member intervene, a sound absorbing material is formed on a second surface of the functional device, a metal foil is disposed on the second surface of the functional device, and a space portion between the printed circuit board and the functional device is sealed with a sealing member preventing the sealing member from intruding at least the space portion.

In an aspect of a fabricating method of an electronic device of the present invention such as a surface acoustic wave device wherein a spacing between a functional device and a printed circuit board is controlled in a manner as described above, when a wiring pattern of a printed circuit board is formed, at least a part of a wiring pattern is obtained by repeatedly coating a conductive paste with a screen printing method, and by firing or cofiring it.

In this case, a difference between a thickness of a repeatedly coated part and that of the other part is preferable to be in the range of from 5 $\mu$m to 100 $\mu$m.

Further, in another aspect of a fabricating method of a surface acoustic wave apparatus of the present invention, when a wiring pattern of a printed circuit board is formed, at least a part of the wiring pattern can be made thicker than a thickness of the other part of the wiring pattern by film forming method such as a vapor depositing method or a sputtering method. At least in an electronic device of the present invention, the difference between the film thicknesses of the respective films is preferred to be in the range of not less than 5 $\mu$m.

Further, in an another aspect of a fabricating method of an electronic device such as a surface acoustic wave device of the present invention wherein a spacing between a functional device and a printed circuit board is controlled, when a printed circuit board is formed, a green sheet can be added to an area opposing to a connecting member for electrical connecting and a neighboring area, thereafter by firing it, a wiring pattern is formed on the printed circuit board.

The difference between a thickness of a part fired with an added green sheet and that of the other part is preferable essentially in the range of 5–500 $\mu$m.

By adopting a fabricating method for fabricating a printed circuit board described above, even if a thickness of a connecting member is small, since a thickness of a printed circuit board material of a wiring pattern part or a thickness of a conductive material can be added to that of the connecting member, an appropriate volume of the space portion can be effectively secured between a surface acoustic wave device and the printed circuit board. In particular, even in the case of the surface acoustic wave device having a surface acoustic wave absorption member disposed on it, a sufficient bonding strength can be kept between the surface acoustic wave device and the printed circuit board. Thus, the bonding strength can be improved and consequently the reliability too.

Further, in another aspect of a fabricating method of an electronic device of the present invention such as a surface acoustic wave device wherein a spacing between a functional device and a printed circuit board is controlled, in order to secure an appropriate volume of a space portion, a plurality of conductive bumps piled up on nearly same place can be used in place of a conductive bonding member for electrically connecting. Here, a total thickness of the plurality of conductive bumps is preferable to be in the range of 30–150 μm. Instead, when conductive ball bumps are applied as a conductive bonding member for connecting electrically, a thickness of a conductive ball bump can be controlled by varying a width of a conductive thin wire. Here, ball bump essentially consisting of Au, ball bump essentially consisting of Sn, ball bump essentially consisting of Pb and the like are preferable as the conductive bump. Or, further, when a surface acoustic wave absorption member is coated at least on one main surface or on a part of the other main surface of the surface acoustic wave device, the surface acoustic wave absorption material can be coated thinner than the thickness of a conductive connecting member.

Thus, by controlling a thickness of a conductive connecting member which serves as an electrical connecting portion, an adequate volume of a space portion can be secured between a surface acoustic wave device and a printed circuit board. In this case, since there is no need to change a thickness of a substrate material of the printed circuit board or to change partially that of the conductive material, a fabricating process becomes much simple.

Further, by forming precedently a connecting member for electrically connecting purpose on a wiring pattern of a printed circuit board, the bonding strength can be improved, consequently the reliability of the bonding is also improved.

A configuration of an electronic device of the present invention comprises, for example; a printed circuit board; a functional device electrically connected to a printed circuit board through a conductive connecting member based on the face-down bonding method; a sealing member covering the functional device while leaving a space portion between a first surface of the functional device and the printed circuit board, and exposing the whole or a part of a second surface of the functional device; and a sealing portion formed by contacting a peripheral portion of the sealing member and a peripheral portion of the printed circuit board.

Further, a functional part can be disposed on a first surface of a functional device, a functional device is not disposed on a second surface of the functional device, and a second surface can be exposed.

Further, functional parts can be mounted on the first and the second surface of the functional device, and the functional part on the second surface can be exposed.

And, the second surface of the functional device and the printed circuit board can be electrically connected with a bonding wire.

Further, the bonding wire can be embedded in the sealing member.

A fabricating method for fabricating a construction like this comprises the steps of; aligning a functional device to a printed circuit board at a predetermined position; assembling a functional device and a printed circuit board through a conductive connecting member with a definite spacing; disposing a sealing member to the printed circuit board and the device; and heating/melting the sealing member while leaving a space portion formed between a first surface of the functional device and a printed circuit board and exposing the whole or a part of the second surface of the functional device. Further, a liquid sealing member can be dripped or poured to be hardened.

Further, a functional part is mounted on the first surface of the functional device, a functional device is not mounted on the second surface of the functional device, and the sealing member can be heated/melted in such a manner that the whole of the second surface is exposed. Further, a liquid sealing member can be hardened after dripping it so that the whole second surface is exposed.

Further, functional parts are mounted on the first surface and the second surface of the functional device, and the sealing member can be heated/melted in such a manner that the functional part of the second surface is exposed. In addition, a liquid sealing member can be hardened after dripping it so that the functional part is exposed.

A configuration of an electronic device of the present invention comprises, for example; a printed circuit board; a functional device electrically connected to a printed circuit board through a conductive connecting member based on the face-down bonding method; a surrounding member surrounding the functional device; and a sealing member sealing by covering the surrounding member.

Further, the functional part can be mounted on both surfaces of front and back surface of a functional device. As an example of a functional part, a quartz oscillator or resonator can be cited.

Further, a surface reverse to a surface of a functional device, which opposes to a printed circuit board, and the printed circuit board can be connected with an electrically connecting means.

A fabricating method of a construction like this comprises, for example, the steps of; aligning a functional device to a printed circuit board at a predetermined position; assembling a functional device and a printed circuit board through a conductive connecting member with a definite spacing; disposing a surrounding member on the printed circuit board so as to surround the functional device; disposing a sealing member on the printed circuit board and the surrounding member; and heating/melting the sealing member. Further, a liquid sealing member can be dripped or poured to be hardened.

Further, a configuration of an electronic device of the present invention comprises, for example; a printed circuit board; a piezoelectric oscillator or resonator having a first electrode electrically connected to a printed circuit board through a conductive connecting member based on the face-down bonding method; a connecting portion electrically connecting a second electrode of the piezoelectric oscillator or resonator and the printed circuit board; a sealing member covering a functional device leaving a space portion between the first electrode surface and the printed circuit board; and a sealing portion formed by contacting a peripheral portion of the sealing member and a peripheral portion of the printed circuit board. Further, the connecting portion can be constituted from an electrically connecting means such as a bonding wire, an ACF, a conductive bump and the like.

A fabricating method of a structure like this comprises the steps of; aligning a piezoelectric oscillator or resonator to a printed circuit board at a predetermined position; assembling a first electrode of the piezoelectric oscillator or resonator and the printed circuit board through a conductive connecting member with a predetermined spacing; connecting electrically a second electrode surface of the piezoelectric oscillator or resonator and the printed circuit board through a connecting member; disposing a sealing member on the printed circuit board and the piezoelectric oscillator or resonator; and heating and melting the sealing member.

Further, an electronic device of the present invention comprises; a printed circuit board; a light-sending part and a light-receiving part constituting a pair of photocouplers which are electrically connected to the printed circuit board through a conductive connecting member based on the face-down bonding method; a surrounding member surrounding the photocoupler; and a sealing member for sealing by covering the surrounding member.

A fabricating method for a structure like this comprises, for example, the steps of; aligning a light-sending part and a light-receiving part constituting a pair of photocouplers to a printed circuit board at predetermined positions; assembling the photocoupler and the printed circuit board through a conductive connecting member with predetermined spacings; disposing a surrounding member on the printed circuit board so as to surround the photocoupler; disposing a sealing member on the printed circuit board and the photocoupler; and heating/melting the sealing member. Further, a thermo-setting member such as a liquid thermo-setting resin and the like can be dripped or poured to be hardened.

Further, an electronic device of the present invention comprises; a light transmitting printed circuit board; a functional device electrically connected to a printed circuit board through a conductive connecting member based on the face-down bonding method, wherein a light sending part or a light receiving part is disposed in an opposite relation with the printed circuit board; a sealing member covering a functional device leaving a space portion formed between the functional device and the printed circuit board; and the sealing portion in which a peripheral portion of the sealing member and a peripheral portion of the printed circuit board are made 'in contact. For the functional device like this, photoelectric conversion devices such as an EPROM, a CCD, a semiconductor laser, a light-emitting diode and the like can be cited. The optical properties of a printed circuit board can be determined according to a necessary requirement. Such a printed circuit board that transmit selectively visible light, infra-red light, ultra-violet light or the like, or that is optically isotropic or anisotropic can be employed. For example, when a functional device is an EPROM, a light transmitting part of the printed circuit board can be optically flat.

Further, in a fabricating method of an electronic device of the present invention, a functional device is aligned to a light transmitting printed circuit board at a predetermined position so that a light sending part or a light receiving part is disposed in an opposite relation with the printed circuit board, the device and the printed circuit board are assembled with a predetermined spacing through a conductive connecting member, a sealing member is disposed to the printed circuit board and the device, and the sealing member is heated and melted leaving a space portion between the substrate and the device. In addition, a liquid sealing member can be hardened by dripping or pouring it.

BEST MODE FOR CARRYING OUT THE INVENTION

Next, with reference to the accompanying embodiments, implementing mode of the present invention will be explained.

Embodiment 1

In embodiment 1, the present invention is applied in a surface acoustic wave apparatus.

FIG. 1(a) shows a sectional view of a surface acoustic wave apparatus according to Embodiment 1.

Figure 1:
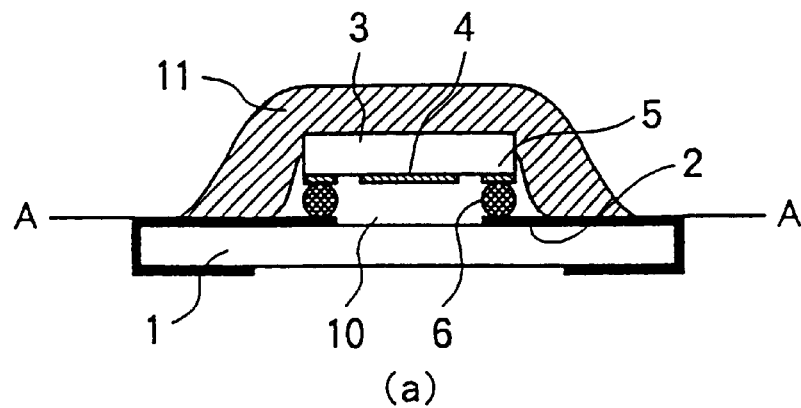
FIG. 1 Sectional view and partial plan view showing a surface acoustic wave device according to Embodiment 1 of the present invention.
Figure 1:
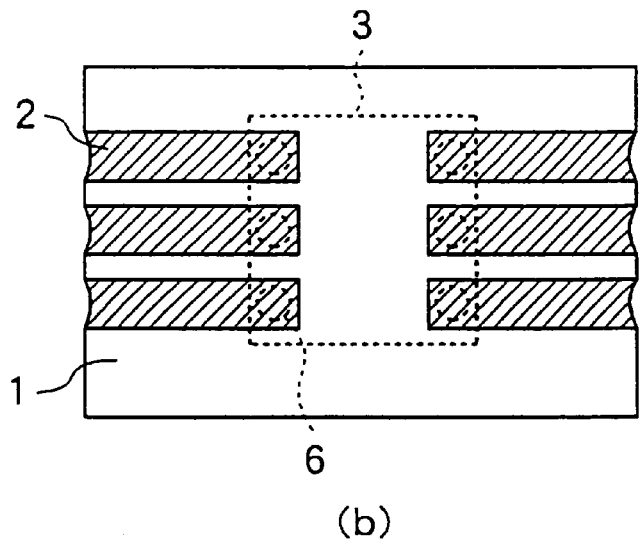

In FIG. 1, a printed circuit board 1 is an insulating substrate such as ceramic, glass coated ceramic, glass-epoxy, or the like. Conductive wiring patterns 2 are formed on both surfaces of the insulating substrate. Further, on one main surface of a surface acoustic wave device 3, a transducer portion 4 composed of a comb-shaped electrode pattern and a wiring pattern 5 electrically connected to the transducer portion are formed. The surface having the transducer portion 4 and the wiring pattern 5 thereon is disposed in an opposite relation with the wiring patterns 2 formed on the printed circuit board 1. In order to electrically connect the both opposed wiring patterns 2, 5 and to form a space portion 10 between the surface acoustic wave device 3 and the printed circuit board 1, the printed circuit board 1 and the surface acoustic wave device 3 are assembled with a plurality of conductive connecting members such as bumps 6 composed of a metal based on a face-down bonding method. The bumps are composed of Au, Ag, solder (Sn-based, Pb-based, In-based and the like), and the like. Further, a connected portion between the surface acoustic wave device 3 and the printed circuit board 1 through the conductive bumps 6 and the surface acoustic wave device 3 are coated with a resin member 11 such as epoxy.

FIG. 1(b) is a plan view taken along line A—A of FIG. 1(a). In FIG. 1(b), the conductive bumps 6 and the surface acoustic wave device 3 are disposed at places shown by dotted lines. Underneath the surface acoustic wave device and around edge positions of the wiring patterns 2, the conductive bumps 6 are inserted. The surface acoustic wave device 3 and the printed circuit board 1 are electrically connected by the face-down bonding method through the conductive bumps 6.

Figure 2:
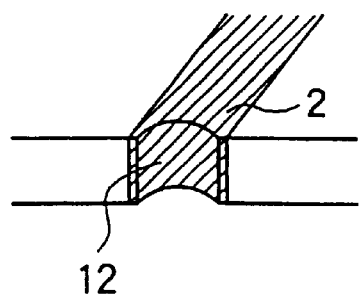
FIG. 2 Partial perspective view showing the surface acoustic wave device according to Embodiment 1 of the present invention.

FIG. 2 is an perspective view of the printed circuit board 1 explaining an practice mode according to Embodiment 1. In other word, between a peripheral edge portion of the resin part not shown in the figure and a peripheral edge portion of the printed circuit board 1, the wiring pattern 2 is exposed from one main surface of the printed circuit board. The wiring patterns 2 are continued with concave-shaped wiring patterns 12 formed on sidewall surface of the printed circuit board 1. Therefore, when electrically connecting the respective wiring patterns of the printed circuit board and the surface acoustic wave device through the solder, since the wiring patterns of the printed circuit board are exposed and soldered area becomes larger, practice of soldering operation becomes easy and electrical connection can be secured.

Embodiment 2

Figure 3:
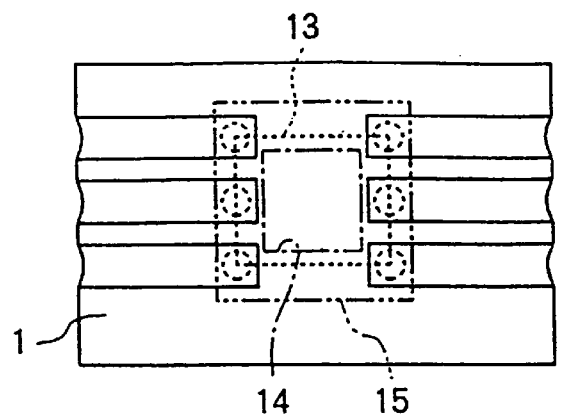
FIG. 3 Plan view showing the surface acoustic wave device according to Embodiment 2 of the present invention.

FIG. 3 is a plan view showing a printed circuit board 1 according to Embodiment 2.

Figure 4:
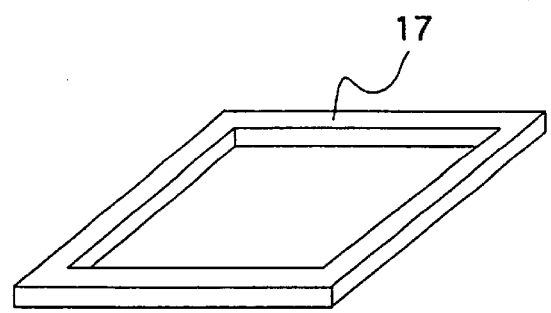
FIG. 4 Partial perspective view showing the surface acoustic wave device according to Embodiment 2 of the present invention.

In FIG. 3, 13 shown by dotted lines shows a locus 13 formed of a plurality of conductive bumps 13. Along a locus 14 formed inside along the locus 13 showing the respective bumps and a locus 15 formed outside along locus 13 of the respective bumps, ring-shaped insulating walls are formed. By introducing these insulating walls, even if viscosity of the resin portion 11 decreases a little, sealing operation is implemented firmly. FIG. 4 is a rough perspective view showing this insulating wall 17. This insulating wall 17 can be disposed either side of the inside of the bumps 14 or outside of the bumps 15.

Embodiment 3

Figure 5:
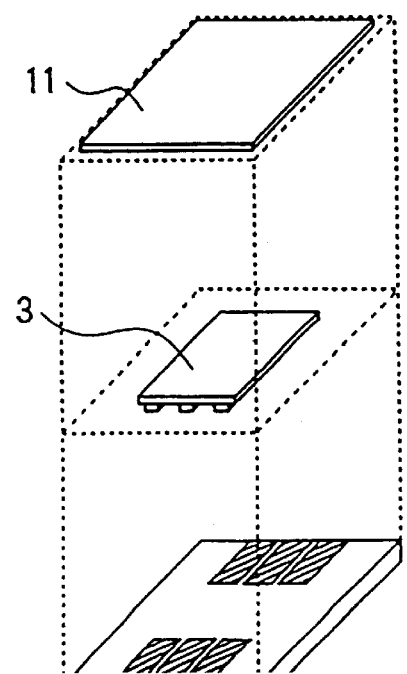
FIG. 5 Exploded perspective view showing the surface acoustic wave device according to Embodiment 3 of the present invention.
Figure 6:
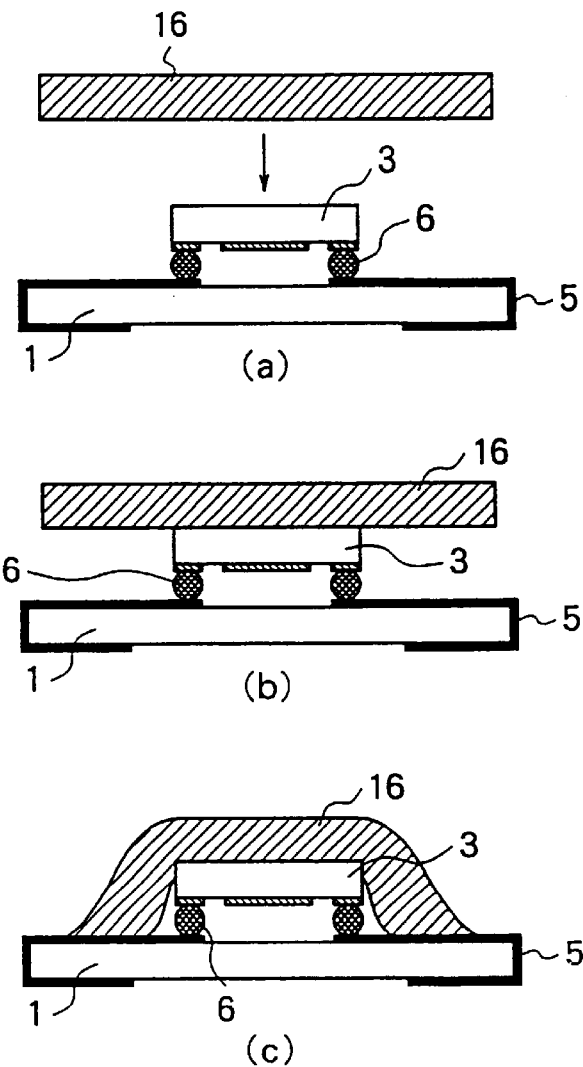
FIG. 6 Flow chart showing fabricating process of the surface acoustic wave device according to Embodiment 3 of the present invention.

With reference to FIGS. 5 and 6, a fabricating method for fabricating a surface acoustic wave device according to Embodiment 3 will be described.

FIG. 5 is a figure outlining respective positional relationship of the resin portion 11, the surface acoustic wave device 3, and the printed circuit board 1 before assembling the surface acoustic wave apparatus of the present embodiment. FIG. 6(a)–FIG. 6(c) show sequential steps for fabrication.

In other word, in FIG. 6(a), the surface acoustic wave device 3 is connected to the printed circuit board 1 through a plurality of conductive bumps disposed on the surface acoustic wave device 3, and, in FIG. 6(b), a preformed sheet of a resin 16 is disposed on the surface acoustic wave device 3. After this, by heating at 150° C. for about 1 minute, almost all of the sheet of the resin is melted while maintaining a high viscosity and, as shown in FIG. 6(c), is deformed to coat the surface acoustic wave device 3, the peripheral portion is connected to the printed circuit board thereby, and thereafter, through hardening of the resin by ensuing heating, a shape of the resin is determined. An ensuing heating is implemented, for example, by heating at 125° C. for 3 hours and by further heating at 150° C. for 3 hours, thereby the hardening is completed. The heating in the present invention can be any one of a direct heating or an indirect heating if it can provide enough quantity of heat to be able to melt or harden the sealing member. Such means for heating as high-frequency heating, heating by electromagnetic wave, heating by ultra-sound, heating by light irradiation and the like can be employed.

In addition, the resin 16 is enough high in thixotropy and viscosity, therefore, it does not spread into a surface of the transducer portion of the surface acoustic wave device.

According to the present invention, a sealing resin having a definite viscosity can prevent the sealing member from spreading into a space portion formed between, for example, a main surface of the transducer side of the surface acoustic wave device and the printed circuit board without a frame-shaped insulating member. Thus, the surface acoustic wave device having a simple construction is easily obtained. Since an electronic device of the present invention does not require to use the frame-shaped insulating member or a surrounding member, the electronic device can be miniaturized. Therefore, the electronic device suitable for the high density mounting can be provided. Further, according to the fabricating method for fabricating the electronic device of the present invention, the functional device can be mounted on the printed circuit board without the frame-shaped insulating member or the surrounding member, and, consequently, a miniaturized electronic device than the conventional one can be obtained. Further, the electronic device suitable for the high density mounting can be fabricated.

Further, if the surface acoustic wave device 3 is, in advance, temporarily adhered to the printed circuit board 1 with an organic adhesive, the scattered portion from the organic adhesive does not adhere to the comb-shaped electrode of the surface acoustic wave device 3. Since the function of the surface acoustic wave device is not impaired, and the sealing and assembling operation during mass production are implemented steadily, the yield during the mass production is improved.

Further, as the sheet of the resin described above, powder composed of an epoxy type resin such as an epoxy resin can be easily transformed into the required shape and weight by cold pressing. For example, Epoxy Pellet EP (product of Nitto Denko Co., Ltd.) or the like is adequate.

Further, a piece of reinforcement sheet (sheet) integrally impregnated with the powder composed of raw material epoxy resin can be die cut in cold to obtain the necessary shape. Further, though the conditions for heating/melting and hardening of the sheet type resin are required to be appropriately controlled, the heating/melting of the sheet of the resin is appropriately executed in the temperature range 100–200° C., and it is appropriate to hold for 20 hrs–2 hrs for hardening. More preferably, after the heating/melting step is executed in the temperature range of 110–170° C. for 1 minute or so, the hardening step is done in the temperature range of 100–160° C. for 3 hrs. These are included in the present invention.

Embodiment 4

Figure 7:
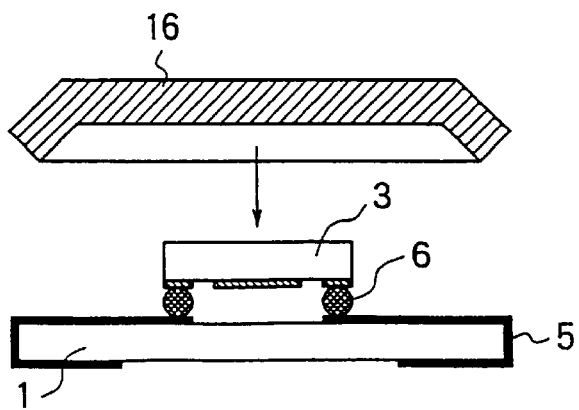
FIG. 7 Sectional view showing the surface acoustic wave device according to Embodiment 4 of the present invention.

A fabricating method for fabricating the surface acoustic wave device according to Embodiment 4 is shown in FIG. 7.

That is, a sheet of the resin hung down, in advance, along it's peripheral portion is aligned similarly as shown in FIG. 6, is disposed on a surface on which neither of the transducer part of the surface acoustic wave device nor the wiring pattern are formed, is heated/melted and hardened.

According to this method, the sheet of the resin makes an intimate contact with a reverse surface of the surface acoustic wave device and coats it. Thus, when sealed with the printed circuit board, the time for assembling is made short.

Figure 47:
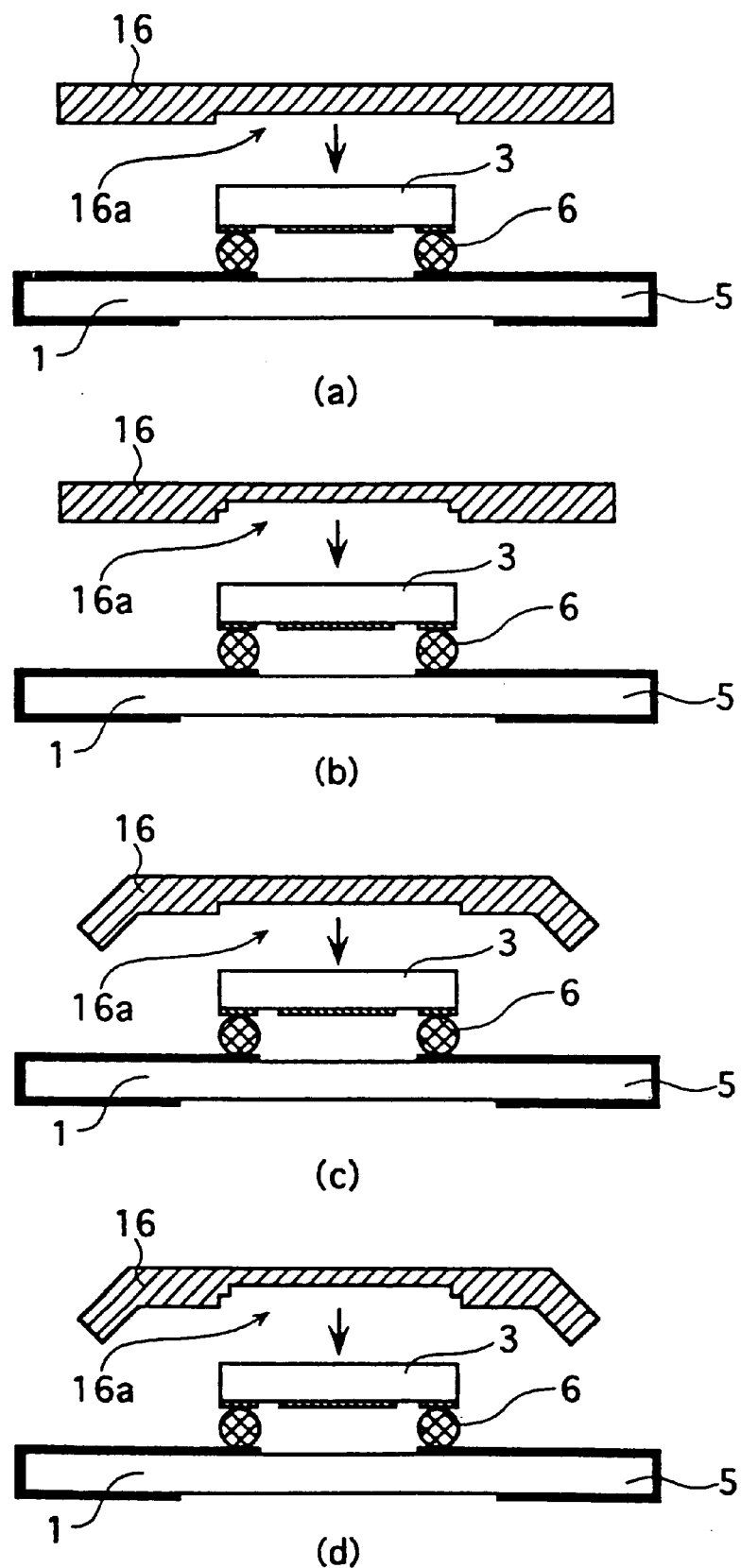
FIG. 47 Figure showing a fabricating method for the surface acoustic wave device according to other embodiments of the present invention.

FIG. 47(a) shows a fabricating method for fabricating the surface acoustic wave device according to this application example. In other word, in the fabricating method for fabricating the surface acoustic wave device shown in Embodiment 3, as an example of an aligning means for aligning the sheet of the resin 16 to the surface acoustic wave device 3, such as a concave portion is formed on a part of the surface of the sheet of the resin 16 faced to the surface acoustic wave device 3. A shape of the concave portion is only a little larger than the outer shape of the surface acoustic wave device 3. By doing like this, disposing operation for disposing the sheet of the resin 16 on the surface acoustic wave device 3 is conveniently executed manually or automatically. In particular, when the sheet of the resin 16 is disposed on the device 3 with the help of vacuum chuck on an auto-mounter (automatically transporting apparatus), the aligning operation is reliably implemented, consequently, the productivity is improved. If a little space is disposed at the bottom of this concave portion and the space portion is formed between the device 3 and the resin 16, it is made possible for a small air portion to form and characteristics of the surface acoustic wave is not impaired due to the warp (deformation) of the device 3. Further, as shown in FIG. 47(b), if the concave portion 16 a is formed in two-storied step shape and the space portion is introduced, beforehand, in the narrower concave portion, when heated/melted, the space portion is easily formed between the sheet and the device 3, and the effect of the buffering member (due to air) can be exhibited.

Further, the concave portion like this can be employed in Embodiment 4 as shown in FIGS. 47(c), (d).

Embodiment 5

Figure 8:
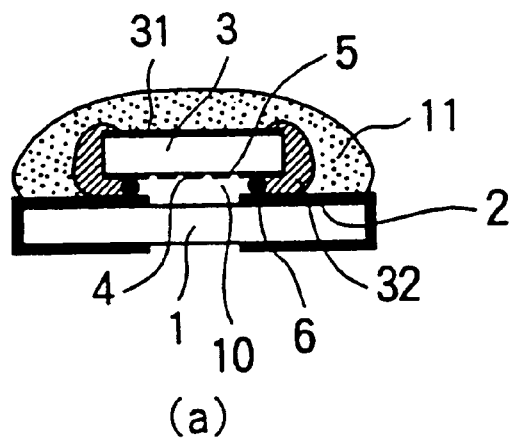
FIG. 8 Sectional view, partial plan view and partial perspective view showing the surface acoustic wave device according to Embodiment 5 of the present invention.
Figure 8:
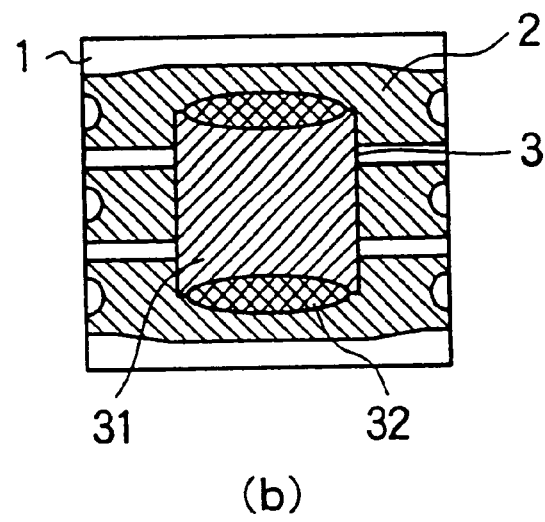
Figure 8:
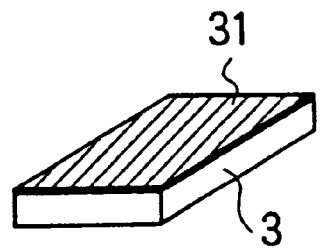

FIG. 8(a) is a sectional view showing the surface acoustic wave device according to Embodiment 5.

In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of a surface acoustic wave device 3, a transducer portion 4 composed of a comb-shaped electrode pattern and wiring patterns 5 connected electrically to the transducer portion are formed. In addition, on the other main surface of the surface acoustic wave device 3, the conductive film 31 composed of deposited aluminum is formed almost over the surface as shown in FIG. 8(c). The surface having the transducer portion 4 and the wiring pattern 5 thereon is disposed in an opposite relation with the wiring patterns 2 formed on the printed circuit board 1 based on the face-down bonding method through a plurality of conductive connecting members such as bumps 6 composed of a metal. The both opposed wiring patterns 2, 5 are electrically connected to form a space portion 10 between the surface acoustic wave device 3 and the printed circuit board 1. The bumps are composed of Au, Ag, solder (Sn-based, Pb-based, In-based and the like), and the like. Further, the conductive film 31 on the other main surface of the surface acoustic wave device 3 and a part of the wiring patterns 2 of the printed circuit board 1 are electrically connected through conductive material 32. Further, a connected portion, which is formed between the surface acoustic wave device 3 and the printed circuit board 1 through the conductive bumps 6, and the surface acoustic wave device 3 are coated with a resin member 11 essentially composed of thermo-setting bis-phenol A type epoxy resin which serves as a hot-melt type member.

FIG. 8(b) is an example of a plan view showing the printed circuit board 1 prior to the coating by the resin portion 11. The conductive film 31 formed on the other main surface of the surface acoustic wave device 3 is electrically connected to a part of the wiring patterns 2 such as the earthing pattern of the printed circuit board 1 through the conductive material 32.

For the conductive material 32, for example, the bonding wire such as Au wire, Al wire, Cu wire, and the like, epoxy type conductive paste including Ag, anisotropic conductive resin film (ACF) and the like are included. In addition, for the conductive film 31, such films as Al film, Au film and the like, the films are made by a depositing method such as a sputtering method or the like.

In this case, so-called electromagnetic wave shield effect against the extraneous electrical noise (shield effect) is given.

Embodiment 6

Figure 9:
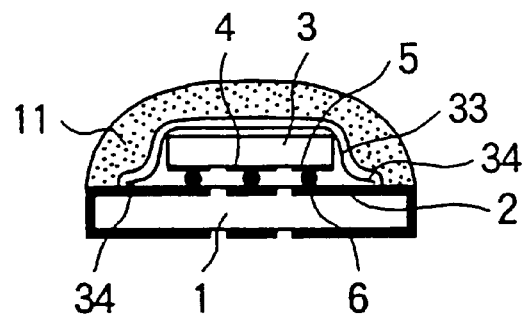
FIG. 9 Sectional view, partial plan view and exploded sectional view showing the surface acoustic wave device according to Embodiment 5 of the present invention.
Figure 9:
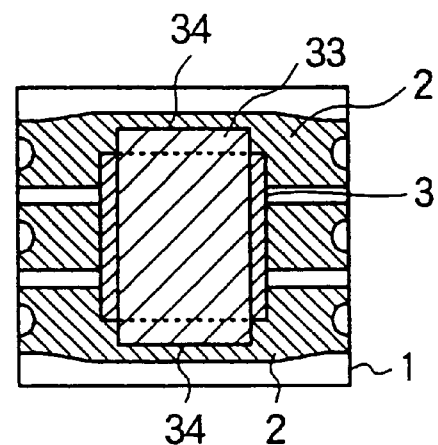
Figure 9:
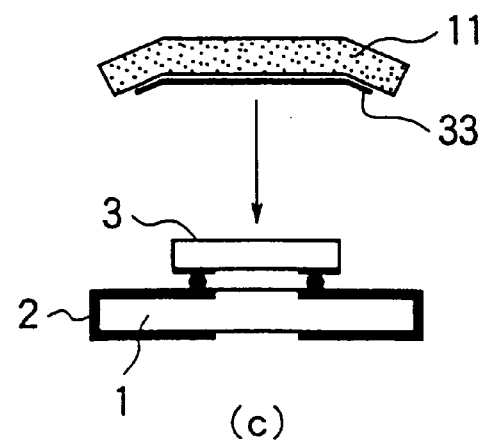

FIG. 9(a) is a sectional view showing the surface acoustic wave apparatus according to Embodiment 6.

In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of a surface acoustic wave device 3, a transducer portion 4 composed of a comb-shaped electrode pattern and a wiring pattern 5 connected electrically to the transducer portion are formed. Further, the surface having the transducer portion 4 and the wiring pattern 5 thereon is disposed in an opposite relation with the wiring patterns 2 formed on the printed circuit board 1 based on the face-down bonding method with a plurality of conductive connecting members such as bumps 6 composed of a metal. Both of the opposed wiring patterns 2, 5 are electrically connected to form a space portion 10 between the acoustic surface wave device 3 and the printed circuit board 1. The bumps are composed of Au, Ag, solder (Sn-based, Pb-based, In-based and the like), and the like. Further, at least on a part of the space portion formed between the other main surface of the surface acoustic wave device 3 and the resin portion 11, a metal foil 33 is disposed, the edge portion 34 of the metal foil 33 being electrically contacted and connected at least to a part of the wiring patterns 2 of the printed circuit board 1. Further, the connected portion, which is formed between the surface acoustic wave device 3 and the printed circuit board 1 with the conductive bumps 6, and the surface acoustic wave device 3 are coated with the resin member 11 essentially composed of thermo-setting epoxy resin which serves as the hot-melt type member.

FIG. 9(b) is an example of a plan view showing the printed circuit board 1 prior to covering by the resin portion 11. The peripheral portion 34 of the metal foil 33 disposed on the other main surface of the surface acoustic wave device 3 is electrically connected to a part of the wiring patterns 2 such as the earthing pattern of the printed circuit board 1.

For the metal foil 33, for example, such well-known inexpensive material as Al foil or the like can be employed. Further, Cu foil, Ni foil, Zn foil, Sn foil and the like can be also used. In particular, the Cu foil, being low in resistivity, is advantageous over the noise in the higher frequency region.

FIG. 9(c) is an example of a fabricating method for fabricating the surface acoustic wave apparatus of the present invention. After the metallic foil 33 is adhered in advance to the resin portion 11 composed of the sheet of the hot-melt type resin 16, the sheet of the resin can be heated/melted/hardened. In this case, a further improvement in precision alignment is attained. Any kind of heating method among the direct heating methods or the indirect heating methods can be employed if it can give enough quantity of heat to melt or harden the sealing member. The heating means such as the high-frequency heating, electromagnetic heating, heating by ultra-sound wave, heating by irradiation of light or the like can be employed.

In this case, the so-called electromagnetic wave shielding effect (shield effect) against the extraneous electrical noise is attained.

Embodiment 7

Figure 10:
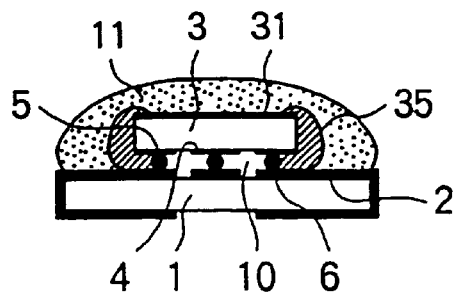
FIG. 10 Sectional view showing the surface acoustic wave device according to Embodiment 7 of the present invention.

FIG. 10 is a sectional view showing the surface acoustic wave device according to Embodiment 7. In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of an surface acoustic wave device 3, a transducer portion 4 composed of a comb-shaped electrode pattern and a wiring pattern 5 connected electrically to the transducer portion are formed. In addition, on the other main surface of the surface acoustic wave device 3, the conductive film 31 composed of deposited aluminum is formed over almost all of the surface. The surface having the transducer portion 4 and the wiring pattern 5 thereon is disposed in an opposite relation through the wiring patterns 2 formed on the printed circuit board 1 based on the face-down bonding method with a plurality of conductive connecting members such as bumps 6 composed of a metal. Both of the opposed wiring patterns 2, 5 are electrically connected to form a space portion 10 between the surface acoustic wave device 3 and the printed circuit board 1. The bumps are composed of Au, Ag, solder (Sn-based, Pb-based, In-based and the like), and the like. Further, the conductive film 31 on the other main surface of the surface acoustic wave device 3 and a part of the wiring patterns 2 of the printed circuit board 1 are connected through the resin 35 dispersed with magnetic material composed of ferrite including Ni, Fe, or Co as a main element. Further, the connected portion, which is formed between the surface acoustic wave device 3 and the printed circuit board 1 through the conductive bumps 6, and the surface acoustic wave device 3 are coated with a resin member 11 essentially composed of thermo-setting epoxy resin.

In this case, since the magnetic material can be electrically conductive state mainly in the high-frequency region of not less than 1 GHz, if the noise is induced from extraneous cause, the conductive film receives the induced noise and conducts it through the magnetic material dispersed resin to the wiring pattern of the printed circuit board to earth.

Further, instead of the resin 11 composed of the thermo-setting epoxy resin, the hot-melt type member obtained by forming the frit of the low melt glass including 75% of PbO, 5% OF B2O3, 1% of SiO2, and others such as ZnO, Al2O3, TiO2, Bi2O3, PbF2, CuO in small quantity respectively, can be employed with similar effect.

Embodiments 8–10

Figure 11:
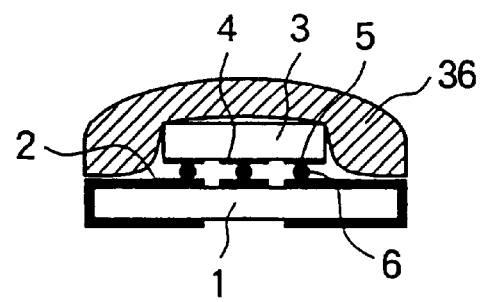
FIG. 11 Sectional view showing the surface acoustic wave device according to Embodiments 8–10 of the present invention.

FIG. 11 is a sectional view showing the surface acoustic wave apparatus according to Embodiments 8–10. In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of an acoustic surface wave device 3, a transducer portion 4 composed of a comb-shaped electrode pattern and a wiring patterns 5 connected electrically to the transducer portion are formed. Further, the surface having the transducer portion 4 and the wiring patterns 5 thereon is disposed in an opposite relation with the wiring patterns 2 formed on the printed circuit board 1 based on the face-down bonding method through a plurality of conductive connecting members such as bumps 6 composed of a metal. Both of the opposed wiring patterns 2, 5 are electrically connected to form a space portion 10 between the surface acoustic wave device 3 and the printed circuit board 1. The bumps are composed of Au, Ag, solder (Sn-based, Pb-based, In-based and the like), and the like.

In embodiment 8, further, the connected portion, which is formed between the surface acoustic wave device 3 and the printed circuit board 1 through the conductive bumps 6, and the surface acoustic wave device 3 are coated by a resin portion such as metal powder dispersed epoxy type resin 36 and the like. In this case, since the resistivity of the metal powder dispersed resin becomes small in the high frequency region and electrically nearly conductive state is realized, even if the noise is induced from the extraneous cause, it flows from the resin to the wiring pattern of the printed circuit board to be earthed.

In Embodiment 9, the connected portion, which is formed between the surface acoustic wave device 3 and the printed circuit board 1 through the conductive bump 6, and the surface acoustic wave device 3 are coated with the resin member-composed of the magnetic powder dispersed resin 36, the magnetic powder being ferrite including Fe, Co, or Ni as a main element. In this case, since the magnetic material can be electrically conductive state mainly in the high-frequency region of not less than 1 GHz, if the noise is induced from extraneous cause, through the magnetic material dispersed resin, further through to the wiring patterns on the printed circuit board, the noise can be earthed.

In Embodiment 10, further, the connected portion, which is formed between the surface acoustic wave device 3 and the printed circuit board 1 through the conductive bump 6, and the surface acoustic wave device 3 are covered by the resin member composed of the electromagnetic wave absorbing material dispersed resin 36. As the electromagnetic wave absorbing material, carbon, ferrite, or the mixture of the both is effective. In this case, since the energy of the ambient noise is absorbed by the electromagnetic wave absorbing material, the adverse effect of the noise on the surface acoustic wave device is alleviated.

Further, as shown in FIG. 11, a predetermined space portion can be intentionally disposed between the surface acoustic wave device 3 and the resin 36 which coats the surface acoustic wave device 3. The resin 36 can be the resin portion 11 shown in FIG. 1 or can be another sealing member. This space portion prevent the surface acoustic wave device 3 from warping during hardening process following heating/melting of the hot-melt type member serving as the sealing member. In other word, when the surface acoustic wave device 3 and the resin portion do not form the space portion between them and are in intimate contact each other, the surface acoustic wave device 3 warps as the hot-melt type member which serves as the resin portion contracts during hardening. By introducing the space portion as described above, such warping can be avoided.

Embodiment 11

Figure 12:
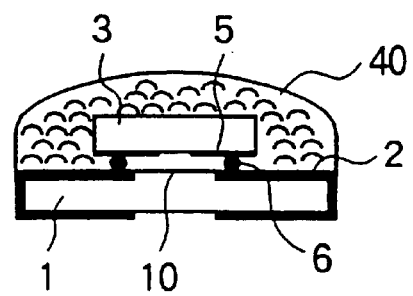
FIG. 12 Sectional view showing the surface acoustic wave device according to Embodiment 11 of the present invention.

FIG. 12 is a sectional view showing the surface acoustic wave apparatus according to Embodiment 11. In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of the surface acoustic wave device 3, a transducer portion 4 composed of a comb-shaped electrode pattern and a wiring pattern 5 connected electrically to the transducer portion are formed. Further, the surface having the transducer portion 4 and the wiring pattern 5 thereon is disposed in an opposite relation with the wiring patterns 2 formed on the printed circuit board 1 based on the face-down bonding method through a plurality of conductive connecting members such as bumps 6 composed of a metal. Both of the opposed wiring patterns 2, 5 are electrically connected to form a space portion 10 between the surface acoustic wave device 3 and the printed circuit board 1. The bumps are composed of Au, Ag, solder (Sn-based, Pb-based, In-based and the like), and the like. Further, the connected portion, which is formed between the surface acoustic wave device 3 and the printed circuit board 1 through the conductive bumps 6, and the surface acoustic wave device 3 are coated with a resin portion composed of the resin 40 which includes the conductive filler composed of such as carbon. In this case, resin including the conductive filler has the low resistivity in the high frequency region and becomes electrically conductive state, even if the noise is induced from the ambient noise, the induced noise flows from the resin to the wiring pattern on the printed circuit board to be earthed. In other word, the electromagnetic wave shield effect (shield effect) against the electrical ambient noise is attained.

Embodiments 12–13

Figure 13:
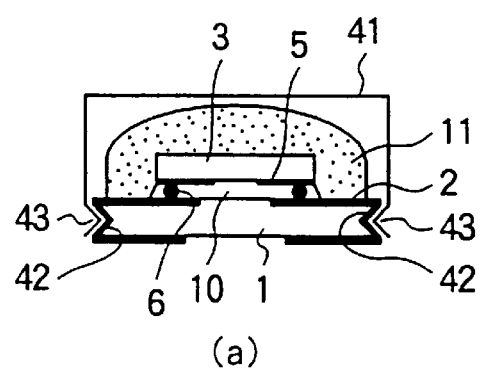
FIG. 13 Sectional view and partial perspective view showing the surface acoustic wave device according to Embodiments 12–13 of the present invention.
Figure 13:
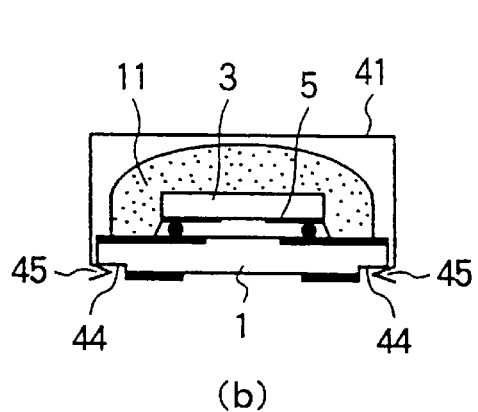
Figure 13:
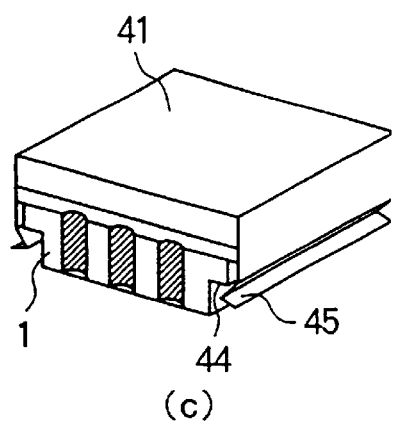

FIG. 13(a) is a sectional view showing the surface acoustic wave apparatus according to Embodiment 12. In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of the surface acoustic wave device 3, a transducer portion 4 composed of a comb-shaped electrode pattern and a wiring pattern 5 connected electrically to the transducer portion are formed. Further, the surface having the transducer portion 4 and the wiring pattern 5 thereon is disposed in an opposite relation with the wiring patterns 2 formed on the printed circuit board 1 based on the face-down bonding method through a plurality of conductive connecting members such as bumps 6 composed of a metal. Both of the opposed wiring patterns 2, 5 are electrically connected to form a space portion 10 between the surface acoustic wave device 3 and the printed circuit board 1. The bumps are composed of Au, Ag, solder (Sn-based, Pb-based, In-based and the like), and the like. Further, the connected portion, which is formed between the surface acoustic wave device 3 and the printed circuit board 1 through the conductive bumps 6, and the surface acoustic wave device 3 are coated with the resin portion 11. Further, concave portions 42 are formed on at least two places of the side surfaces of the printed circuit board, the metal plate having the convex portions 43 at the edge portions is disposed in such a manner that covers at least a part of the resin portion 11, and, further, the metal plate 41 and the printed circuit board 1 are integrated by further engaging the concave portions 42 formed on the side surfaces of the printed circuit board 1 and the convex portions 43 formed at edge portions of the metal plate.

By employing such a structure like this, a flat portion is easily formed on the metal plate and, on that flat metal portion, marking can be easily done by employing a method like stamping and the like.

Further, the metal plate 41 itself can be electrically connected to a part of the wiring patterns 2 of the printed circuit board 1, that is, to an earthing patterns by a method such as a contact connecting method and the like, and is earthed. The easy marking property and the electromagnetic wave shield effect can be given and the resistance against the ambient noise can be improved.

FIG. 13(b) is a sectional view showing the surface acoustic wave device according to Embodiment 13 and FIG. 13(c) is a perspective view of the device. In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of an surface acoustic wave device 3, a transducer portion 4 composed of a comb-shaped electrode pattern and a wiring pattern 5 connected electrically to the transducer portion are formed. Further, the surface having the transducer portion 4 and the wiring pattern 5 thereon is disposed in an opposite relation with the wiring patterns 2 formed on the printed circuit board 1 based on the face-down bonding method with a plurality of conductive connecting members such as bumps 6 composed of a metal. Both of the opposed wiring patterns 2, 5 are electrically connected to form a space portion 10 between the surface acoustic wave device 3 and the printed circuit board 1. The bumps are composed of Au, Ag, solder (Sn-based, Pb-based, In-based and the like), and the like. Further, the connected portion between the surface acoustic wave device 3 and the printed circuit board 1 through the conductive bumps 6 and the surface acoustic wave device 3 are coated with the resin portion 11. Further, cut-out portions 44 are formed on at least two places of the side surfaces of the printed circuit board 1, the metal plate having the protruded portions 45 at the edge portions is disposed in such a manner that covers at least a part of the resin portion 11, and, further, the metal plate 41 and the printed circuit board 1 are integrated by further engaging the cut-out portion 44 formed on the side surfaces of the printed circuit board 1 and the protruded portions 45 formed at edge portions of the metal plate.

By employing a structure like this, the metal plate is precisely set on the printed circuit board. On the flat portion of the metal plate, marking can be easily done by employing a method like stamping and the like.

Further, the metal plate 41 itself can be electrically connected to a part of the wiring patterns 2 of the printed circuit board 1, that is, to an earthing patterns by a method such as a contact connecting method and the like, thus being earthed. The easy marking property as well as the electromagnetic wave shield effect can be given and the resistance against the ambient noise can be improved.

As a method for forming the concave portion 42 or the cut-out portion 44 on the side surfaces of the printed circuit board, the fabricating method for fabricating the printed circuit board can employ a process to laminate the two or three layers of green sheet. Mechanical method can be also employed.

Embodiment 14

Figure 14:
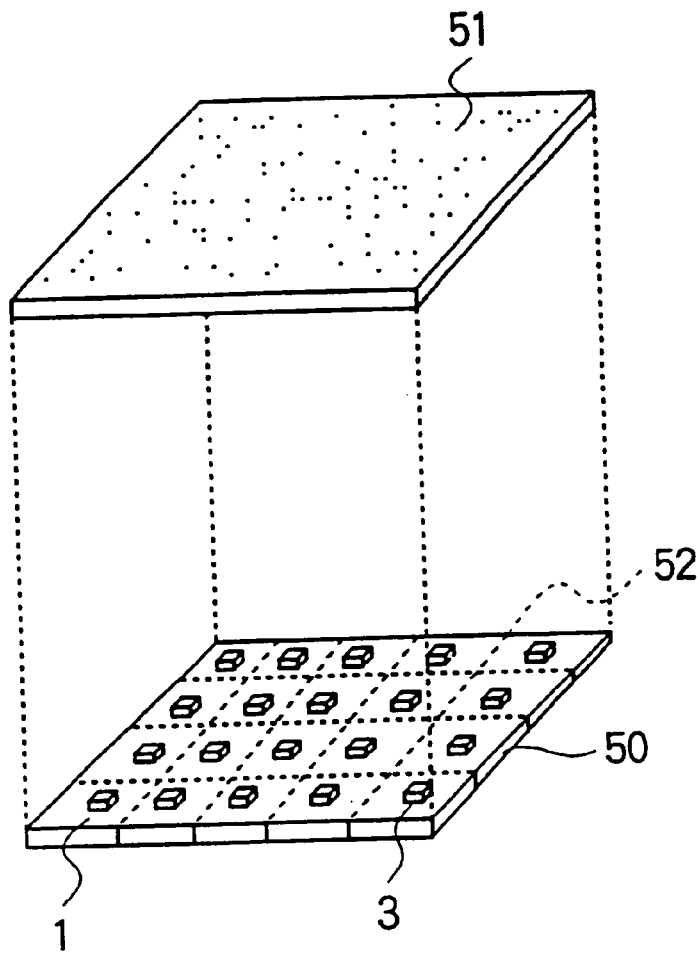
FIG. 14 Figure showing a fabricating method for the surface acoustic wave device according to Embodiment 14 of the present invention.
Figure 14:
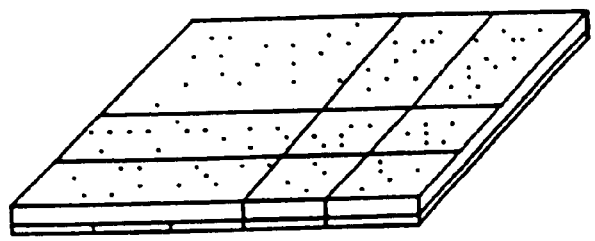

FIG. 14 is a perspective view describing a fabricating method for fabricating the surface acoustic wave apparatus according to Embodiment 14. In FIG. 14(a), an aggregate of a plurality of printed circuit boards 50 is disposed and grooves or perforations 52 are formed mechanically in such a manner that the dividing operation can be executed easily to obtain individual printed circuit boards 1 after division.

A plurality of surface acoustic wave devices are aligned to the aggregate of a plurality of printed circuit boards at respective predetermined positions, and the device 3 and the aggregate 50 of the printed circuit board are assembled with a predetermined spacing between them through the electrical connecting portions (not shown).

Further, a sheet of the hot-melt type resin 51 is aligned to the aggregate of the printed circuit board 50 and is hardened by heating and melting.

After this, as shown in FIG. 14(b), the aggregate 50 of a plurality of printed circuit boards is divided together with the sheet of the resin 51 along the grooves or the perforation 52 to obtain the individual surface acoustic wave apparatuses.

In this case, the connecting member and the surface acoustic wave device are collectively assembled on the aggregate of the printed circuit boards, then a sheet of the resin is disposed on them and sealed. That is, because a plurality of apparatuses are obtained simultaneously, the productivity can be improved.

Embodiment 15

A printed circuit board having a shape of 4 mm×4 mm×0.5 mm and a surface acoustic wave device having a shape of 2 mm×2 mm (central frequency is at 1.5 GHz) are electrically connected through bumps 6 with a space portion having a spacing of 30 $\mu$m. A sheet of a resin (4 mm×4 mm×0.4 mm) is disposed thereon, and sealing properties are evaluated on the embodiment samples which are obtained by varying the conditions for heating/melting and hardening.

Figure 15:
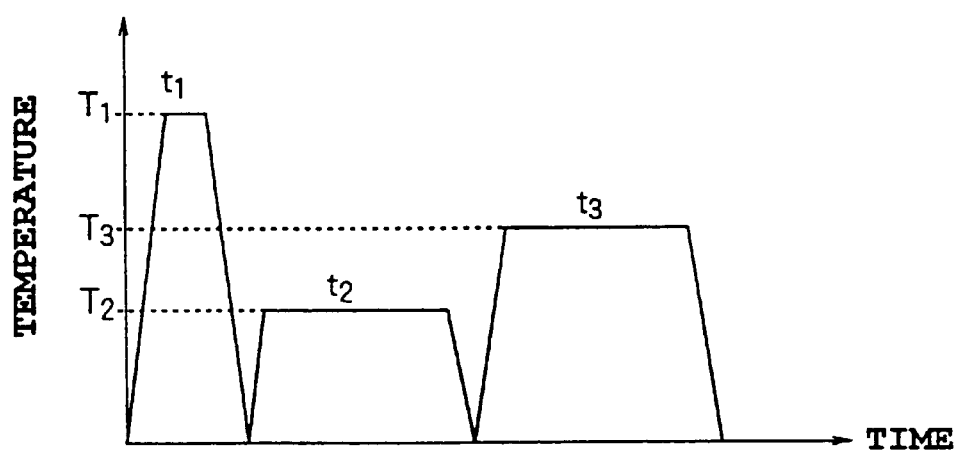
FIG. 15 Figure showing heating condition during fabrication of the surface acoustic wave device according to Embodiment 15 of the present invention.

FIG. 15 is a temperature profile showing the operating time-temperature relationship for heating/melting and hardening steps. Further, in Table 1, data obtained for such items as hardening state, airtightness of the sealed part, and frequency characteristic which constitute evaluation basis are shown by evaluating 10 samples respectively of respective embodiments. Here, respective evaluations were done based on the following criteria, that is, good appearance with eye inspection for the hardening state, being bubble free when immersed in the inert liquid for the airtightness, minimum insertion loss being not larger than 3 dB for the frequency characteristic. Resin members A and B are the sheets of the resin (thermo-setting epoxy resin ) of the present invention, A being bis-phenol A type epoxy resin having glass transition temperature of 162° C., B being phenol-novolac type crystalline epoxy resin having the glass transition temperature of 135° C. For reference, data for the conventional liquid potting resin (glass transition temperature 130° C.) are shown as resin member C.

Au bumps are formed on a part of the wiring patterns as a plurality of connecting members, the wafer is cut to obtain individual surface acoustic wave devices. In this case, the speed of the cutting blade and the resistivity of the water used during the cutting operation are varied and the obtained devices are evaluated. As a piezoelectric wafer, a 3 inches 36° Y-cut LiTaO3 having a pyroelectric coefficient of $2.3 \times 10^{-5} C/(deg \cdot m^2)$ is employed, and thereon the transducer portion composed of the predetermined electrode pattern and the wiring pattern, which is electrically connected and provides the signal, are formed as Al films with PEP and the like method. After Au bumps are formed on a part of the wiring pattern, the wafer is cut to 2 mm×2 mm size to obtain the individual acoustic surface wave devices. Fifty pieces of thus obtained surface acoustic wave devices are evaluated about cutting performance and the results are shown in Table 2. For reference, the results obtained under the cutting conditions outside the present invention are also shown in Table 2.

TABLE 1

|  | No | Resin Member | Heating Temp. T1 (C.) | Melting Time t1 (sec) | Hardening (1) Temp. T2 (C.) | Hardening (1) Time t2 (H) | Hardening (2) Temp. T2 (C.) | Hardening (2) Time t3 (H) | Hardened State Yield | Airtightness Yield | Frequency Characteristic | Judgement |
|---|---|---|---|---|---|---|---|---|---|---|---|---|
| Embodiment | 1 | A | 100 | 600 | 110 | 4 | 150 | 16 | 9/10 | 9/10 | 10/10 | OK |
|  | 2 | A | 120 | 600 | 110 | 4 | 150 | 16 | 10/10 | 10/10 | 10/10 | OK |
|  | 3 | A | 130 | 420 | 110 | 4 | 150 | 16 | 10/10 | 10/10 | 10/10 | OK |
|  | 4 | A | 140 | 360 | 120 | 4 | 150 | 6 | 10/10 | 10/10 | 10/10 | OK |
|  | 5 | A | 150 | 120 | 120 | 4 | 150 | 6 | 10/10 | 10/10 | 10/10 | OK |
|  | 6 | A | 160 | 90 | 120 | 4 | 150 | 6 | 10/10 | 10/10 | 10/10 | OK |
|  | 7 | A | 160 | 60 | — | — | 150 | 10 | 10/10 | 10/10 | 10/10 | OK |
|  | 8 | A | 170 | 90 | 120 | 4 | 150 | 6 | 10/10 | 10/10 | 10/10 | OK |
|  | 9 | A | 180 | 60 | 120 | 4 | 150 | 6 | 10/10 | 10/10 | 10/10 | OK |
|  | 10 | A | 180 | 60 | 120 | 4 | 150 | 16 | 10/10 | 10/10 | 10/10 | OK |
|  | 11 | A | 190 | 30 | 120 | 4 | 150 | 6 | 10/10 | 10/10 | 9/10 | OK |
|  | 12 | B | 110 | 420 | 100 | 4 | 130 | 6 | 10/10 | 9/10 | 9/10 | OK |
|  | 13 | B | 120 | 210 | 100 | 4 | 130 | 6 | 10/10 | 10/10 | 10/10 | OK |
|  | 14 | B | 120 | 120 | 100 | 4 | 130 | 6 | 10/10 | 10/10 | 10/10 | OK |
|  | 15 | B | 130 | 180 | 100 | 4 | 130 | 6 | 10/10 | 10/10 | 10/10 | OK |
|  | 16 | B | 140 | 120 | 100 | 4 | 130 | 6 | 10/10 | 9/10 | 9/10 | OK |
| Reference | 1 | C | (dripping) |  | 80 | 1 | 150 | 3 | 10/10 | 10/10 | 0/10 | NG |
|  | 2 | A | 90 | 600 | 110 | 4 | 150 | 6 | 0/10 | 0/10 | 9/10 | NG |
|  | 3 | A | 210 | 30 | 120 | 4 | 150 | 6 | 5/10 | 10/10 | 1/10 | NG |
|  | 4 | A | 160 | 90 | 120 | 1 | 150 | 0.5 | 3/10 | 3/10 | 9/10 | NG |
|  | 5 | B | 90 | 900 | 100 | 4 | 130 | 6 | 0/10 | 0/10 | 1/10 | NG |
|  | 6 | B | 100 | 600 | 100 | 4 | 130 | 6 | 3/10 | 0/10 | 0/10 | NG |
|  | 7 | B | 150 | 60 | 150 | 4 | 130 | 6 | 10/10 | 3/10 | 2/10 | NG |
|  | 8 | B | 120 | 60 | 120 | 0.5 | 130 | 1 | 8/10 | 0/10 | 9/10 | NG |

As apparent from Table 1, by implementing the process relating to heating/melting/hardening of the sheet of the resin in three steps, that is, (1) the step for determining the shape of the resin by heating/melting of the sheet of the resin, (2) the step for transferring into gelatinous state maintaining the shape of the resin, (3) the step for hardening the resin, and by setting the process temperature of the step (2) lower than that of the steps (1) or (2), sealing performance can be improved.

However, if the process temperature of the step (1) is set much higher or much lower than the glass transition temperature, the good sealing performance can not be obtained as apparent from the reference examples.

Embodiment 16

In a fabricating method for fabricating the surface acoustic wave apparatus according to Embodiment 16, the transducer portion and a plurality of wiring patterns connected electrically to the transducer portion are formed on one main surface of the wafer which is a piezoelectric material. After

TABLE 2

| No. | Cutting Speed (mm/sec) | Resistivity of Water (MΩcm) | Destructed Pattern due to Discharge | Electrode Erosion | Chipping | Judgement |
|---|---|---|---|---|---|---|
| Embodiments |  |  |  |  |  |  |
| 1 | 10 | 13 | 0/50 | 0/50 | 0/50 | OK |
| 2 | 10 | 0.3 | 0/50 | 0/50 | 0/50 | OK |
| 3 | 25 | 13 | 0/50 | 0/50 | 0/50 | OK |
| 4 | 25 | 0.3 | 0/50 | 0/50 | 0/50 | OK |
| 5 | 50 | 13 | 0/50 | 0/50 | 0/50 | OK |
| 6 | 50 | 0.3 | 0/50 | 0/50 | 0/50 | OK |
| References |  |  |  |  |  |  |
| 1 | 0.3 | 13 | 0/50 | 30/50 | 0/50 | NG |
| 2 | 0.3 | 0.3 | 10/50 | 10/50 | 0/50 | NG |

TABLE 2-continued

| No. | Cutting Speed (mm/sec) | Resistivity of Water (MΩcm) | Destructed Pattern due to Discharge | Electrode Erosion | Chipping | Judgement |
|---|---|---|---|---|---|---|
| 3 | 0.3 | 0.004 | 50/50 | 5/50 | 0/50 | NG |
| 4 | 3 | 13 | 0/50 | 5/50 | 0/50 | NG |
| 5 | 3 | 0.3 | 5/50 | 20/50 | 0/50 | NG |
| 6 | 3 | 0.004 | 50/50 | 3/50 | 0/50 | NG |
| 7 | 10 | 0.004 | 50/50 | 3/50 | 0/50 | NG |
| 8 | 25 | 0.004 | 50/50 | 3/50 | 0/50 | NG |
| 9 | 50 | 0.004 | 30/50 | 0/50 | 0/50 | NG |
| 10 | 75 | 13 | 0/50 | 0/50 | 28/50 | NG |
| 11 | 75 | 0.3 | 0/50 | 0/50 | 30/50 | NG |
| 12 | 75 | 0.004 | 0/50 | 0/50 | 24/50 | NG |

As apparent from Table 2, after the transducer portion and a plurality of wiring patterns connected electrically to the transducer portion are formed on one main surface of the wafer composed of piezoelectric material, and a plurality of connecting members are formed on a part of the wiring pattern, the individual surface acoustic wave devices are obtained by cutting. At this time, by controlling the cutting conditions such as the cutting speed in the range of 10–50 mm/sec and the resistivity of water during the cutting operation in the range of 0.01–100 MΩcm, the damage due to the electrostatic charge induced during the cutting operation can be avoided. In more concrete, destruction and deterioration of the transducer portion or the electrode wiring pattern can be prevented.

Further, for the wafer of the piezoelectric material, instead of the 36° Y-cut LiTaO3, other wafer can be used with similar result.

Embodiment 17

A fabricating method for fabricating the surface acoustic wave apparatus according to Embodiment 17 will be described.

Firstly, the connecting member which serves as an electrical connecting portion was formed on the wiring pattern formed on at least one main surface of the printed circuit board. Gold was plated on the wiring pattern of the printed circuit board. For the connecting member of this case, Au bumps were employed. Then, the surface acoustic wave device was aligned to the printed circuit board at a predetermined position, and the surface acoustic device and the printed circuit board were assembled with a predetermined spacing through the electrical connecting portion. Here, during connecting operation, heating as well as ultra-sound were employed. Further, a sheet of the hot-melt type member was aligned to the printed circuit board, and, by heating and melting the sheet of the resin, the surface acoustic wave apparatus was obtained leaving the space portion between the printed circuit board and the device.

For reference purpose, the connecting members serving as electrical connecting portion were formed on a part of the wiring pattern with parallel use of ultra-sound heating and the other after a transducer portion and a wiring pattern connecting to the transducer portion was formed on one main surface of the wafer which forms the surface acoustic wave device. After cutting, the individual acoustic surface wave device were obtained. After this, thus obtained surface acoustic wave devices were aligned to the printed circuit board at a predetermined position, and the surface acoustic wave devices and the printed circuit board were assembled with a predetermined spacing through the electrical connecting portion. Here, the connecting operation was executed under application of the heating while applying ultra-sound. Then, the sheet of the hot-melt type resin was aligned to the printed circuit board, the sheet of the resin was heated/melted, and the surface acoustic wave apparatuses, which have a structure having the space portions between the printed circuit board and the devices, were obtained.

After leaving these surface acoustic wave apparatuses under high temperature of 200° C. for 100 hrs, number of the apparatuses having the deteriorated performance were compared. When the variation of the minimum insertion loss was over 1 dB, the device was judged as deteriorated. When the connecting members according to the fabricating method for fabricating the surface acoustic wave apparatuses of the present invention were formed precedently on the wiring pattern of the printed circuit board, the number of the deteriorated devices was 1/50. On the contrary, in the reference cases where the connecting members were formed precedently on the wiring pattern of the wafer, the number of the deteriorated apparatuses were 10/50.

As apparent from these results, after the conductive connecting member which works as the electrical connecting portion are formed on the wiring pattern formed on at least one main surface of the printed circuit board, by assembling the device and the printed circuit board through the conductive connecting member with a predetermined spacing, the heat history to the boundary surface of the connecting portion formed between the surface acoustic wave device and the conductive connecting member which serves as the electrical connecting portion can be alleviated. Thus, the connecting strength and the reliability can be improved.

The respective surface acoustic wave apparatuses according to Embodiments 5–13 were actually fabricated and the evaluated results of the noise level and the like are shown in Table 3.

TABLE 3

| No | Embodiment No. | Application | Spacing between device and substrate (μm) | Bump Material | Device Material | Dimension of Device (mm) | Printed Circuit Board | Dimension of Printed circuit board (mm) | Noise Level (Relative value.) (100 is assigned to a state without shield.) |
|---|---|---|---|---|---|---|---|---|---|
| 1 | 5 | Mobile | 20 | Au | LiTaO3 | 1.7 × 1.4 | Alumina | 3.8 × 3.8 | 30 |
| 2 | 6 | TV | 30 | Sn-Ag | LiNbO3 | 9.0 × 1.5 | Glass coated Alumina | 12.0 × 4.0 | 35 |

TABLE 3-continued

| No | Embodiment No. | Application | Spacing between device and substrate (μm) | Bump Material | Device Material | Dimension of Device (mm) | Printed Circuit Board | Dimension of Printed circuit board (mm) | Noise Level (Relative value.) (100 is assigned to a state without shield.) |
|---|---|---|---|---|---|---|---|---|---|
| 3 | 7 | Mobile | 25 | Au | LiNbO3 | 2.0 × 2.0 | Glass Epoxy | 4.8 × 5.2 | 42 |
| 4 | 8 | TV | 35 | Pb-Sm | LiTaO3 | 12.0 × 3.0 | Bakelite | 15.0 × 5.0 | 58 |
| 5 | 9 | TV | 35 | Al | Quartz | 12.0 × 3.0 | Alumina | 15.0 × 5.0 | 60 |
| 6 | 10 | TV | 35 | Cu | LiTaO3 | 12.0 × 3.0 | Glass Epoxy | 15.0 × 5.0 | 48 |
| 7 | 11 | Mobile | 20 | In-Sn | LiTaO3 | 1.7 × 1.4 | Glass coated Alumina | 3.8 × 3.8 | 53 |
| 8 | 12 | Mobile | 25 | Au | LiNbO3 | 1.7 × 1.4 | Alumina | 3.8 × 3.8 | 28 |
| 9 | 13 | Mobile | 25 | Au | LiNbO3 | 1.7 × 1.4 | Alumina | 3.8 × 3.8 | 25 |
| 10 | 14 | Mobile | 30 | Sn-Ag | LiTaO3 | 2.0 × 2.0 | Alumina | 4.0 × 4.0 | — |
| 11 | 15 | Mobile | 30 | Au | LiTaO3 | 2.0 × 2.0 | Alumina | 4.0 × 4.0 | — |
| 12 | 16 | Mobile | 30 | Au | LiTaO3 | 2.0 × 2.0 | Alumina | 4.0 × 4.0 | — |
| 13 | 17 | Mobile | 30 | Au | LiNbO3 | 2.0 × 2.0 | Alumina | 4.0 × 4.0 | — |

Embodiment 18

Figure 16:
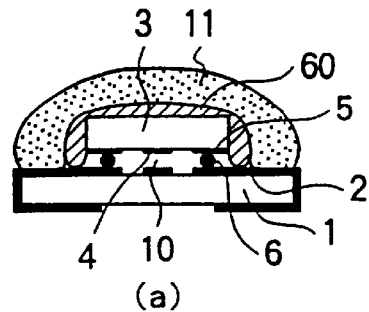
FIG. 16 Sectional view and partial plan view showing the acoustic surface wave device according to Embodiment 18 of the present invention.
Figure 16:
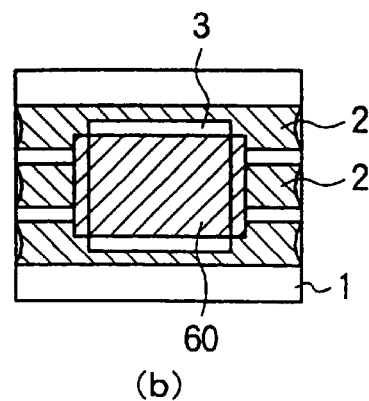

FIG. 16(a) is a sectional view showing the surface acoustic wave apparatus according to Embodiment 18.

In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of an surface acoustic wave device 3, a transducer portion 4 composed of a comb-shaped electrode pattern and a wiring pattern 5 connected electrically to the transducer portion 4 are formed. Further, the surface having the transducer portion 4 and the wiring pattern 5 thereon is disposed in an opposite relation with the wiring patterns 2 formed on the printed circuit board 1 based on the face-down bonding method through a plurality of conductive connecting members such as bumps 6 composed of a metal. Both of the opposed wiring patterns 2, 5 are electrically connected to form a space portion 10 between the surface acoustic wave device 3 and the printed circuit board 1. The bumps are composed of Au, Ag, solder (Sn-based, Pb-based, In-based and the like), and the like. Further, at least on a part between the other main surface of the surface acoustic wave device 3 and the resin portion 11, buffering member 60 is disposed. Further, the connected portion, which is formed between the surface acoustic wave device 3 and the printed circuit board 1 through the conductive bumps 6, and the surface acoustic wave device 3 are coated with a resin member 11 essentially composed of thermo-setting type bis-phenol A type epoxy resin which serves as the hot-melt type member.

FIG. 16(b) is an example of a plan view showing the printed circuit board 1 prior to the coating by the resin portion 11. On the other surface of the surface acoustic wave device 3 is disposed the buffering member 60.

For the buffering member, such material as elastic rubber sheet rich in elasticity can be cited. Instead, a sheet of metal foil or two sheet of waxed paper laminated together can be disposed. With these structures, the strain caused by the contraction or the difference of the thermal expansions during hardening of the resin members can be alleviated. Such buffering member can be disposed in such a manner that it covers the whole or a part of the other surface the surface acoustic wave device 3.

Further, such buffering member can be formed with following fabricating process.

Figure 48:
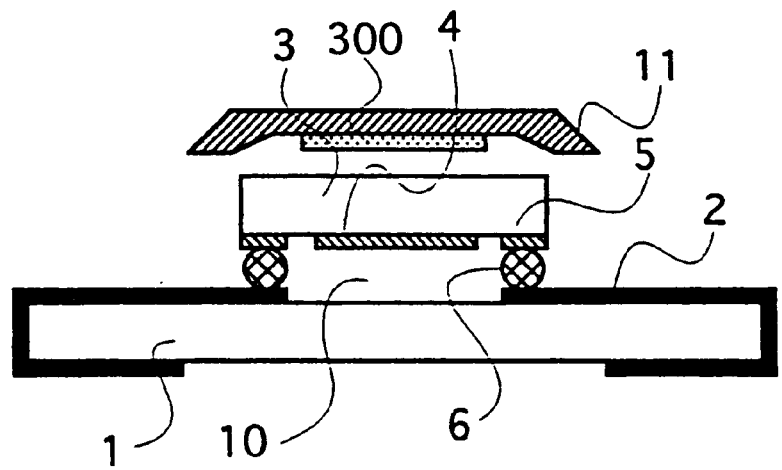
FIG. 48 Figure showing a fabricating method for the surface acoustic wave device according to other embodiments of the present invention.
Figure 48:
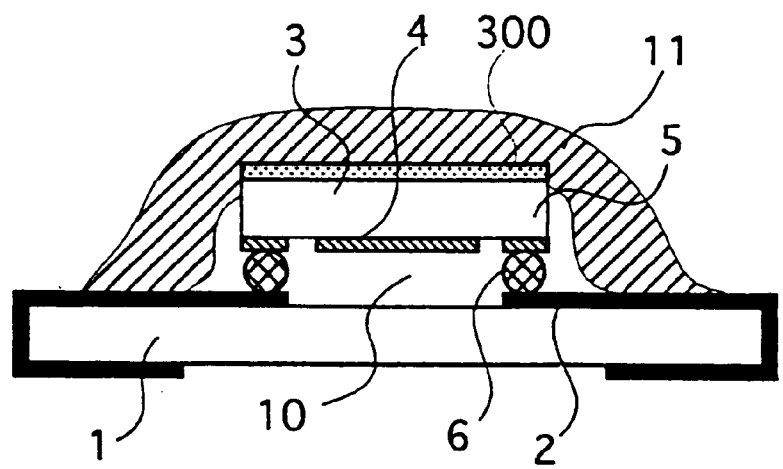

That is, liquid silicone 300 is coated on the bottom surface of the concave shaped resin part 11 as shown in FIG. 48(a). Then, the concave shaped resin part 11 is disposed in such a manner that the resin covers the surface acoustic wave device 3. Next, by heating/melting the concave shaped resin part 11, the surface acoustic wave device 3 is sealed, wherein, as shown in FIG. 48(b), the liquid silicone becomes rubber like state and serves as the buffering member. In this case, although the liquid silicone 300 works as the buffering member after the heating/melting step, before this step, it works as if a glue and aligns the hot-melt type member.

Figure 49:
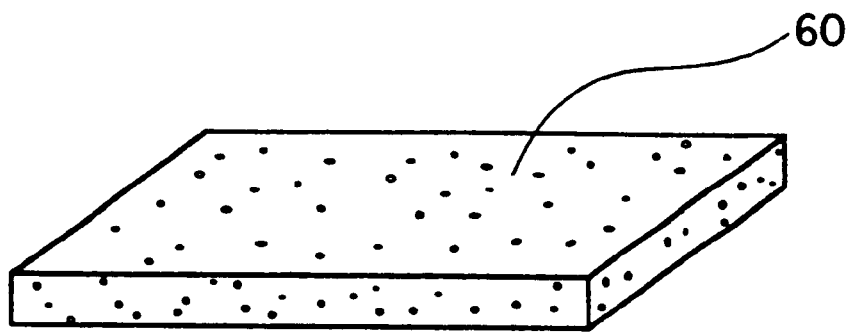
FIG. 49 Figure showing a fabricating method for the surface acoustic wave device according to other embodiments of the present invention.
Figure 49:
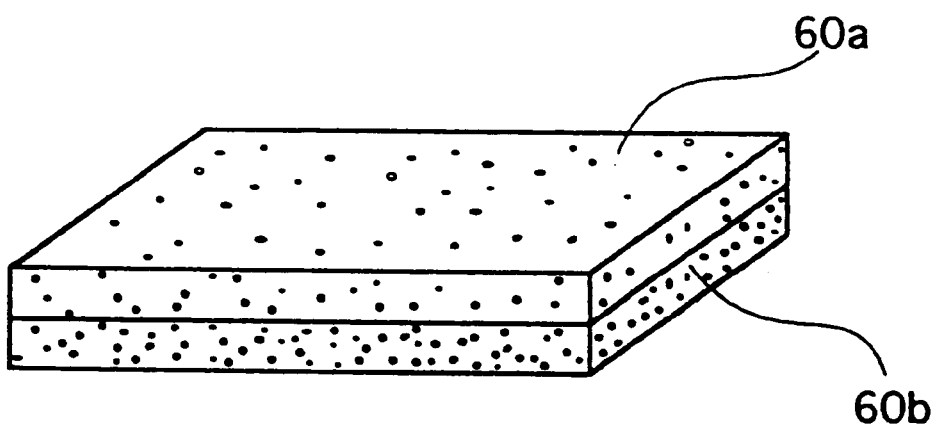

Further, other than the cited buffering members, a space portion (air) can be introduced between the resin portion 11 and the device 3. That is, as shown in FIG. 49(a), the epoxy resin having a low packing density can be used as raw material of the resin member 60, thereby, due to the remaining bubbles in the resin, the epoxy resin having the lower bulk density than that obtained in Embodiment 1 can be obtained by cold pressing after heating/melting. Further, as shown in FIG. 49(b), two layers of resin material having fillers of different densities, that is, different bubble densities, can be applied. That is, by applying the epoxy resin 60b having low packing density (high fluidity material) for the layer facing the functional device 3 and higher packing density one 60a (high fluidity material) than one used in Embodiment 1 for the other layer, the two layers of resin material having different densities are realized. In this case, the fluidity of the material can be controlled by varying the quantity of the hardener or the filler in the resin.

Embodiment 19

Figure 17:
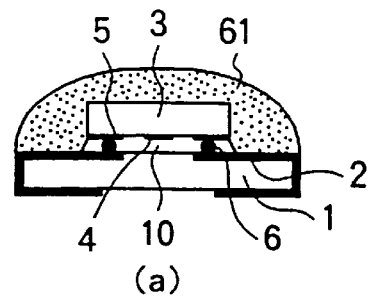
FIG. 17 Sectional view and partial plan view showing the surface acoustic wave device according to Embodiment 19 of the present invention.
Figure 17:
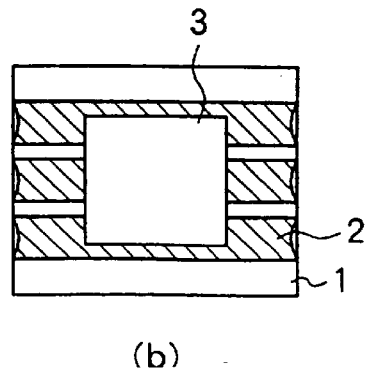

FIG. 17(a) is a sectional view showing the surface acoustic wave apparatus according to Embodiment 19.

In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of an acoustic surface wave device 3, a transducer portion 4 composed of a comb-shaped electrode pattern and a wiring pattern 5 connected electrically to the transducer portion are formed. Further, the surface having the transducer portion 4 and the wiring pattern 5 thereon is disposed in an opposite relation with the wiring patterns 2 formed on the printed circuit board 1 based on the face-down bonding method through a plurality of conductive connecting members such as bumps 6 composed of a metal. Both of the opposed wiring patterns 2, 5 are electrically connected to form a space portion 10 between the surface acoustic wave device 3 and the printed circuit board 1. The bumps are composed of Au, Ag, solder (Sn-based, Pb-based, In-based and the like), and the like. Further, the connected portion formed between the surface acoustic wave device 3 and the printed circuit board 1 with the conductive bumps 6 and the acoustic surface wave device 3 are coated with the resin member 11 of thermo-setting type epoxy resin composed of glass filler incorporated resin 61.

FIG. 17(b) is an example of a plan view showing the printed circuit board 1 prior to the coating by the resin portion 11 composed of the glass filler incorporated resin 61.

As an example of the glass filler, such as fused silica, amorphous silica, and crystalline silica or the low melt glass contained such as PbO-B2O3 system or SiO2, Al2O3, PbF2, and the like can be cited. In this embodiment, fractured fused silica was employed. The shape of that silica were distributed within the average particle diameter ranging from 0.5 µm to 5 µm. With such a structure, a thermal expansion coefficient of the resin portion can be made small enough to be close to that of the surface acoustic wave device or the printed circuit board. Thus, the strain induced by the stress can be alleviated, the reliability involving the thermal shock resistance can be improved, and the mechanical strength can be improved.

Embodiment 20

Figure 18:
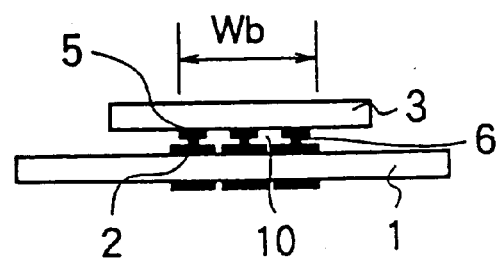
FIG. 18 Sectional view and partial plan view showing the surface acoustic wave device according to Embodiment 20 of the present invention.
Figure 18:
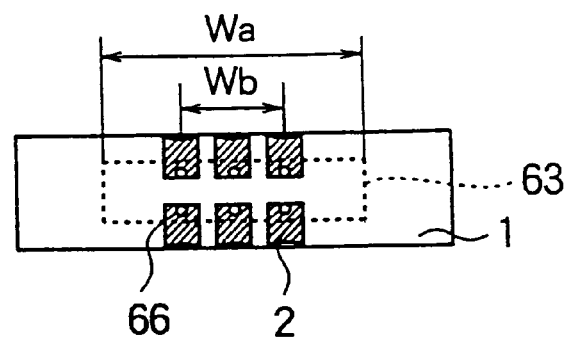

FIG. 18(a) is a sectional view showing the surface acoustic wave apparatus according to Embodiment 20 except for the hot-melt type member 11. In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of a surface acoustic wave device 3, a transducer portion 4 composed of a comb-shaped electrode pattern and a wiring pattern 5 connected electrically to the transducer portion are formed. Further, the surface having the transducer portion 4 and the wiring pattern 5 thereon is disposed in an opposite relation with the wiring patterns 2 formed on the printed circuit board 1 based on the face-down bonding method through a plurality of conductive connecting members such as bumps 6 composed of a metal. Both of the opposed wiring patterns 2, 5 are electrically connected to form a space portion 10 between the surface acoustic wave device 3 and the printed circuit board 1. The bumps are composed of Au, Ag, solder (Sn-based, Pb-based, In-based and the like), and the like. Further, the connected portion, which is formed between the surface acoustic wave device 3 and the printed circuit board 1 through the conductive bumps 6, and the surface acoustic wave device 3 are coated with the resin portion of thermo-setting type epoxy resin (not shown).

FIG. 18(b) is a plan view showing a state further eliminated the surface acoustic wave device 3. Here, the positions 66 to be disposed with the connecting members 6 are disposed around a central portion wb against the longer side wa of the surface acoustic wave device 3. More preferably, ratio wb/wa is less than 0.75.

Figure 19:
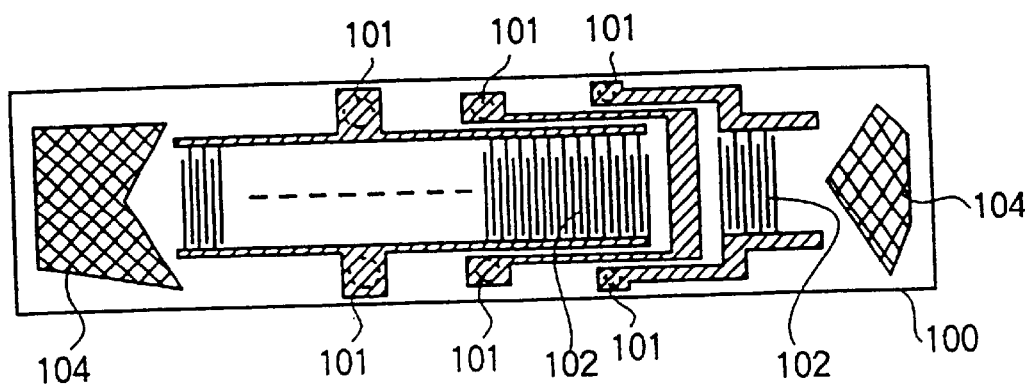
FIG. 19 Plan view showing the surface acoustic wave device according to Embodiment 20 of the present invention.

FIG. 19 is a plan view showing the surface acoustic wave device of the present embodiment.

As shown in this figure, on a piezoelectric substrate 100 having a relatively long and narrow rectangular shape, a plurality of pairs of the comb-shaped electrodes 102 are formed. Further, on the piezoelectric substrate 100, sound absorbing materials 104 are formed in such a manner that sandwiches the comb-shaped electrodes 102. Further, on both sides adjacent to the near center portion on the piezoelectric substrate 100, a plurality of external connecting terminals 101 are intensively disposed. And, the external connecting terminals 101 disposed around the central portion and the comb-shaped electrodes 102, which connect to the terminals and are disposed relatively outside, are electrically connected by extending the external connecting terminals 101.

Figure 20:
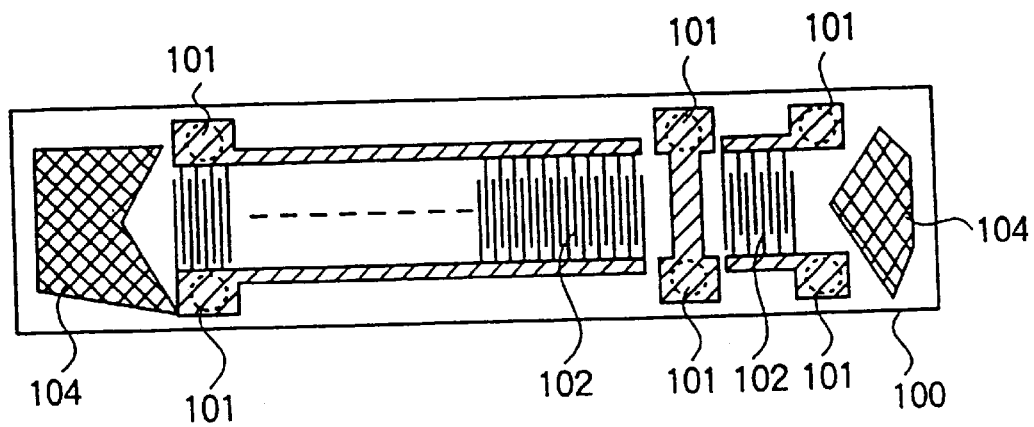
FIG. 20 Plan view showing a conventional surface acoustic wave device.

By the way, a structure of a conventional surface acoustic wave device of this kind is shown in FIG. 20. The external connecting terminals 101 of the conventional surface acoustic wave device are disposed at the closest positions, namely, making unnecessary the extended portions.

Figure 21:
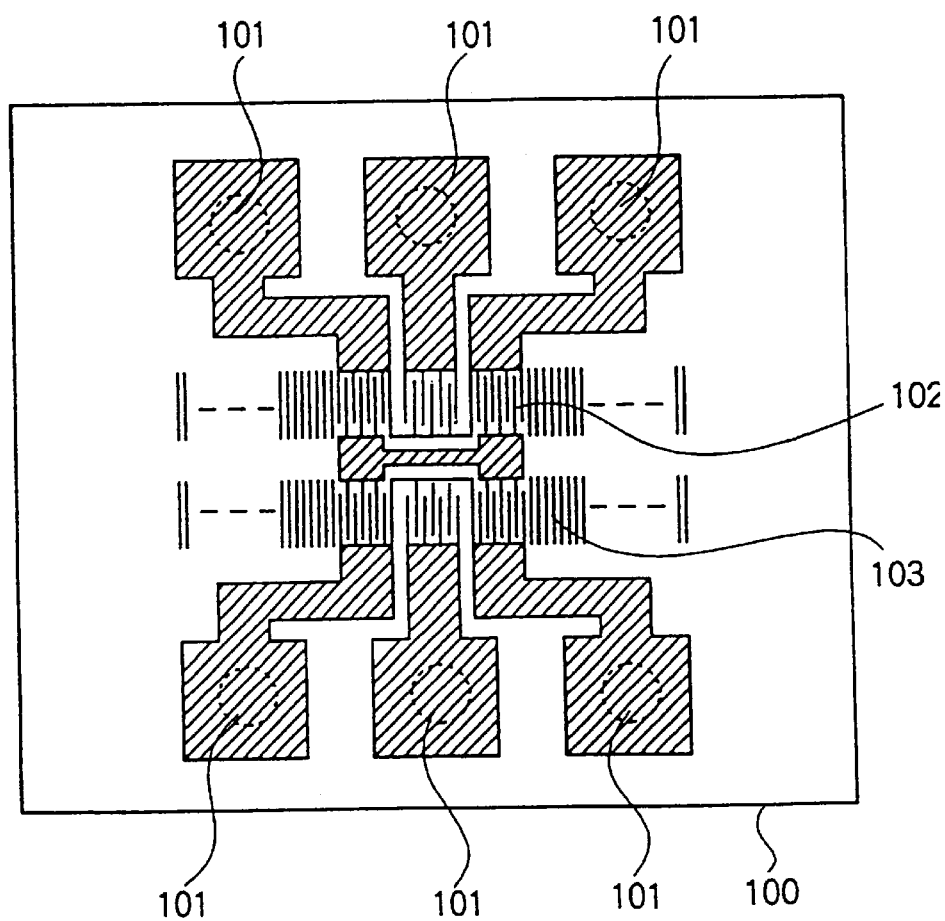
FIG. 21 Plan view showing a conventional surface acoustic wave device.

Further, an example of a surface acoustic wave device not so long and narrow in shape is shown in FIG. 21. Here, code 103 shows a reflector portions. The surface acoustic wave device of this shape can be employed in the surface acoustic wave apparatus of the present invention.

Thus, by disposing intensively a plurality of connecting members in an opposed position around the central portion of the device, the concentration of the strain due to stress induced by differences between the thermal-expansion coefficients of the constitutional elements can be alleviated. This is particularly effective when being applied to the surface acoustic wave device 3 having a long and narrow shape. Further, not to mention, whether the connecting members 6 are precedently formed on the printed circuit board 1 or on the surface acoustic wave device 3 is arbitrary, and either cases are included in the present invention.

Embodiment 21

Figure 22:
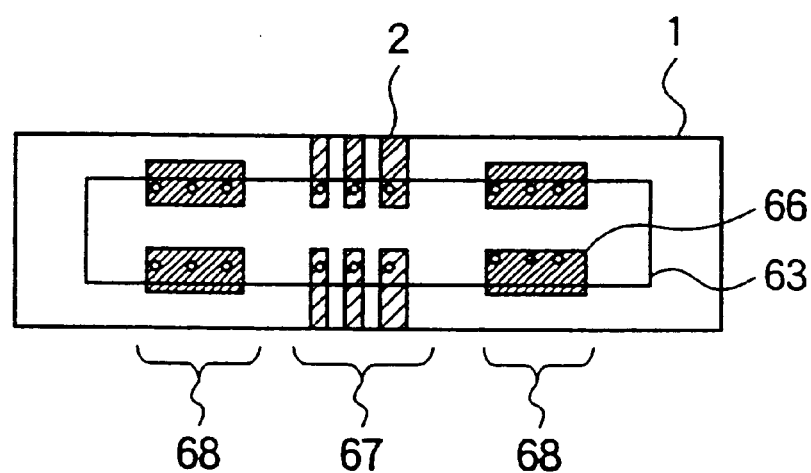
FIG. 22 Plan view showing the surface acoustic wave device according to Embodiment 21 of the present invention.

FIG. 22 is a figure showing a surface acoustic wave device according to Embodiment 21, that is, showing a plan view in which the hot-melt type member 11 and the surface acoustic wave device 3 are eliminated. In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of the surface acoustic wave device (not shown), a transducer portion 4 composed of a comb-shaped electrode pattern and a wiring pattern 5 connected electrically to the transducer portion are formed. Further, the surface having the transducer portion 4 and the wiring pattern 5 thereon is disposed in an opposite relation with the wiring pattern 2 formed on the printed circuit board 1 based on the face-down bonding method through a plurality of conductive connecting members such as bumps 6 composed of a metal. Both of the opposed wiring patterns 2, 5 are electrically connected to form a space portion (not shown) between the surface acoustic wave device 3 and the printed circuit board 1. The bumps are composed of Au, Ag, solder (Sn-based, Pb-based, In-based and the like), and the like. Further, the connected portion formed between the surface acoustic wave device 3 and the printed circuit board 1 through the conductive bumps 6 and the surface acoustic wave device 3 are coated with the resin portion of thermo-setting type epoxy resin (not shown). Here, a plurality of connecting members 67 involving in the electrical connection are disposed intensively around the central portion of the surface acoustic wave device in an opposite position. Further, a plurality of connecting members 68 not involving in the electrical connection are disposed along the peripheral portion of the surface acoustic wave device in an opposite position.

Figure 23:
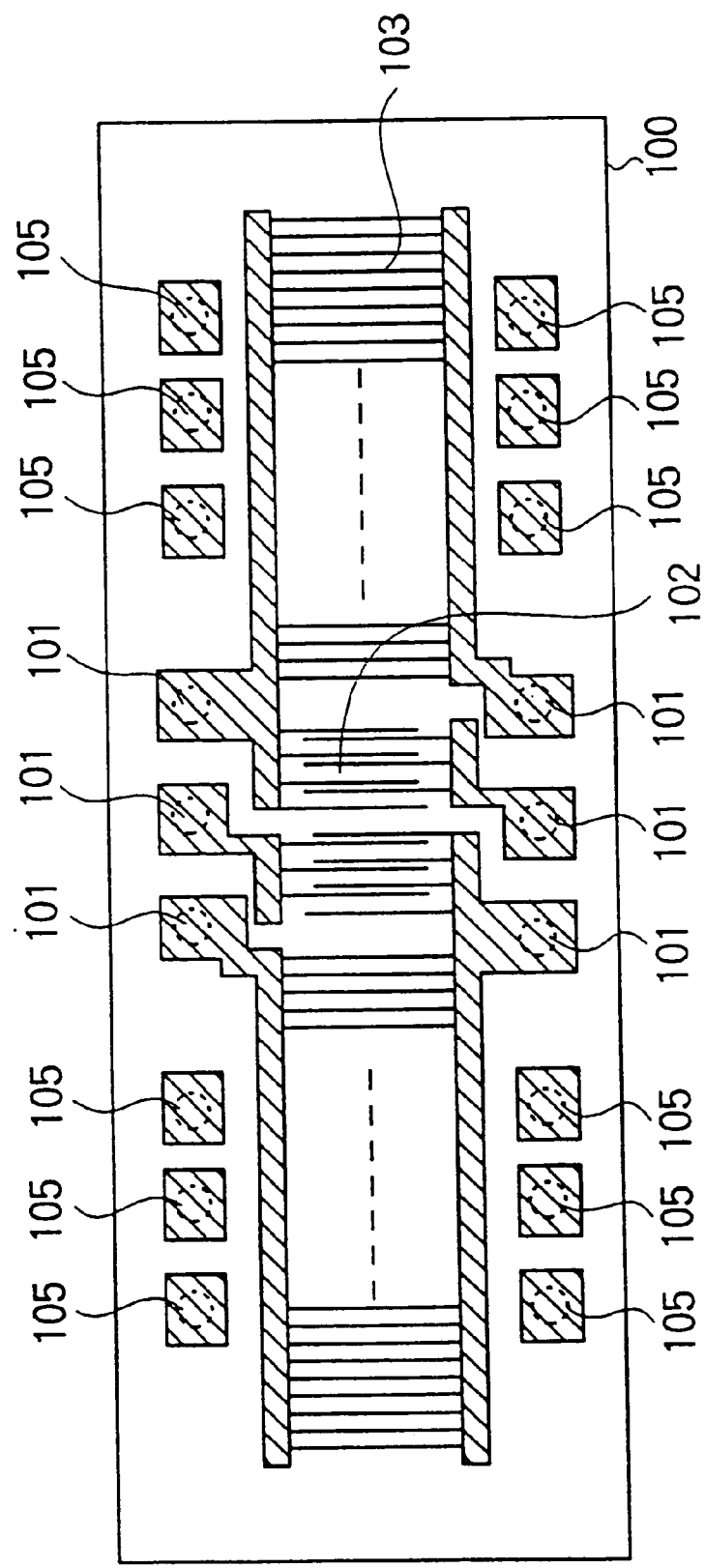
FIG. 23 Plan view showing the surface acoustic wave device according to Embodiment 21 of the present invention.

FIG. 23 is a plan view showing the surface acoustic wave device according to the present embodiment.

As shown in this figure, around central portion of the piezoelectric substrate 100 having a relatively long and narrow rectangular shape, a pair of the comb-shaped electrodes 102 are formed. Further, on the piezoelectric substrate 100, the reflector portions 103 are formed in such a manner that sandwiches the comb-shaped electrodes 102. Further, on both sides adjacent to the near center portion on the piezoelectric substrate 100, a plurality of external connecting terminals 101 are intensively disposed. And, on the relatively outside position of the piezoelectric substrate 100, the bonding pad portions 105 not involving in the electrical connection are disposed.

By doing like this, the surface acoustic wave device and the printed circuit board can be more firmly connected and a plurality of connecting members 68, which are disposed in an opposite position around the peripheral portion of the surface acoustic wave device, prevent the sheet of the resin from intruding into the transducer portion of the surface acoustic wave device. This is particularly effective when being applied to the surface acoustic wave device having a long and narrow shape. Further, not to mention, whether the connecting members 6 are precedently formed on the printed circuit board 1 or on the surface acoustic wave device 3 is arbitrary, and either cases are included in the present invention.

Embodiment 22

Figure 24:
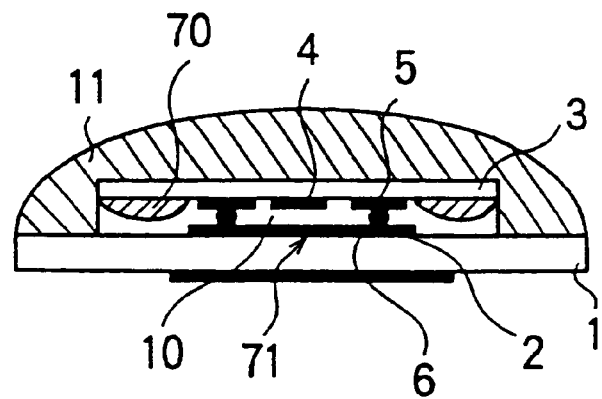
FIG. 24 Sectional view showing the surface acoustic wave device according to Embodiment 22 of the present invention.

FIG. 24 is a sectional view showing the surface acoustic wave apparatus according to Embodiment 22. In this figure, a printed circuit board 1 is an insulating substrate such as ceramic, glass coated ceramic, glass-epoxy, or the like. Conductive wiring patterns 2 are formed on both surfaces of the insulating substrate. A part of the conductive wiring pattern 2 has a wiring pattern 71 thicker in thickness of conductive material than that of the other part. Further, on one main surface of the surface acoustic wave device 3, a transducer portion 4 composed of a comb-shaped electrode pattern and a wiring pattern 5 connected electrically to the transducer portion are formed. Further, on one main surface of the surface acoustic wave device 3, the sound wave absorbers 70 are disposed. Further, the surface having the transducer portion 4 and the wiring pattern 5 thereon are assembled with the wiring pattern 71, which is thicker than the thickness of the conductive material formed on the printed circuit board 1, based on the face-down bonding method through a plurality of conductive connecting members such as bumps 6 composed of a metal. Both of the opposed wiring patterns 71, 5 are electrically connected to form a space portion 10 between the surface acoustic wave device 3 and the printed circuit board 1. The bumps are composed of Au, Ag, solder (Sn-based, Pb-based, In-based and the like), and the like. Further, the connected portion formed between the surface acoustic wave device 3 and the printed circuit board 1 through the conductive bumps 6 and the surface acoustic wave device 3 are coated with the resin portion 11 mainly composed of the thermo-setting type epoxy resin which works as the hot-melt type member.

With such a structure, even if the thickness of the conductive connecting members 6 is small, since the thickness of the conductive material can be added, an appropriate volume of the space portion can be secured effectively between the surface acoustic wave device 3 and the printed circuit board 1. The difference between the thickness of the wiring pattern having the thicker conductive material and that of the normal wiring pattern is controlled essentially in the range of from 5 µm to 100 µm.

To obtain a structure like this, when the wiring pattern is formed on the printed circuit board, the following method can be arbitrary selected.

When ceramic such as Al2O3, glass coated ceramic(low temperature sintered ceramic substrate) or the like is used as the printed circuit board, prior to the sintering of the printed circuit board, on a part of raw sheet on which the wiring patterns are formed, conductive paste such as tungsten paste is coated with a screen printing method, and after drying, the ceramic and the conductive paste are cofired. On the printed circuit board thus obtained, the wiring patterns 2 are formed. At this time, by repeating coating operation with the screen printing method at least on a part of necessary places of the wiring patterns, the thickness of the conductive paste of that part can be increased than that of the other part. Consequently, on the printed circuit board, posterior to the cofiring, the part of wiring pattern 71 being thicker in the thickness of the conductive material can be formed easily.

When ceramic or glass epoxy is used as the printed circuit board, instead of the cofiring method, to the ceramic posterior to baking or to the glass epoxy after die casting, by coating the conductive paste by the screen printing method multiple times at least on a part of the wiring pattern 1 and baking them, the wiring pattern 71 having a thicker conductive material can be formed.

Still further, when the wiring patterns of the printed circuit board are formed, a vacuum filming method such as a vapor depositing or a sputtering of conductive metal can be employed together with the screen printing method. In this case, by employing such a method that masks an area not required to increase the thickness, a part of the wiring patterns being required to increases the thickness can be made thicker than that of the other part with the filming method such as the vapor deposition or the sputtering method.

Embodiment 23

Figure 25:
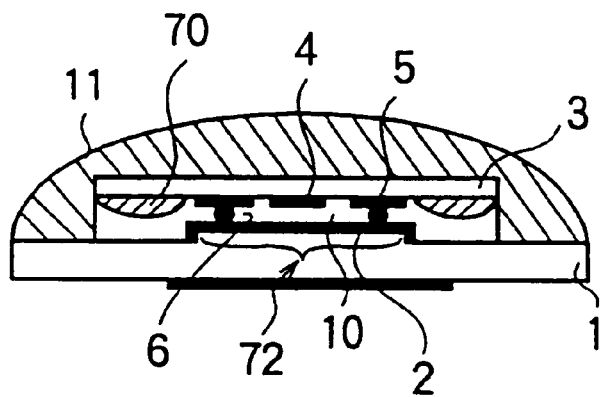
FIG. 25 Sectional view showing the surface acoustic wave device according to Embodiment 23 of the present invention.

FIG. 25 is a sectional view showing the surface acoustic wave apparatus according to Embodiment 23. In this figure, a printed circuit board 1 is an insulating substrate such as ceramic, glass coated ceramic, glass-epoxy, or the like. Conductive wiring patterns 2 are formed on both surfaces of the insulating substrate. A part of the wiring patterns 2 of the printed circuit board 1 is formed on an area 72 that is thicker in thickness than that of the other part of the printed circuit board material. Further, on one main surface of a surface acoustic wave device 3, a transducer portion 4 composed of a comb-shaped electrode pattern and a wiring pattern 5 connected electrically to the transducer portion are formed. Further, on one main surface of the surface acoustic wave device 3, a sound wave absorber 70 is disposed. Further, the surface having the transducer portion 4 and the wiring pattern 5 thereon is disposed in an opposite relation with the wiring patterns 2 on the area 72, that is thicker in the thickness than other part of the printed circuit board material formed on the printed circuit board 1, based on the face-down bonding method through a plurality of conductive connecting members such as bumps 6 composed of a metal. Both of the opposed wiring patterns 2, 5 are electrically connected to form a space portion 10 between the surface acoustic wave device 3 and the printed circuit board 1. The bumps are composed of Au, Ag, solder (Sn-based, Pb-based, In-based and the like), and the like. Further, the connected portion, which is formed between the surface acoustic wave device 3 and the printed circuit board 1 through the conductive bumps 6, and the surface acoustic wave device 3 are coated with the resin portion 11 composed of the thermo-setting type epoxy resin.

With such a constitution, even if the thickness of the conductive connecting member 6 is small, since the thickness of the conductive material can be added, an appropriate volume of a space portion can be secured effectively between the surface acoustic wave device 3 and the printed circuit board 1. The difference between the thicknesses of the printed circuit board materials is preferable to be controlled essentially in the range of from 5 $\mu$m to 100 $\mu$m.

To obtain such a constitution like this, when the wiring patterns are formed on the printed circuit board, the following method can be selected arbitrarily.

For example, when ceramic such as Al2O3, glass coated ceramic or the like are used as the printed circuit board, by adding a green sheet, which corresponds to a part opposed to the connecting member serving as an electric connecting portion and neighboring area, to a green sheet which should be sintered later, the area 72 having a thickness thicker than that of the other part of the printed circuit board material can be formed easily. The difference of the thicknesses should be essentially in the range of from 5 $\mu$m to 500 $\mu$m, more preferably in the range of from 5 $\mu$m to 100 $\mu$m.

Further, in the case of a printed circuit board such as glass epoxy, bakelite, or the like, by laminating several sheets only on the required region of the printed circuit board, the area 72 having a thickness thicker than that of the other part of the printed circuit board material can be easily formed

Embodiments 24–26

Figure 26:
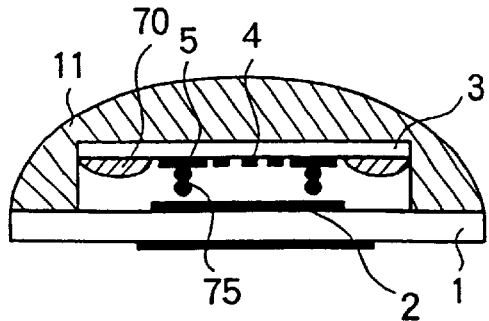
FIG. 26 Sectional view and partial sectional view showing the surface acoustic wave device according to Embodiment 24–26 of the present invention.
Figure 26:
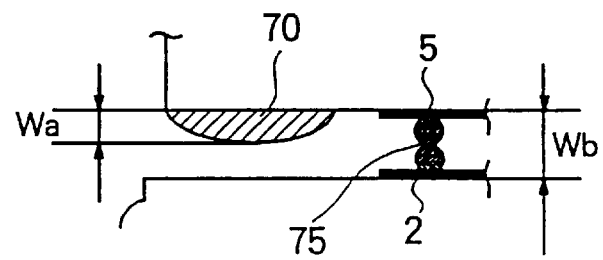
Figure 26:
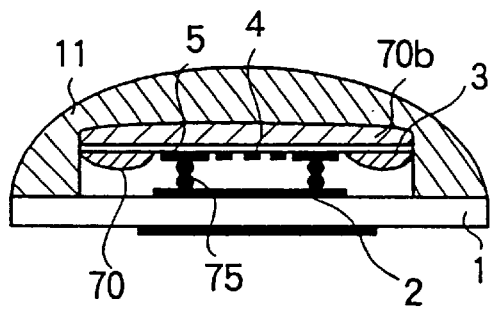
Figure 26:
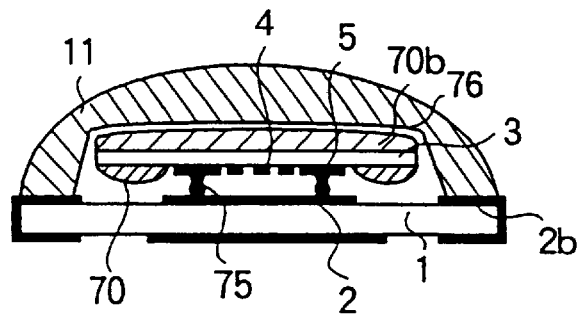

FIG. 26(a) is a sectional view showing a surface acoustic wave apparatus according to Embodiment 24. In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of a surface acoustic wave device 3, a transducer portion 4 composed of a comb-shaped electrode pattern and a wiring pattern 5 connected electrically to the transducer portion are formed. Further, the acoustic surface wave absorbing material 70 is disposed on one main surface of the surface acoustic wave device 3. Further, the surface having the transducer portion 4 and the wiring pattern 5 thereon is disposed in an opposite relation with the wiring patterns 2 formed on the printed circuit board 1 based on the face-down bonding method through the connecting members 75 which are obtained by piling up a plurality of conductive metal bumps 6 on nearly same place. Both of the opposed wiring patterns 2, 5 are electrically connected to form a space portion 10 between the surface acoustic wave device 3 and the printed circuit board 1. The bumps are composed of Au, Ag, solder (Sn-based, Pb-based, In-based and the like), and the like. Further, the connected portion, which is formed between the surface acoustic wave device 3 and the printed circuit board 1 through the conductive bumps 6, and the surface acoustic wave device 3 are coated with the resin portion 11 of thermo-setting type epoxy resin.

FIG. 26(b) is a figure showing partial enlargement of FIG. 26(a). Here, a thickness wa of a sound wave absorber 70 is smaller than that wb (includes the thickness of the wiring pattern) of the conductive connecting members 75 piled up on the nearly same place. The wb is preferable to be essentially in the range of from 30–150 $\mu$m.

As described above, by controlling a thickness of the conductive connecting member serving as an electrical connecting portion, an appropriate volume of a space portion can be effectively secured between a surface acoustic wave device and a printed circuit board. In this case, since there is no need for controlling the thickness of the printed circuit board material or that of the conductive material, the fabricating process becomes more simple.

FIG. 26(c) is a sectional view showing a surface acoustic wave apparatus according to Embodiment 25. In this example, on one main surface of the surface acoustic wave device 3, the sound wave absorber 70 is disposed. Still further, on the other main surface of the surface acoustic wave device 3, the sound wave absorber 70b is disposed.

FIG. 26(d) is a sectional view showing a surface acoustic wave apparatus according to Embodiment 26. In this example, a metal foil 76 is disposed between a resin portion 11 and the sound wave absorber 70b which is disposed on the other main surface of the surface acoustic wave device 3, and a part of the metal foil is connected to the wiring patterns 2b on the printed circuit board. Therefore, if an extraneous noise is induced, because of the existence of the metal foil, the so-called shield effect which electrically shields the noise can be provided.

Embodiment 27

Figure 27:
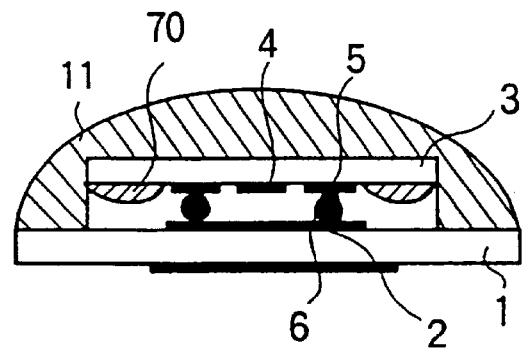
FIG. 27 Sectional view and partial sectional view of the surface acoustic wave device according to Embodiment 27 of the present invention.
Figure 27:
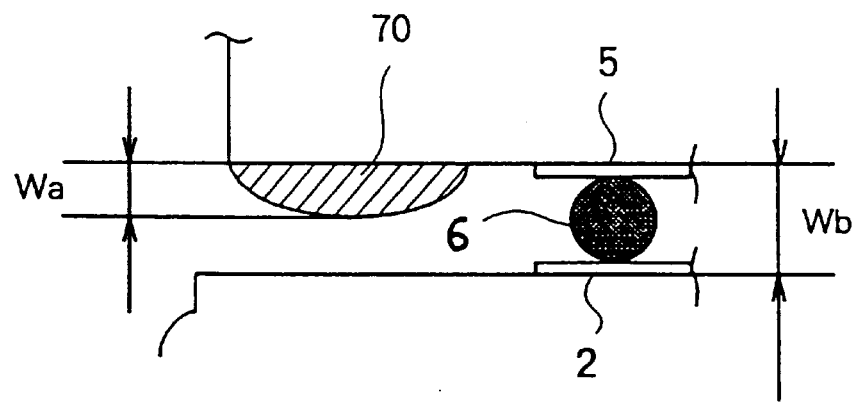

FIG. 27(a) is a sectional view showing a surface acoustic wave apparatus according to Embodiment 27. In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of a surface acoustic wave device 3, a transducer portion 4 composed of a comb-shaped electrode pattern and a wiring pattern 5 connected electrically to the transducer portion are formed. Further, a sound wave absorber 70 is disposed on one main surface of the surface acoustic wave device 3. Further, the surface having the transducer portion 4 and the wiring pattern 5 thereon is disposed in an opposite relation with the wiring patterns 2 formed on the printed circuit board 1 based on the face-down bonding method through a plurality of conductive connecting members such as the metal bumps 6. Both of the opposed wiring patterns 2, 5 are electrically connected to form a space portion 10 between the surface acoustic wave device 3 and the printed circuit board 1. The bumps are composed of Au, Ag, solder (Sn-based, Pb-based, In-based and the like), and the like. Further, the connected portion, which is formed between the surface acoustic wave device 3 and the printed circuit board 1 through the conductive bumps 6, and the surface acoustic wave device 3 are coated with the resin portion 11 of thermo-setting type epoxy resin.

FIG. 27(b) is a figure showing a partially enlarged figure of FIG. 27(a). Here, a thickness wa of a sound wave absorber 70 is smaller than the height wb of a plurality of conductive connecting members 6 (includes the thickness of the wiring pattern).

Such a constitution like this can be easily formed as follows. When a conductive ball bump such as Au bump or solder bump is used as a conductive connecting member, by varying a width of a conductive thin wire when the ball bump is formed, the dimension of a ball can be controlled. Thus, notwithstanding whether the ball bump is formed on the surface acoustic wave device 3 side or the printed circuit board 1 side, the structure described above can be easily obtained. For the method for controlling the width or the diameter, other than the method for varying the width of the bump itself and the like, there is a method such as reducing the pressure against the bump during bump formation.

Further, as a method for disposing a sound wave absorber 70, the sound wave absorber can be diluted with the diluents such as organic solvents and, thereafter, can be coated. In this case, for the organic solvent, such as terpineol, naphtha, and the like can be employed. These organic solvents evaporate during drying step for drying the sound wave absorber and the thickness wa of the sound wave absorber 70 can be thinner, thus wa can be made smaller than wb. Further, not to mention, it is arbitrary whether the conductive connecting member 6 is formed precedently on the printed circuit board 1 side or on the surface acoustic wave device 3 side. Either case can be included in the scope of the present invention.

Embodiment 28

FIG. 28(a) is a sectional view showing a surface acoustic wave apparatus according to Embodiment 28.

In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of a surface acoustic wave device 3, a transducer portion 4 composed of a comb-shaped electrode pattern and a wiring pattern 5 connected electrically to the transducer portion are formed. Further, the surface having the transducer portion 4 and the wiring pattern 5 thereon is disposed in an opposite relation with the wiring patterns 2 formed on the printed circuit board 1 based on the face-down bonding method through a plurality of conductive connecting members such as the metal bumps 6. Both of the opposed wiring patterns 2, 5 are electrically connected to form a space portion 10 between the surface acoustic wave device 3 and the printed circuit board 1. The bumps are composed of Au, Ag, solder (Sn-based, Pb-based, In-based and the like), and the like. Further, the connected portion, which is formed between the surface acoustic wave device 3 and the printed circuit board 1 through the conductive bumps 6, and the surface acoustic wave device 3 are coated with the resin such as the epoxy and the like or glass 11.

FIG. 28(b) is a plan view taken along line A—A of FIG. 28(a). In the figure, conductive bumps 6 and a surface acoustic wave device 3 are shown imaginary with dotted lines. And around edge positions of wiring patterns 2, electrical connecting positions with conductive bumps 6 which are disposed on the surface acoustic wave device side are shown. The surface acoustic wave device 3 and the printed circuit board 1 are electrically connected by the face-down bonding method through the conductive bumps 6.

Figure 28:
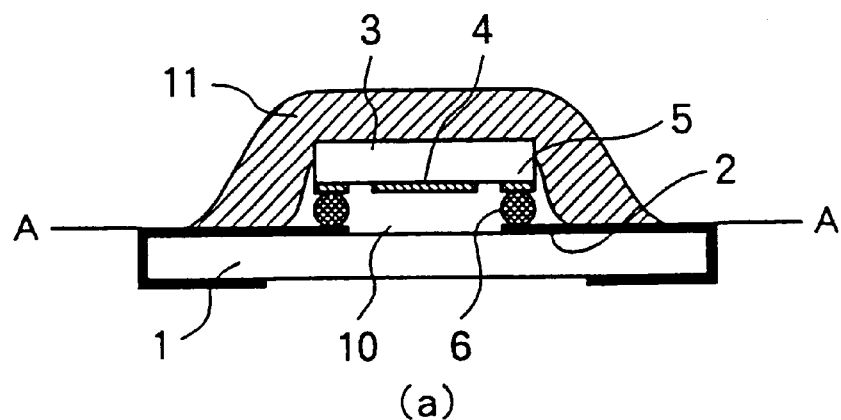
FIG. 28 Sectional view and partial plan view of the surface acoustic wave device according to 28 of the present invention.
Figure 28:
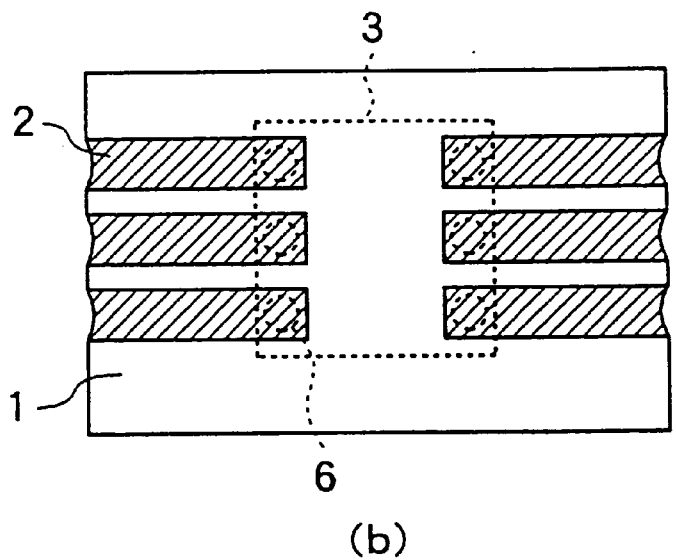
Figure 29:
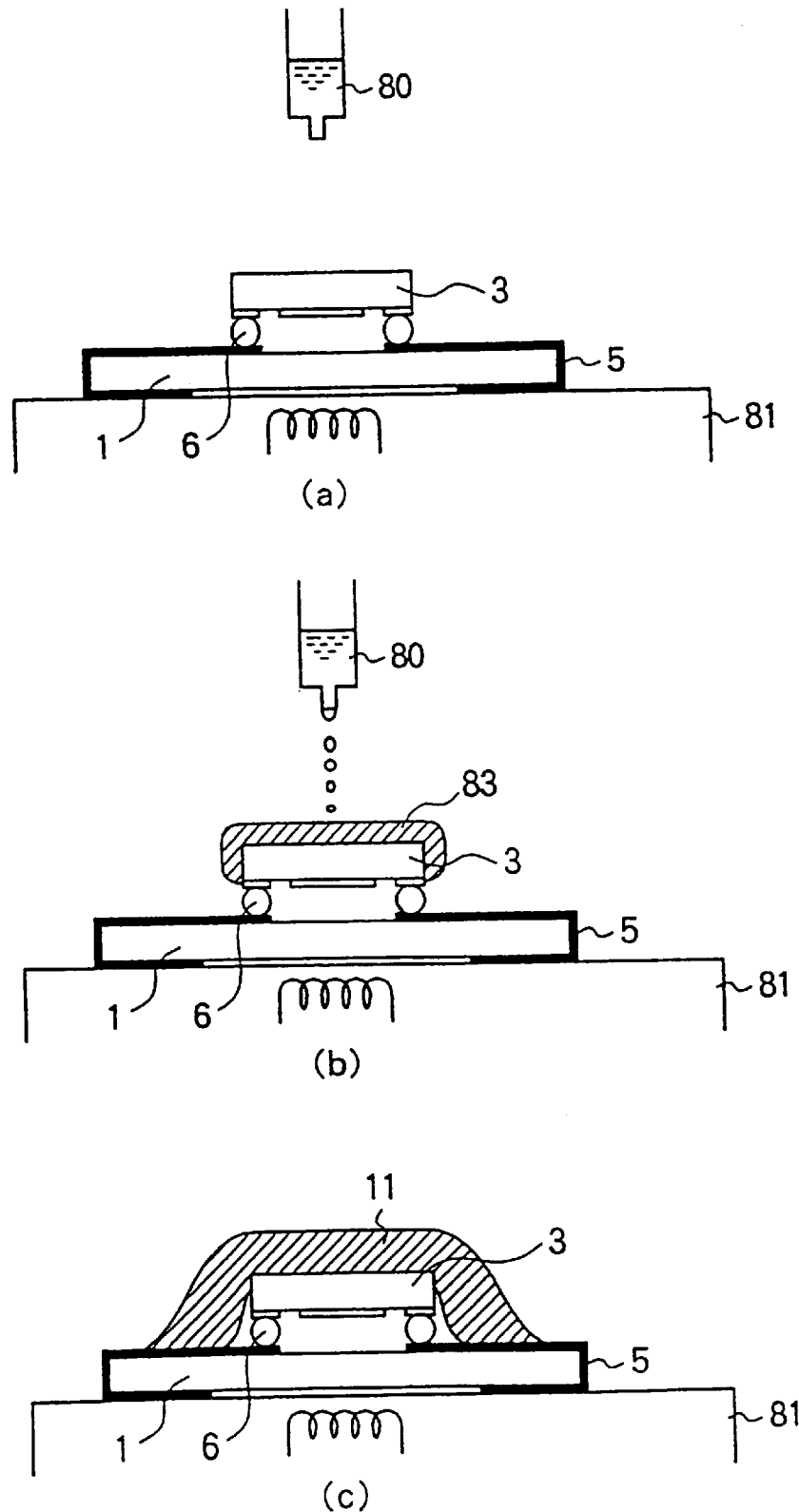
FIG. 29 Flow chart showing fabricating processes of the surface acoustic wave device according to Embodiment 28 of the present invention.

FIG. 29 shows a fabricating method for fabricating a surface acoustic wave apparatus depicted in FIG. 28, wherein (a)–(d) are sequential steps for fabrication.

That is, in FIG. 29(a), a state wherein a printed circuit board 1 is connected to a surface acoustic wave device 3 through a plurality of conductive bumps 6 disposed on a surface acoustic wave device 3 is shown, further, the printed circuit board 1 is heated at temperature around in the range of from 150 to 200° C., and epoxy type liquid resin 80 is ready for use. The viscosity of the resin in this case is controlled low. Subsequently, as shown in FIG. 29(b), when the liquid resin 80 is dripped onto the other main surface of the surface acoustic wave device 3, the resin spreads to the side part of the device 3 and, further, since the viscosity of the liquid resin rises due to heating, the dripped resin 83 maintains it's shape as it is. Further, as shown in FIG. 29(c), by dripping the liquid resin 80 while controlling it's quantity, it is deformed to coat the surface acoustic wave device 3 while maintaining the high viscosity, periphery is connected to the printed circuit board 1, and thereafter, by ensuing heating, the resin 11 is hardened and the shape of the resin is set. The ensuing heating is executed at, for example, 125° C. for 3 hrs and, further, at 150° C. for 6 hrs.

Further, by raising the viscosity enough high, the resin 11 or 83 enough can be prevented from spreading into the surface of the transducer portion of the surface acoustic wave device 3. Consequently, no impairment of the function of the surface acoustic wave apparatus occurred.

Further, when borosilicate lead glass containing PbO 75%, B2O3 5%, SiO2 1% is similarly used in place of the resin and treating similarly, since the dripped liquid glass cools and solidifies, the similar effect is obtained.

Embodiment 29

Figure 30:
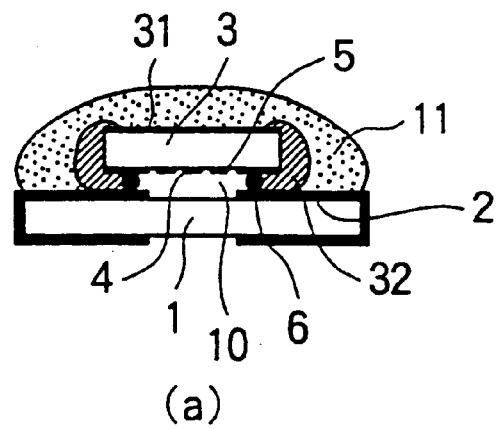
FIG. 30 Sectional view, partial plan view and partial perspective view showing the surface acoustic wave device according to Embodiment 29 of the present invention.
Figure 30:
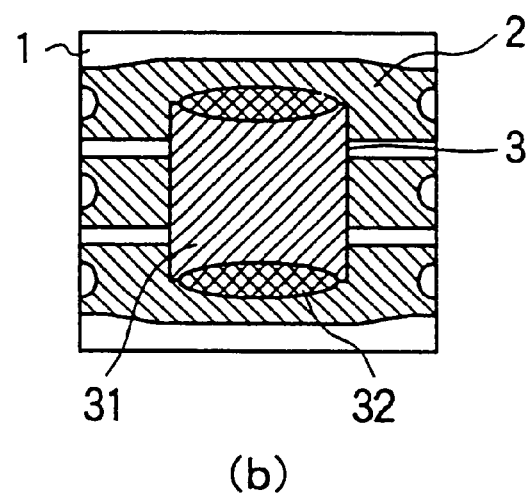
Figure 30:
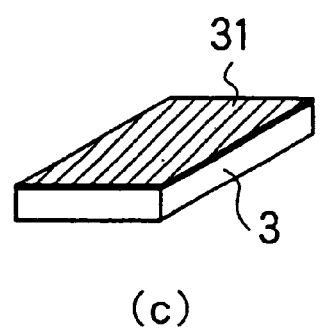

FIG. 30(a) is a sectional view showing a surface acoustic wave apparatus according to Embodiment 29.

In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of a surface acoustic wave device 3, a transducer portion 4 composed of a comb-shaped electrode pattern and a wiring pattern 5 connected electrically to the transducer portion are formed.

Further, on almost all of the other main surface of the surface acoustic wave device 3, as shown in FIG. 30(c), conductive film 31 is formed.

Further, the surface having a transducer portion 4 and the wiring pattern 5 thereon is disposed in an opposite relation with the wiring patterns 2 formed on the printed circuit board 1 based on the face-down bonding method through a plurality of conductive connecting members such as the metal bumps 6. Both of the opposed wiring patterns 2, 5 are electrically connected to form a space portion 10 between a surface acoustic wave device 3 and the printed circuit board 1. The bumps are composed of Au, Ag, solder (Sn-based, Pb-based, In-based and the like), and the like. Further, the conductive film 31 formed on the other main surface of the surface acoustic wave device 3 and a part of the wiring patterns 2 of the printed circuit board 1 are electrically connected through conductive material 32.

Further, a connected portion, which is formed between the surface acoustic wave device 3 and the printed circuit board 1 through the conductive bumps 6, and the surface acoustic wave device 3 are coated with the resin such as an epoxy and the like or the glass 11 obtained by dripping.

FIG. 30(b) is an example of a plan view showing a printed circuit board 1 prior to coating by the resin 11. The conductive film 31 formed on the other main surface of the surface acoustic wave device 3 is electrically connected to a part of the wiring patterns 2, such as an earthing pattern, of the printed circuit board 1 through the conductive material 32.

For the conductive material 32, for example, bonding wire such as Au wire, Al wire, and the like, epoxy type conductive paste including Ag, anisotropic conductive resin film (ACF)

and the like are included. In addition, for the conductive film 31, such films as Al film, Au film and the like made by a depositing method, a sputtering method or the like are included.

In this case, the so-called electromagnetic wave shield effect (shield effect) against an extraneous electrical noise is provided.

Further, connection can be attained through resin having magnetic material dispersed in place of the conductive material 32. In this case, since the magnetic material becomes electrically conductive in the high frequency region of mainly more than 1 MHz, if noise is induced by an extraneous cause, the noise is conducted through the magnetic material dispersed resin and is earthed through the wiring pattern on the printed circuit board.

Embodiment 30

Figure 31:
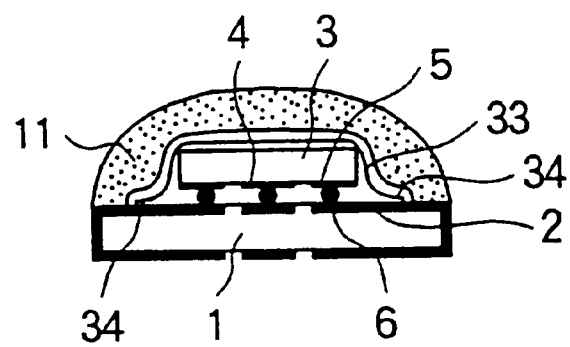
FIG. 31 Sectional view and partial plan view showing the surface acoustic wave device according to Embodiment 30 of the present invention.
Figure 31:
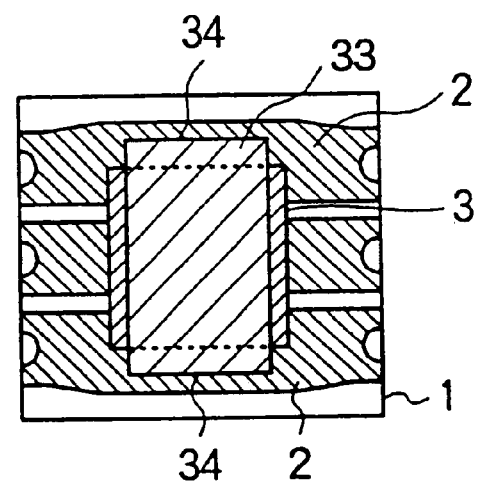

FIG. 31(a) is a sectional view showing a surface acoustic wave apparatus according to Embodiment 30.

In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of a surface acoustic wave device 3, a transducer portion 4 composed of a comb-shaped electrode pattern and a wiring pattern 5 electrically connected to the transducer portion are formed.

Further, a surface having a transducer portion 4 and the wiring pattern 5 thereon is disposed in an opposite relation with the wiring patterns 2 formed on the printed circuit board 1 based on the face-down bonding method through a plurality of conductive connecting members such as the metal bumps 6. Both of the opposed wiring patterns 2, 5 are electrically connected to form a space portion 10 between the surface acoustic wave device 3 and the printed circuit board 1. The bumps are composed of Au, Ag, solder (Sn-based, Pb-based, In-based and the like), and the like. Further, on at least a part of the space formed between the other surface of the surface acoustic wave device 3 and the resin portion 11, the metallic foil 33 is disposed, and the edge portion 34 of the metallic foil 33 is contacted and electrically connected to at least part of the wiring patterns 2 of the printed circuit board 1.

Further, the connected portion, which is disposed between the surface acoustic wave device 3 and printed circuit board 1, and the surface acoustic wave device 3 are coated with a sealing member hardened by dripping or pouring the resin such as an epoxy and the like or the glass 11.

FIG. 31(b) is an example of a plan view of the printed circuit board 1 prior to hardening and coating of the resin 11 by dripping or pouring. The edge portion 34 of a metallic foil 33 disposed on the other main surface of the surface acoustic wave device 3 is contacted and electrically connected to a part of the wiring patterns 2, such as an earthing pattern, of the printed circuit board 1.

For the metallic foil 33 like this, such well known inexpensive materials as Al foil or Cu foil can be used. Therefore, the so-called electromagnetic wave shield effect (shield effect) can be provided.

Embodiments 31–32

Figure 32:
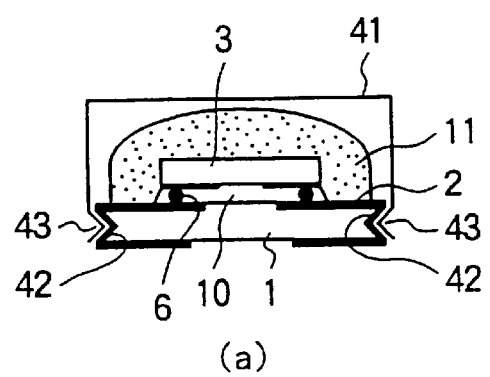
FIG. 32 Sectional view and partial perspective view showing the surface acoustic wave device according to Embodiment 31–32 of the present invention.
Figure 32:
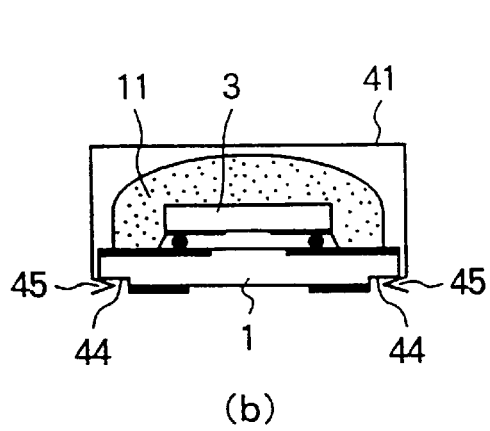
Figure 32:
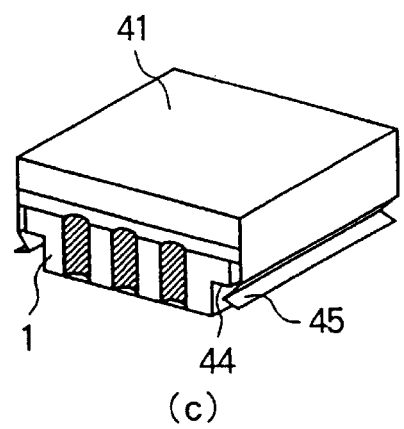

FIG. 32(a) is a sectional view showing a surface acoustic surface wave apparatus according to Embodiment 31.

In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of a surface acoustic wave device 3, a transducer portion 4 composed of a comb-shaped electrode pattern and a wiring pattern 5 connected electrically to the transducer portion are formed. Further, the surface having the transducer portion 4 and the wiring pattern 5 thereon is disposed in an opposite relation with the wiring patterns 2 formed on the printed circuit board 1 based on the face-down bonding method through a plurality of conductive connecting members such as the metal bumps 6. Both of the opposed wiring patterns 2, 5 are electrically connected to form a space portion 10 between the surface acoustic wave device 3 and the printed circuit board 1. The bumps are composed of Au, Ag, solder (Sn-based, Pb-based, In-based and the like), and the like. Further, the connected portion, which is formed between the surface acoustic wave device 3 and the printed circuit board 1 with the conductive bumps 6, and the surface acoustic wave device 3 are coated with the resin or the glass 11 obtained by dripping.

Concave portions 42 are formed at least on two places of the side surfaces of the printed circuit board 1, and the metal plate having convex portions 43 formed at edges is disposed so that it covers at least a part of the resin 11, further the metal plate 41 and the printed circuit board 1 are integrated by engaging the concave portions 42 formed on the side surfaces of the printed circuit board 1 and the convex portions 43 formed at the edges of the metal plate 41.

By employing a constitution like this, a flat part is easily formed on the metal plate, and thereon the marking is easily executed with a method such as stamping.

Further, the metal plate 41 itself can be electrically connected to a part of the wiring patterns 2 of the printed circuit board 1, that is, to an earthing pattern by a method such as a contact connecting method and the like and is earthed. An easy marking property and an electromagnetic wave shield effect can be provided, and the resistance against an ambient noise can be improved.

FIGS. 32(b) is a sectional view showing a surface acoustic wave apparatus according to Embodiment 32 and (c) is a perspective view showing the same.

In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of a surface acoustic wave device 3, a transducer portion 4 composed of a comb-shaped electrode pattern and a wiring pattern 5 connected electrically to the transducer portion are formed. Further, the surface having the transducer portion 4 and the wiring pattern 5 thereon is disposed in an opposite relation with the wiring patterns 2 formed on the printed circuit board 1 based on the face-down bonding method through a plurality of conductive connecting members such as the metal bumps 6. Both of the opposed wiring patterns 2, 5 are electrically connected to form a space portion 10 between the surface acoustic wave device 3 and the printed circuit board 1. The bumps are composed of Au, Ag, solder (Sn-based, Pb-based, In-based and the like), and the like. Further, the connected portion, which is formed between the surface acoustic wave device 3 and the printed circuit board 1 through the conductive bumps 6, and the surface acoustic wave device 3 are coated with the resin or glass 11 obtained by dripping. Further, cut-out portions 44 are formed at least on two places of the side surfaces of the printed circuit board 1, and a metal plate having protruded portions 45 formed at edges is disposed so that it coats at least a part of the resin 11, and the metal plate 41 and the printed circuit board 1 are integrated by engaging the cut-out portions 44 formed on the side surfaces of the printed circuit board 1 and the protruded portions 45 formed at the edges of the metal plate 41.

By employing a structure like this, the metal plate can be set precisely on the printed circuit board, on a flat portion of the metal plate, marking can be easily done by employing such a method as stamping and the like.

Further, the metal plate 41 itself can be electrically connected to a part of the wiring patterns 2 of the printed circuit board 1, that is, to an earthing pattern by a method such as a contact connecting method and the like and is earthed. An easy marking property and an electromagnetic wave shield effect can be provided and resistance against tan ambient noise can be improved.

As a method for forming concave portions 42 or cut-out portions 44 on the side surfaces of the printed circuit board 1, such a method as laminating two layers or three layers of green sheet to obtain a structure can be employed for fabrication of the printed circuit board. Instead, they can be formed mechanically.

Embodiment 33

The detail of a surface acoustic wave apparatus according to Embodiment 33 will be described.

Firstly, conductive connective members serving as electrical connecting portions were formed on the wiring patterns formed at least on the one main surface of the printed circuit board. On wiring patterns of the printed circuit board, gold was plated. For this connecting member, gold bumps were employed. Thereafter, a surface acoustic wave device was disposed to the printed circuit board at a predetermined position, and the surface acoustic wave device and the printed circuit board were assembled with a predetermined spacing through electrical connecting portions, wherein connecting operation was executed under application of heat as well as ultra-sound. Thereafter, liquid resin was dripped on the surface acoustic wave device while heating the package and the surface acoustic wave device in a temperature range of from 150° C. to 200° C. Thereby the liquid resin was made high in it's viscosity and was spread over to side surfaces of the surface acoustic wave device so as to serve as a surface acoustic wave absorber, and, further, by hardening after spreading over to the printed circuit board, coated the surface acoustic wave device. Thus, in this surface acoustic wave apparatus, the surface acoustic wave device and the printed circuit board were sealed leaving a space portion between a transducer portion formed on the surface acoustic wave device and the printed circuit board.

For reference, a reference surface acoustic wave apparatus was fabricated as follows. After a transducer portion and a plurality of wiring patterns connected electrically to the transducer portion were formed on one main surface of a wafer which forms surface acoustic wave devices, conductive connecting members serving as electrical connecting portions were formed on a part of the wiring patterns by applying heat together with ultra-sound. Then, the individual acoustic surface wave devices were obtained by cutting. After that, thus obtained surface acoustic wave devices were aligned to the printed circuit board at a predetermined position, and the surface acoustic wave device and the printed circuit board were assembled with a predetermined spacing through electrical connecting portions, wherein the connecting operation was executed by applying heat together with ultra-sound. Thereafter, liquid resin was dripped on the surface acoustic wave device while heating the package and the surface acoustic wave device. Thereby the viscosity of the liquid resin was made high and the resin was spread over to side surfaces of the surface acoustic wave device so that it can serve as a surface acoustic wave absorber, and, further, by hardening after spreading to the printed circuit board, it coated the surface acoustic wave device. Thus, the surface acoustic wave device and the printed circuit board were sealed leaving a space portion between the transducer portion formed on the surface acoustic wave device and the printed circuit board.

After leaving these surface acoustic wave apparatuses under a temperature of 200° C. for 100 hrs, number of the apparatuses shown deteriorated performance were compared. When variation of the minimum insertion loss was over 1 dB, the device was judged as deteriorated. When the connecting member, according to the fabricating method of the surface acoustic wave apparatus of the present invention, was formed precedently on the wiring pattern of the printed circuit board, the number of the deteriorated apparatuses was 1/50. On the contrary, in the case of reference samples where the connecting members were formed precedently on the wiring pattern of the printed circuit board, the number of the deteriorated devices was 14/50.

As apparent from these results, after conductive connecting members which work as electrical connecting portions are formed on the wiring patterns which are formed at least on one main surface of the printed circuit board, by assembling the device and the printed circuit board with a predetermined spacing through conductive connecting members, the heat history to connecting boundary surface formed between the surface acoustic wave device and the conductive connecting member serving as electrical connecting portions can be alleviated, thus, connecting strength and reliability can be improved.

Embodiments 34, 35

Figure 33:
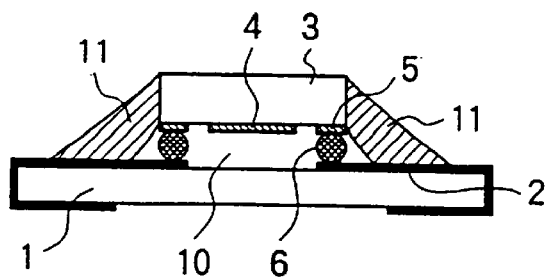
FIG. 33 Sectional view showing the surface acoustic wave device according to Embodiment 34 of the present invention.
Figure 34:
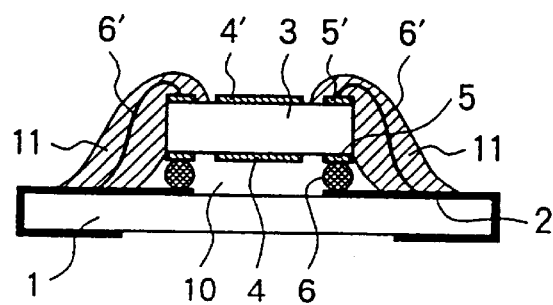
FIG. 34 Sectional view showing the surface acoustic wave device according to Embodiment 35 of the present invention.

FIG. 33 is a sectional view showing a surface acoustic wave apparatus according to Embodiment 34. In this figure, a printed circuit board 1 is an insulating substrate such as ceramic, glass coated ceramic, glass-epoxy, or the like. Conductive wiring patterns 2 are formed on both surfaces of the insulating substrate. Further, on one main surface of a surface acoustic wave device 3, a transducer portion 4 composed of a comb-shaped electrode pattern and a wiring pattern 5 connected electrically to the transducer portion are formed. The surface having a transducer portion 4 and wiring pattern 5 thereon is disposed in an opposite relation with the wiring patterns 2 formed on the printed circuit board 1 based on the face-down bonding method with a plurality of conductive connecting members such as bumps 6 composed of a metal. Both of the opposed wiring patterns 2, 5 are electrically connected to form a space portion 10 between the surface acoustic wave device 3 and the printed circuit board 1. The bumps are composed of Au, Ag, solder (Sn-based, Pb-based, In-based and the like), and the like. Further, the connected portion, which is formed between the surface acoustic wave device 3 and the printed circuit board 1 with the conductive bumps 6, and the surface acoustic wave device 3 are coated with a resin member 11 mainly composed of thermo-setting bis-phenol A type epoxy resin which serves as hot-melt type member. All of the other main surface of the surface acoustic wave device 3 was exposed without being coated with the resin portion 11. Further, as Embodiment 35 shown in FIG. 34, only a part of the other main surface of the surface acoustic wave device 3 can be exposed without being coated with the resin portion 11. In this case, for example, the other wiring pattern 4' can be disposed on the other main surface of the surface acoustic wave device 3, or these and the wiring pattern of the printed circuit board 1 can be connected through wire bondings 6'. Here, the wire bondings 6' can be constituted so that they are included in the resin portion 11. Thereby, the mechanical strength of the wire bondings 6' can be improved. However, the wire bondings 6' can also be exposed.

Embodiment 36

Figure 35:
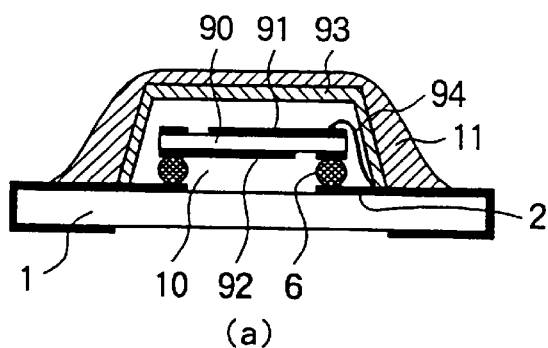
FIG. 35 Sectional view showing a quartz oscillator or resonator according to Embodiment 36 of the present invention.
Figure 35:
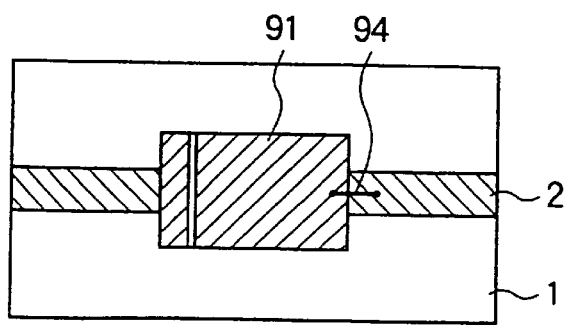

FIG. 35 is a sectional view showing a quartz oscillator or resonator according to Embodiment 36. In this figure, a printed circuit board 1 is an insulating substrate such as ceramic, glass coated ceramic, glass-epoxy, or the like. Conductive wiring patterns 2 are formed on both surfaces of the insulating substrate. Further, on both surfaces of a quartz oscillator or resonator 90, electrodes 91, 92 are formed respectively. The surface having electrode 91 is connected to wiring patterns 2 on the printed circuit board 1 with wire bonding 94. Further, a surface having the electrode 92 is assembled with the wiring patterns 2 formed on the printed circuit board 1 based on the face-down bonding method through a plurality of conductive connective members such as bumps 6 made of metal. And a space portion 10 is formed between the quartz oscillator or resonator 90 and the printed circuit board 1. The bumps are composed of Au, Ag, solder (Sn-based, Pb-based, In-based and the like), and the like. Further, the connected portion, which is formed between the surface acoustic wave device 3 and the printed circuit board 1 through the conductive bumps 6, and the surface acoustic wave device 3 are coated with a resin member 11 mainly composed of thermo-setting bis-phenol A type epoxy resin which serves as a hot-melt type member.

Embodiment 37

Figure 36:
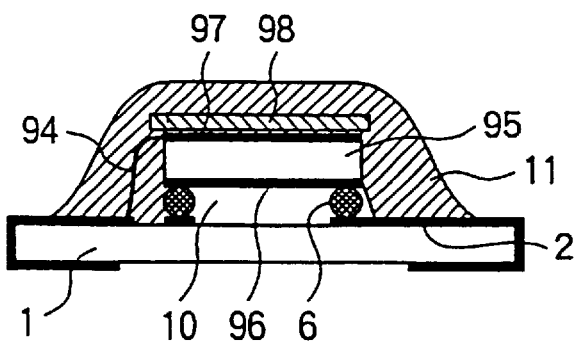
FIG. 36 Sectional view showing a piezoelectric oscillator or resonator according to Embodiment 37 of the present invention.

FIG. 36 is a sectional view showing a piezoelectric oscillator or resonator apparatus according to Embodiment 37. In this figure, a printed circuit board 1 is an insulating substrate such as ceramic, glass coated ceramic, glass-epoxy, or the like. Conductive wiring patterns 2 are formed on both surfaces of the insulating substrate. Further, on both surfaces of a piezoelectric device 95, electrodes 96, 97 are formed respectively. The surface having the electrode 96 is connected to the wiring patterns 2 on the printed circuit board 1 with a wire bonding 94. Further, the surface having electrode 97 is assembled with the wiring patterns 2 formed on the printed circuit board 1 based on the face-down bonding method through a plurality of conductive connective members such as bumps 6 made of metal. The bumps are composed of Au, Ag, solder (Sn-based, Pb-based, In-based and the like), and the like. Further, above the piezoelectric device 95, a buffering member 98 is disposed. Further, a connected portion between the piezoelectric device 95 and the printed circuit board 1 through conductive bumps 6 are coated with a resin member 11 mainly composed of thermo-setting bis-phenol A type epoxy resin which serves as the hot-melt type member.

By adopting such a constitution like this, interference between a wave emitted from the piezoelectric device and that reflected from the printed circuit board 1 can be alleviated.

Embodiment 38

Figure 37:
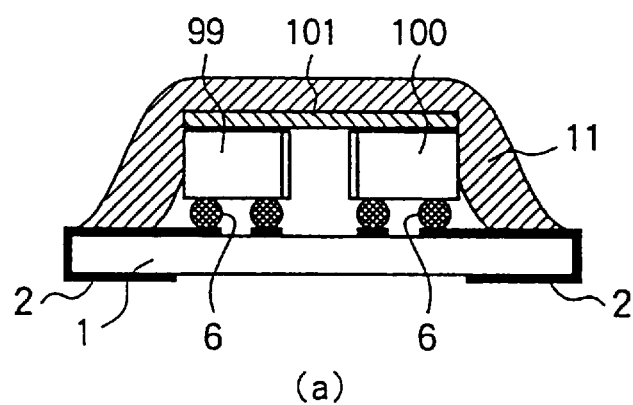
FIG. 37 Sectional view and partial perspective view showing a photocoupler according to Embodiment 38 of the present invention.
Figure 37:
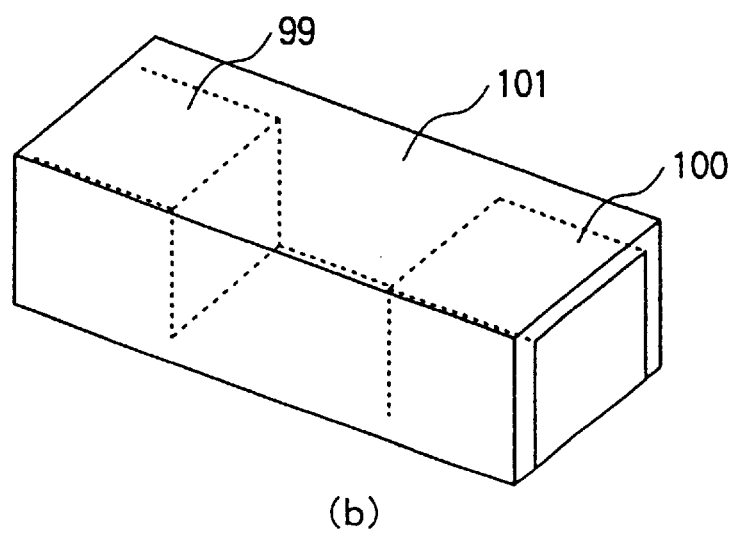

FIG. 37(a) is a sectional view showing a photocoupler according to Embodiment 38. In this figure, a printed circuit board 1 is an insulating substrate such as ceramic, glass coated ceramic, glass-epoxy, or the like. Conductive wiring patterns 2 are formed on both surfaces of the insulating substrate. A light-sending portion 99 and a light-receiving portion 100 of a photopcoupler are disposed and connected on these wiring patterns through the conductive connecting member such as the conductive bumps 6. The bumps are composed of Au, Ag, solder (Sn-based, Pb-based, In-based and the like), and the like. As shown in FIG. 37(a), above the light-sending portion 99 and the light-receiving portion 100, a Japanese character-shape insulating member 101 is disposed. Further, connected portions between the light-sending portion 99 and the light-receiving portion 100, further between insulating material 101 and the printed circuit board 1 are connected through the conductive bumps 6, and are coated with a resin member 11 mainly composed of thermo-setting bis-phenol A type epoxy resin which serves as the hot-melt type member.

By adopting such a constitution like this, an assembled type photocoupler is easily fabricated.

Embodiment 39

Figure 38:
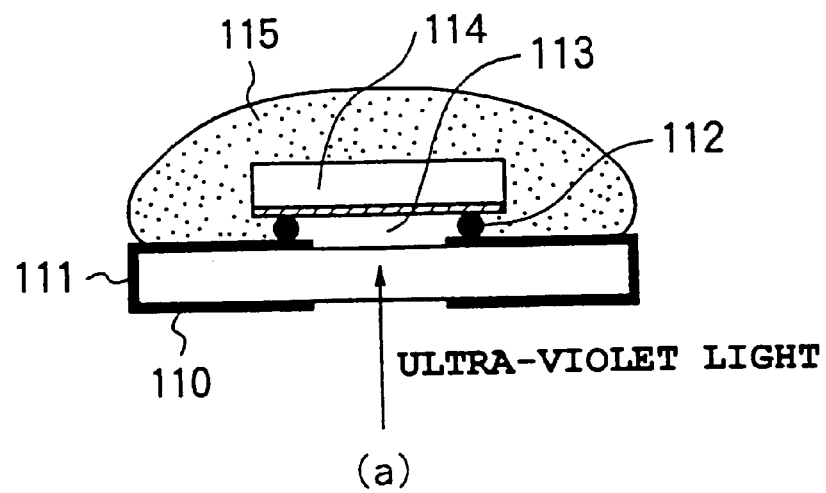
FIG. 38 Sectional view and partial plan view showing an EPROM according to Embodiment 39 of the present invention.
Figure 38:
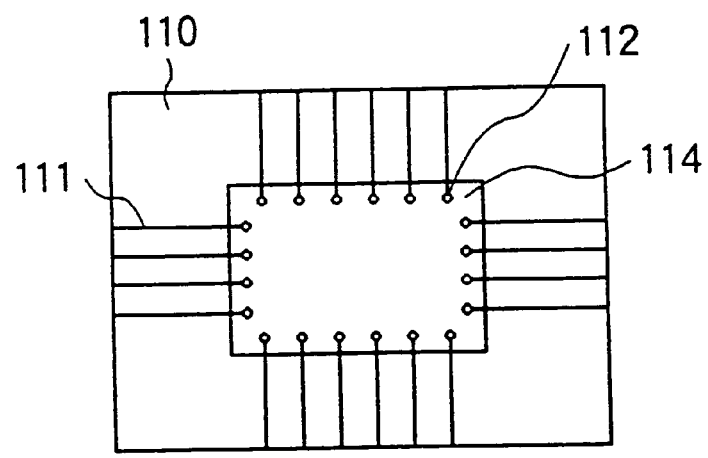

FIG. 38(a) is a sectional view showing an EPROM according to Embodiment 39, and FIG. 38(b) is a plan view showing the same. In the figure, on both surfaces of a substrate being transparent at least in ultra-violet light region (includes the substrate having filter on it) such as glass substrate 110, conductive wiring patterns 111 are formed, and, above the glass substrate 110, an EPROM 114 is disposed in an opposite relation. And the opposed glass substrate 110 and the EPROM 114 are electrically connected through a plurality of conductive connecting members such as metal bumps 112 based on the face-down bonding method in such a manner that the space portion 113 is formed between the glass substrate 110 and the EPROM 114. The bumps are composed of Au, Ag, solder (Sn-based, Pb-based, In-based and the like), and the like. Further, a connected portion between the glass substrate 110 and the EPROM 114 through conductive bumps 6 and the EPROM 114 are coated with the resin portion 115 such as epoxy and the like. The EPROM 114 is initialized with ultra-violet light. The ultra-violet light receiving surface of the EPROM 114 and the glass substrate 110 are disposed so that they are opposed each other. That is, the EPROM 114 is initialized by the ultra-violet light transmitted through the rear side of the glass substrate 110.

With such a constitution like this, an assembled type EPROM can be easily fabricated.

Embodiment 40

Figure 39:
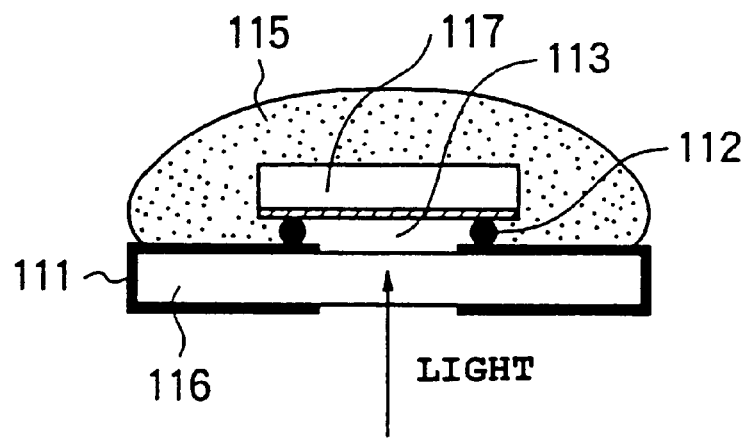
FIG. 39 Sectional view showing a CCD according to Embodiment 40 of the present invention.

FIG. 39 is a sectional view showing a CCD according to Embodiment 40. In the figure, on both surfaces of a substrate transparent at least in visible light region (includes the substrate having filter on it) such as glass substrate 116 (preferable to have optically flat surface), conductive wiring patterns 111 are formed, and, above one surface of the glass substrate 116, a CCD device 117 is disposed in an opposed position. And the opposed glass substrate 116 and the CCD device 117 are electrically connected through a plurality of conductive connecting members such as metal bumps 112 based on the face-down bonding method in such a manner that the space portion 113 is formed between the glass substrate 116 and the CCD device 117. The bumps are composed of Au, Ag, solder (Sn-based, Pb-based, In-based and the like), and the like. Further, a connected portion between the glass substrate 116 and the CCD 117 through the conductive bumps 6 and the CCD 117 are coated with the resin portion 115 such as epoxy and the like. And, an image pickup surface of the CCD 117 and the glass substrate 116 are disposed in an opposed relation. That is, the CCD 117 receives image forming light from the rear surface of the glass substrate 116.

With such a constitution as this, a CCD can be easily assembled.

Such a substrate like this can be applied to a camera, contact type sensor and the like.

Embodiment 41

Figure 40:
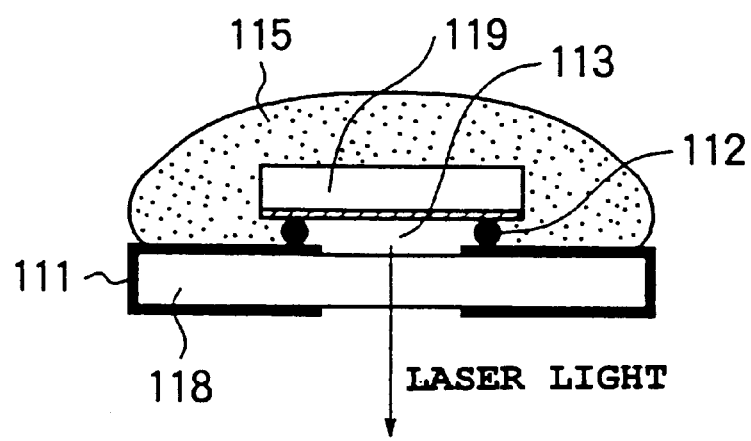
FIG. 40 Sectional view showing a semiconductor laser according to Embodiment 41 of the present invention.

FIG. 40 is a sectional view showing a semiconductor laser according to Embodiment 41. In the figure, on both surfaces of a substrate which is transparent to at least laser light (includes the substrate having filter on it) such as glass substrate 118, conductive wiring patterns 111 are formed, and, above one surface of the glass substrate 116, a semiconductor laser device 119 is disposed in an opposed position. And, in order to connect electrically mutually opposed glass substrate 118 and the semiconductor laser device 119 and to form a space portion 113 between the glass substrate 118 and the semiconductor laser 119, a face-down bonding method is applied with a plurality of bumps 112 comprised of conductive connecting member such as metal. The bumps are composed of Au, Ag, solder (Sn-based, Pb-based, In-based and the like), and the like. Further, a connected portion between the glass substrate 118 and the semiconductor laser device 119 through the conductive bumps 6 and the semiconductor laser device 119 are coated with the resin portion 115 such as epoxy and the like. And, a light-emitting surface of the semiconductor laser device 119 and glass substrate 118 are disposed in an opposed relation. That is, laser light emitted from the semiconductor device 119 transmits the glass substrate 118 to outside.

With such a structure as this, a semiconductor laser can be easily assembled.

Such a substrate like this can be applied also to a light-emitting diode instead of a semiconductor laser.

Embodiment 42

Figure 41:
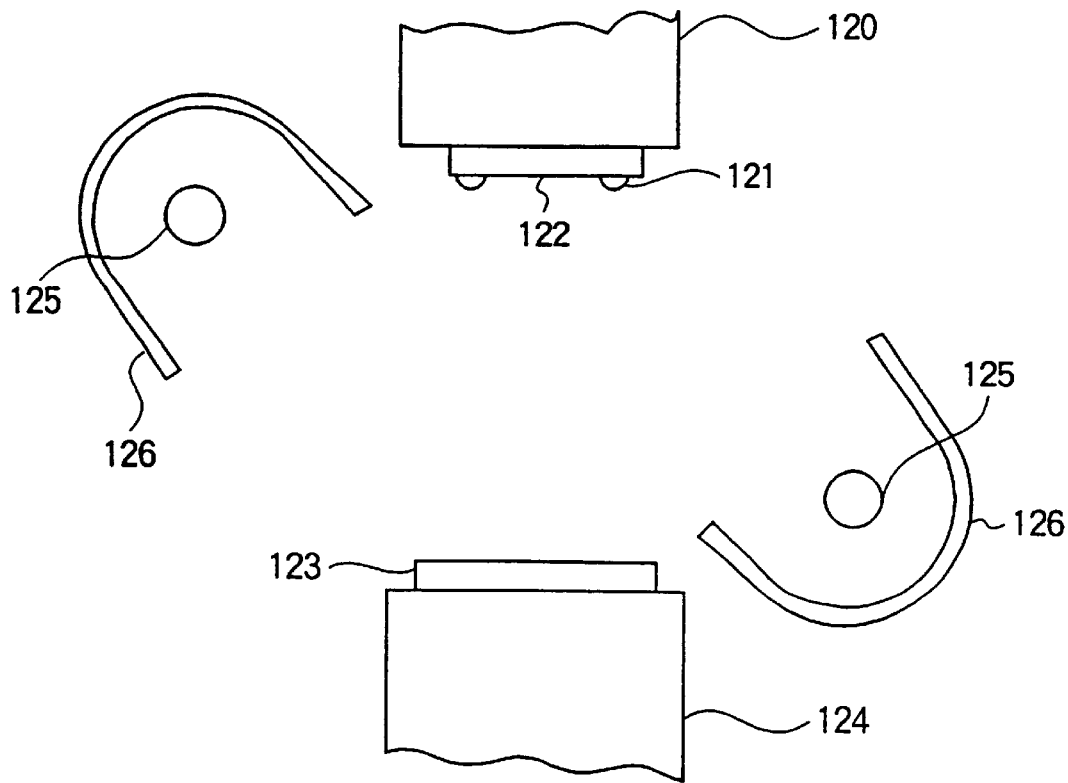
FIG. 41 Figure showing a fabricating method for the surface acoustic wave device according to Embodiment 42 of the present invention.

FIG. 41 is a figure describing a fabricating method for fabricating a surface acoustic wave apparatus according to Embodiment 42. In the figure, on a pressure head 120, a functional device such as a surface acoustic wave device 122 having bumps 121 formed thereon is gripped through vacuum chucking method and the like. Thereunder, a substrate such as a printed circuit board 123 is prepared on a mount 124. Numerical number 125 shows an infra-red light source and 126 a reflector. For the infra-red light source, a tungsten-halogen lamp and the like can be employed. Since the tungsten-halogen lamp emits very intense infra-red light, the surface of the reflector 126 should be treated with gold plating and the like to avoid development of oxidation. With the situation like this, a boundary layer between a surface acoustic wave device 122 and a printed circuit board 123 is irradiated with energy emitted from the infra-red light source 125 and heated to enough high temperature needed for executing face-down bonding. The heating temperature and heating time vary depending on the type of material and shape of the functional device and substrate, and material of bumps. For instance, in a case of the bumps being mainly composed of Sn, it is possible to raise the temperature to around 250° C. necessary for the face-down bonding within around 5 seconds. Whether the temperature rose high enough for the face-down bonding by the infra-red irradiation or not can be regulated through measurement by a radiation pyrometer. When the temperature reaches the predetermined one, the pressure head 120 is lowered, if the surface acoustic wave device 122 is pressed to the printed circuit board 123 through bumps, thereby the bumps 121 heated and melted by the infra-red light are connected also to the printed circuit board 123, and, thus, the face-down bonding completes. Usually, the temperature required for the face-down bonding is several hundred degrees Celsius. With the tungsten-halogen lamp, the maximum temperature of around 800° C. is attained. Hence, there is no need to employ such a heating method as ultra-sound vibration and the like.

Therefore, since harmful force or vibration are not inflicted on the surface acoustic wave device or the printed circuit board, occurrence of the functional device such as the surface acoustic wave device is rare.

Embodiment 43

Figure 42:
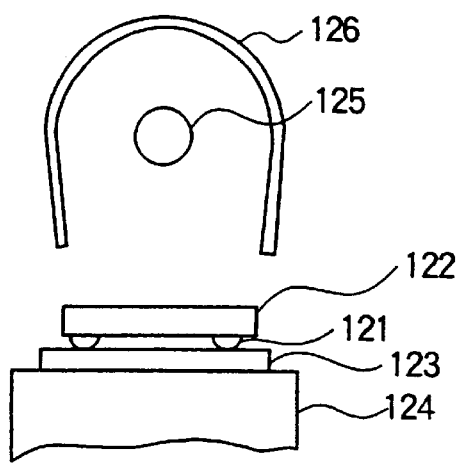
FIG. 42 Figure showing a fabricating method for the surface acoustic wave device according to Embodiment 43 of the present invention.

FIG. 42 describes the details of Embodiment 43. This embodiment is a variation of the Embodiment 42. In this method, a printed circuit board 123 and a functional device such as a surface acoustic wave device 122 having bumps thereon are precedently aligned to a mount 124, an infra-red light is irradiated on the rear side of the surface acoustic wave device 122 from the infra-red light source 125 installed above it, and, thus, bumps 121 are melted by the heat conducted through the surface acoustic wave device 122, and execute a step for face-down bonding. In this case, since the surface temperature of the functional device such as the surface acoustic wave device 122 and the like becomes rather high on the surface facing the infra-red light source, there is a possibility of the deterioration of the electrical characteristics depending on the material of the functional device. Hence, a careful temperature control is required.

Embodiment 44

Figure 43:
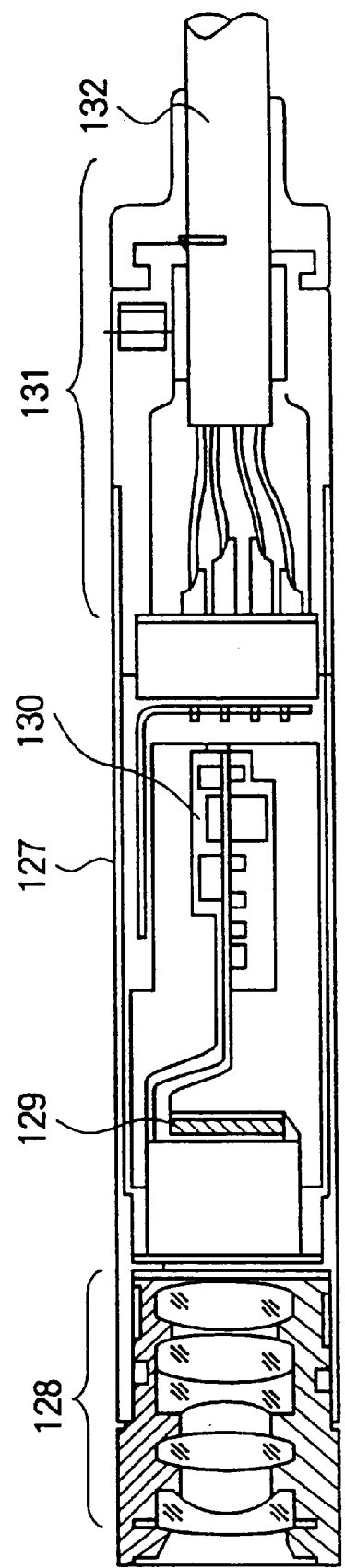
FIG. 43 Sectional view showing a CCD camera according to Embodiment 44 of the present invention.

FIG. 43 is a sectional view showing an image pickup apparatus according to Embodiment 44. As shown in the figure, on one edge of a cylindrical casing 127, an optical system 128 picking up imaging light is disposed. Behind the optical system 128, a CCD device 129 is disposed. For the CCD device 129, the CCD shown in the Embodiment 40 can be employed. The CCD device 129 is connected to a printed circuit board 130 disposed behind it. The printed circuit board 130 is connected to a camera cable portion 131 disposed behind it. A cable 132 is pulled out from the other edge portion of the casing 127 through the camera cable portion 131.

Embodiment 45

Figure 44:
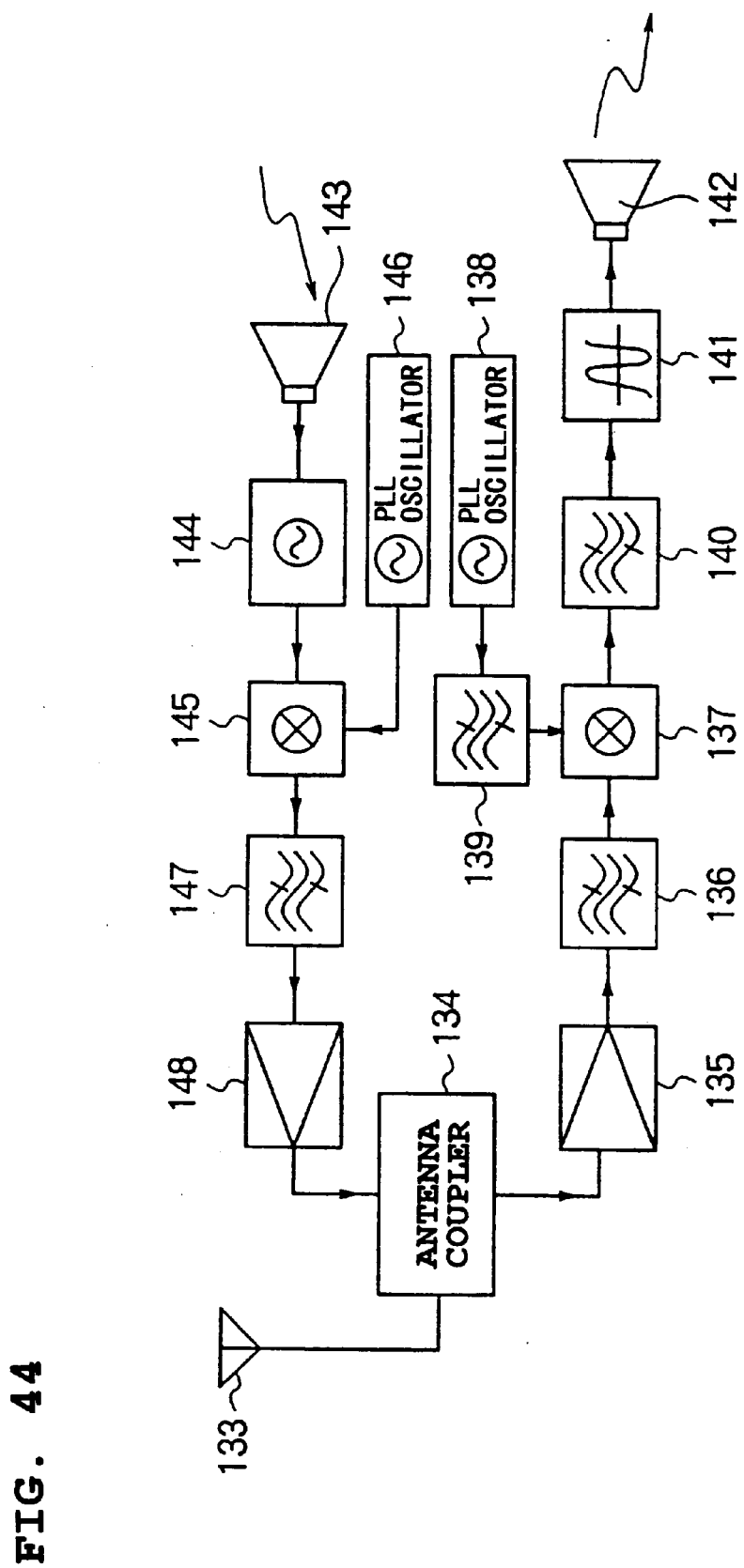
FIG. 44 Block diagram showing a mobile communication apparatus according to Embodiment 45 of the present invention.

FIG. 44 is a block diagram showing a constitution of a mobile communication apparatus according to Embodiment 45. For an example of the mobile communication apparatus, a mobile telephone, a cordless telephone, or the like can be cited. As shown in the figure, a receive wave received through an antenna 133 is separated to a receiving system through an antenna coupler 134. After the separated receive signal is amplified through an amplifier 135, a desired band-width is extracted through a band-pass filter for receiving use 136 and inputted into a mixer 137. Into the mixer, a local oscillator signal sent out from a PPL oscillator 138 is inputted through a local oscillator signal filter 139. The output power of the mixer 137 is sent out as receive sound from a speaker 142 through an IF filter 140, a FM demodulator 141. On the contrary, sending sound inputted from a microphone 143 is output to a mixer 145 through a FM demodulator 145. To the mixer 145, a local oscillator signal transmitted from the PPL oscillator 146 is inputted. The output power from the mixer 145 is output as a transmitting wave from the antenna 133 through the band-pass filter 147, a power amplifier 148, and the antenna coupler 135.

The respective surface acoustic wave apparatuses according to the present invention can be employed for each part of the mobile communication apparatus. For such as a band-pass filter 147 for transmitting use, a band-pass filter 136 for receiving use, a local oscillator filter 139, and an antenna-coupler 134, a surface acoustic wave device according to the present invention can be employed as a filter for RF stage. As to an IF filter 140, a surface acoustic wave apparatus according to the present invention is employed as a filter of the IF stage having a narrow band width indispensable for channel selection. For the FM demodulator 144, the surface acoustic wave apparatus according to the present invention is employed as a surface acoustic wave resonator in the stage of FM demodulation.

Embodiment 46

Figure 45:
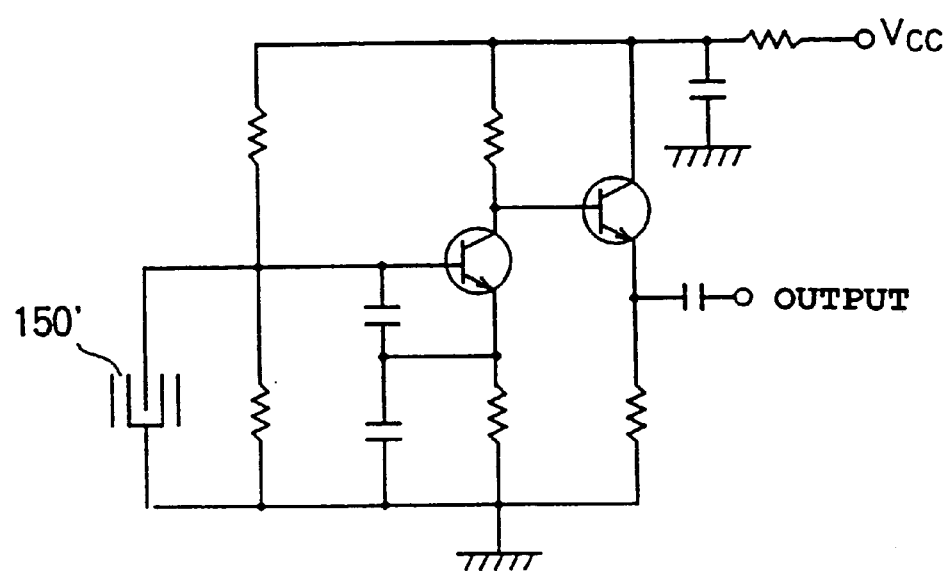
FIG. 45 Circuit diagram showing an oscillator circuit according to Embodiment 46 of the present invention.
Figure 46:
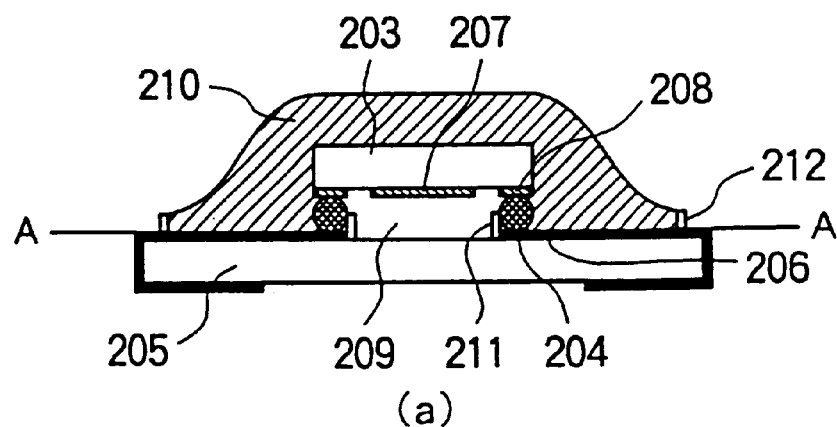
FIG. 46 Sectional view and partial plan view showing a conventional surface acoustic wave device.
Figure 46:
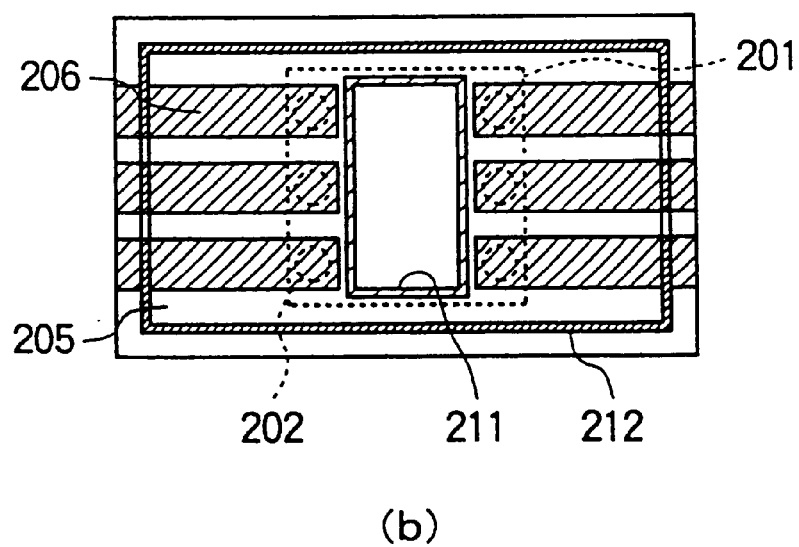

FIG. 45 is a circuit diagram showing an oscillator circuit of a RF modulator to be used for a VTR or a CATV according to Embodiment 46. For a resonator shown in the figure, a surface acoustic wave apparatus of the present invention is employed. Further, for the resonator, a quartz oscillator or resonator apparatus (ref. Embodiment 36) can be employed too.

Although some embodiments were explained above, the present invention is not limited to the above-described embodiments. Such as an electronic device according to a combination of the above-described embodiments or a fabricating method for fabricating an electronic device are naturally included in the range of the present invention.

Industrial Applicability

According to a fabricating method for fabricating an electronic device of the present invention, when a pre-formed sheet of resin is employed, through melting and further hardening by heating, the sheet of the resin coats the electronic device and seals with a printed circuit board. Thus, the structure of the electronic device can be simplified and the electronic device can be easily sealed with the resin without adversely affecting on the electrical characteristics of the electronic device. Further, handling during operation becomes simple compared with the conventional liquid resin. As a result, the present invention contributes to improving productivity and has an immense industrial value.

Further, being highly resistant against electrical noise, being easy in marking, being sealed easily with resin without affecting adversely on the electrical characteristics of the electronic device, being able to contribute to improvement of productivity as a result of simplification of handling during the operation compared with the conventional liquid type resin, the industrial value is immense accordingly.

Still further, by disposing a buffering member between a hot-melt type member for sealing and a surface acoustic wave device, or by employing resin including glass filler as the hot-melt type member for sealing, and, further, by aligning a connecting member at a pre-determined position, strain due to stress induced by hardening of the resin or the difference of thermal expansions can be absorbed, as a result, reliability is improved, and, since an undesirable spreading of the resin for sealing can be prevented, an undesirable influence on the performance due to sealing can be alleviated. Further, according to a fabricating method for fabricating an electronic device of the present invention, namely, a surface acoustic wave apparatus, a sheet of a buffering member can be aligned easily between a hot-melt type member for sealing and a surface acoustic wave device serving as a functional device, hence, the present invention can contribute to improvement of productivity and reliability, and can have an immense industrial value.

Further, since bonding strength of bonding between a surface acoustic wave device, which requires such as a surface acoustic wave absorber, and a printed circuit board can be strengthened and an appropriate volume of a space portion can be formed, the present invention can contribute to improvement of characteristics, productivity, and reliability. Hence, the industrial value is immense.

Since resin spread over to side surface portions of a surface acoustic wave device can be a surface acoustic wave absorber (sound absorber) which absorbs unnecessary surface acoustic wave, an unnecessary spurious radiation can be attenuated, thereby the performance as a surface acoustic wave apparatus can be improved. Further, since, by hardening liquid resin or by dripping and solidifying low melt glass, sealing member, together with a printed circuit board, seals the surface acoustic wave device, the structure of a surface acoustic wave apparatus can be made simple. Further, the apparatus of the present invention can be resistant against electrical noise, be easy for marking, be sealed easily with resin without adversely affecting on the propagation path of a surface acoustic wave, and be simple in handling during processing compared with the conventional fabricating method wherein the liquid resin is employed. Hence, the productivity can be improved. Thus, the industrial value of the present invention is remarkable.

Further, according to a fabricating method for fabricating an electrical device of the present invention, since an infrared light can heat a faying surface effectively and without contact, defective product such as a chipped one does not occur. Thus, the device can be stably bonded.

Further, according to an electronic device of the present invention, when a hot-melt type member is employed as a sealing member, the sealing member can be melted and hardened by heating and thereby coats the electronic device and seals the electronic device together with a printed circuit board. Further, a resin for sealing, by connecting through pouring or dripping and hardening of the sealing resin such as a liquid resin, thereby coats the electronic device and seals the electronic device together with the printed circuit board. And, since a frame-shaped insulating member is not necessarily required for preventing the sealing member from intruding into a space portion formed between the surface acoustic wave device which works as a functional device and the printed circuit board, the electronic device having a simple structure can be obtained and the miniaturization of the electronic device can be attained. Thus, electronic devices can be mounted with high density.

What is claimed is:

1. A surface acoustic wave device, comprising:
   a printed circuit board possessing a first surface and a second surface, concave parts being formed respectively on two side surfaces thereof;
   a surface acoustic wave device possessing a first surface formed thereon at least a transducer portion and a second surface, the first surface thereof being disposed in an opposite relation with the first surface of the printed circuit board;
   a sealing member for sealing a space portion formed between the first surface of the printed circuit board and the first surface of the surface acoustic wave device while preventing the sealing member from spreading into the space portion; and a metal plate disposed in such a manner that a pair of convex portions, which engage with respective concave portions disposed on the printed circuit board, oppose each other on two leg portions, and covering the first surface of the printed circuit board and the surface acoustic wave device.

2. A surface acoustic wave device, comprising:

a printed circuit board possessing a first surface and a second surface, concave portions being formed on two side surfaces of the printed circuit board respectively, and wiring patterns being formed inside the respective concave portions;

a surface acoustic wave device possessing a first surface formed thereon at least a transducer portion and a second surface, the first surface thereof being disposed in an opposite relation with the first surface of the printed circuit board;

a sealing member for sealing a space portion formed between the first surface of the printed circuit board and the first surface of the surface acoustic wave device while preventing the sealing member from spreading into the space portion; and, a metal plate disposed in such a manner that a pair of convex portions, which engage to the respective concave portions disposed on the printed circuit board and connect electrically to the respective wiring patterns of the inner surface of the concave portions, oppose each other at two leg portions, and covering the first surface of the printed circuit board and the surface acoustic wave device.

3. A surface acoustic wave device, comprising:

a printed circuit board possessing a first surface and a second surface, stepped parts being formed on two respective side surfaces thereof, the respective first surface sides thereof being upper stairs;

a surface acoustic wave device possessing a first surface formed thereon at least a transducer portion and a second surface, the first surface thereof being disposed in an opposite relation with the first surface of the printed circuit board;

a sealing member for sealing a space portion formed between the first surface of the printed circuit board and the first surface of the surface acoustic wave device while preventing the sealing member from spreading into the space portion; and a metal plate disposed in such a manner that a pair of protruded portions, which engage to the respective stepped portions disposed on the printed circuit board, are disposed oppositely on two leg parts of the metal plate, and covering the first surface of the printed circuit board and the surface acoustic wave device.

4. A surface acoustic wave device, comprising:

a printed circuit board possessing a first board surface and a second board surface, first stepped surface portions being formed on opposite sides of the second board surface by at least two cut-out portions in such a manner that the first stepped surface portions are out of the plane of the remainder of the second board surface containing wiring patterns;

a surface acoustic wave element possessing a first element surface including at least a transducer portion and a second element surface, the first element surface being disposed in an opposite relation with the first board surface to form a space portion between the first element surface and the first board surface;

a sealing member configured to seal the space portion while preventing the sealing member from spreading into the space portion; and a metal plate disposed in such a manner that a pair of protruded portions engage with respective first stepped portions disposed on opposite sides of the printed circuit board and connect electrically to the respective wiring patterns, said metal plate having a covering portion covering the first board surface and the first element surface and two opposed leg portions extending from the covering portion to the pair of protruded portions.

5. A surface acoustic wave device, comprising:

a printed circuit board possessing a first surface and a second surface;

a surface acoustic wave device possessing a first surface and a second surface, the first surface thereof being disposed in an opposite relation with the first surface of the printed circuit board; and a hot-melt type member for sealing a firs space portion formed between the first surface of the printed circuit board and the first surface of the surface acoustic wave device while preventing the hot-melt type member from spreading into the first space portion and a second space portion formed between the second surface of the surface acoustic wave device and the hot-melt type member.

6. An electronic device, comprising:

a printed circuit board possessing a first surface and a second surface;

a functional device possessing a first surface and a second surface, the first surface thereof being disposed in an opposite relation with the first surface of the printed circuit board;

a hot-melt type member for sealing a first space portion formed between the first surface of the printed circuit board and the first surface of the functional device while preventing the hot-melt type member from spreading into the first space portion and a second space portion formed between a second surface of the functional device and the hot-melt type member; and a thermo-setting type buffering member interposed between the second surface of the functional device and the hot-melt type member.

7. The electronic device as set forth in claim 6:

wherein the thermo-setting type buffering member is a liquid silicone.

8. A surface acoustic wave device, comprising:

a printed circuit board possessing a first board surface and a second board surface;

a surface acoustic wave element possessing a first element surface including at least a transducer portion and a second element surface, the first element surface being disposed in opposite relation with respect to and spaced from the first board surface to form a space portion between the first element surface and the first board surface;

a sealing member having a sealing portion making contact with the first board surface over a contact area on the first board surface completely outside of the space portion, the sealing member being formed from a sheet of hot-melt material having a characteristic preventing the hot-melt material from spreading into the space portion; and a means for preventing deformation of the surface acoustic wave element with respect to a relation between the surface acoustic wave element and the sealing member, wherein the means for preventing the deformation is a buffering member disposed between the surface acoustic wave element and the sealing member.

9. A surface acoustic wave device, comprising:

a printed circuit board possessing a first board surface and a second board surface;

a surface acoustic wave element possessing a first element surface including at least a transducer portion and a second element surface, the first element surface being disposed in opposite relation with respect to and spaced from the first board surface to form a space portion between the first element surface and the first board surface;

a sealing member having a sealing portion making contact with the first board surface over a contact area on the first board surface completely outside of the space portion, the sealing member being formed from a sheet of hot-melt material having a characteristic preventing the hot-melt material from spreading into the space portion; and a means for preventing deformation of the surface acoustic wave element with respect to a relation between the surface acoustic wave element and the sealing member, wherein the means for preventing the deformation includes a large number of bubbles included in the sealing member.

* * * * *

UNITED STATES PATENT AND TRADEMARK OFFICE
CERTIFICATE OF CORRECTION

PATENT NO. : 6,262,513 B1
DATED : July 17, 2001
INVENTOR(S) : Osamu Furukawa et al.

It is certified that error appears in the above-identified patent and that said Letters Patent is hereby corrected as shown below:

Column 2,
Line 49, please insert -- materials -- before "such as".

Column 10,
Line 40, please delete "the"; and change "parts" to -- part --;
Line 57, delete "the".

Column 16,
Lines 9, 21, 38 and 52, insert -- to -- between the words "relation" and "each."

Column 18,
Line 35, please delete "Cf2".

Column 21,
Line 11, please insert -- (3). -- after the word "and".

Column 39,
Line 66, please change "instep" to -- in step --.

Column 46,
Line 40, please insert -- to -- between the words "made" and "remain".

Column 50,
Line 6, please delete "Am".

Column 51,
Line 14, please change "it" to -- its --.

Column 52,
Line 64, delete ",";
Line 65, change "is" to -- are --;
Line 67, please delete "maintaining".

Column 53,
Line 25, please change "roll" to -- role --.

Column 55,
Line 42, please change "play-a roll" to -- play a role --.

UNITED STATES PATENT AND TRADEMARK OFFICE
CERTIFICATE OF CORRECTION

PATENT NO.    : 6,262,513 B1
DATED         : July 17, 2001
INVENTOR(S)   : Osamu Furukawa et al.

It is certified that error appears in the above-identified patent and that said Letters Patent is hereby corrected as shown below:

Column 63,
Line 18, please change "it" to -- its --.

Column 66,
Line 59, please delete "and".

Column 70,
Line 12, please change "it's" to -- its --.

Column 74,
Line 63, please change "it's" to -- its --.

Column 79,
Line 16, please change "it's" to -- its --.

Column 88,
Line 53, please change "typemember" to -- type member --; and please change "settingmember" to -- setting member --.

Column 111,
Line 23, please change "In stead" to -- Instead --.

Column 117,
Line 29, please change "'in" to -- in --.

Column 122,
Line 21, please change "it's" to -- its --.

Column 142,
Lines 5 and 6, please change "it's" to -- its --.

Column 144,
Line 40, please change "FIGS." to -- FIG. --.

Column 145,
Line 43, please change "it's" to -- its --.

UNITED STATES PATENT AND TRADEMARK OFFICE
CERTIFICATE OF CORRECTION

PATENT NO.   : 6,262,513 B1
DATED        : July 17, 2001
INVENTOR(S)  : Osamu Furukawa et al.

It is certified that error appears in the above-identified patent and that said Letters Patent is hereby corrected as shown below:

Column 148,
Line 4, please change "photopcoupler" to -- photocoupler --.

Column 154,
Line 23, please change "firs" to -- first --.

Signed and Sealed this

Eleventh Day of March, 2003

JAMES E. ROGAN
*Director of the United States Patent and Trademark Office*